US011302714B2

United States Patent
Cui et al.

(10) Patent No.: US 11,302,714 B2
(45) Date of Patent: Apr. 12, 2022

(54) THREE-DIMENSIONAL MEMORY DEVICE INCLUDING A COMPOSITE SEMICONDUCTOR CHANNEL AND A HORIZONTAL SOURCE CONTACT LAYER AND METHOD OF MAKING THE SAME

(71) Applicant: SANDISK TECHNOLOGIES LLC, Addison, TX (US)

(72) Inventors: Zhixin Cui, Nagoya (JP); Satoshi Shimizu, Yokkaichi (JP); Yanli Zhang, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 111 days.

(21) Appl. No.: 16/985,388

(22) Filed: Aug. 5, 2020

(65) Prior Publication Data

US 2022/0045091 A1    Feb. 10, 2022

(51) Int. Cl.
*H01L 27/11582* (2017.01)
*H01L 27/11519* (2017.01)
(Continued)

(52) U.S. Cl.
CPC .. *H01L 27/11582* (2013.01); *H01L 21/32135* (2013.01); *H01L 27/1157* (2013.01);
(Continued)

(58) Field of Classification Search
CPC ......... H01L 27/11582; H01L 21/32135; H01L 27/11519; H01L 27/11524; H01L 27/11556; H01L 27/11565; H01L 27/1157
See application file for complete search history.

(56) References Cited

U.S. PATENT DOCUMENTS 8,766,414 B2    7/2014  Herner
9,023,719 B2    5/2015  Pachamuthu et al.
(Continued)

FOREIGN PATENT DOCUMENTS

CN    108878435 A    11/2018

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).
(Continued)

*Primary Examiner* — Allison Bernstein
(74) *Attorney, Agent, or Firm* — The Marbury Law Group PLLC

(57) ABSTRACT

A three-dimensional memory device includes a source contact layer overlying a substrate, an alternating stack of insulating layers and electrically conductive layers located overlying the source contact layer, and a memory opening fill structure located within a memory opening extending through the alternating stack and the source contact layer. The memory opening fill structure includes a composite semiconductor channel and a memory film laterally surrounding the composite semiconductor channel. The composite semiconductor channel includes a pedestal channel portion having controlled distribution of n-type dopants that diffuse from the source contact layer with a lower diffusion rate provided by carbon doping and smaller grain sizes, or has arsenic doping providing limited diffusion into the vertical semiconductor channel. The vertical semiconductor channel has large grain sizes to provide high charge carrier mobility, and is free of or includes only a low concentration of carbon atoms and n-type dopants therein.

20 Claims, 81 Drawing Sheets

(51) Int. Cl.
*H01L 27/11565* (2017.01)
*H01L 21/3213* (2006.01)
*H01L 27/11524* (2017.01)
*H01L 27/1157* (2017.01)
*H01L 27/11556* (2017.01)

(52) U.S. Cl.
CPC .. *H01L 27/11519* (2013.01); *H01L 27/11524* (2013.01); *H01L 27/11556* (2013.01); *H01L 27/11565* (2013.01)

(56) References Cited

U.S. PATENT DOCUMENTS

| | | | |
|---|---|---|---|
| 9,230,979 | B1 | 1/2016 | Pachamuthu et al. |
| 9,460,931 | B2 | 10/2016 | Pachamuthu et al. |
| 9,524,976 | B2 | 12/2016 | Pachamuthu et al. |
| 9,576,967 | B1 | 2/2017 | Kimura et al. |
| 9,659,956 | B1 | 5/2017 | Pachamuthu et al. |
| 9,754,958 | B2 | 9/2017 | Pachamuthu et al. |
| 9,799,670 | B2 | 10/2017 | Nishikawa et al. |
| 9,831,266 | B2 | 11/2017 | Kai et al. |
| 9,842,851 | B2 | 12/2017 | Pachamuthu et al. |
| 9,876,031 | B1 | 1/2018 | Shimizu et al. |
| 9,917,100 | B2 | 3/2018 | Zhang et al. |
| 9,985,098 | B2 | 5/2018 | Matsumoto et al. |
| 10,008,570 | B2 * | 6/2018 | Yu ................. H01L 27/11582 |
| 10,020,363 | B2 | 7/2018 | Ogawa et al. |
| 10,115,681 | B1 | 10/2018 | Ariyoshi |
| 10,115,730 | B1 | 10/2018 | Baraskar et al. |
| 10,199,359 | B1 | 2/2019 | Sakakibara et al. |
| 10,224,340 | B2 | 3/2019 | Hada et al. |
| 10,224,373 | B2 | 3/2019 | Sei et al. |
| 10,290,650 | B1 | 5/2019 | Iwai |
| 10,381,373 | B2 | 8/2019 | Okizumi et al. |
| 10,381,443 | B2 | 8/2019 | Matsumoto et al. |
| 10,438,964 | B2 | 10/2019 | Makala et al. |
| 10,629,613 | B1 | 4/2020 | Shimizu et al. |
| 11,127,759 | B2 * | 9/2021 | Obu ................. H01L 27/11556 |
| 2016/0172368 | A1 | 6/2016 | Pang et al. |
| 2019/0371807 | A1 | 12/2019 | Nishikawa et al. |
| 2020/0020715 | A1 | 1/2020 | Nakamura et al. |
| 2020/0194450 | A1 | 6/2020 | Pachamuthu et al. |

OTHER PUBLICATIONS

U.S. Appl. No. 16/916,476, filed Jun. 30, 2020, SanDisk Technologies LLC.
U.S. Appl. No. 16/912,279, filed Jun. 25, 2020, SanDisk Technologies LLC.
U.S. Appl. No. 16/910,752, filed Jun. 24, 2020, SanDisk Technologies LLC.
U.S. Appl. No. 16/887,818, filed May 29, 2020, SanDisk Technologies LLC.
U.S. Appl. No. 16/800,097, filed Feb. 25, 2020, SanDisk Technologies LLC.
U.S. Appl. No. 16/800,078, filed Feb. 25, 2020, SanDisk Technologies LLC.
U.S. Appl. No. 16/406,335, filed May 8, 2019, SanDisk Technologies LLC.
U.S. Appl. No. 16/394,233, filed Apr. 25, 2019, SanDisk Technologies LLC.
U.S. Appl. No. 16/407,310, filed May 9, 2019, SanDisk Technologies LLC.
U.S. Appl. No. 16/272,468, filed Feb. 11, 2019, SanDisk Technologies LLC.
U.S. Appl. No. 16/408,722, filed May 10, 2019, SanDisk Technologies LLC.
U.S. Appl. No. 16/268,183, filed Feb. 5, 2019, SanDisk Technologies LLC.
U.S. Appl. No. 16/268,132, filed Feb. 5, 2019, SanDisk Technologies LLC.
U.S. Appl. No. 16/267,625, filed Feb. 5, 2019, SanDisk Technologies LLC.
U.S. Appl. No. 16/241,221, filed Jan. 7, 2019, SanDisk Technologies LLC.
U.S. Appl. No. 16/241,171, filed Jan. 7, 2019, SanDisk Technologies LLC.
U.S. Appl. No. 16/291,220, filed Mar. 4, 2019, SanDisk Technologies LLC.
U.S. Appl. No. 16/200,115, filed Nov. 26, 2018, SanDisk Technologies LLC.
U.S. Appl. No. 16/224,367, filed Dec. 18, 2018, SanDisk Technologies LLC.
U.S. Appl. No. 16/199,885, filed Nov. 26, 2018, SanDisk Technologies LLC.
Notification of Transmillal of the International Search Report and the Written Opinion of the International Searching Authority for International Patent Application No. PCTUS2021/035902, dated Sep. 2, 2021, 13 pages.
U.S. Appl. No. 16/985,340, filed Aug. 5, 2020, 250 pages.
U.S. Appl. No. 16/985,410, filed Aug. 5, 2020, 250 pages.

* cited by examiner

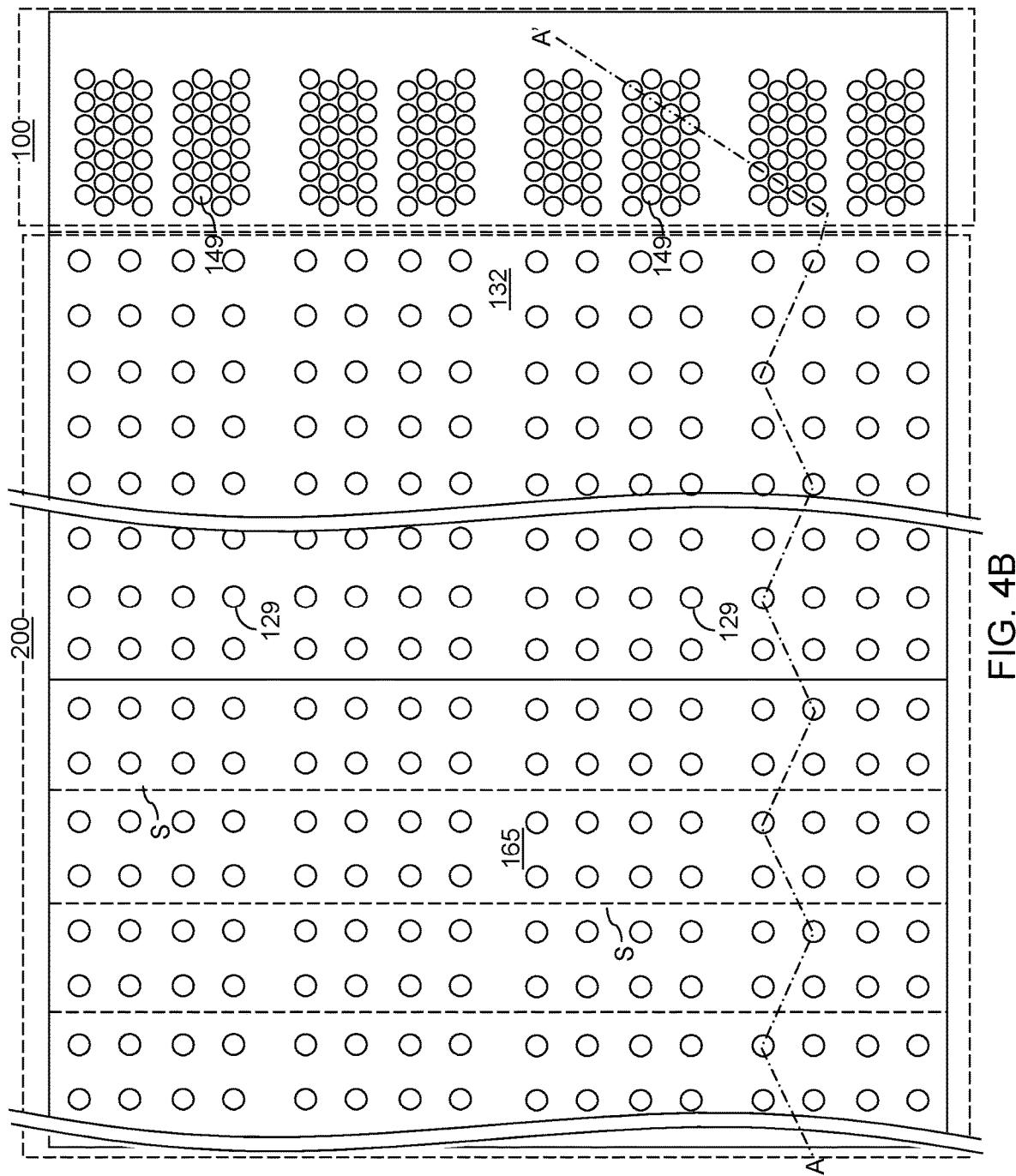

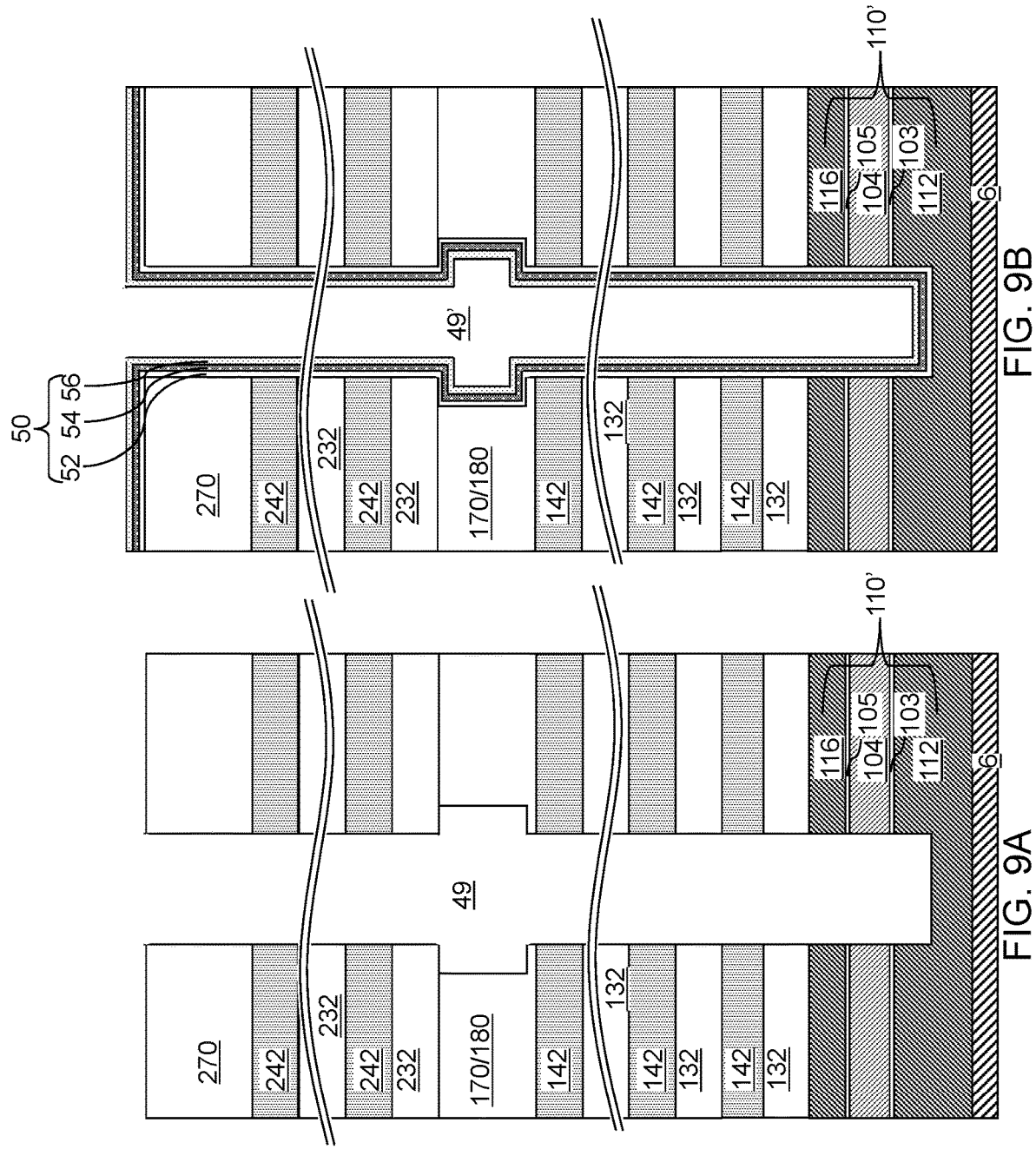

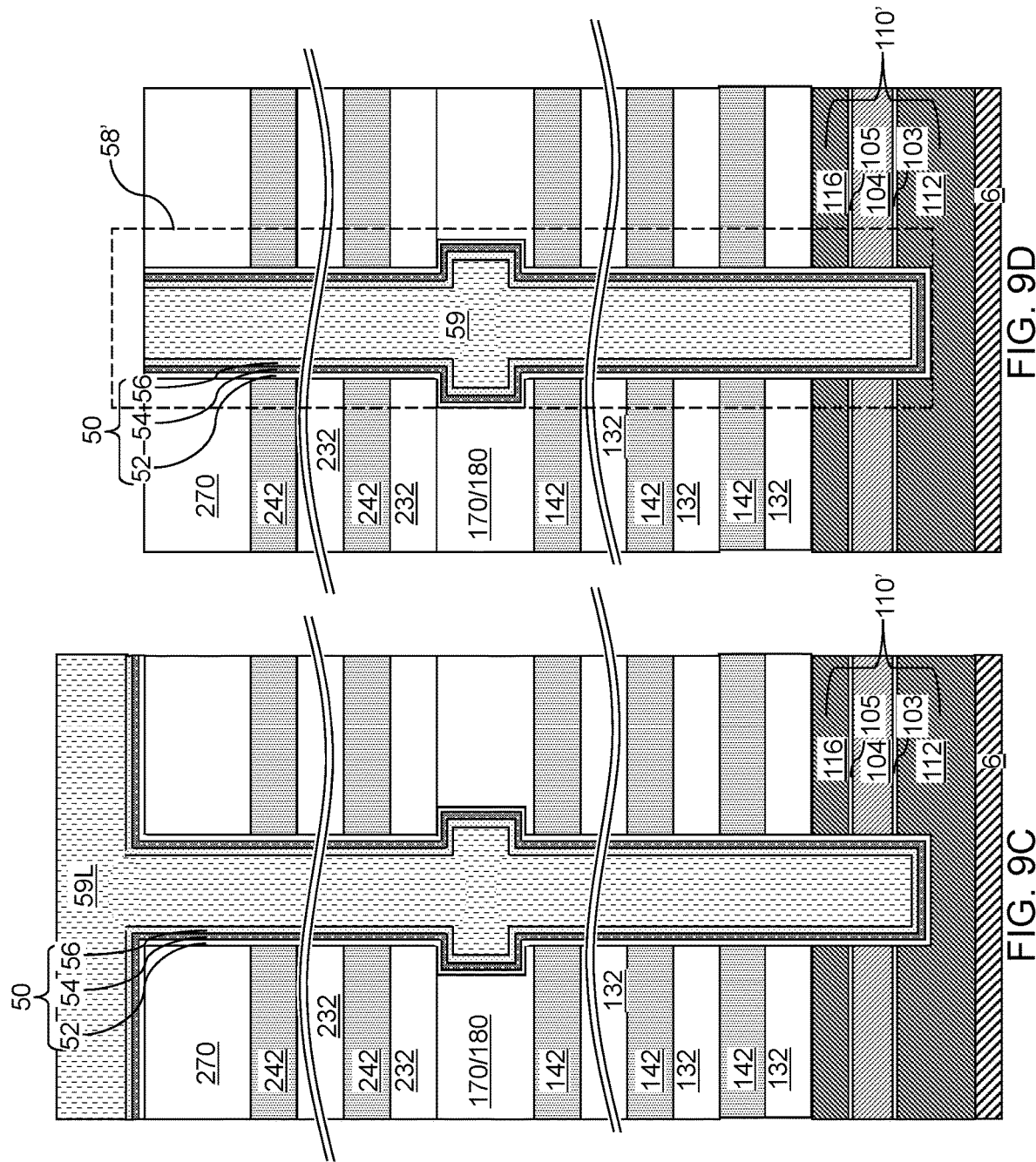

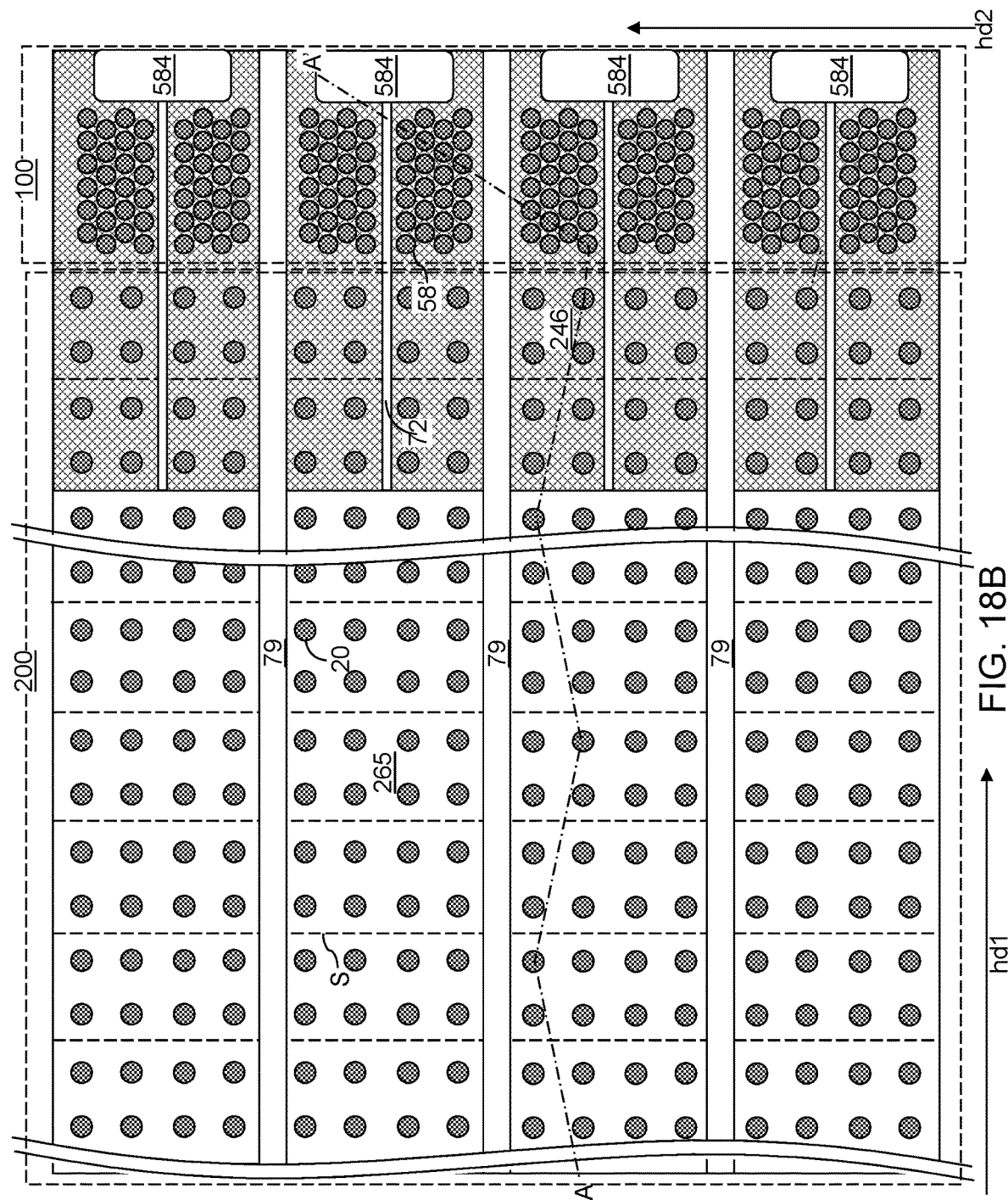

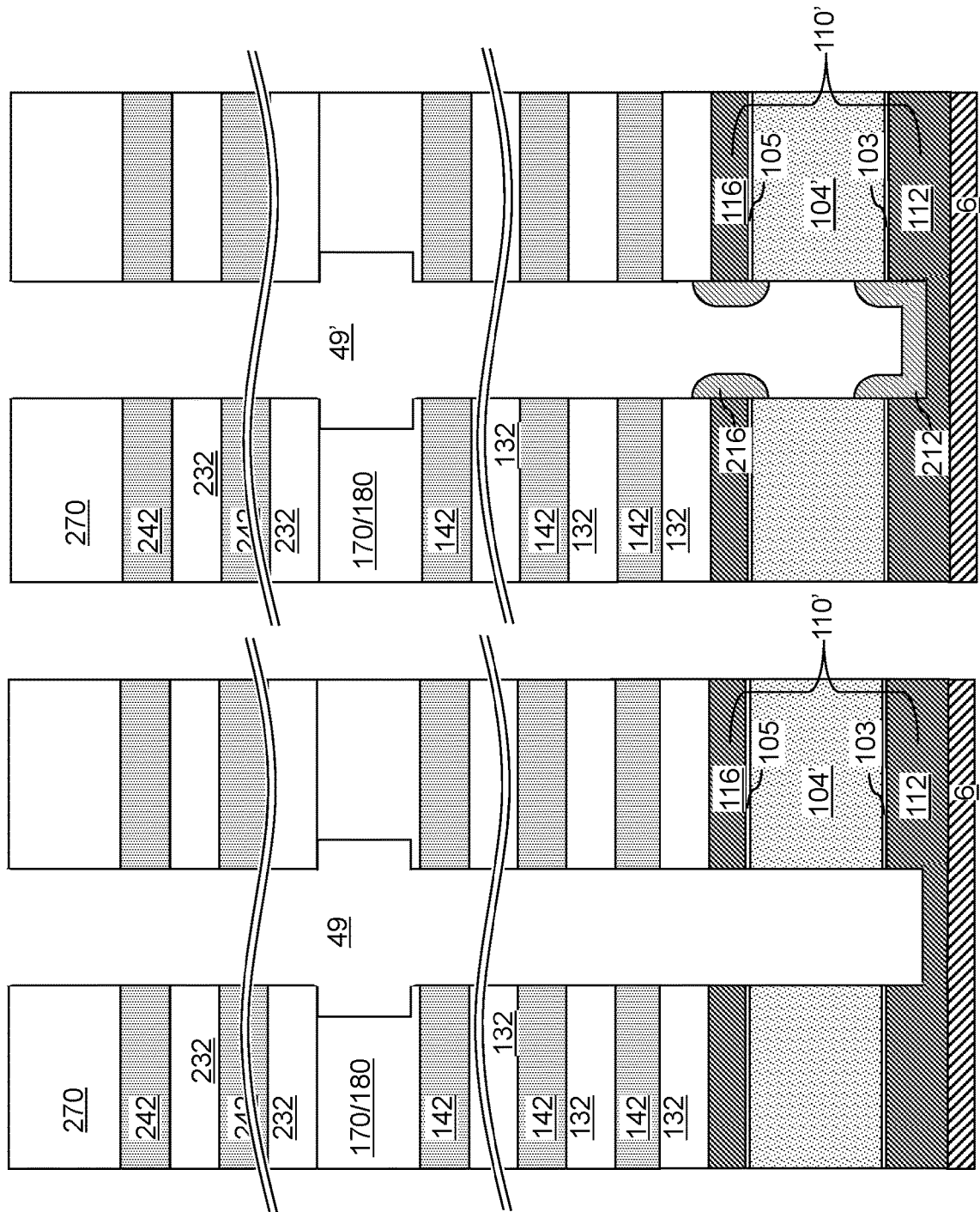

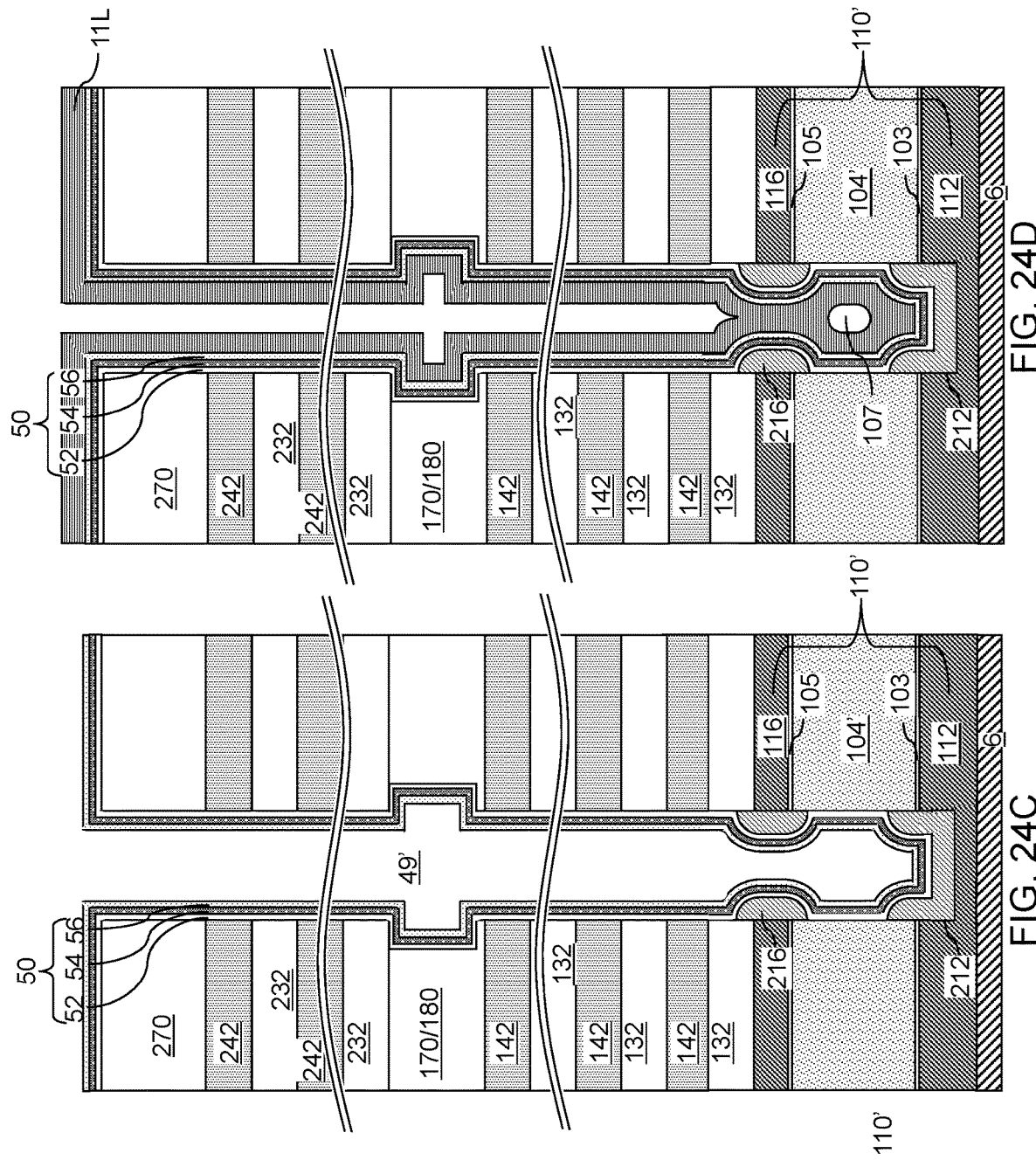

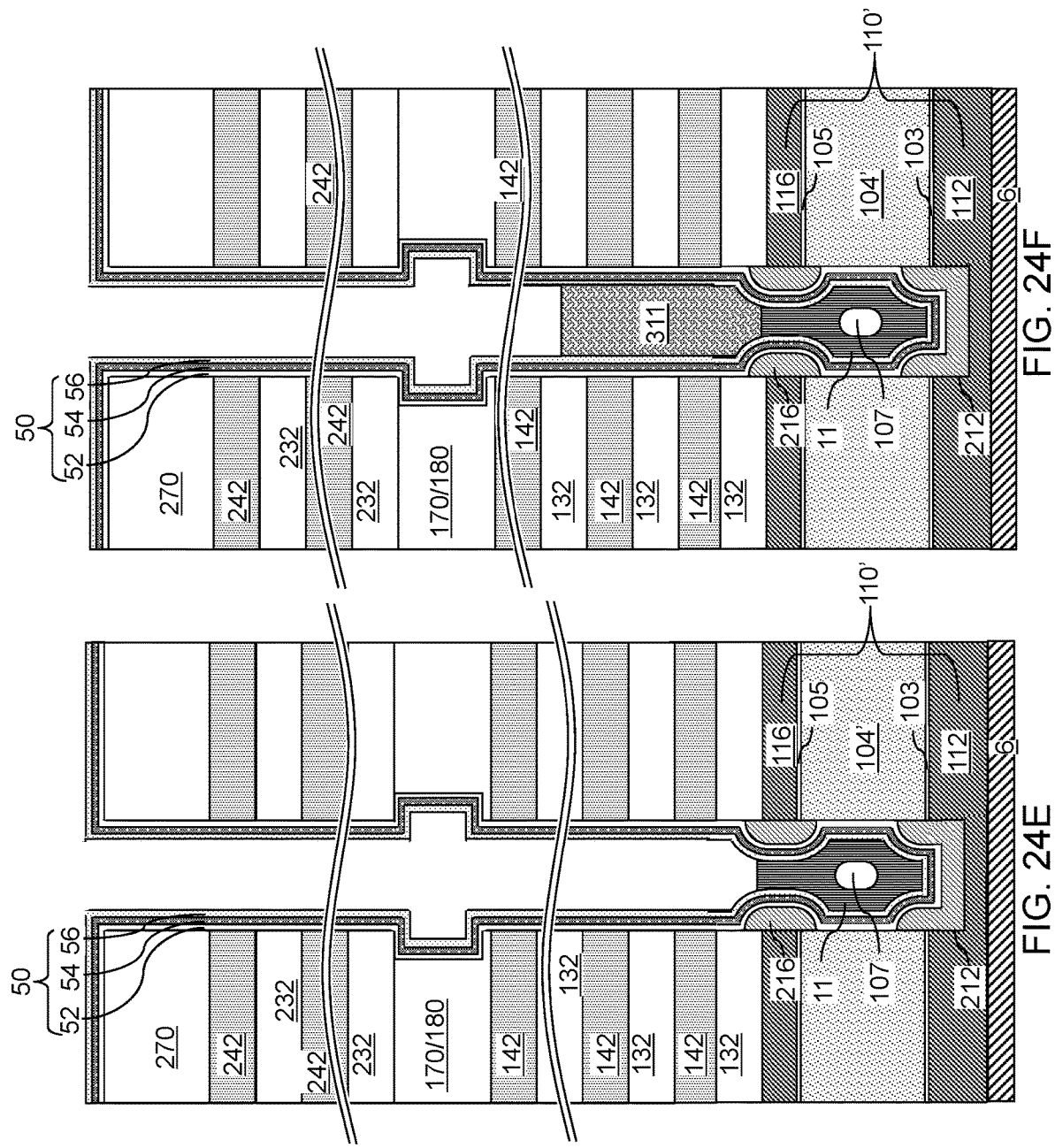

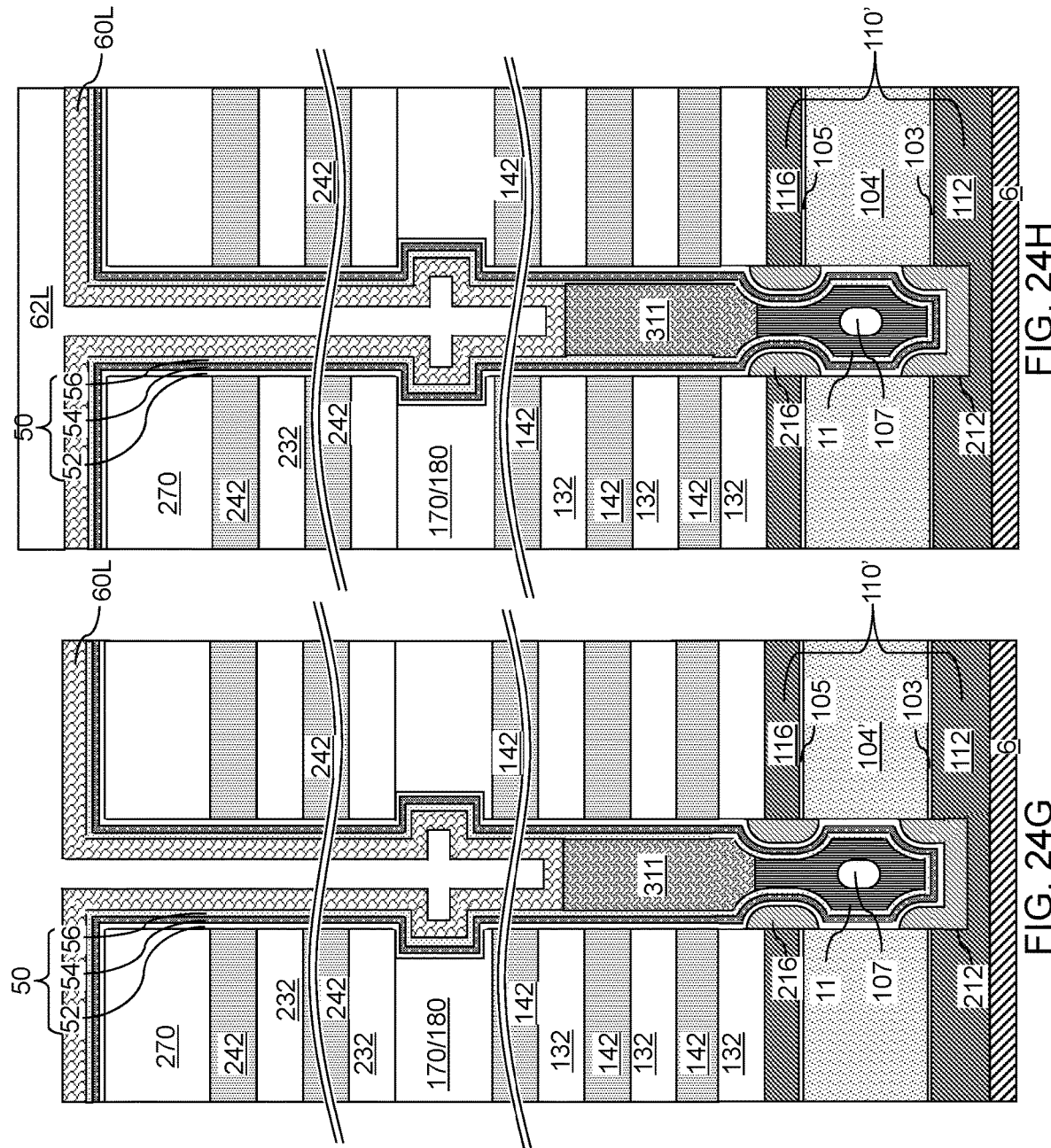

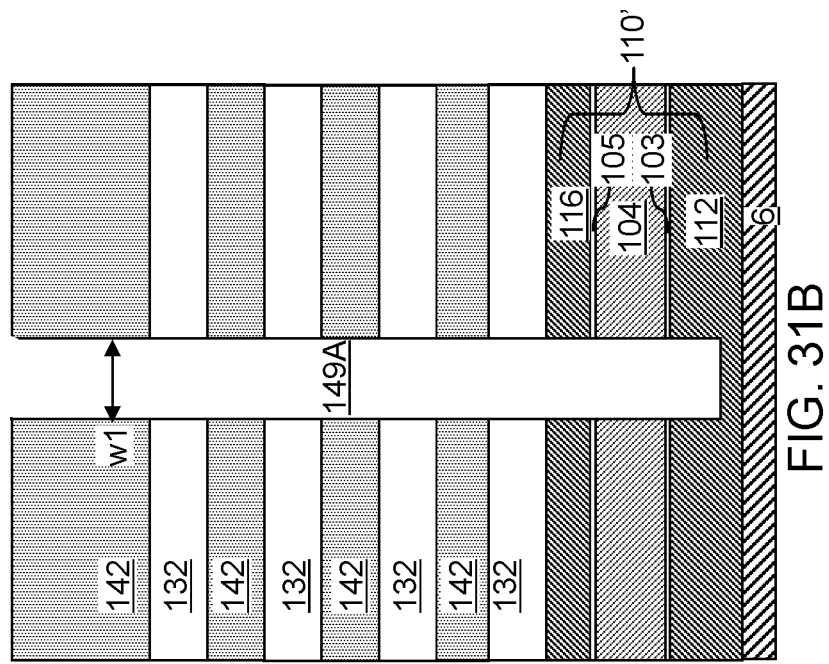
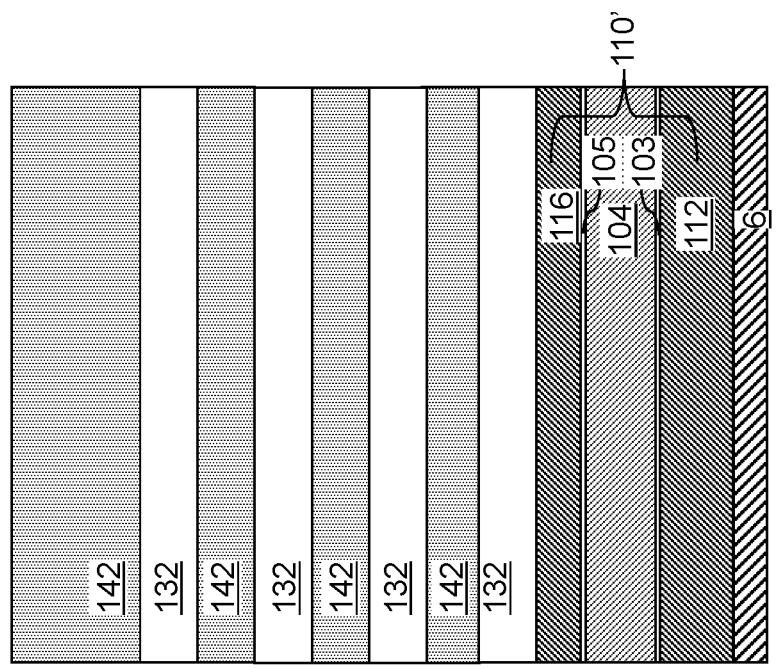
FIG. 31A
FIG. 31B

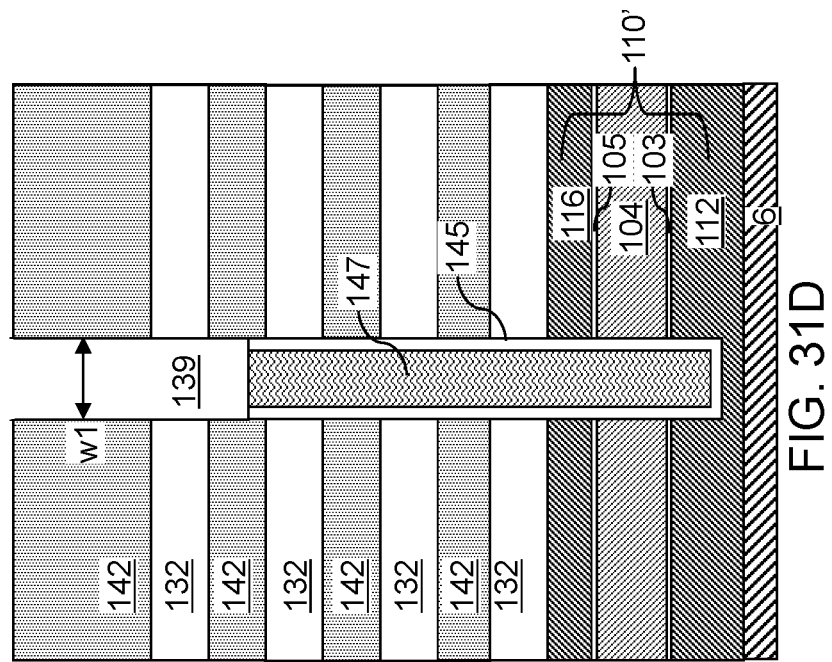
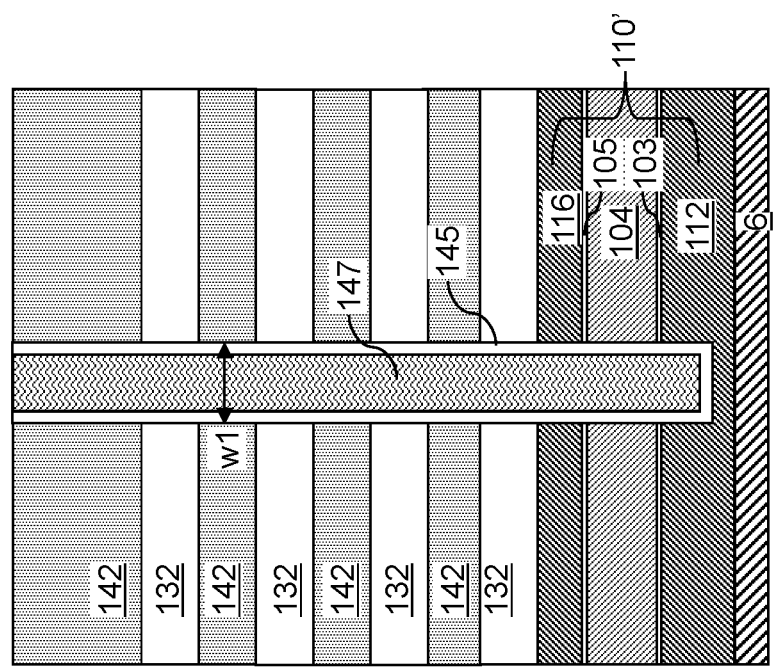

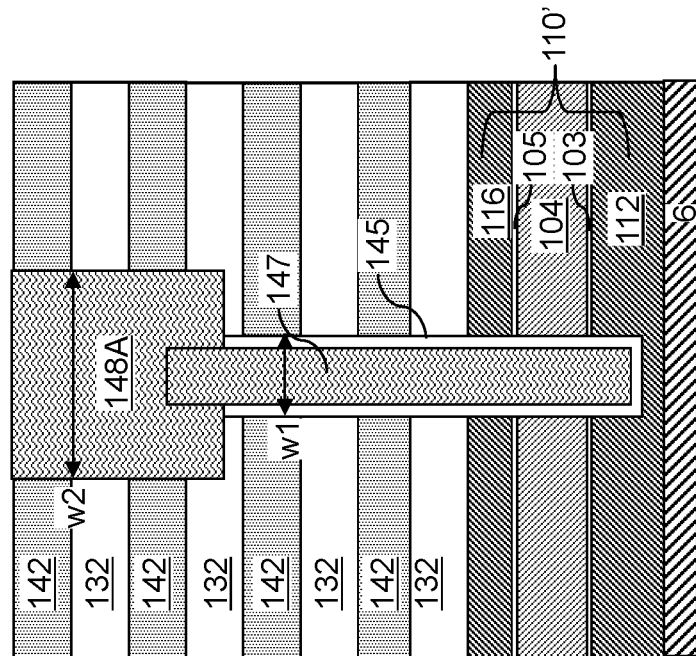
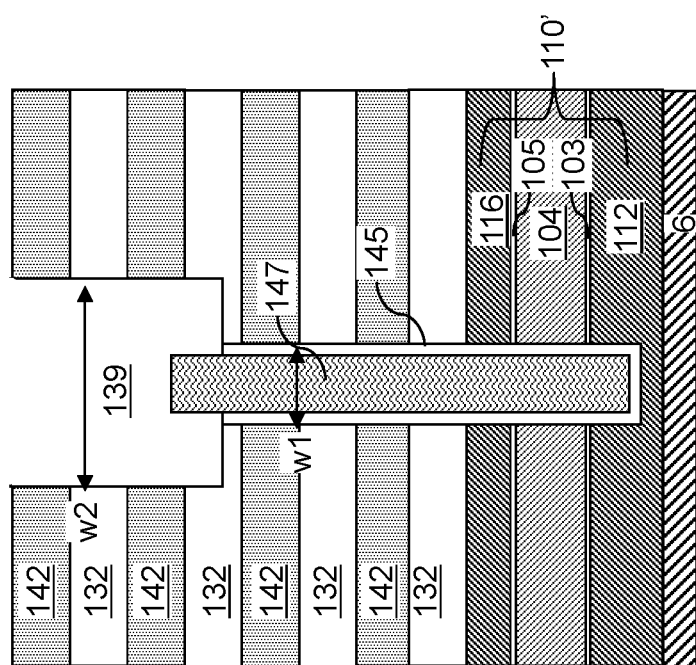

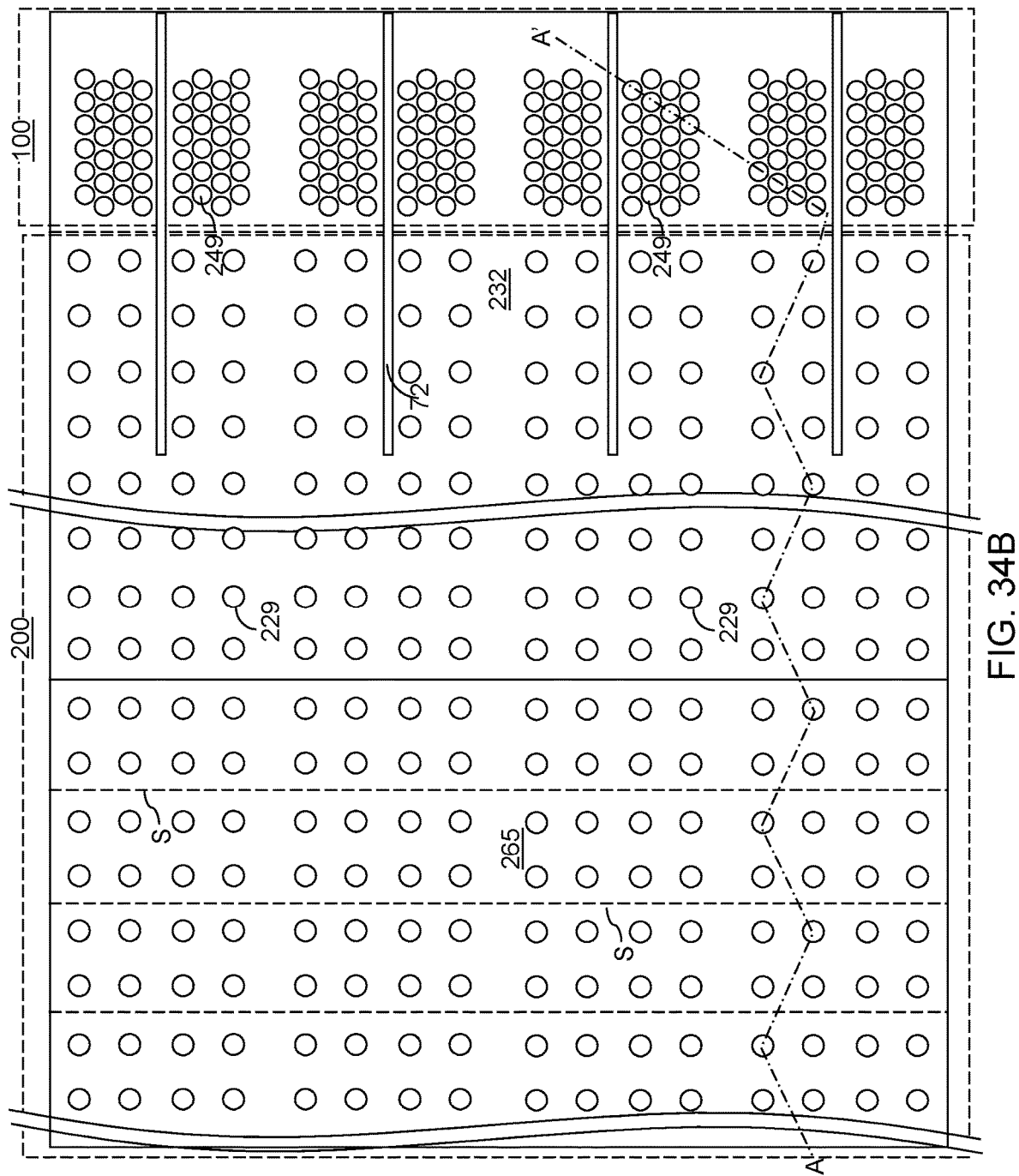

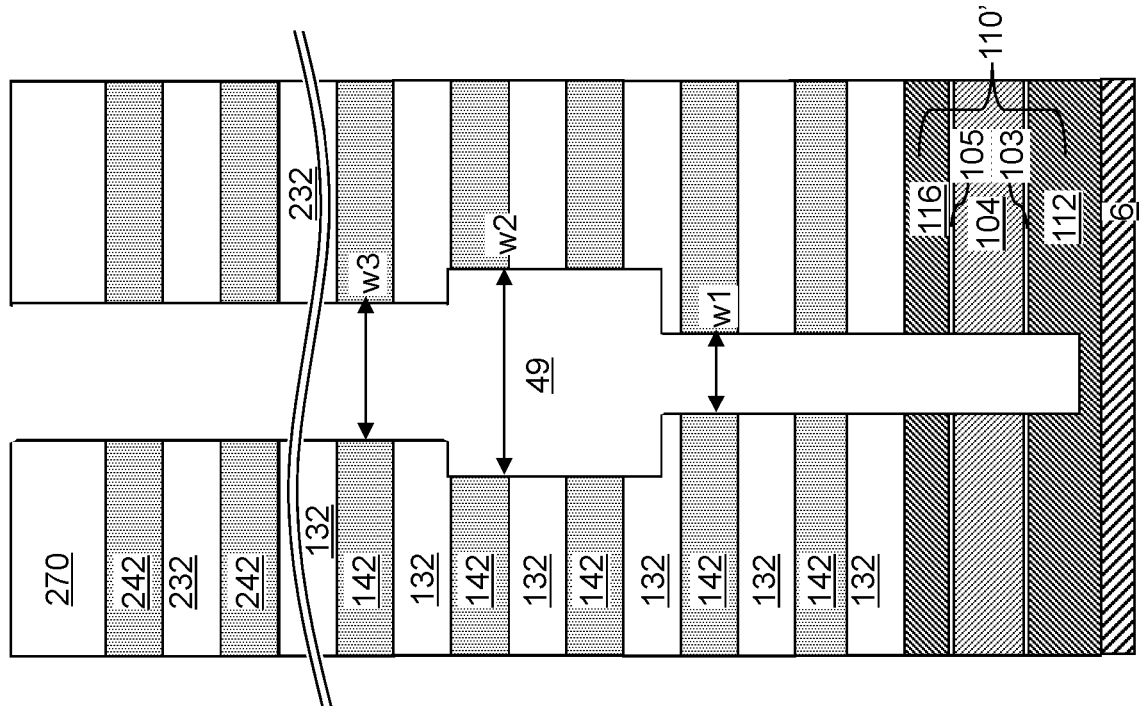
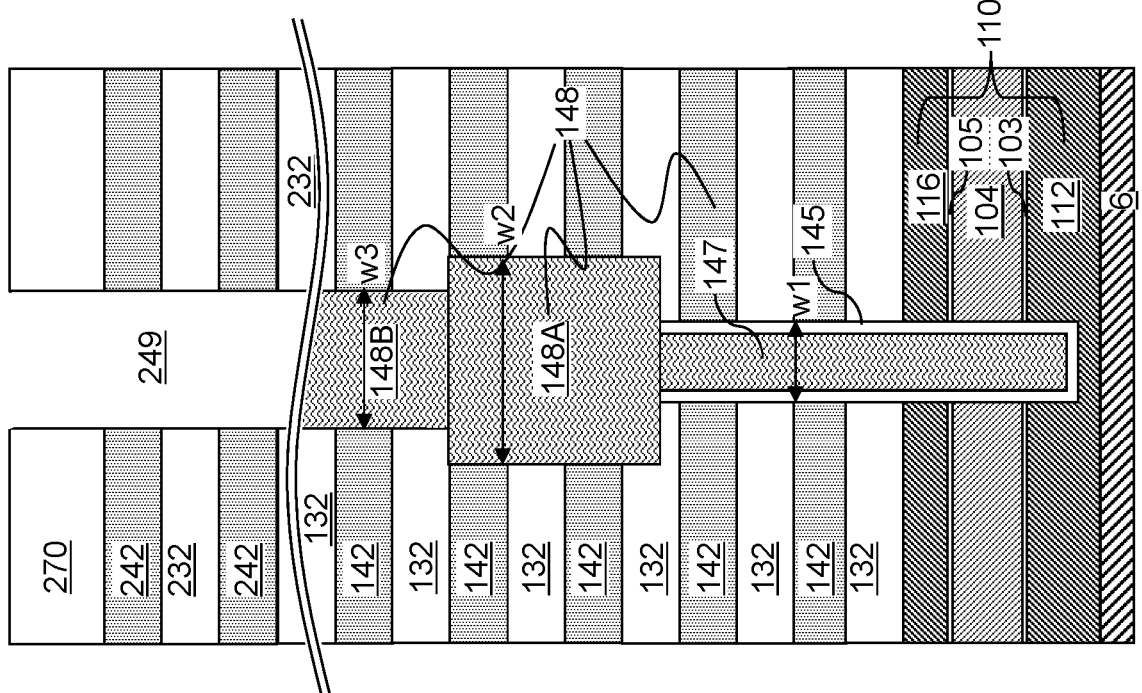
FIG. 35A
FIG. 35B

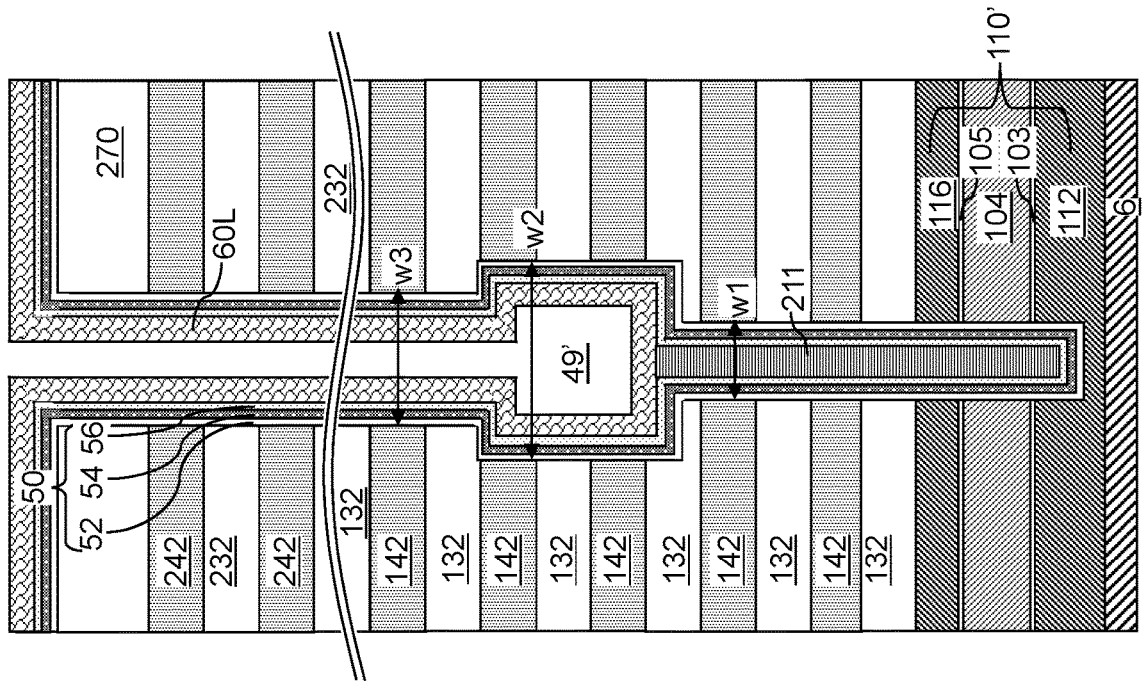
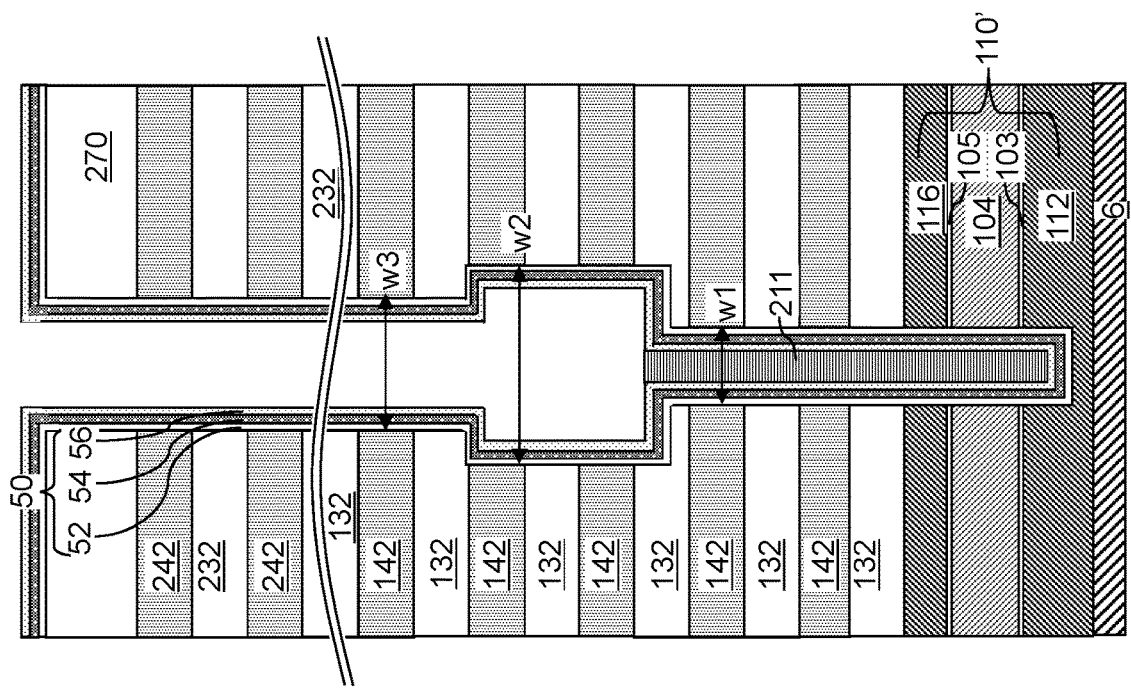
FIG. 35F
FIG. 35E

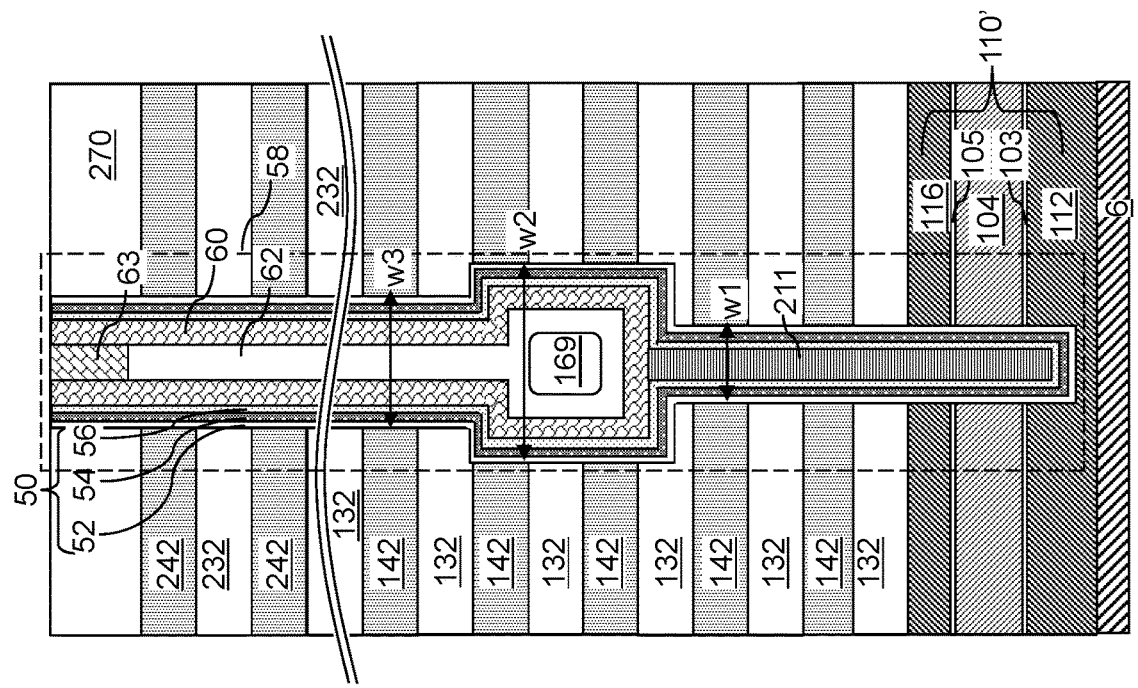
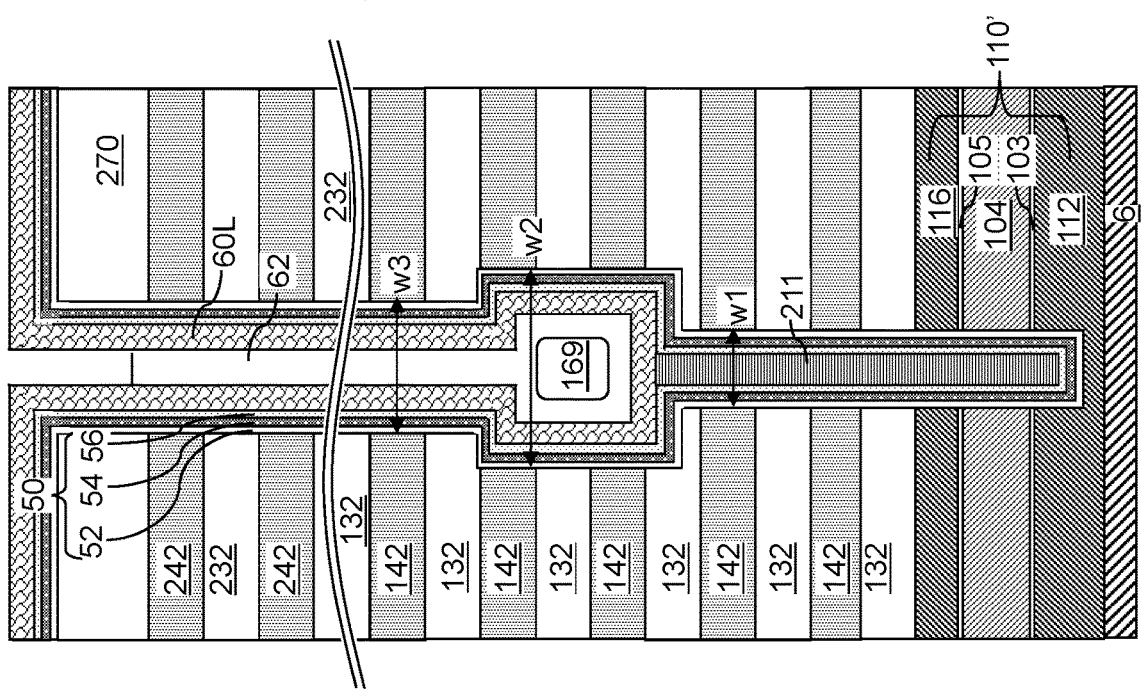

THREE-DIMENSIONAL MEMORY DEVICE INCLUDING A COMPOSITE SEMICONDUCTOR CHANNEL AND A HORIZONTAL SOURCE CONTACT LAYER AND METHOD OF MAKING THE SAME

FIELD

The present disclosure relates generally to the field of semiconductor devices, and particular to a three-dimensional memory device including a composite semiconductor channel and horizontal source contact layer, and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional semiconductor device is provided, which comprises: an alternating stack of insulating layers and electrically conductive layers located over a substrate; a source contact layer located between the substrate and the alternating stack; a memory opening vertically extending through the alternating stack and the source contact layer; and a memory opening fill structure located within the memory opening and comprising a composite semiconductor channel and a memory film laterally surrounding the composite semiconductor channel, wherein the composite semiconductor channel comprises: a pedestal channel portion having a cylindrical sidewall segment that contacts the source contact layer and including at least one of carbon or arsenic dopant atoms at a first average dopant concentration; and a vertical semiconductor channel contacting a top surface of the pedestal channel portion, wherein the vertical semiconductor channel includes the at least one of carbon or arsenic dopant atoms at a second average dopant concentration that is less than 20% of the first average dopant concentration or is free of the at least one of carbon or arsenic dopants atoms.

According to another embodiment of the present disclosure, a method of forming a three-dimensional semiconductor device is provided, which comprises the steps of: forming a source-level sacrificial layer over a substrate; forming an alternating stack of insulating layers and sacrificial material layers over the sacrificial source layer; forming a memory opening through the alternating stack and the source-level sacrificial layer; forming an in-process memory opening fill structure comprising a memory film and a sacrificial memory opening fill material portion in the memory opening; forming a source cavity by removing the source-level sacrificial layer and a cylindrical portion of the memory film located at a level of the source-level sacrificial layer; depositing a source contact layer in the source cavity on a cylindrical sidewall of the sacrificial memory opening fill material portion; forming a memory cavity by removing the sacrificial memory opening fill material portion; forming a pedestal channel portion by selectively growing a first semiconductor material from a surface of the source contact layer in a lower portion of the memory cavity; forming a vertical semiconductor channel by non-selectively depositing a second semiconductor material over the pedestal channel portion and on the memory film; and replacing the sacrificial material layers with electrically conductive layers.

According to yet another aspect of the present disclosure, a three-dimensional memory device is provided, which comprises: an alternating stack of insulating layers and electrically conductive layers located over a substrate; source-level material layers located between the substrate and the alternating stack, wherein the source-level material layers comprise, from bottom to top, a lower source-level semiconductor layer, a source contact layer, and an upper source-level semiconductor layer; a memory opening vertically extending through the alternating stack, the upper source-level semiconductor layer, the source contact layer, and an upper portion of the lower source-level semiconductor layer; and a memory opening fill structure located within the memory opening and comprising a semiconductor constriction ring, a composite semiconductor channel, and a memory film laterally surrounding the composite semiconductor channel, wherein: the semiconductor constriction ring is located on, and within, a cylindrical surface of the upper source-level semiconductor layer; the memory film contacts an inner sidewall of the semiconductor constriction ring and has a lesser lateral dimension inside the semiconductor constriction ring than above the semiconductor constriction ring; and the composite semiconductor channel comprises a pedestal channel portion in contact with the source contact layer, and a vertical semiconductor channel that overlies the pedestal channel portion.

According to still another aspect of the present disclosure, a method of forming a three-dimensional semiconductor device is provided, which comprises: forming in-process source-level material layers over a substrate, the in-process source-level material layers comprise, from bottom to top, a lower source-level semiconductor layer, a source-level sacrificial layer, and an upper source-level semiconductor layer; forming an alternating stack of insulating layers and sacrificial material layers over the sacrificial source layer; forming a memory opening through the alternating stack and into the in-process source-level material layers; growing a semiconductor constriction ring from a surface of the upper source-level sacrificial layer by performing a selective semiconductor deposition process inside the memory opening; forming a memory film at a peripheral portion of the memory opening over the semiconductor constriction ring; forming a composite semiconductor channel including a pedestal channel portion and a vertical semiconductor channel over the memory film; forming a source cavity by removing the source-level sacrificial layer and a cylindrical portion of the memory film located at a level of the source-level sacrificial layer; depositing a source contact layer in the source cavity on a cylindrical sidewall of the pedestal channel portion; and replacing the sacrificial material layers with electrically conductive layers.

According to even another aspect of the present disclosure, a three-dimensional memory device is provided, which comprises: an alternating stack of insulating layers and electrically conductive layers located over a substrate, wherein the electrically conductive layers comprise source-select-level electrically conductive layers and word-line-level electrically conductive layers overlying the source-select-level electrically conductive layers; a source contact layer located between the substrate and the alternating stack; a memory opening vertically extending through the alternating stack and the source contact layer with a width-modulated vertical cross-sectional profile that has a first width at and below levels of the source-select-level electrically conductive layers, and has a second width that is greater than the first width at levels of a first subset of the word-line-level electrically conductive layers; and a memory opening fill structure located within the memory opening and comprising a composite semiconductor channel and a memory film laterally surrounding the composite semiconductor channel, wherein the composite semiconductor channel comprises: a pedestal channel portion located within a portion of the memory opening having the first width and having a cylindrical sidewall segment that contacts the source contact layer; and a vertical semiconductor channel contacting a top surface of the pedestal channel portion and extending through the word-line-level electrically conductive layers.

According to further another aspect of the present disclosure, a method of forming a three-dimensional memory device is provided, which comprises: forming a source-level sacrificial layer over a substrate; forming an alternating stack of insulating layers and sacrificial layers containing a memory opening therethrough over the source-level sacrificial layer, wherein the memory opening has a width-modulated vertical cross-sectional profile that has a first width at a lower region extending through the source-level sacrificial layer and a first subset of the sacrificial material layers, and has a second width that is greater than the first width at a middle region located at levels of a second subset of the sacrificial material layers that overlie the first subset of the sacrificial material layers; forming a memory film at a peripheral portion of the memory opening; forming a pedestal channel portion in the lower region of the memory opening by conformally depositing a first semiconductor material over the memory film and plugging the lower region of the memory opening with the first semiconductor material, and by isotropically etching the first semiconductor material from the middle region of the memory opening; forming a vertical semiconductor channel in the middle region of the memory opening over the pedestal channel portion and the memory film by conformally depositing a second semiconductor material; forming a source cavity by removing the source-level sacrificial layer and a cylindrical portion of the memory film located at a level of the source-level sacrificial layer; depositing a source contact layer in the source cavity on a cylindrical sidewall of the pedestal channel portion; and replacing the sacrificial material layers with electrically conductive layers.

BRIEF DESCRIPTION OF THE DRAWINGS

FIG. 4B is a horizontal cross-sectional view of the first exemplary structure of FIG. 4A. The hinged vertical plane A-A' corresponds to the plane of the vertical cross-sectional view of FIG. 4A.

FIGS. 9A-9D illustrate sequential vertical cross-sectional views of a memory opening during formation of an in-process memory opening fill structure according to the first embodiment of the present disclosure.

FIG. 18B is a horizontal cross-sectional view of the first exemplary structure along the horizontal plane B-B' of FIG. 18A. The hinged vertical plane A-A' corresponds to the plane of the vertical cross-sectional view of FIG. 18A.

FIGS. 24A-24I illustrate sequential vertical cross-sectional views of a memory opening in a second exemplary structure during formation of a memory opening fill structure according to a second embodiment of the present disclosure.

FIGS. 31A-31I illustrate sequential vertical cross-sectional views of a portion of a third exemplary structure during formation of a sacrificial first-tier memory opening fill portion according to a third embodiment of the present disclosure.

FIG. 34B is a horizontal cross-sectional view of the first exemplary structure along the horizontal plane B-B' of FIG. 34A. The hinged vertical plane A-A' corresponds to the plane of the vertical cross-sectional view of FIG. 34A.

FIGS. 35A-35H illustrate sequential vertical cross-sectional views of a memory opening in the third exemplary structure during formation of a memory opening fill structure according to the third embodiment of the present disclosure.

DETAILED DESCRIPTION

Figure 1A:
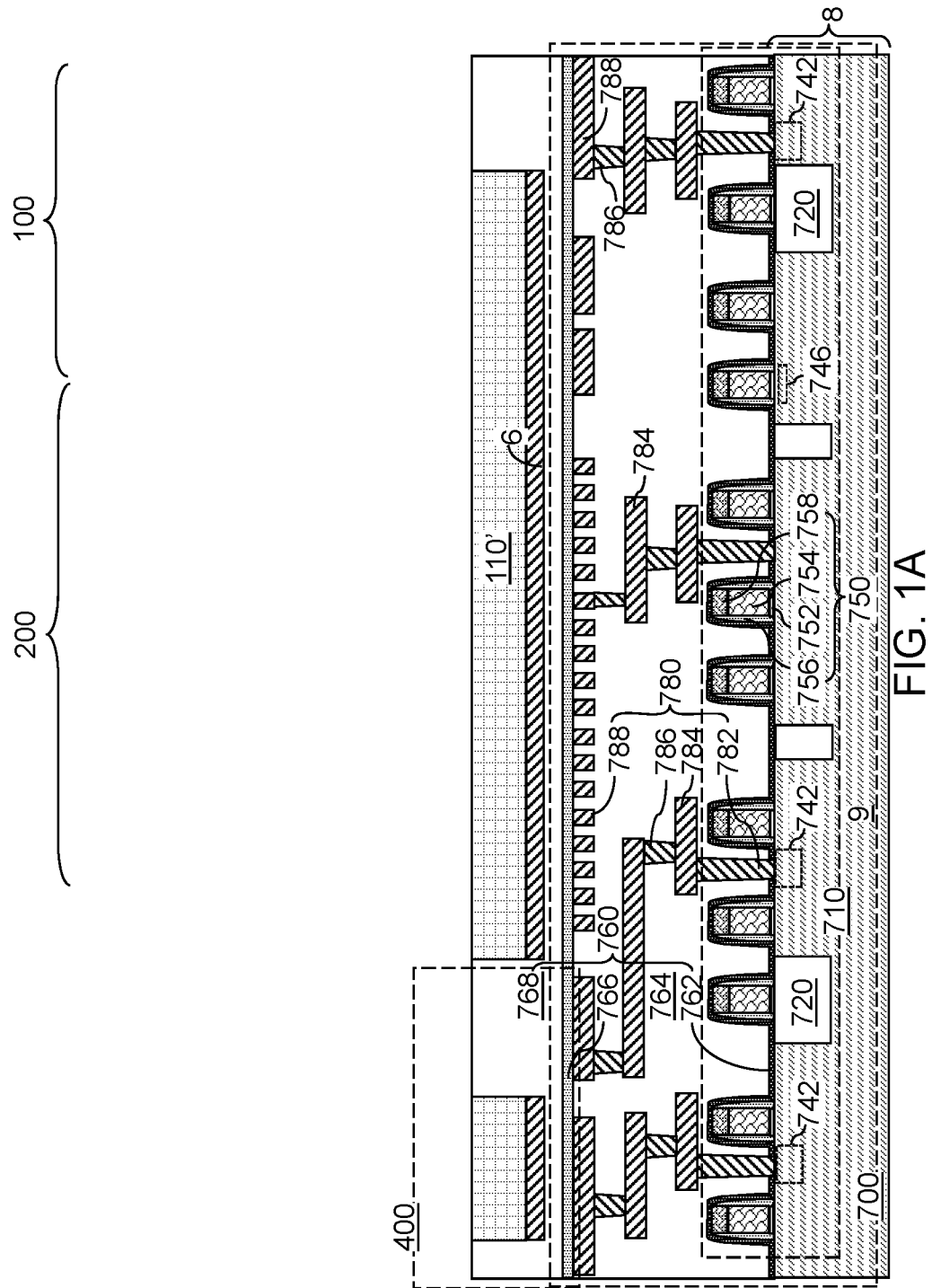
FIG. 1A is a vertical cross-sectional view of a first exemplary structure after formation of semiconductor devices, lower level dielectric layers, lower metal interconnect structures, and in-process source-level material layers on a semiconductor substrate according to a first embodiment of the present disclosure.

Some three-dimensional memory devices employ horizontal source contact layer (i.e., a direct strap contact structure) in which a horizontal source contact layer underlies an alternating stack of insulating layers and electrically conductive layers. In this configuration, diffusion of n-type dopants from the source contact layer into vertical semiconductor channels of NAND strings needs to be controlled such that the n-type dopants diffuse upward in the vertical semiconductor channels to a sufficiently uniform height (e.g., roughly at the height of a horizontal plane located between source side select gate electrodes (also referred to as source-select-level electrically conductive layers herein) and word lines (also referred to as word-line-level electrically conductive layers herein). Control of the diffusion profile of the n-type dopants is challenging in implementing the direct strap contact structure because of the large grain size of the polysilicon material of the vertical semiconductor channel which enhances n-type dopant diffusion rate and different grain boundary orientations in different vertical semiconductor channels, some of which enhance and some of which reduce the diffusion of the n-type dopants. This results in uneven height distribution of the n-type doped regions in different channels and/or in a diffuse p-n junction at the top of the diffused n-type doped region.

Embodiments of the present disclosure are directed to a three-dimensional memory device including a composite semiconductor channel having upper and lower portions with different dopant concentrations and/or different grain sizes to control the n-type dopant diffusion from a horizontal source contact layer (e.g., direct strap) contact and methods of manufacturing the same, the various aspects of which are described herein in detail. Furthermore, a more abrupt junction may be formed, which results in improved source side select transistor performance, such as an improved on/off ratio and/or improved gate induced drain leakage (GIDL) erase operation. The embodiments of the present disclosure may be used to form various semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the embodiments of the present disclosure may include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1B:
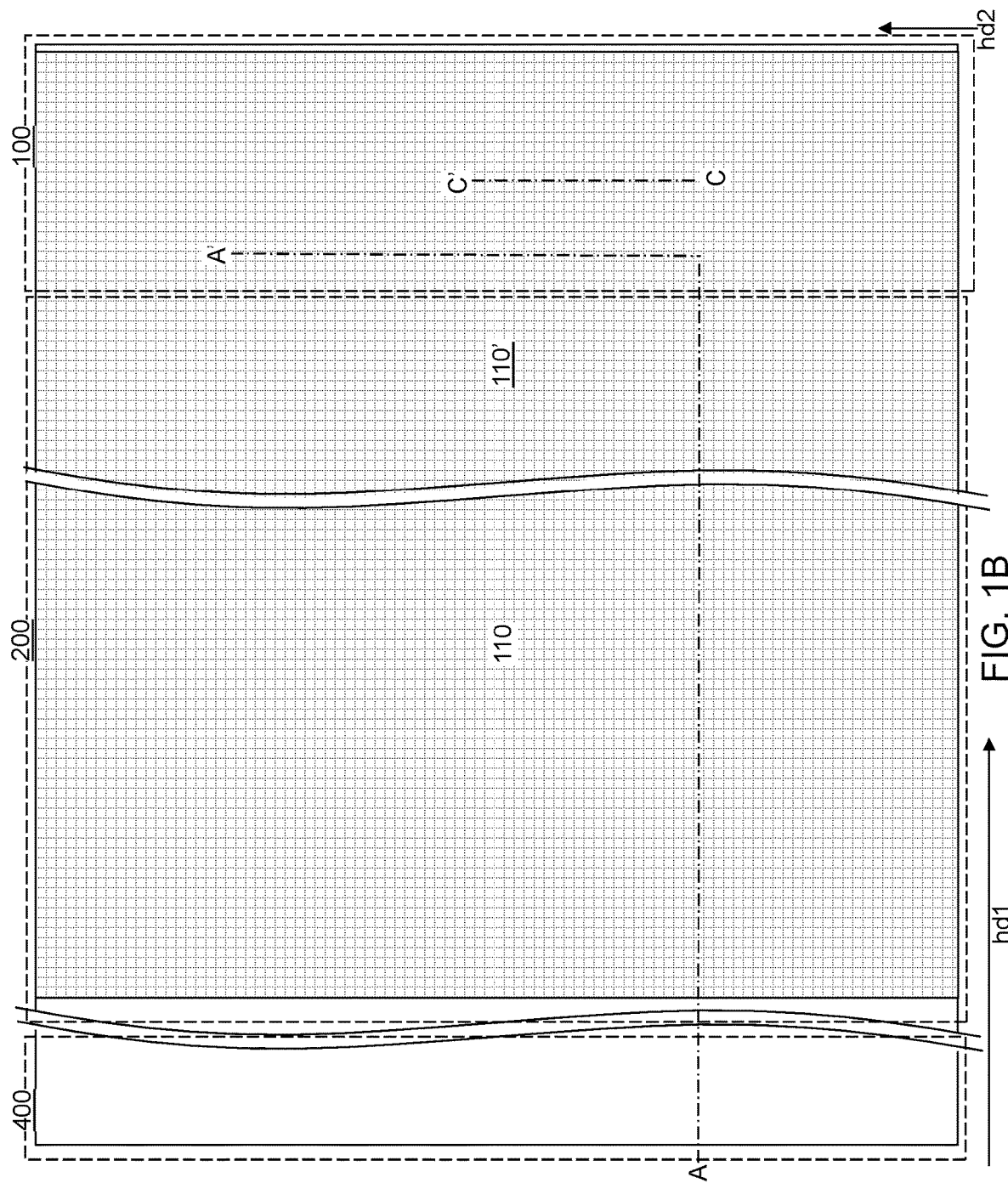
FIG. 1B is a top-down view of the first exemplary structure of FIG. 1A. The hinged vertical plane A-A' is the plane of the vertical cross-sectional view of FIG. 1A.
Figure 1C:
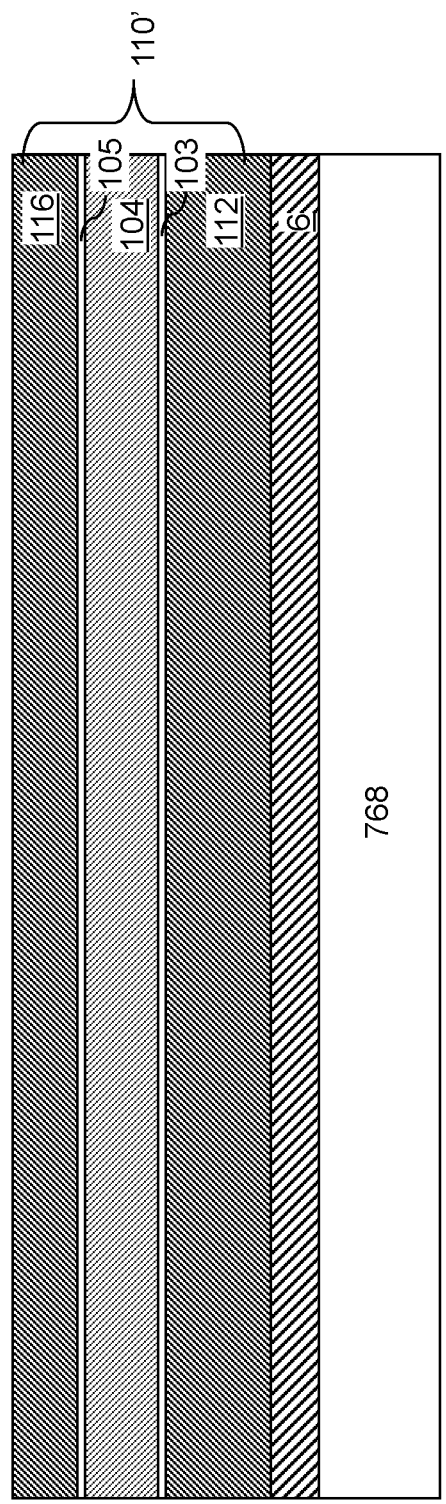
FIG. 1C is a magnified view of the in-process source-level material layers along the vertical plane C-C' of FIG. 1B.

Referring to FIGS. 1A-1C, a first exemplary structure according to an embodiment of the present disclosure is illustrated. FIG. 1C is a magnified view of an in-process source-level material layers 110' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. In one embodiment, the first conductivity type can be p-type, and the second conductivity type can be n-type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. Alternatively, the source-level sacrificial layer 104 may include borosilicate glass or amorphous carbon. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
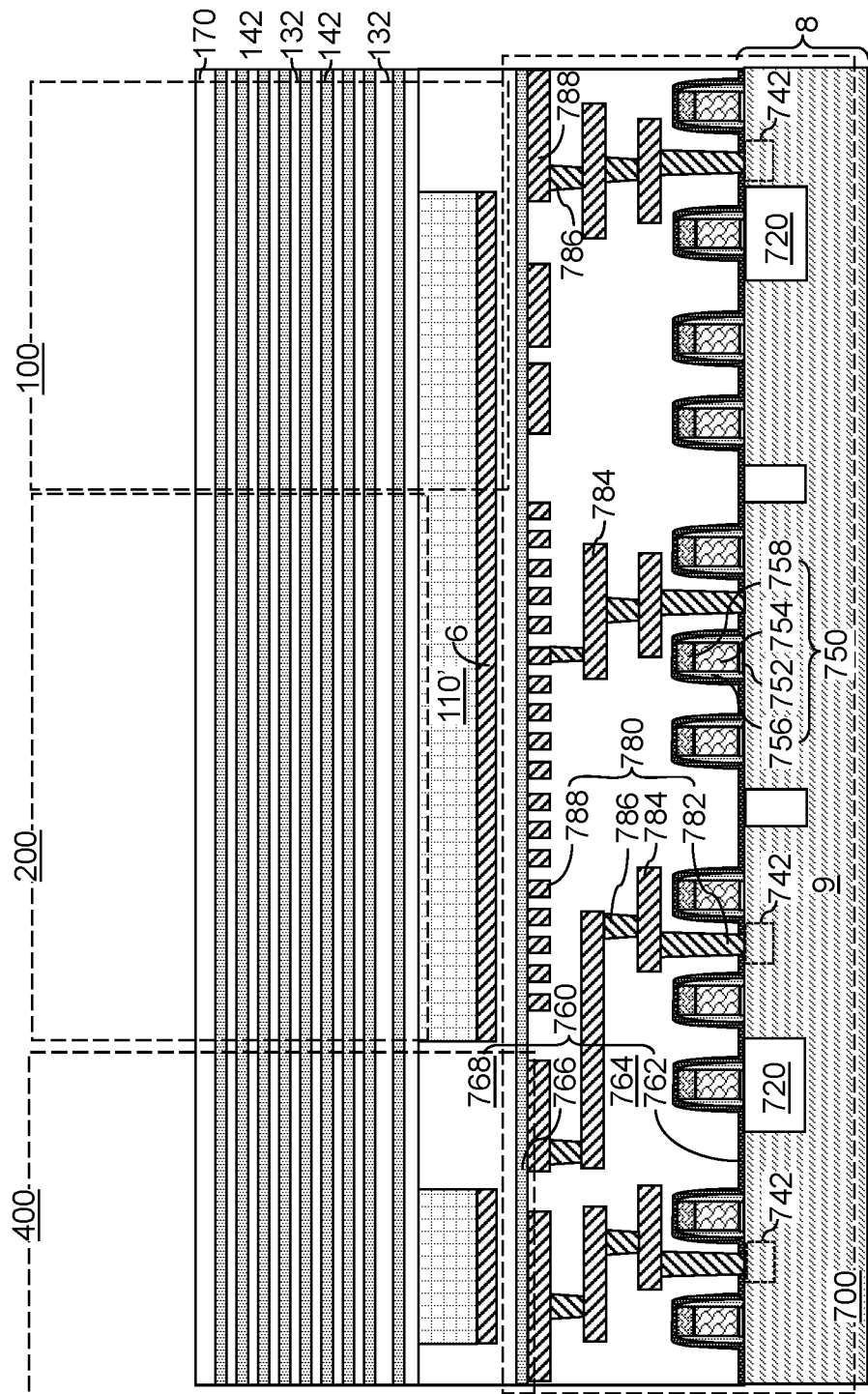
FIG. 2 is a vertical cross-sectional view of the first exemplary structure after formation of a first-tier alternating stack of first insulting layers and first spacer material layers according to the first embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
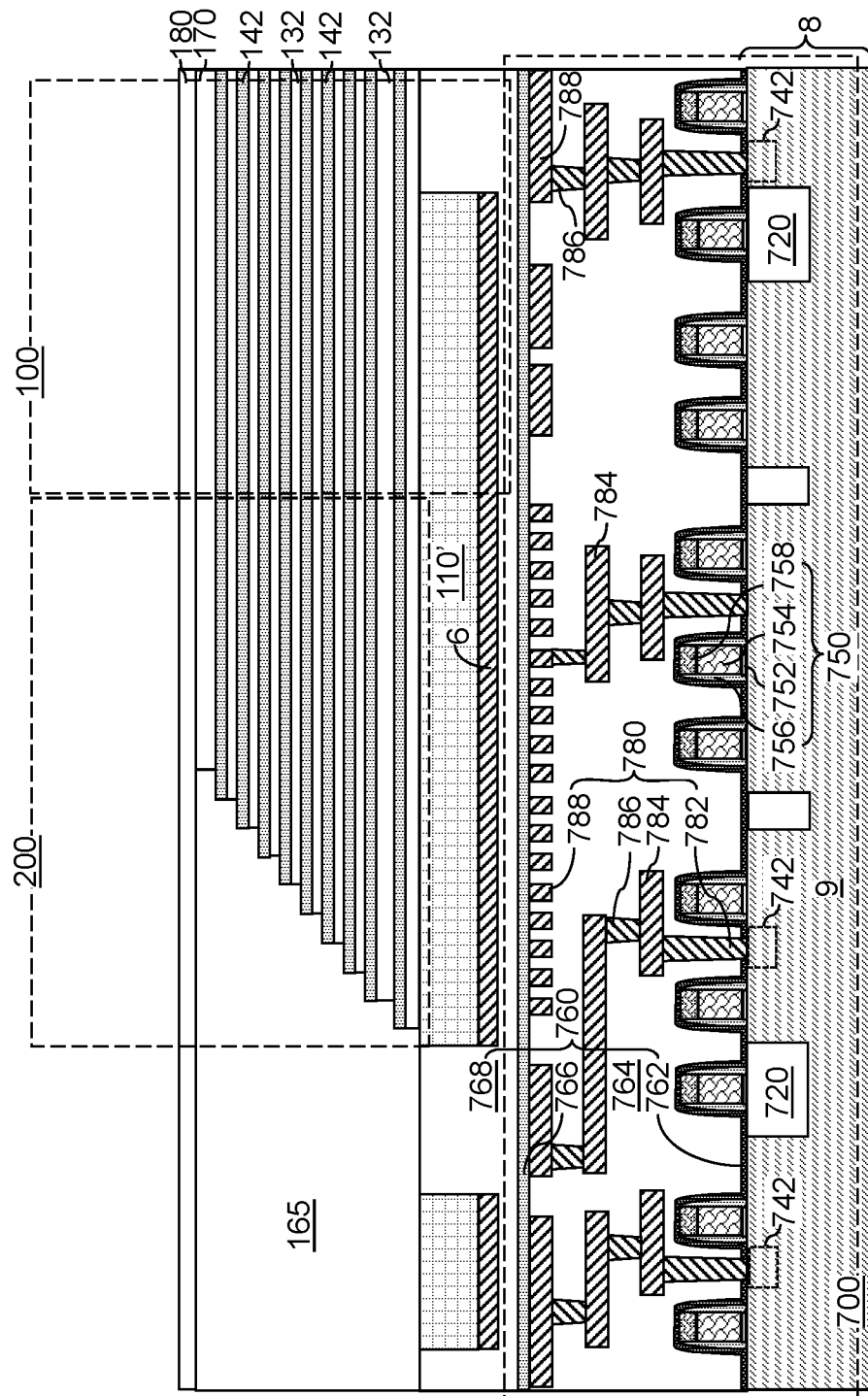
FIG. 3 is a vertical cross-sectional view of the first exemplary structure after patterning a first-tier staircase region, a first retro-stepped dielectric material portion, and an inter-tier insulating layer according to the first embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier insulating layer 180 may be optionally deposited over the first-tier structure (132, 142, 170, 165). The inter-tier insulating layer 180 includes a dielectric material such as silicon oxide. In one embodiment, the inter-tier insulating layer 180 may include a doped silicate glass having a greater etch rate than the material of the first insulating layers 132 (which may include an undoped silicate glass). For example, the inter-tier insulating layer 180 may include phosphosilicate glass. The thickness of the inter-tier insulating layer 180 may be in a range from 30 nm to 300 nm, although lesser and greater thicknesses may also be used.

Figure 4A:
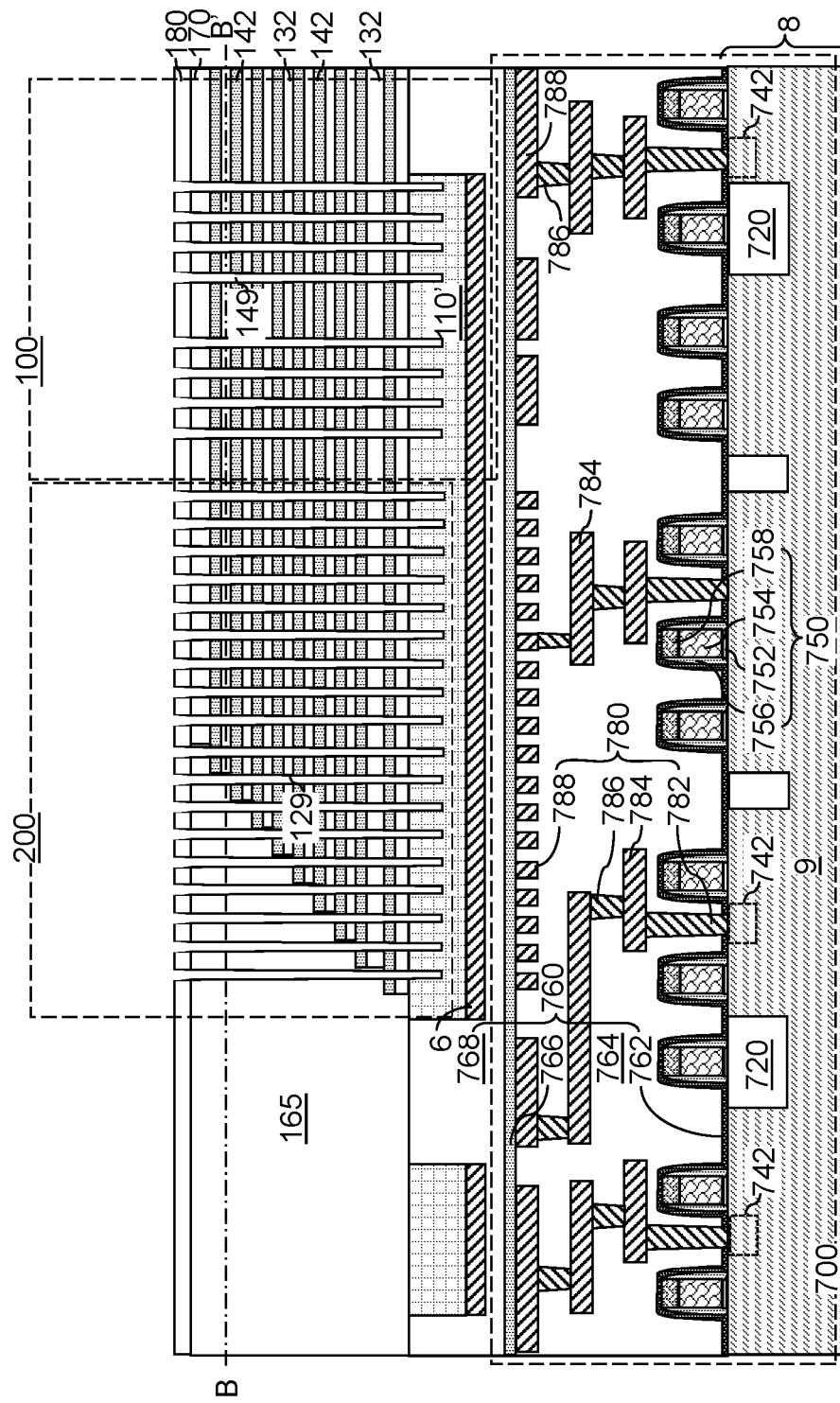
FIG. 4A is a vertical cross-sectional view of the first exemplary structure after formation of first-tier memory openings and first-tier support openings according to the first embodiment of the present disclosure.

Referring to FIGS. 4A and 4B, various first-tier openings (149, 129) may be formed through the inter-tier insulating layer 180 and the first-tier structure (132, 142, 170, 165) and into the in-process source-level material layers 110'. A photoresist layer (not shown) may be applied over the inter-tier insulating layer 180, and may be lithographically patterned to form various openings therethrough. The pattern of openings in the photoresist layer may be transferred through the inter-tier insulating layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier insulating layer 180 may be laterally expanded by an isotropic etch. In this case, the inter-tier insulating layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier insulating layer 180. The portions of the first-tier memory openings 149 located at the level of the inter-tier insulating layer 180 may be optionally widened to provide a larger landing pad for second-tier memory openings to be subsequently formed through a second-tier alternating stack (to be subsequently formed prior to formation of the second-tier memory openings).

Figure 5:
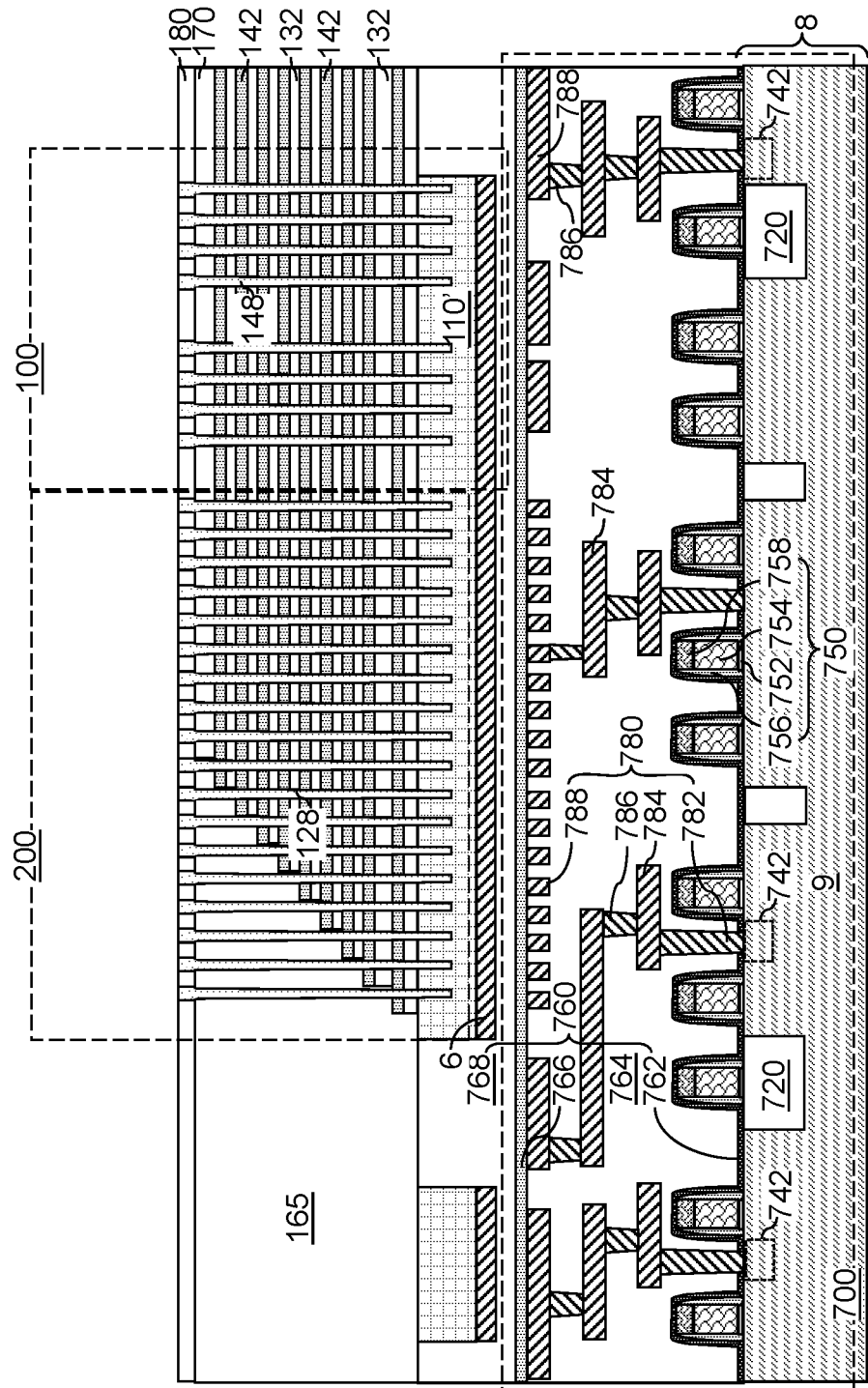
FIG. 5 is a vertical cross-sectional view of the first exemplary structure after formation of various sacrificial fill structures according to the first embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier insulating layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier insulating layer 180. For example, the sacrificial first-tier fill material may be recessed to a top surface of the inter-tier insulating layer 180 using a planarization process. The planarization process may include a recess etch, chemical mechanical planarization (CMP), or a combination thereof. The top surface of the inter-tier insulating layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier insulating layer 180). The top surfaces of the sacrificial first-tier opening fill portions (148, 128) may be coplanar with the top surface of the inter-tier insulating layer 180. Each of the sacrificial first-tier opening fill portions (148, 128) may, or may not, include cavities therein.

Figure 6:
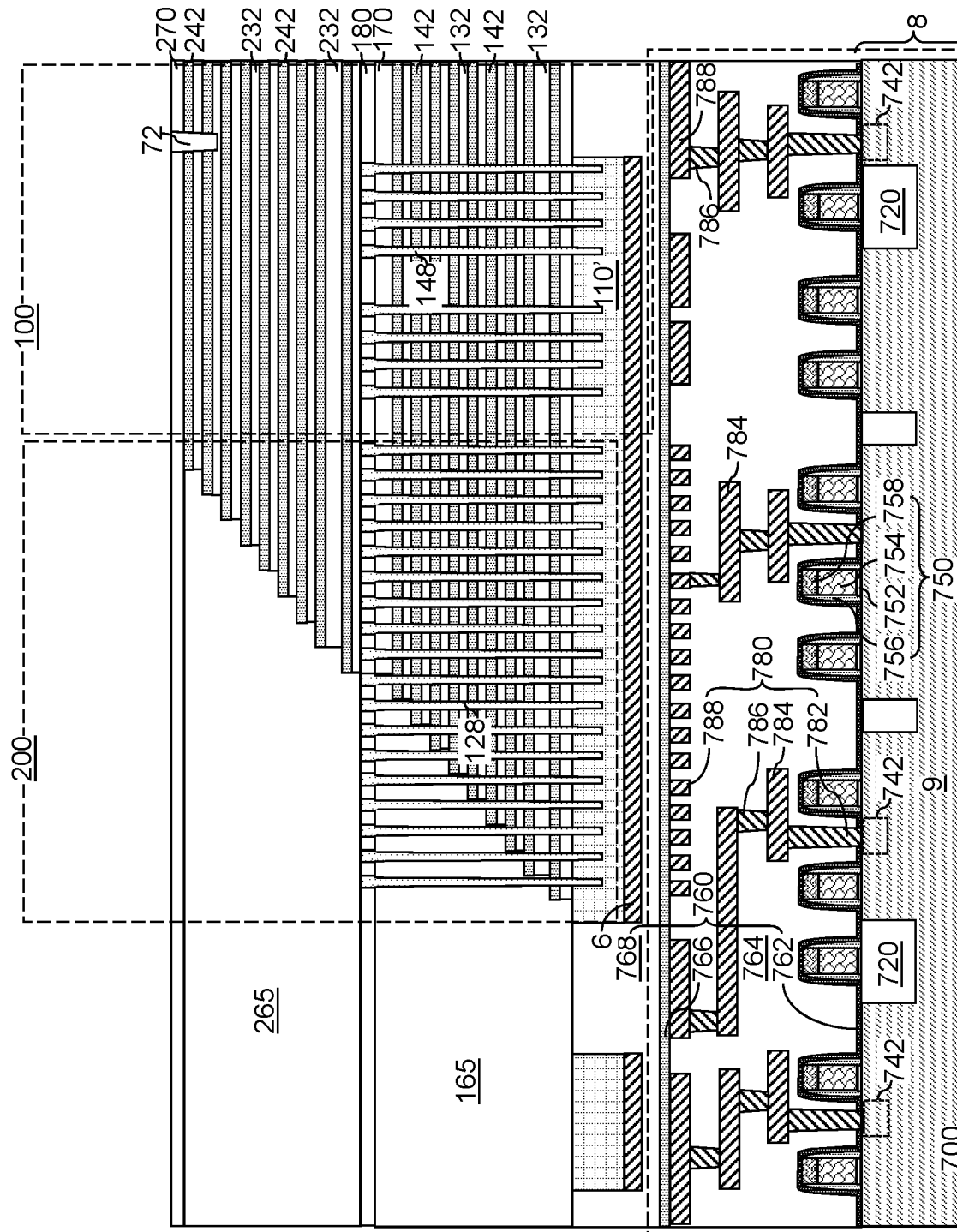
FIG. 6 is a vertical cross-sectional view of the first exemplary structure after formation of a second-tier alternating stack of second insulating layers and second spacer material layers, second stepped surfaces, and a second retro-stepped dielectric material portion according to the first embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
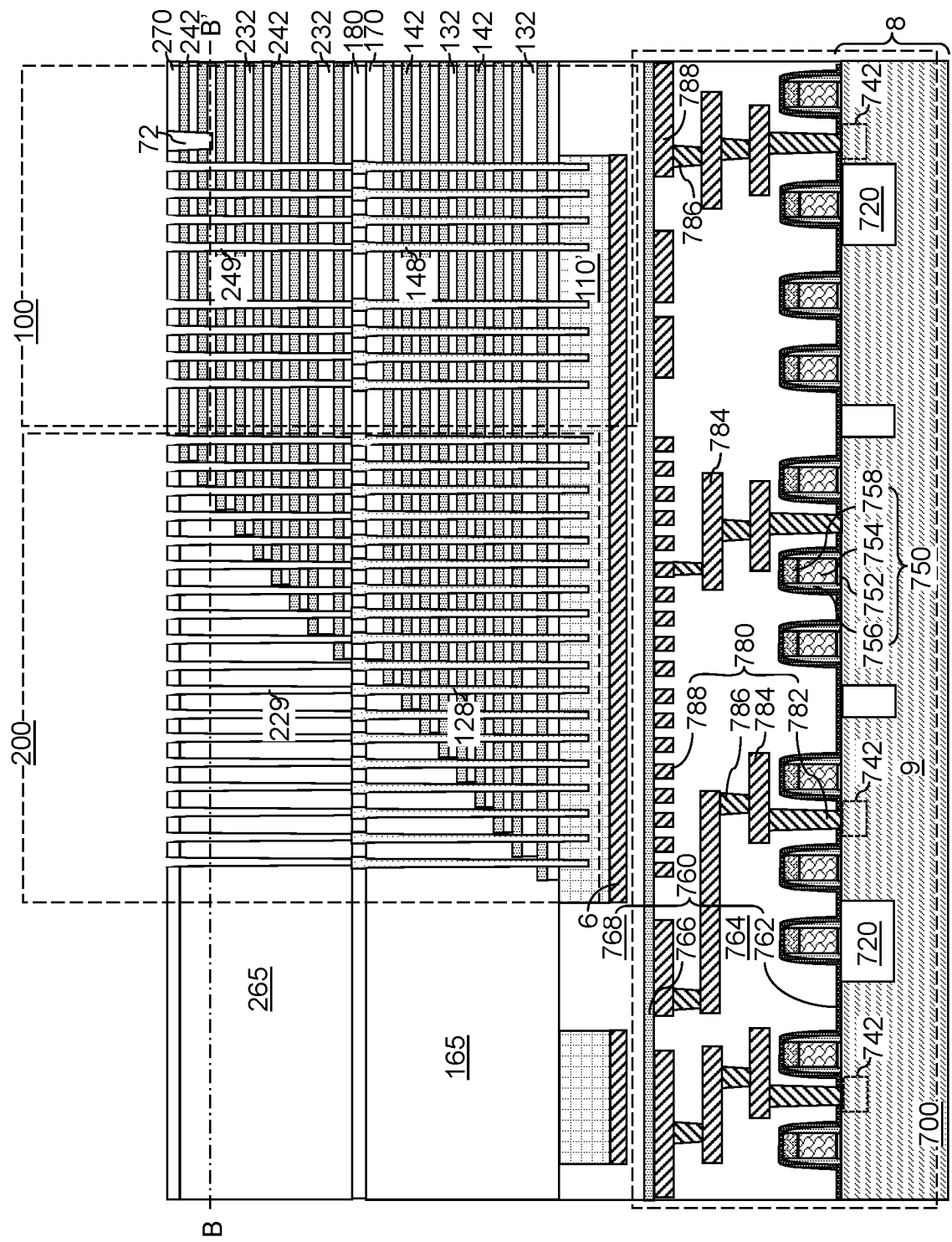
FIG. 7A is a vertical cross-sectional view of the first exemplary structure after formation of second-tier memory openings and second-tier support openings according to the first embodiment of the present disclosure.
Figure 7B:
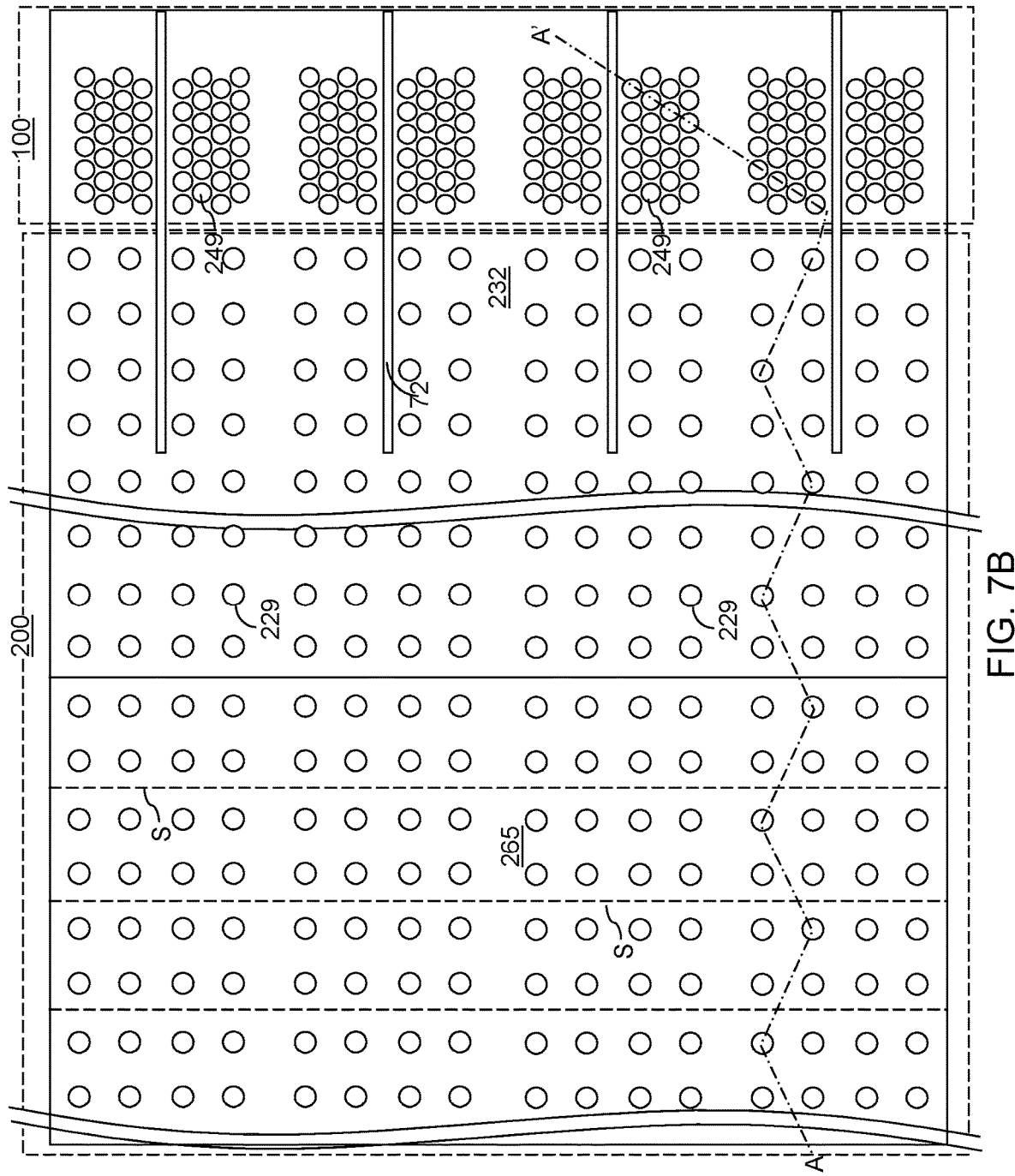
FIG. 7B is a horizontal cross-sectional view of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
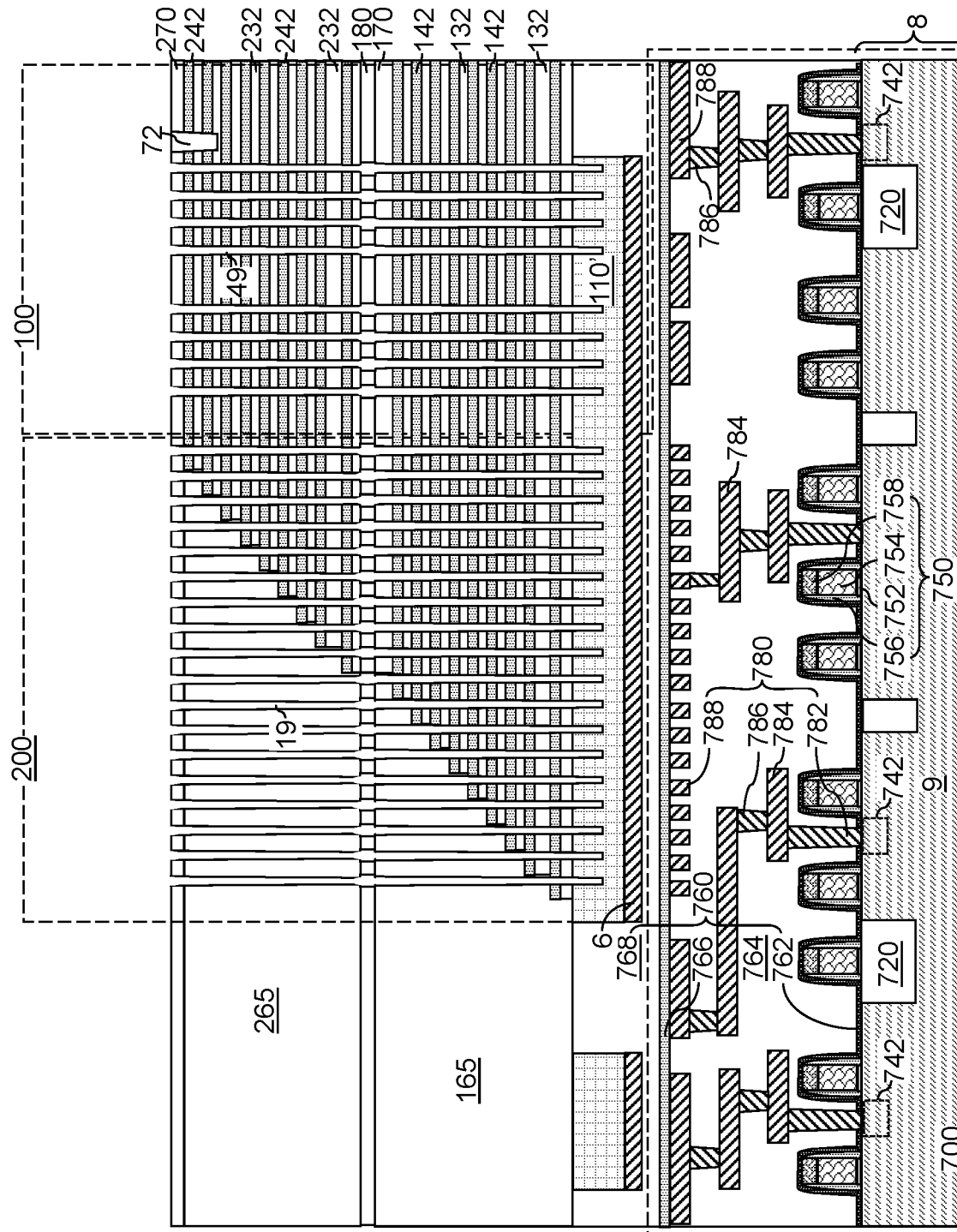
FIG. 8 is a vertical cross-sectional view of the first exemplary structure after formation of inter-tier memory openings and inter-tier support openings according to the first embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier insulating layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D illustrate sequential vertical cross-sectional views of a memory opening during formation of an in-process memory opening fill structure according to the first embodiment of the present disclosure. The same structural change occurs in each of the memory openings 49 and the support openings 19.

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, and a tunneling dielectric layer 56 may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

Referring to FIG. 9C, a sacrificial fill material can be deposited in the cavities 49' to form a sacrificial memory opening fill material layer 59L. The sacrificial fill material of the sacrificial memory opening fill material layer 59L includes a material that can be removed selective to the material of the outermost layer of the memory film 50 (i.e., the tunneling dielectric layer 56). For example, the sacrificial fill material of the sacrificial memory opening fill material layer 59L may include silicon nitride, polysilicon, amorphous silicon, a silicon-germanium alloy, organosilicate glass, amorphous carbon, diamond-like carbon (DSC), a silicon-based polymer material or a combination thereof. For example, the sacrificial memory opening fill material layer 59L may include an outer sacrificial polysilicon sublayer and an inner silicon nitride core.

Referring to FIG. 9D, portions of the sacrificial memory opening fill material layer 59L and the memory film 50 that are located above the horizontal plane including the top surface of the second insulating cap layer 270 can be removed by a planarization process. The planarization process may employ a recess etch process and/or a chemical mechanical planarization process. The memory film 50 is divided into a plurality memory films 50 located within a respective one of the memory openings 49. Each remaining portion of the sacrificial memory opening fill material layer 59L located within a respective one of the memory openings 49 comprises a sacrificial memory opening fill material portion 59. Each contiguous combination of a memory film 50 and a sacrificial memory opening fill material portion 59 constitutes an in-process memory opening fill structure 58', which is modified to provide a memory opening fill structure including a respective memory stack structure in subsequent processing steps.

Figure 10:
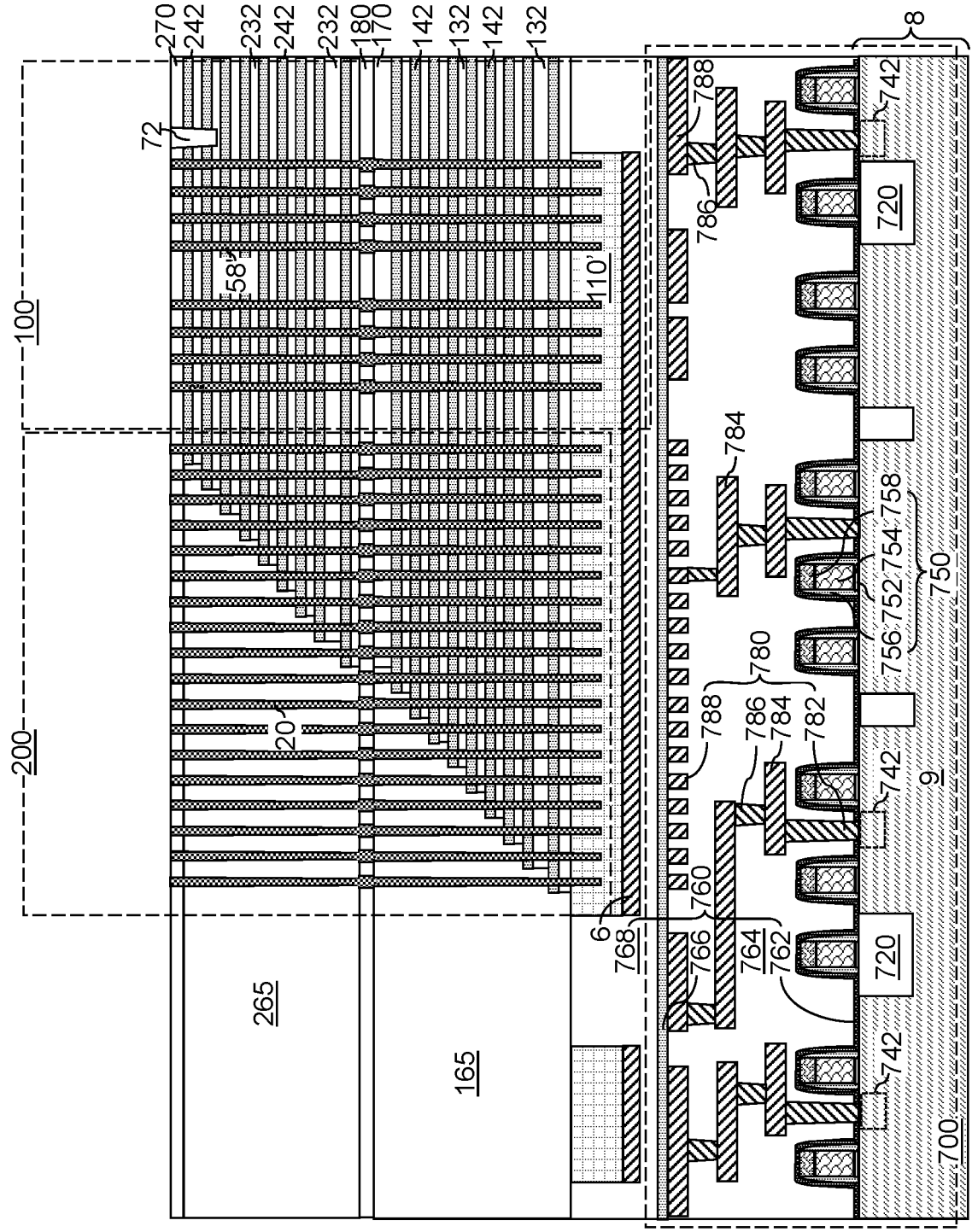
FIG. 10 is a vertical cross-sectional view of the first exemplary structure after formation of memory opening fill structures and support pillar structures according to the first embodiment of the present disclosure.

Referring to FIG. 10, the first exemplary structure is illustrated after formation of the in-process memory opening fill structures 58'. Support pillar structures 20 are formed in the support openings 19 concurrently with formation of the in-process memory opening fill structures 58'. Each support pillar structure 20 may have a same set of components as the in-process memory opening fill structure 58'.

Figure 11A:
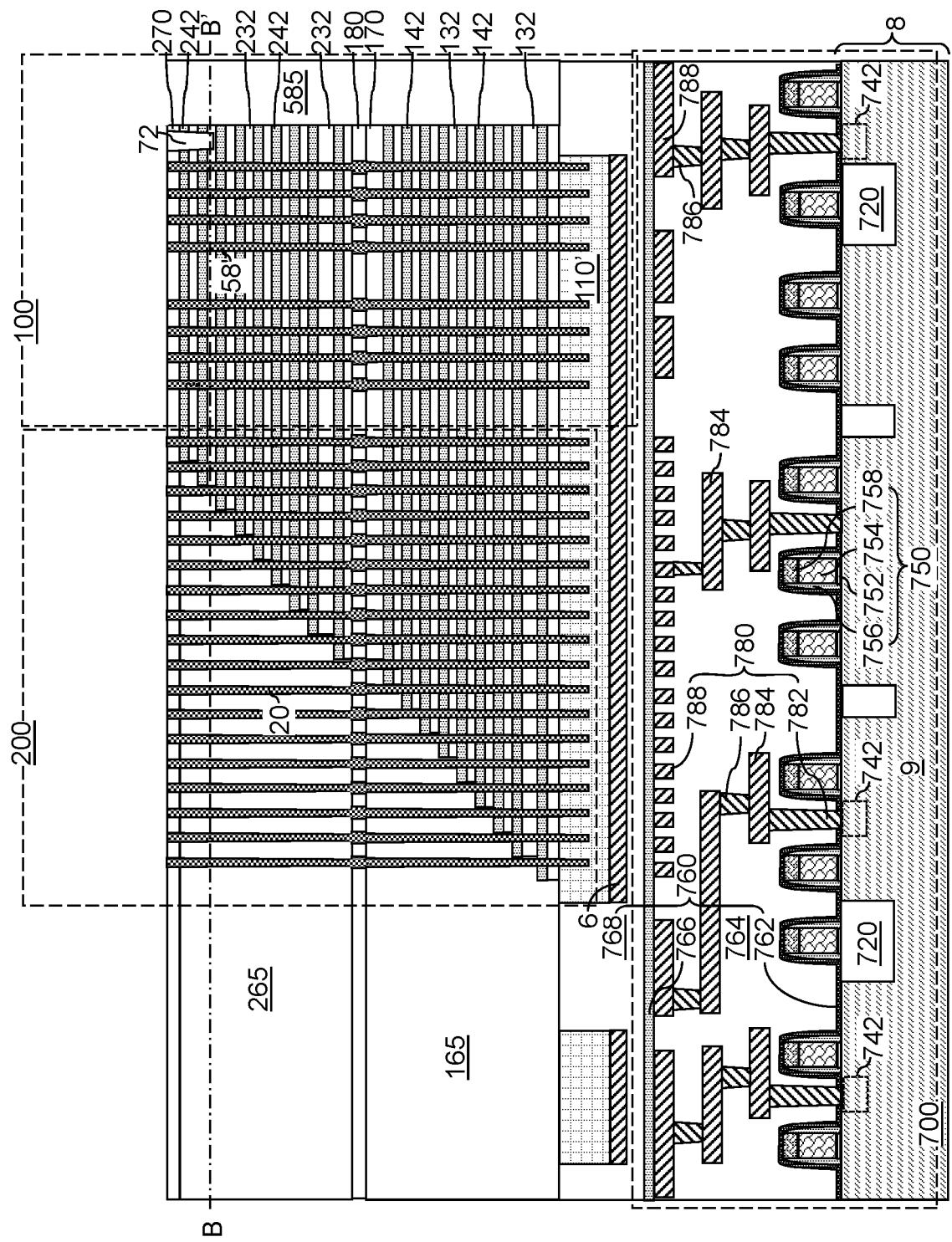
FIG. 11A is a vertical cross-sectional view of the first exemplary structure after formation of pillar cavities according to the first embodiment of the present disclosure.
Figure 11B:
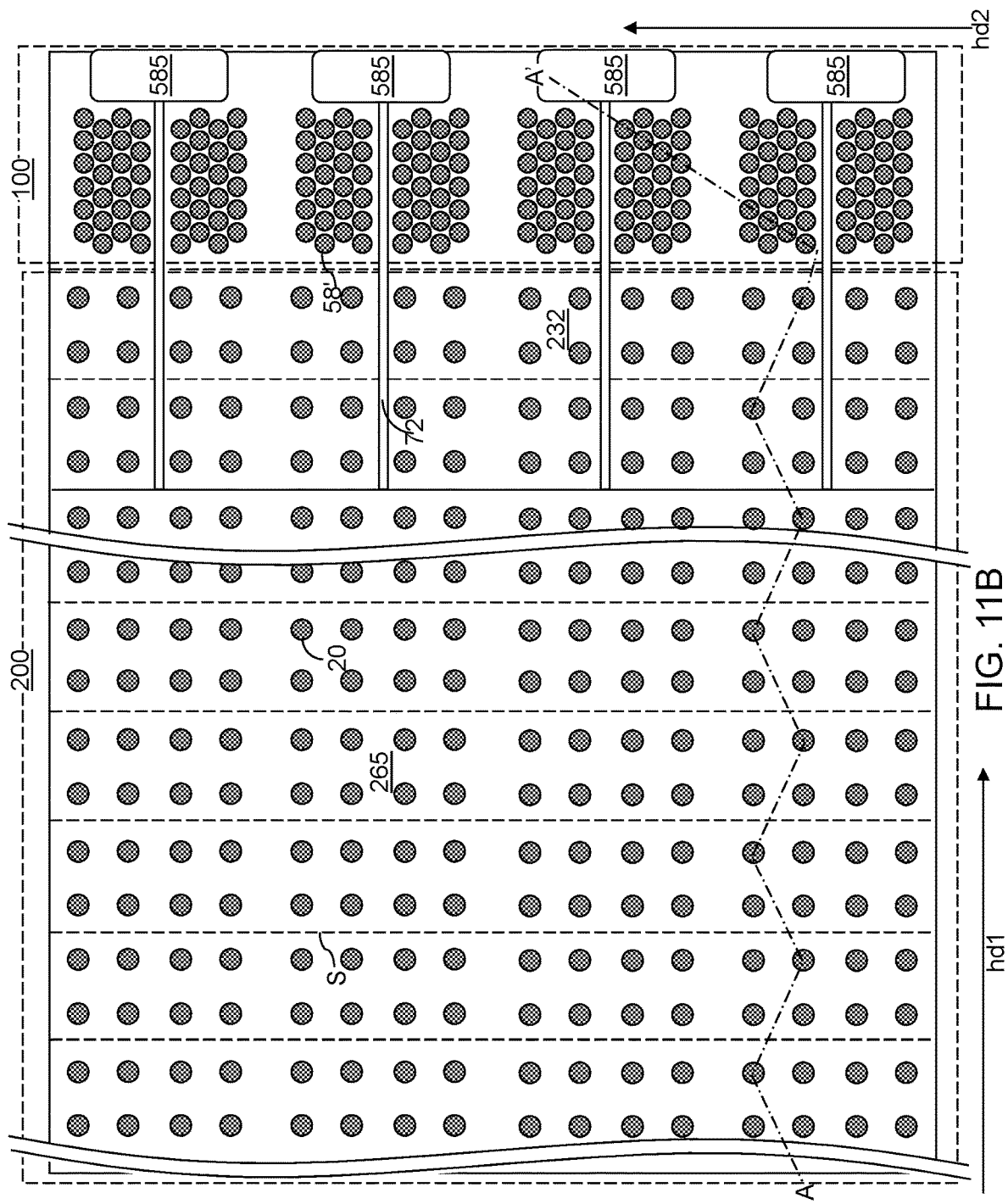
FIG. 11B is a horizontal cross-sectional view of the first exemplary structure along the horizontal plane B-B' of FIG. 11A. The hinged vertical plane A-A' corresponds to the plane of the vertical cross-sectional view of FIG. 11A.

Referring to FIGS. 11A and 11B, a photoresist layer (not shown) may be applied over the second-tier structure (232, 242, 270, 265, 72), and may be lithographically patterned to form discrete openings within the area of the memory array region 100 in which the in-process memory opening fill structures 58' are not present. An anisotropic etch may be performed to form vertical interconnection region cavities 585 having substantially vertical sidewalls that extend through the second-tier structure (232, 242, 270, 265, 72) and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 12:
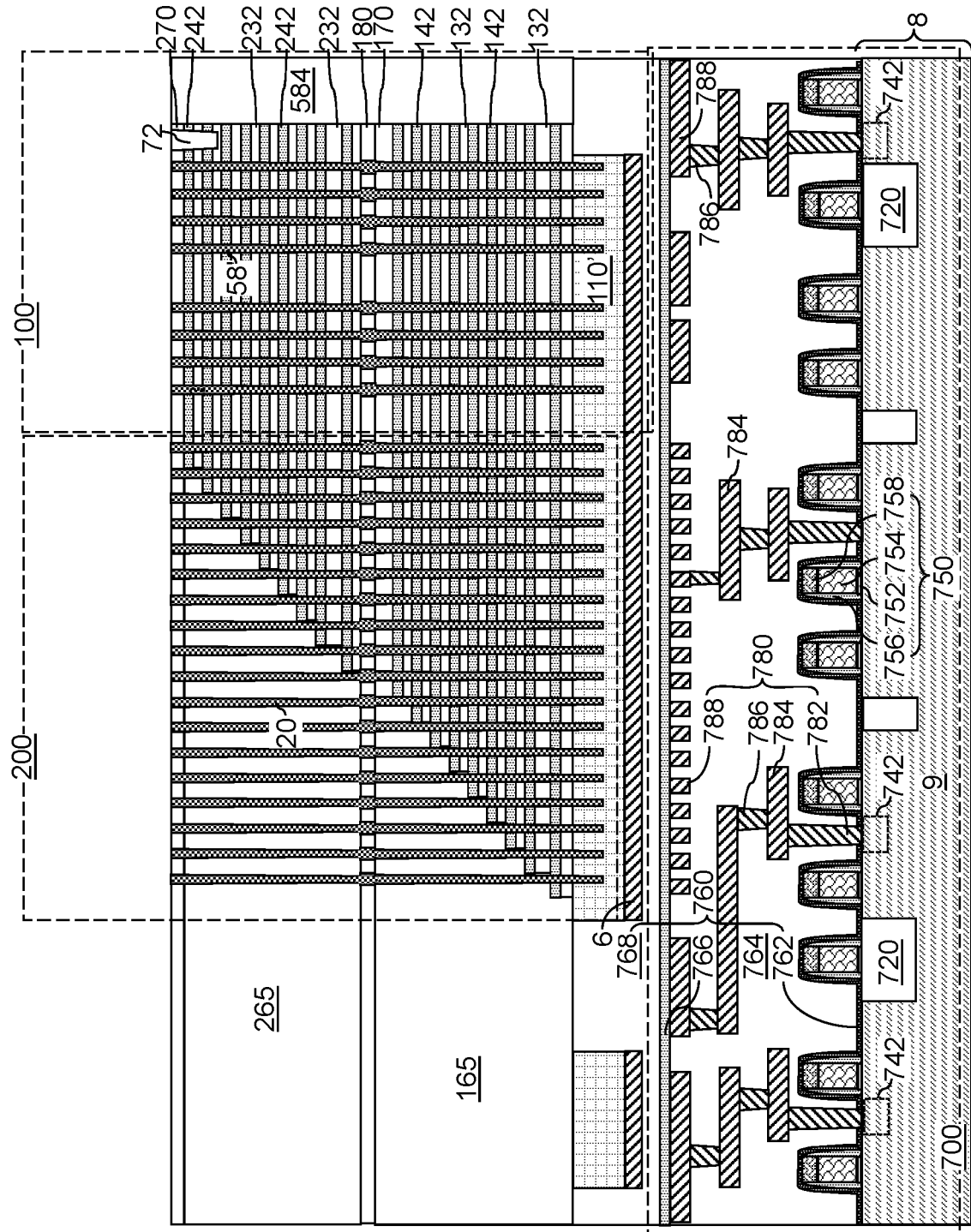
FIG. 12 is a vertical cross-sectional view of the first exemplary structure after formation of dielectric pillar structures according to the first embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the second-tier structure (232, 242, 270, 265, 72) by a planarization process. Remaining portions of the dielectric material in the vertical interconnection region cavities 585 constitute interconnection region dielectric fill material portions 584.

Figure 13A:
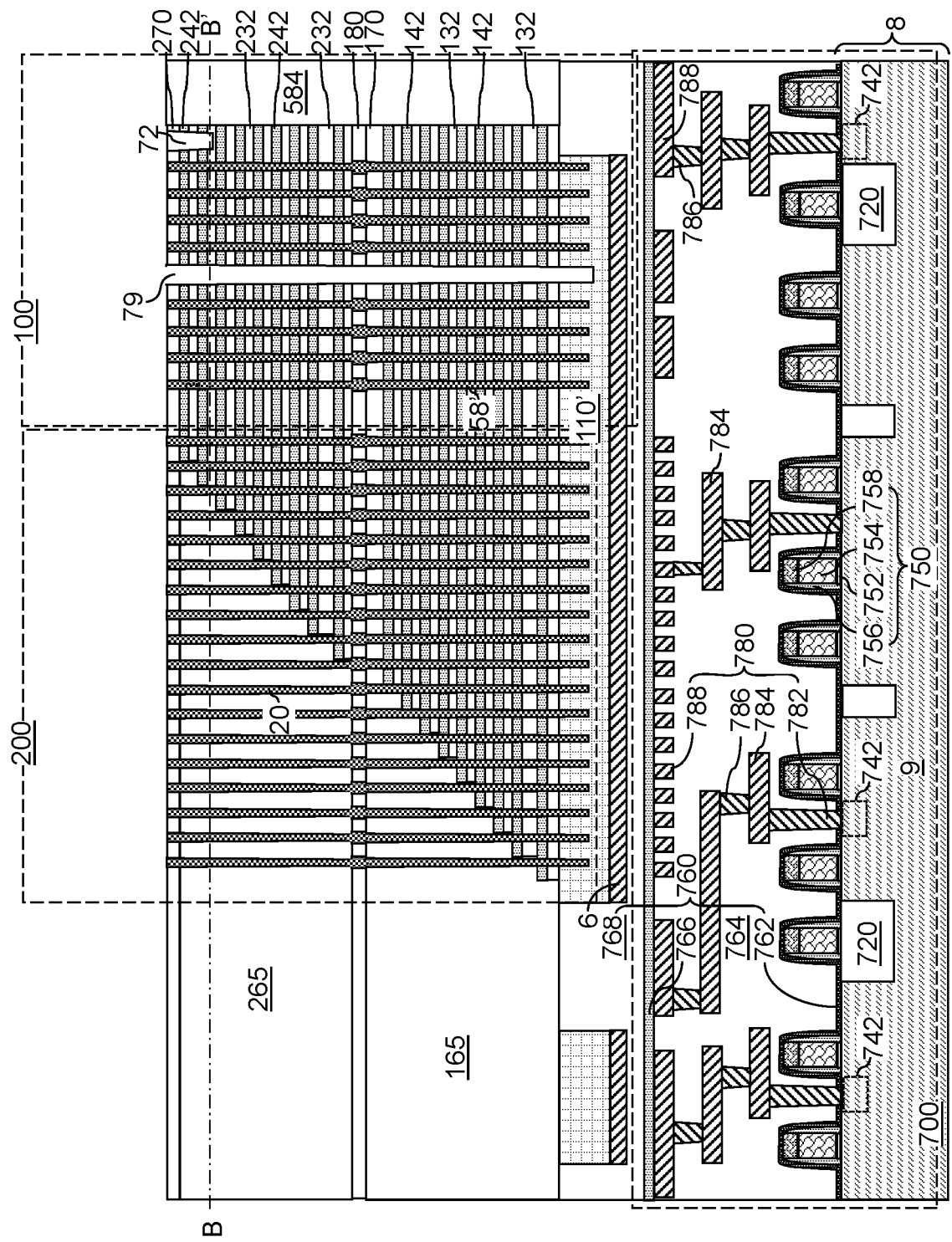
FIG. 13A is a vertical cross-sectional view of the first exemplary structure after formation of backside trenches according to the first embodiment of the present disclosure.
Figure 13B:
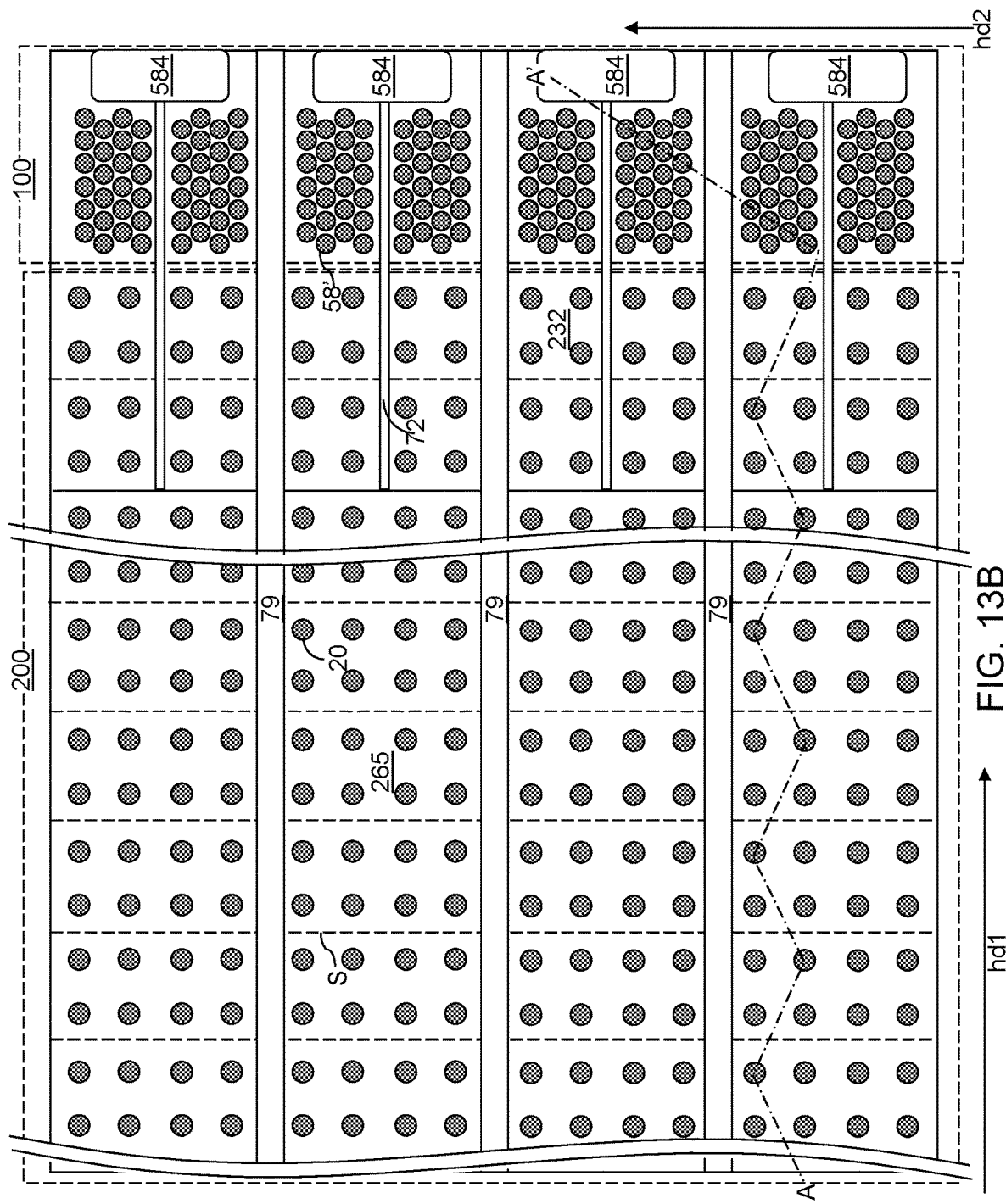
FIG. 13B is a horizontal cross-sectional view of the first exemplary structure along the horizontal plane B-B' of FIG. 13A. The hinged vertical plane A-A' corresponds to the plane of the vertical cross-sectional view of FIG. 13A.

Referring to FIGS. 13A and 13B, a photoresist layer may be applied over the second-tier structure (232, 242, 270, 265, 72) and may be lithographically patterned to form elongated openings that extend along the first horizontal direction hd1 between clusters of the in-process memory opening fill structures 58'. Backside trenches 79 may be formed by transferring the pattern in the photoresist layer (not shown) through the second-tier structure (232, 242, 270, 265, 72) and the first-tier structure (132, 142, 170, 165), and into the in-process source-level material layers 110'. Portions of the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of in-process memory opening fill structures 58'. The clusters of in-process memory opening fill structures 58' may be laterally spaced apart along the second horizontal direction hd2 by the backside trenches 79.

Figure 14:
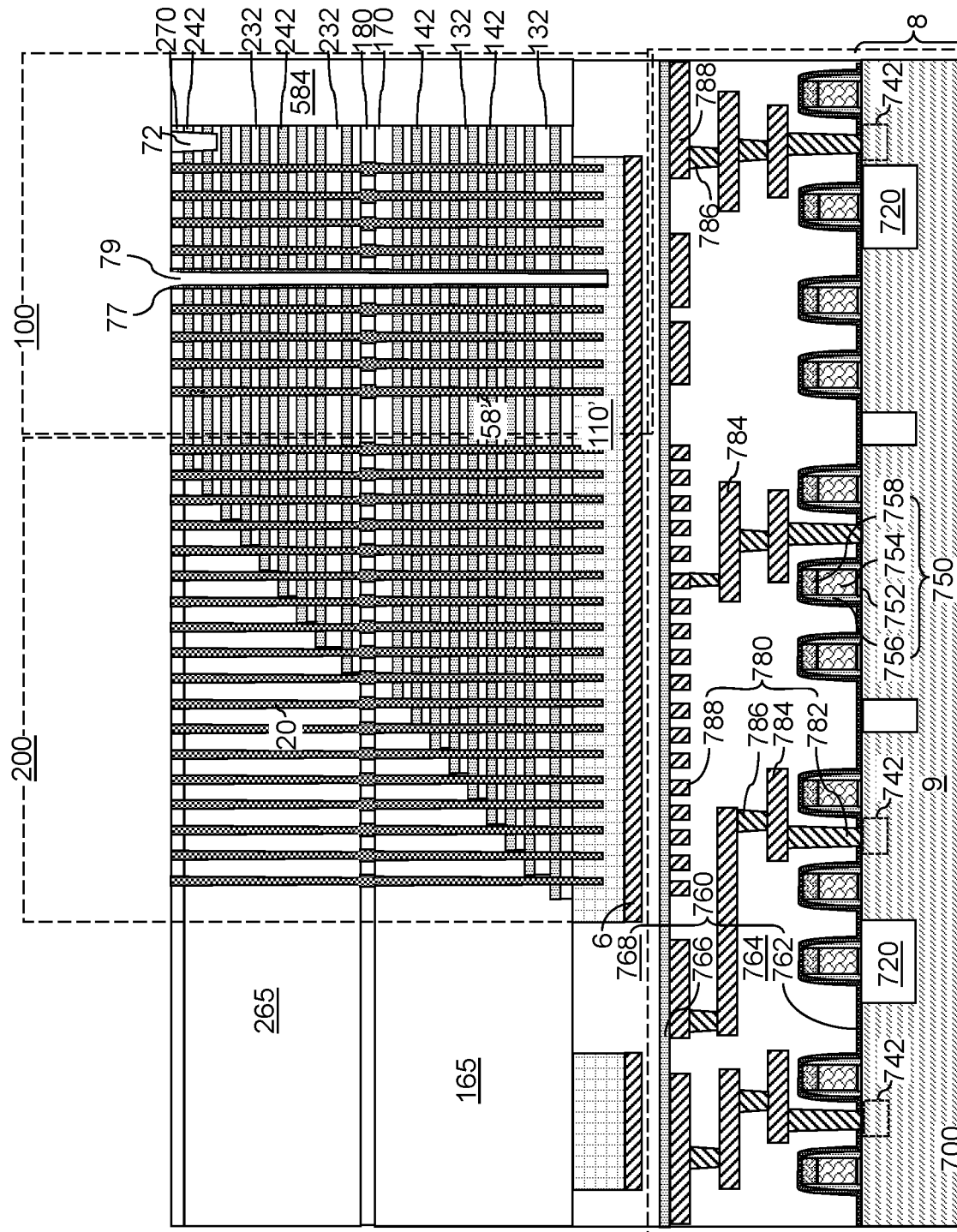
FIG. 14 is a vertical cross-sectional view of the first exemplary structure after formation of backside trench spacers according to the first embodiment of the present disclosure.
Figure 15A:
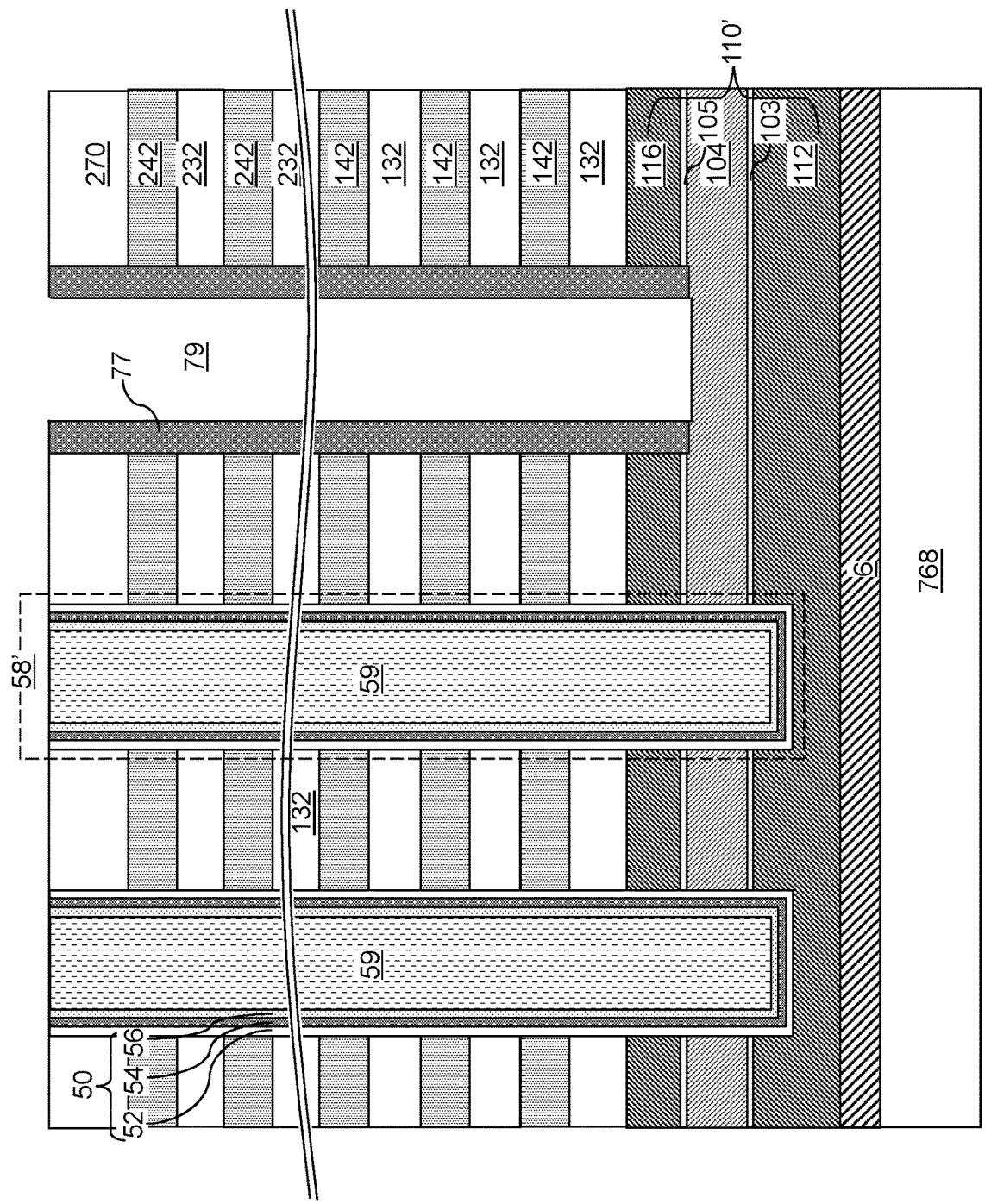
FIGS. 15A-15F illustrate sequential vertical cross-sectional views of memory opening fill structures and a backside trench during formation of source-level material layers according to the first embodiment of the present disclosure.

Referring to FIGS. 14 and 15A, a backside trench spacer 77 may be formed on sidewalls of each backside trench 79. For example, a conformal spacer material layer may be deposited in the backside trenches 79 and over the second-tier structure (232, 242, 270, 265, 72), and may be anisotropically etched to form the backside trench spacers 77. The backside trench spacers 77 include a material that is different from the material of the source-level sacrificial layer 104. For example, the backside trench spacers 77 may include silicon nitride.

Figure 15B:
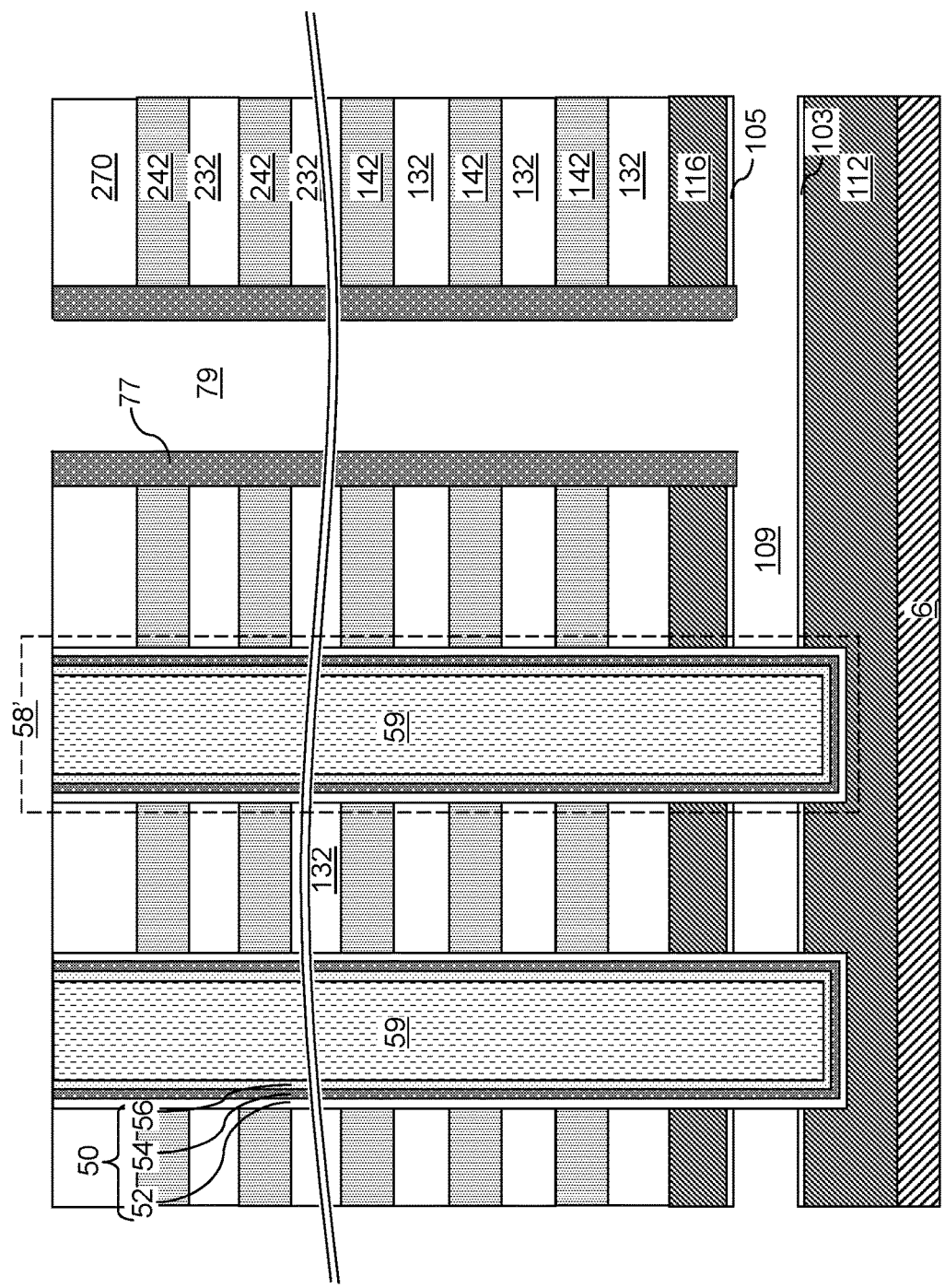

Referring to FIG. 15B, an etchant that etches the material of the source-level sacrificial layer 104 selective to the materials of the backside trench spacers 77, the second insulating cap layer 270, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). In case the source-level sacrificial layer 104 includes borosilicate glass, a wet etch process employing hydrofluoric acid may be employed. A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the in-process memory opening fill structures 58' is physically exposed to the source cavity 109. Specifically, each of the in-process memory opening fill structures 58' includes a sidewall and that are physically exposed to the source cavity 109.

Figure 15C:
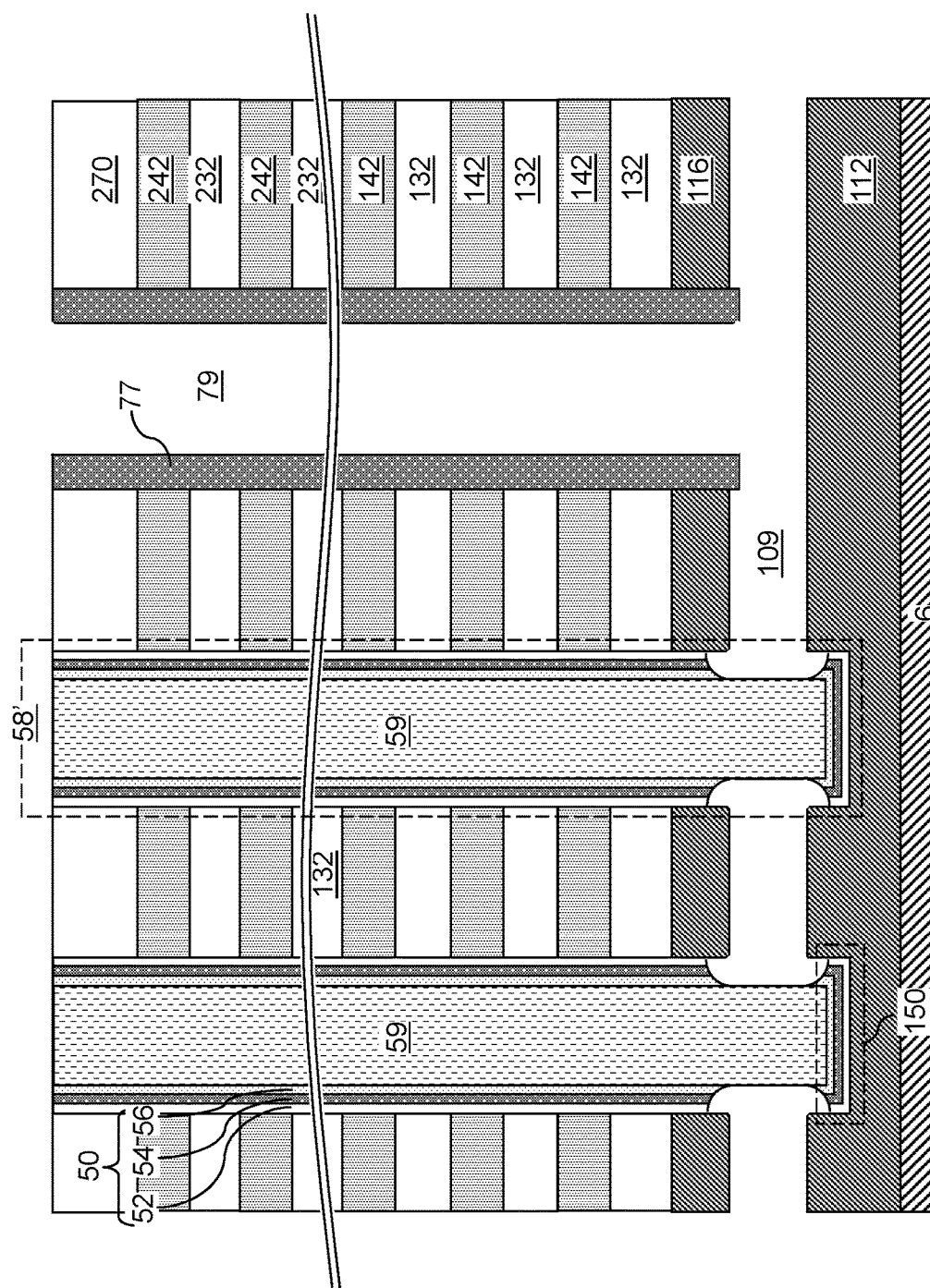

Referring to FIG. 15C, a sequence of isotropic etchants, such as wet etchants, may be applied to the physically exposed portions of the memory films 50 to sequentially etch the various component layers of the memory films 50 from outside to inside, and to physically expose cylindrical surfaces of the sacrificial memory opening fill material portions 59 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the sacrificial memory opening fill material portions 59.

Generally, the source cavity 109 can be formed by removing the source-level sacrificial layer 104 and a cylindrical portion of each memory film 50 located at the level of the source-level sacrificial layer 104. A bottom portion of each memory film 50 is detached from a predominant remaining portion of the memory film 50 upon removal of the cylindrical portion of the memory film 50. The detached bottom portion of each memory film 50 is herein referred to as a bottom dielectric cap structure 150. Each bottom dielectric cap structure 150 can have the same set of material compositions as component layers of the overlying memory film 50. In one embodiment, each of the memory film 50 and each bottom dielectric cap structure 150 can comprise a respective layer stack including, from one side to another, a blocking dielectric layer 52, a charge storage layer 54, and a tunneling dielectric layer 56. In one embodiment, each bottom dielectric cap structure 150 comprises a concave annular surface that is formed due to the isotropic nature of the etch process employed to form the source cavity 109. In one embodiment, each in-process memory opening fill structure 58' may be formed with straight sidewalls at the levels of the in-process source-level material layers 110'. In this case, a bottom periphery of an outer sidewall of the memory film 50 and a top periphery of an outer sidewall of the bottom dielectric cap structure 150 may have the same horizontal cross-sectional shape, and may overlap with each other in a plan view. As used herein, a plan view is a view along a vertical direction, which is the direction that is perpendicular to the top surface of the substrate 8.

Figure 15D:
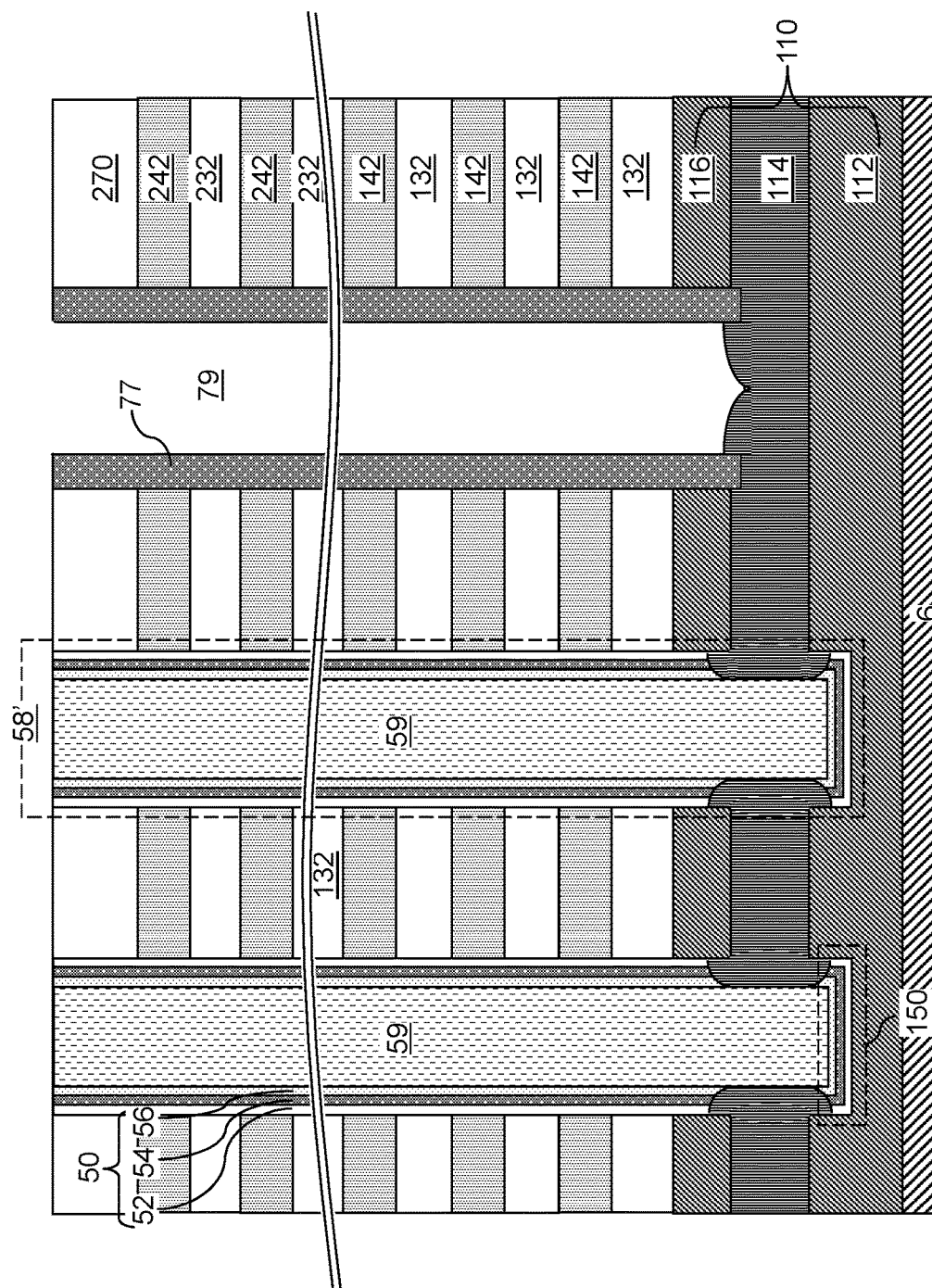

Referring to FIG. 15D, a semiconductor material having a doping of the second conductivity type may be deposited on the physically exposed surfaces around the source cavity 109. In one embodiment, the second conductivity type can be n-type. The physically exposed surfaces include bottom portions of outer sidewalls of the sacrificial memory opening fill material portions 59 and a horizontal surface of the at least one source-level semiconductor layer (such as a bottom surface of the upper source-level semiconductor layer 116 and/or a top surface of the lower source-level semiconductor layer 112). For example, the physically exposed surfaces may include the bottom portions of outer sidewalls of the sacrificial memory opening fill material portions 59, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine or arsine. In one embodiment, the selective semiconductor deposition process grows an n-doped semiconductor material, such as n-type polysilicon from physically exposed semiconductor surfaces around the source cavity 109, and gradually contacts and covers the physically exposed surfaces of the sacrificial memory opening fill material portions 59. Alternatively, the n-doped semiconductor material of the second conductivity type may be deposited on all physically exposed surfaces of the source cavity 109 by a non-selective semiconductor deposition process. In this case, portions of the deposited semiconductor material may be etched back from above the second insulating cap layer 270 and from inside the backside trenches 79. Optionally, one or more etch back processes may be used in combination with a plurality of selective or non-selective deposition processes to provide a seamless and/or voidless source contact layer 114.

The deposited doped semiconductor material forms a source contact layer 114, which contacts sidewalls of the sacrificial memory opening fill material portions 59. The atomic concentration of the n-type dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. In one embodiment, the second conductivity type can be n-type, and the electrical dopants within the source contact layer 114 may include phosphorous atoms and/or arsenic atoms. In one embodiment, arsenic atoms may be used because they diffuse slower than phosphorus atoms and permit a subsequent improved dopant diffusion profile.

The source contact layer 114 as initially formed may consist essentially of semiconductor atoms and dopant atoms of the second conductivity type. Alternatively, the source contact layer 114 may be deposited with in-situ doping of carbon atoms in addition to n-type dopant atoms (e.g., phosphorus and/or arsenic). In case in-situ doping of carbon atoms is employed to deposit the source contact layer 114, the semiconductor deposition process can flow a carbon dopant gas such as methane, ethane, ethylene, acetylene, etc. concurrently with flow of the silicon-containing precursor gas and the n-type dopant gas. The average atomic concentration of carbon atoms in the source contact layer 114 may be in a range from $5.0 \times 10^{17}$ atoms/$cm^3$ to $2.0 \times 10^{21}$ atoms/$cm^3$, such as from $2.0 \times 10^{18}$ atoms/$cm^3$ to $1.0 \times 10^{21}$ atoms/$cm^3$, and/or from $1.0 \times 10^{19}$ atoms/$cm^3$ to $1.0 \times 10^{20}$ atoms/$cm^3$, although lesser and greater atomic concentrations can also be employed. The carbon atoms hinder growth of large grains in the polysilicon of the source contact layer 114. Therefore, the smaller polysilicon grain size helps control the subsequent diffusion profile of the n-type dopants into the semiconductor channel, as will be described in more detail below.

The duration of the selective semiconductor deposition process may be selected such that the source cavity 109 is filled with the source contact layer 114, and the source contact layer 114 contacts bottom end portions of inner sidewalls of the backside trench spacers 77. Thus, the source-level sacrificial layer 104 may be replaced with the source contact layer 114. The layer stack including the lower source-level semiconductor layer 112, the source contact layer 114, and the upper source-level semiconductor layer 116 constitutes source-level material layers 110, which replaces the in-process source-level material layers 110'. The source-level material layers 110 are collectively referred to as a buried source layer.

Generally, the source contact layer 114 can be deposited in the source cavity 109 on each cylindrical sidewall of the sacrificial memory opening fill material portions 59. In one embodiment, the source contact layer 114 can be deposited with in-situ doping of n-type dopant atoms, which is subsequently employed as a dopant source for n-type dopants to diffuse into pedestal channel portions to be subsequently formed in the memory openings 49. In one embodiment, each memory film 50 can comprise a concave annular bottom surface segment that contacts the source contact layer 114, and the outer periphery of the concave annular bottom surface may be located at a greater vertical distance from the substrate 8 than an inner periphery of the concave annular bottom surface is from the substrate 8 due to the etch profile provided by the isotropic etch process employed to remove cylindrical portions of the memory films 50 during formation of the source cavity 109.

Figure 15E:
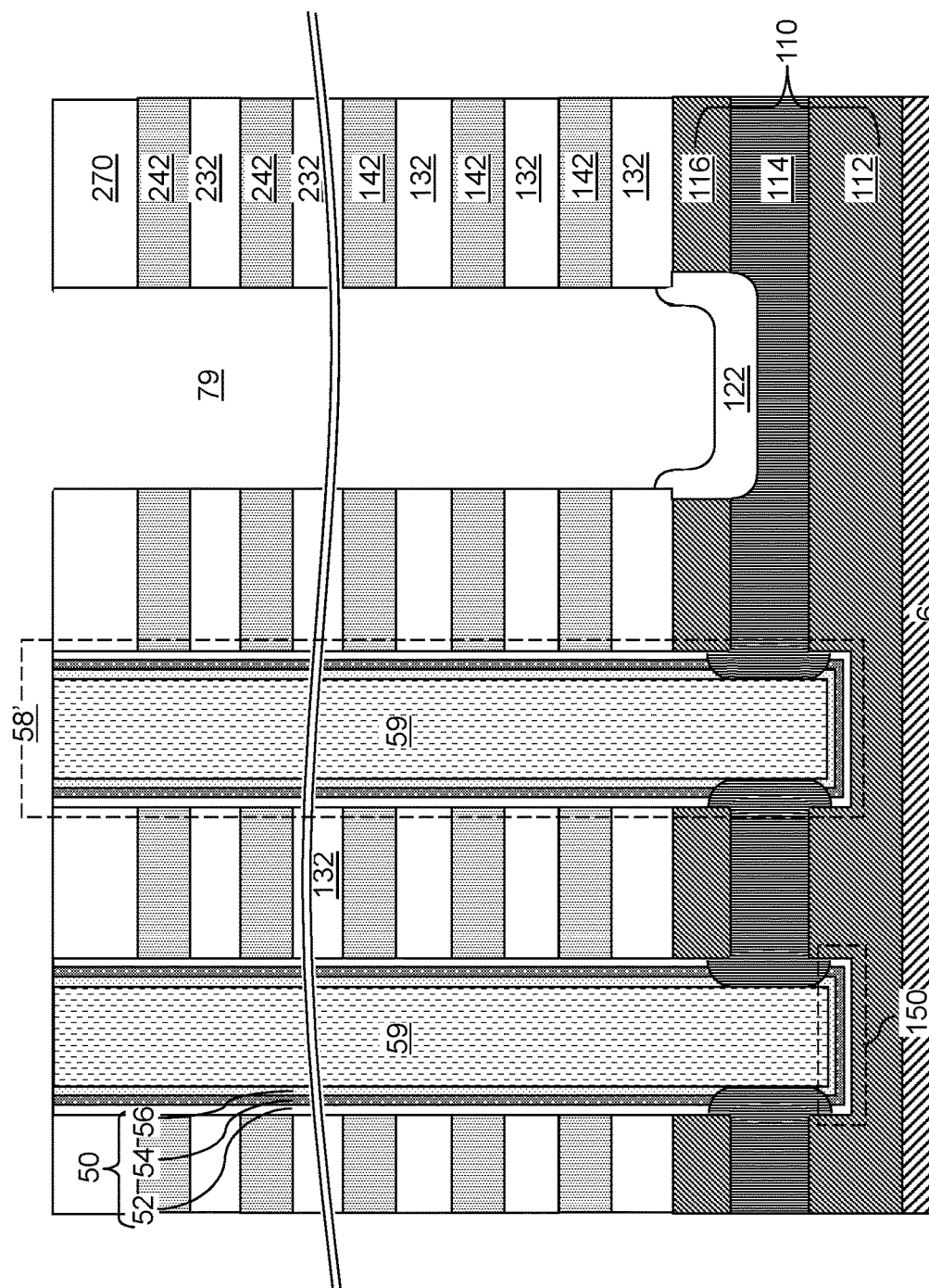

Referring to FIG. 15E, the backside trench spacers 77 may be removed selective to the insulating layers (132, 232), the first and second insulating cap layers (170, 270), and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122.

Figure 15F:
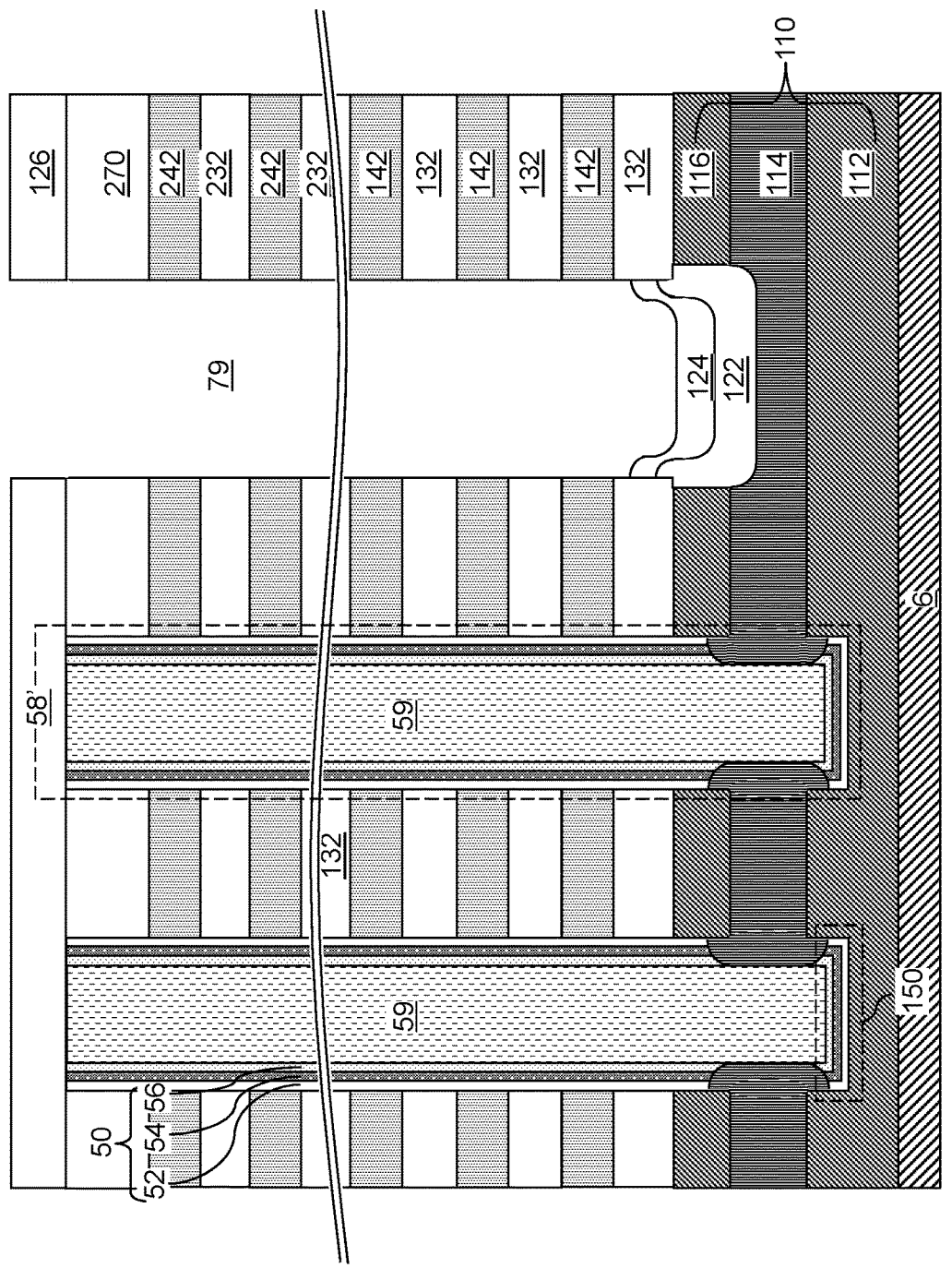
Figure 16:
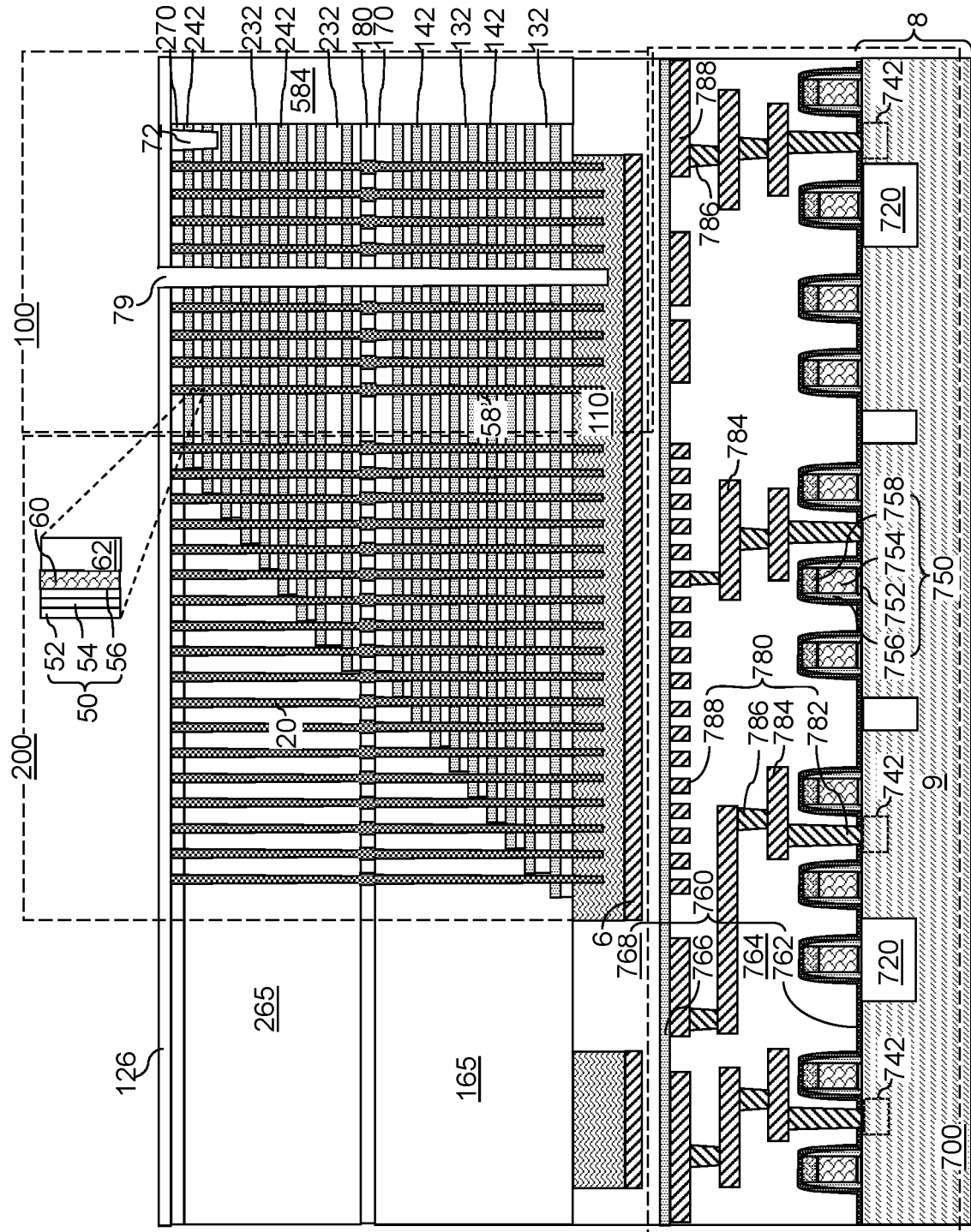
FIG. 16 is a vertical cross-sectional view of the first exemplary structure after formation of source-level material layers according to the first embodiment of the present disclosure.

Referring to FIGS. 15F and 16, a dielectric cover material such as undoped silicate glass or a doped silicate glass may be anisotropically deposited over the second-tier structure (232, 242, 265, 270, 72) and at the bottom of each backside trench 79 in case the sacrificial memory opening fill material portions 59 include the same material as the sacrificial material layers 42. For example, if the sacrificial memory opening fill material portions 59 and the sacrificial material layers 42 include silicon nitride, the dielectric cover material may include borosilicate glass or undoped silicate glass. A dielectric cover material layer 126 can be formed over the second-tier structure (232, 242, 265, 270, 72), and a dielectric cover material portion 124 can be formed at the bottom of each backside trench 79. The thickness of the dielectric cover material layer 126 can be in a range from 6 nm to 60 nm, although lesser and greater thicknesses can also be employed. In case the sacrificial memory opening fill material portions 59 include a different material from the material of the sacrificial material layers 42, formation of the dielectric cover material layer 126 can be omitted.

Figure 17:
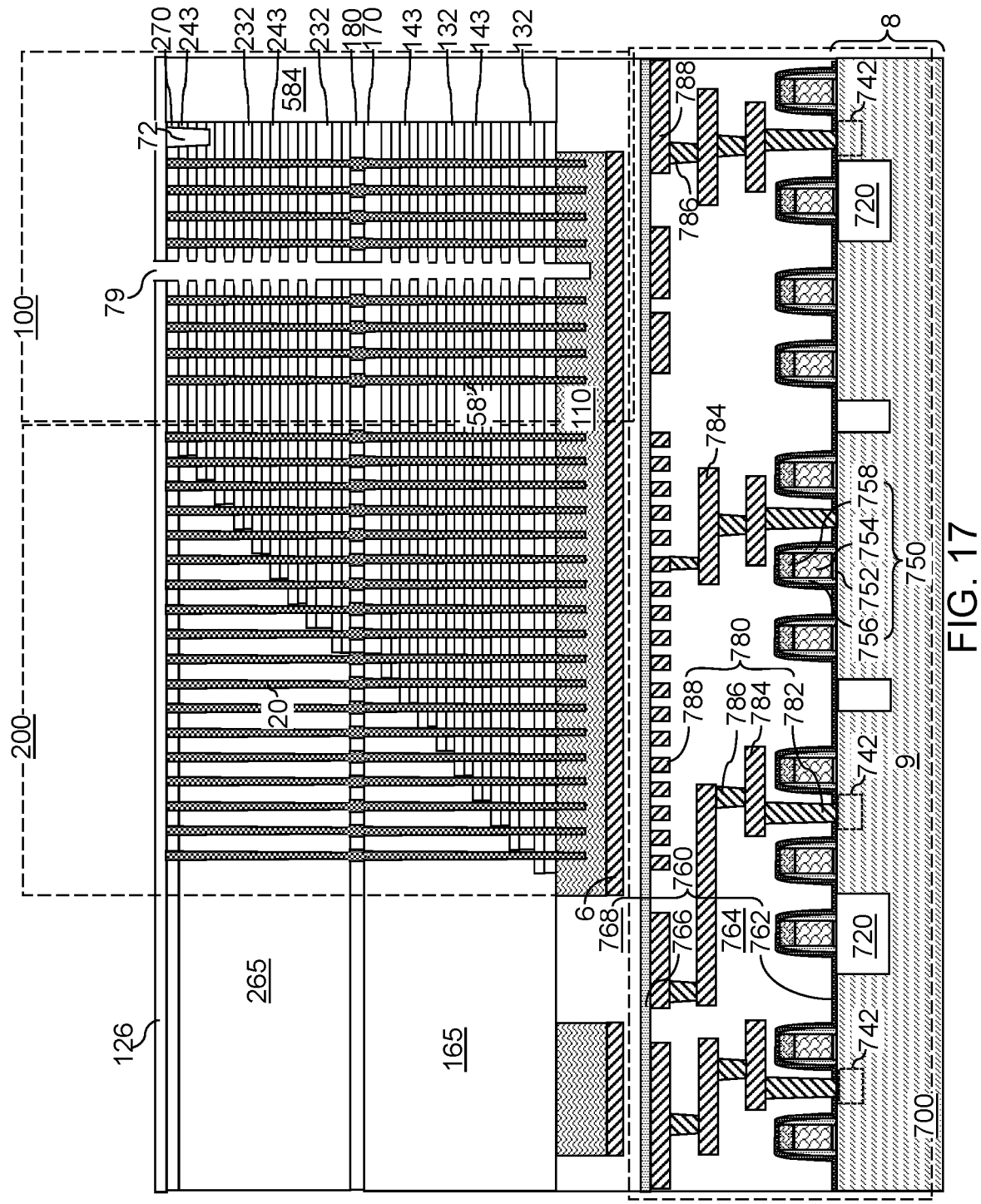
FIG. 17 is a vertical cross-sectional view of the first exemplary structure after formation of backside recesses according to the first embodiment of the present disclosure.

Referring to FIG. 17, the sacrificial material layers (142, 242) are may be removed selective to the insulating layers (132, 232), the first and second insulating cap layers (170, 270), and the source contact layer 114, and the dielectric semiconductor oxide plates 122. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 18A:
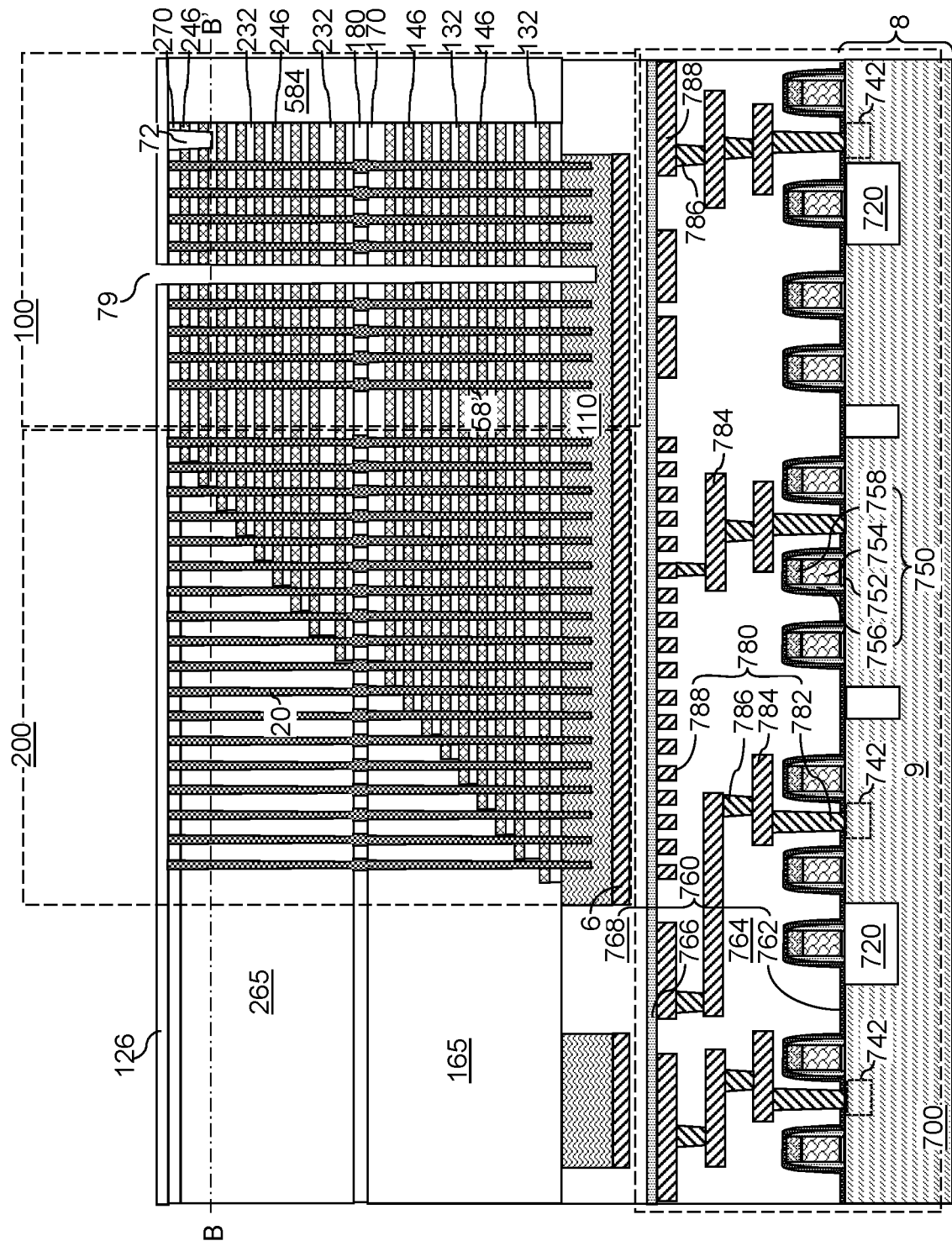
FIG. 18A is a vertical cross-sectional view of the first exemplary structure after formation of electrically conductive layers according to the first embodiment of the present disclosure.
Figure 19A:
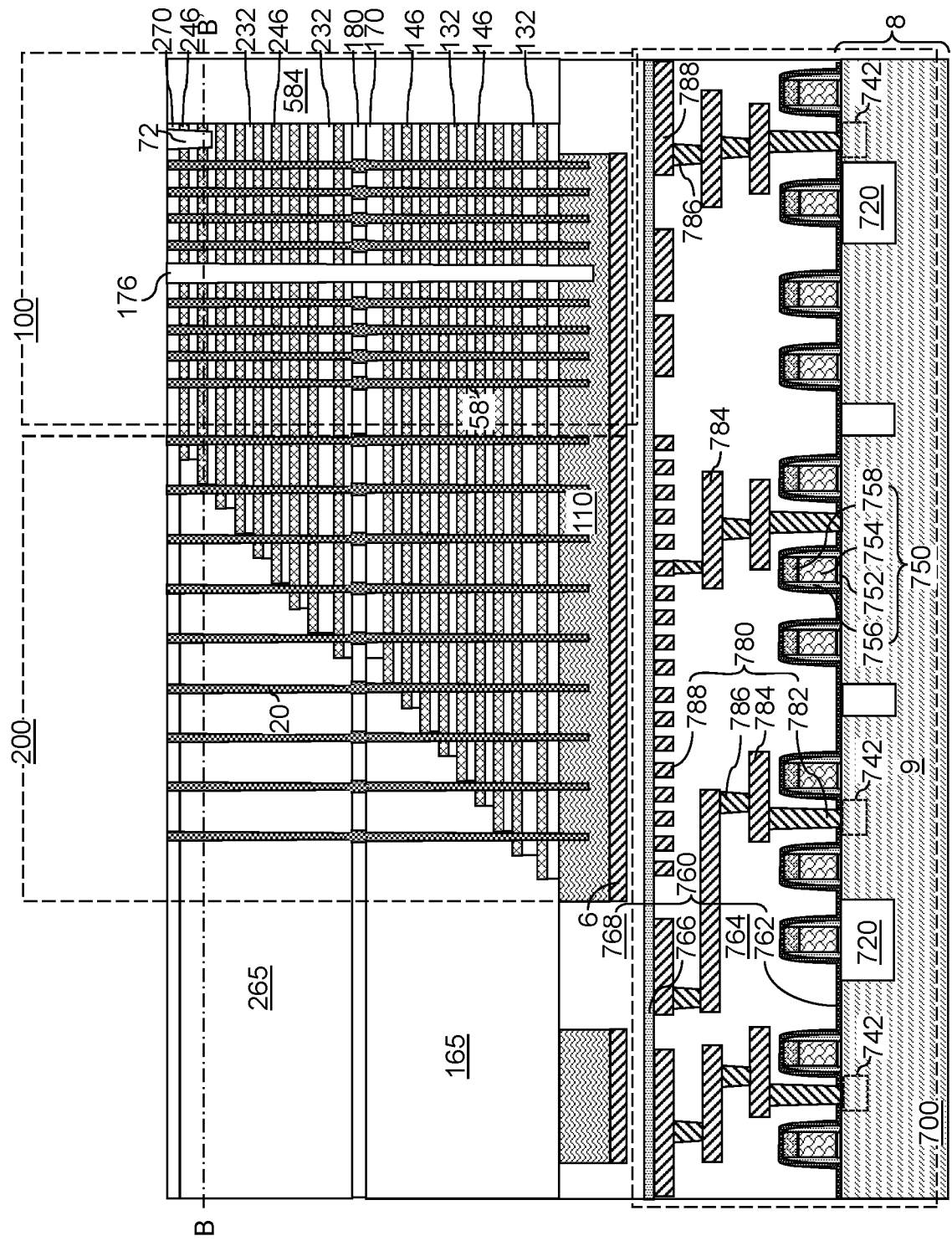
FIG. 19A is a vertical cross-sectional view of the first exemplary structure after formation of backside trench fill structures in the backside trenches according to the first embodiment of the present disclosure.
Figure 19B:
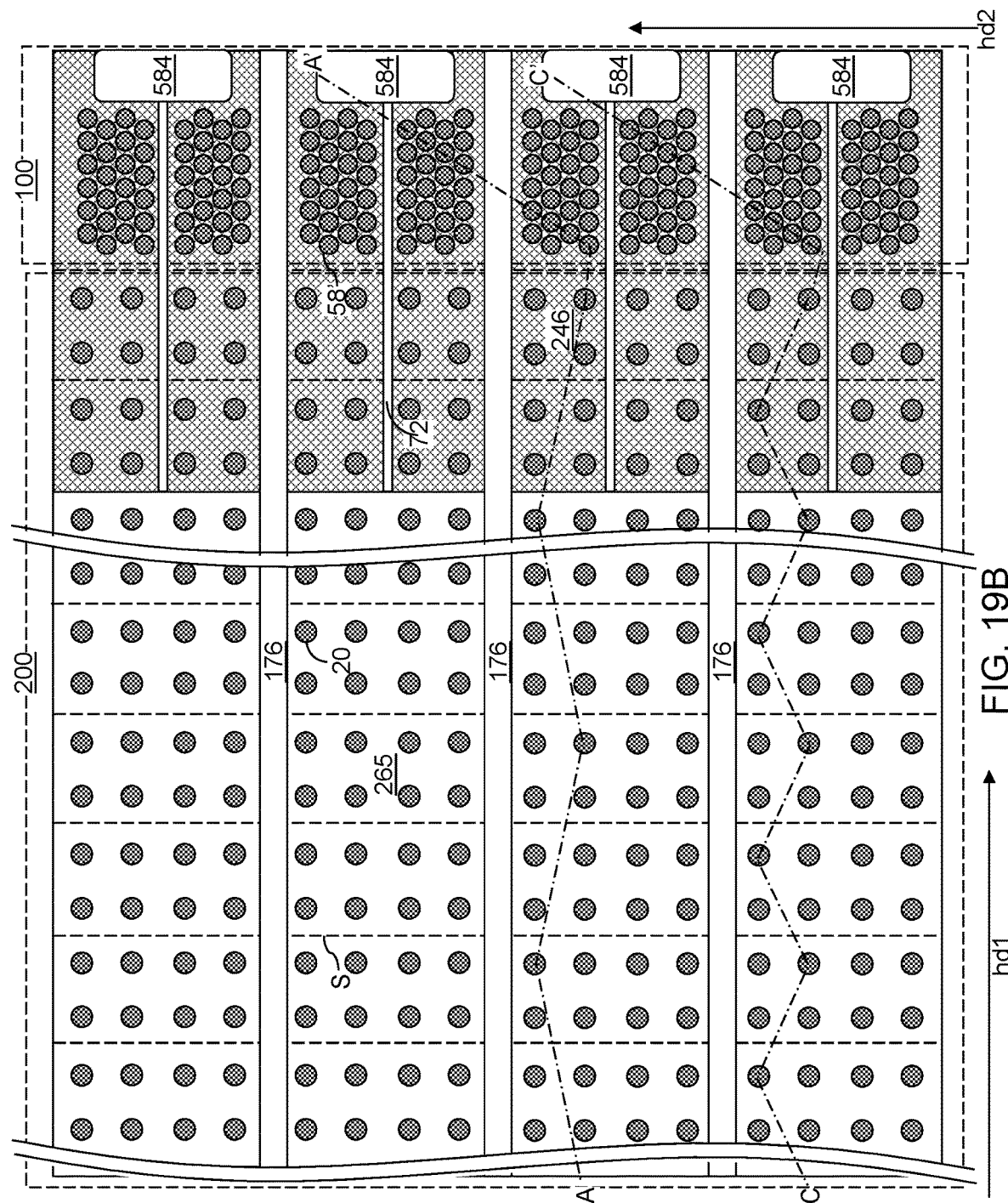
FIG. 19B is a horizontal cross-sectional view of the first exemplary structure along the horizontal plane B-B' of FIG. 19A. The hinged vertical plane A-A' corresponds to the plane of the vertical cross-sectional view of FIG. 19A.
Figure 19C:
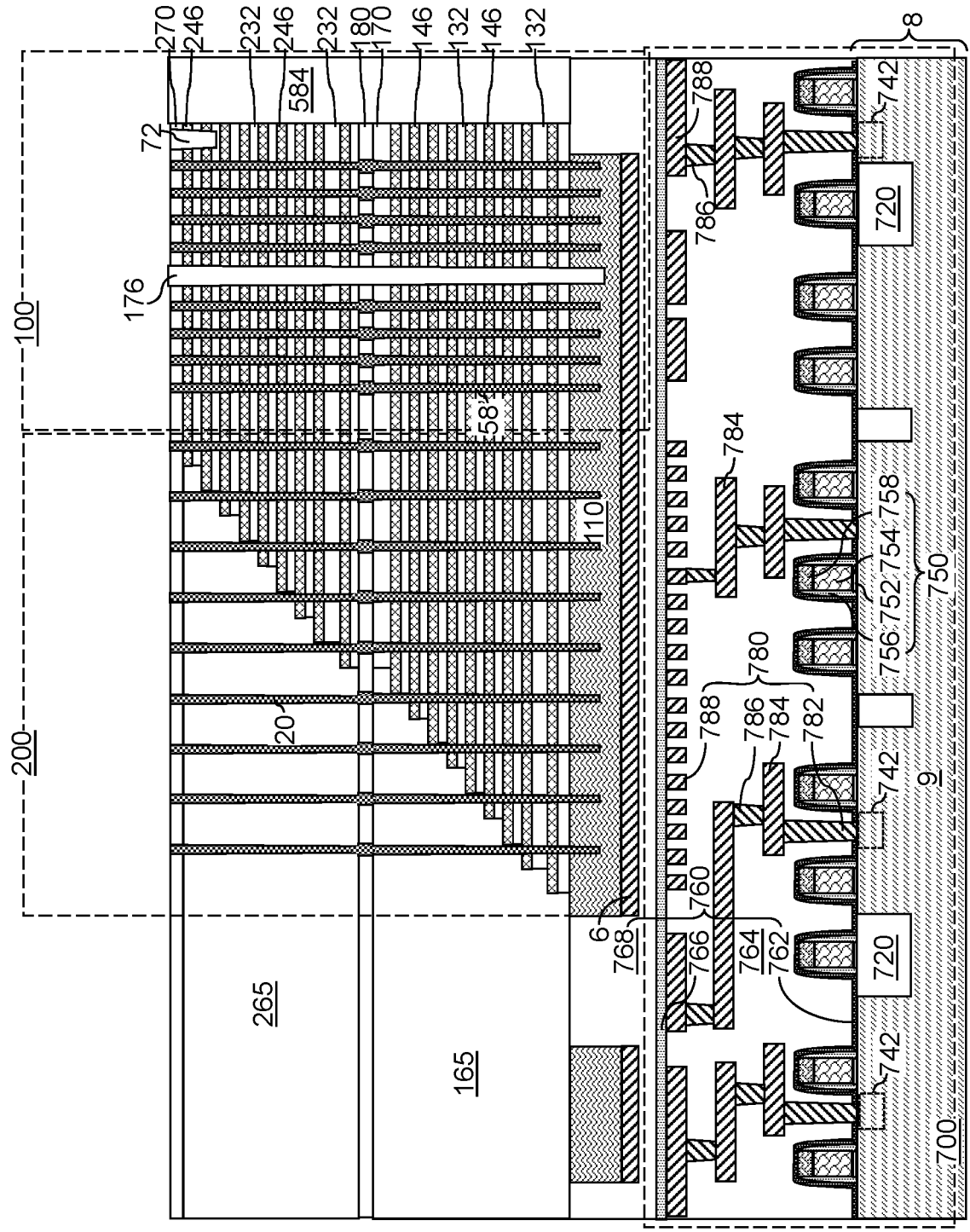
FIG. 19C is a vertical cross-sectional view of the first exemplary structure along the vertical plane C-C' of FIG. 19B.

Referring to FIGS. 18A and 18B, a backside blocking dielectric layer (not shown) may be optionally deposited in the backside recesses (143, 243) and the backside trenches 79 and over the second-tier structure (232, 242, 270, 265, 72). The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the second-tier structure (232, 242, 270, 265, 72). The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the second-tier structure (232, 242, 270, 265, 72). Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the second-tier structure (232, 242, 270, 265, 72), for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with in-process memory opening fill structures 58'. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for vertical NAND strings to be subsequently formed in the memory openings 49.

Referring to FIGS. 19A-19C and 20A, a dielectric fill material may be conformally deposited in the backside trenches 79 and over the second insulating cap layer 270 by a conformal deposition process. The dielectric fill material may include, for example, silicon oxide. Portions of the dielectric fill material that is deposited over the second insulating cap layer 270 can be removed, for example, by a recess etch process. Each remaining portion of the dielectric fill material that fills the backside trenches 79 constitutes a dielectric backside trench fill structure 176.

Figure 20A:
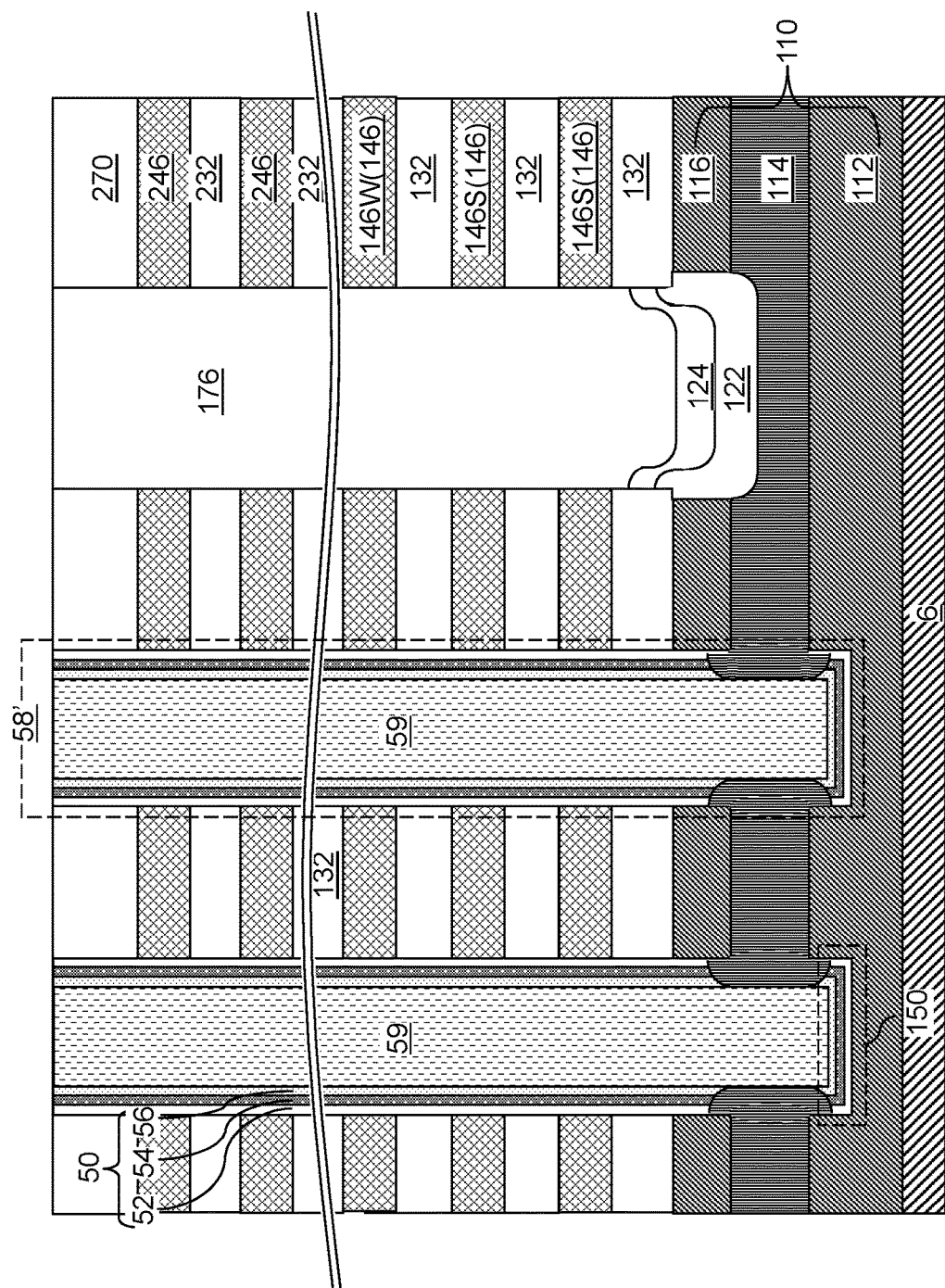
FIGS. 20A-20E illustrate sequential vertical cross-sectional views of a pair of memory openings and a backside trench during formation of a composite semiconductor channel, a dielectric core, and a drain region within each memory opening according to the first embodiment of the present disclosure.
Figure 20B:
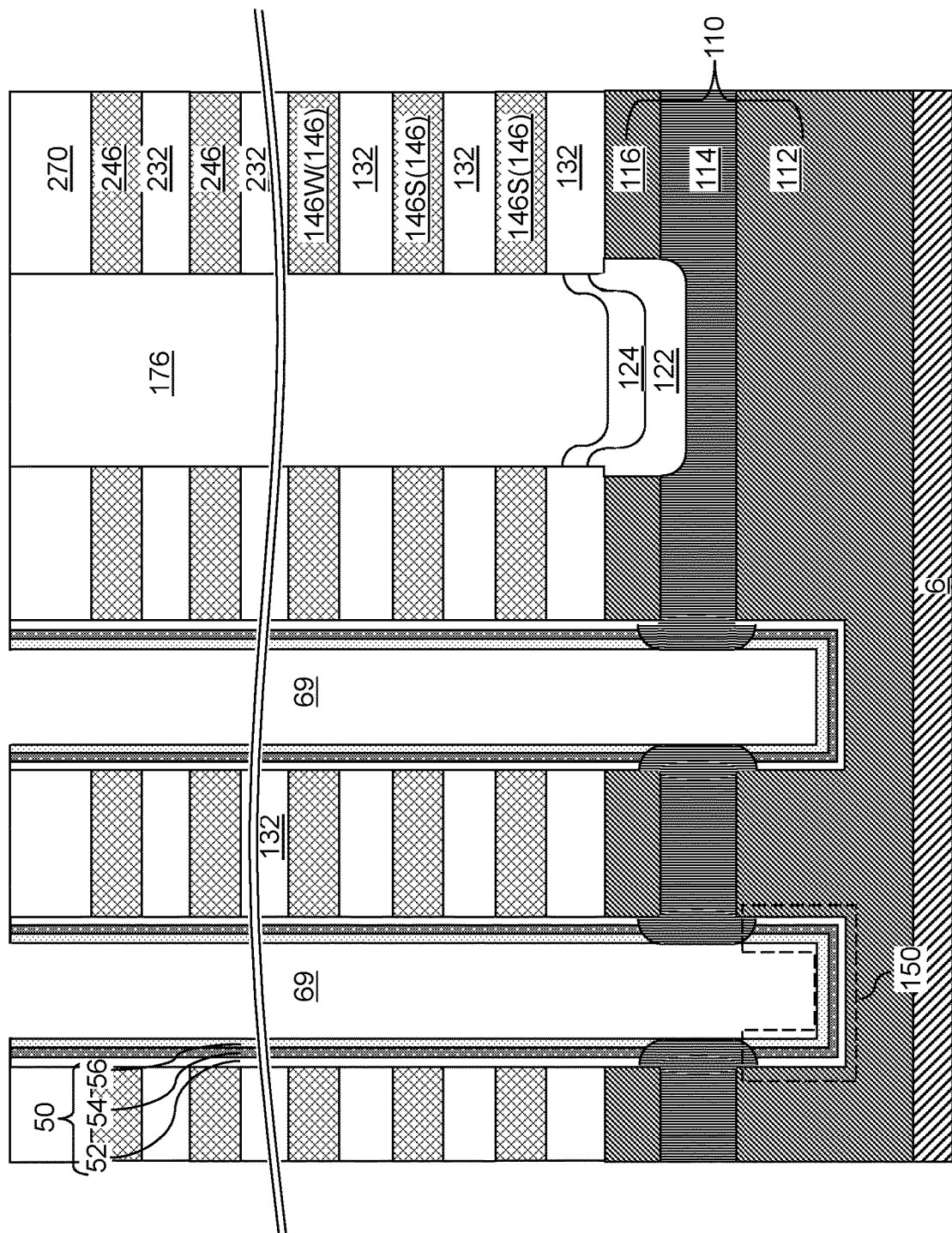

Referring to FIG. 20B, the sacrificial memory opening fill material portions 59 can be removed selective to the memory film 50, the source contact layer 114, and the second insulating cap layer 270 by an etch process. For example, an isotropic etch process such as a wet etch process can be employed to selectively etch the material of the sacrificial memory opening fill material portions 59 without etching the memory films 50 or the source contact layer 114. For example, if the sacrificial memory opening fill material portions 59 include silicon nitride, a wet etch employing hot phosphoric acid can be performed. If the sacrificial memory opening fill material portions 59 include amorphous silicon or polysilicon, wet etch process employ TMAH or TMY can be performed. If the sacrificial memory opening fill material portions 59 a silicon-germanium alloy, a wet etch process employing a combination of hydrofluoric acid, hydrogen peroxide, and acetic acid can be performed. If the sacrificial memory opening fill material portions 59 include amorphous carbon (preferably with a void therein), the material of the sacrificial memory opening fill material portions 59 may be ashed employing an oxygen-containing plasma. If the sacrificial memory opening fill material portions 59 include a silicon-containing polymer, a wet etch process employing an organic solvent may be performed to remove the sacrificial memory opening fill material portions 50. A memory cavity 69 can be formed in each volume from which a sacrificial memory opening fill material portion 59 is removed.

Figure 20C:
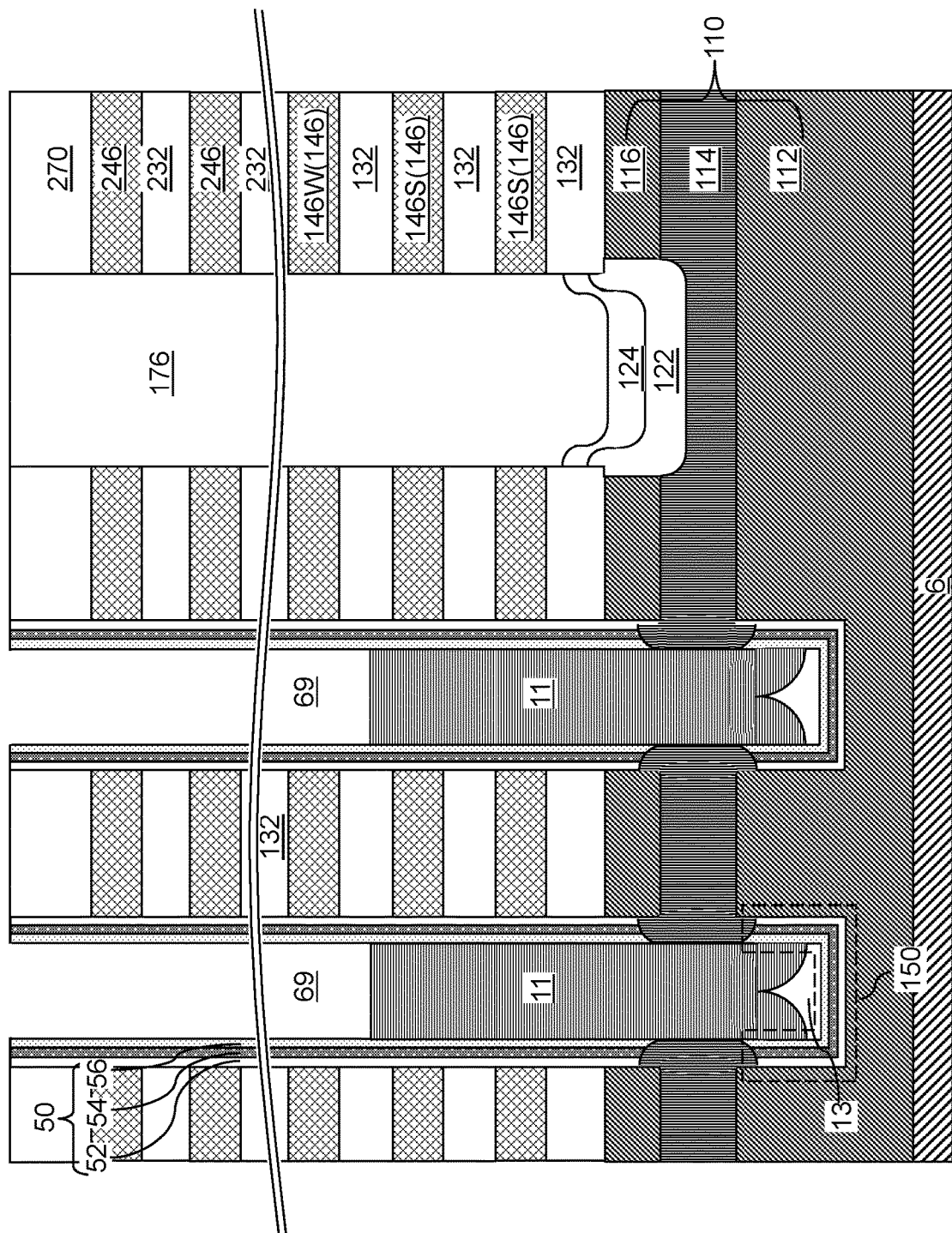

Referring to FIG. 20C, a selective semiconductor deposition process can be performed to selectively grow a first semiconductor material from each physically exposed surface of the source contact layer 114 in a lower portion of each memory cavity 69. A selective semiconductor deposition process is a semiconductor deposition process that causes a semiconductor material to grow from a physically exposed semiconductor surface while suppressing growth of the semiconductor material from dielectric surfaces. A selective semiconductor deposition process flows a semiconductor-containing precursor gas and an etchant gas simultaneously or alternately into a process chamber containing a substrate that has at least one physically exposed surface and at least one physically exposed dielectric surface such as the first exemplary structure provided at the processing steps of FIG. 20B. In this case, the first semiconductor material is selectively grown by performing a selective semiconductor deposition process in which a semiconductor precursor gas (such as $SiH_4$, $SiH_2Cl_2$, $SiH_3Cl$, $Si_2H_6$) and an etchant gas (such as gas phase HCl) are concurrently or alternately flown into a process chamber in which the substrate 8 is disposed to selectively deposit a silicon material (e.g., amorphous silicon or polysilicon). The first semiconductor material does not grow from surfaces of the memory films 50 during the selective semiconductor deposition process, and grows only from the physically exposed surfaces of the source contact layer 114. In one embodiment, each surface of the source contact layer 114 from which the first semiconductor material grows selectively may comprise a respective cylindrical surface.

In one embodiment, the first semiconductor material grows from the cylindrical surfaces of the source contact layer 114 in a generally isotropic manner because the source contact layer 114 is polycrystalline or amorphous. In other words, faceting of the first semiconductor material is generally not predominant, even if some faceting may be present. Thus, the growth surfaces of the deposited first semiconductor material may be equidistant or substantially equidistant from the cylindrical surfaces of the source contact layer 114, which is the initial growth surface for the first semiconductor material. The duration of the selective semiconductor deposition can be selected such that the growth distance of the first semiconductor material is greater than the radius, the semiminor axis, or one half of a maximum lateral dimension of a memory cavity 69 along a widthwise direction. In this case, the first semiconductor material is merged at a center region of the lower portion of each memory cavity 69 to fill a gap around an axis passing through the geometrical center of each memory cavity 69. Each material portion of the first semiconductor material formed by the selective semiconductor deposition process has a general configuration of a pedestal, and is herein referred to as a pedestal channel portion 11.

Generally, each pedestal channel portion 11 can be formed by selectively growing the first semiconductor material, such as amorphous silicon or polysilicon, and can contact the source contact layer 114 at a respective cylindrical interface located within a cylindrical vertical plane located at, or inside, an inner sidewall of a respective memory film 50. In one embodiment, the isotropic growth pattern of the first semiconductor material during the selective semiconductor deposition process may cause formation of a gap fill at the level of the source contact layer 114 before the first semiconductor material contacts a center portion of the top surface of a planar portion of an underlying bottom dielectric cap structure 150. In this case, a void (i.e., air gap) 13 that is free of any solid phase material can be formed at a bottom portion of the memory cavity 69 underneath the pedestal channel portion 11. Each void 13 may be formed between a respective bottom dielectric cap structure 150 and a pedestal channel portion 11. Each void 13 may be spatially bounded by surfaces of a bottom dielectric cap structure 150 and a pedestal channel portion 11. In one embodiment, each void 13 may comprise a tapered concave upper boundary at an interface with a tapered convex bottom surface of the pedestal channel portion 11, and may have a greater height at a center portion than at a peripheral portion that laterally surrounds the center portion. In other words, each void 13 may be high at the center portion than at the peripheral portion.

In one embodiment, the pedestal channel portions 11 may be deposited as an amorphous material (e.g., amorphous silicon) that is subsequently crystallized into a polycrystalline semiconductor material (e.g., polysilicon). According to an aspect of the present disclosure, the first semiconductor material of the pedestal channel portions 11 may be deposited with in-situ doping of carbon atoms in addition to the n-type dopants (e.g., phosphorus and/or arsenic). In case in-situ doping of carbon atoms is employed to deposit the pedestal channel portions 11, the selective semiconductor deposition process can flow a carbon dopant gas such as methane, ethane, ethylene, acetylene, etc. concurrently with flow of the silicon-containing precursor gas. The average atomic concentration of carbon atoms in the pedestal channel portions 11 may be in a range from $5.0 \times 10^{17}$ atoms/cm$^3$ to $2.0 \times 10^{21}$ atoms/cm$^3$, such as from $2.0 \times 10^{18}$ atoms/cm$^3$ to $1.0 \times 10^{21}$ atoms/cm$^3$, and/or from $1.0 \times 10^{19}$ atoms/cm$^3$ to $1.0 \times 10^{20}$ atoms/cm$^3$, although lesser and greater atomic concentrations can also be employed. The carbon atoms hinder growth of large grains during polysilicon growth or during crystallization of the amorphous silicon of the pedestal channel portions 11 during a subsequent anneal process. Reduction of the average grain size in the pedestal channel portions 11 induces formation of a large number of grain boundaries, which occupies a large volume fraction of each pedestal channel portion 11 after the anneal process. The dense network of grain boundaries in the pedestal channel portions 11 provides a more uniform diffusion rate of the n-type dopant atoms from the source contact layer 114 into various pedestal channel portions 11 and/or from the pedestal channel portions 11 into a respective overlying vertical channel to be formed. In other words, dopants in one pedestal channel portion 11 cannot diffuse at a high speed in one direction through one large grain, while being slowed down by random perpendicular grain boundary between two large grains in another pedestal channel portion 11. Thus, the diffusion profile of n-type dopants into and/or from the pedestal channel portions 11 can be enhanced due to the presence of carbon atoms in the pedestal channel portions 11.

According to another aspect of the present disclosure, the first semiconductor material (e.g., amorphous silicon or polysilicon) of the pedestal channel portions 11 may be deposited with in-situ doping of arsenic atoms. In case in-situ doping of arsenic atoms is employed to deposit the pedestal channel portions 11, the selective semiconductor deposition process can flow an arsenic-containing dopant gas such as arsine (AsH$_3$) concurrently with flow of the silicon-containing precursor gas. The average atomic concentration of arsenic atoms in the pedestal channel portions 11 may be in a range from $1.0 \times 10^{18}$ atoms/cm$^3$ to $1.0 \times 10^{20}$ atoms/cm$^3$, such as from $3.0 \times 10^{18}$ atoms/cm$^3$ to $3.0 \times 10^{20}$ atoms/cm$^3$, although lesser and greater atomic concentrations can also be employed. The arsenic atoms diffuse slower through silicon than phosphorus and thus provide a better control of n-type dopant diffusion profile than phosphorus atoms. The arsenic atoms provide in-situ n-type doping of the pedestal channel portions 11, which functions as an extension of a source region for a vertical field effect transistor that is formed within each memory opening 49. The pedestal channel portions 11, as doped with n-type dopants, provide the paths for gate-induced drain leakage (GIDL) current generation during an erase operation of the three-dimensional NAND memory array to be formed.

The duration of the selective semiconductor deposition process is selected such that the top surface of each pedestal channel portion 11 is formed above the topmost source-select-level electrically conductive layer (i.e., topmost source side select gate electrode) 146S and below the bottommost word-line-level electrically conductive layer (i.e., bottommost word line) 146W. A predominant subset of the electrically conductive layers (146, 246) function as word-line-level electrically conductive layers (146W, 246), which are electrically conductive layers that function as word lines of the vertical field effect transistors to be formed in the memory openings 49. Portions of the charge storage layers 54 located at the levels of the word-line-level electrically conductive layers (146W, 246) used as charge storage elements. A minority subset of the first electrically conductive layers 146 that are proximal to the source contact layer 114 comprise the source-select-level electrically conductive layers 146S, which are electrically conductive layers that are employed to selectively active (i.e., enable flow of electrical current through) a source select transistor of the vertical NAND strings formed in the memory openings 49. Generally, portions of the charge storage layers 54 located at the levels of the source-select-level electrically conductive layers 146S are not employed as charge storage elements. The total number of source-select-level electrically conductive layers 146S may be in a range from 1-6, such as from 2-4, although lesser and greater numbers may also be employed.

In one embodiment, the electrically conductive layers (146, 246) can comprise source-select-level electrically conductive layers 146S located below a horizontal plane including an outer periphery of the top surface of a pedestal channel portion 11, and word-line-level electrically conductive layers (146W, 246) located above the horizontal plane including the outer periphery of the top surface of the pedestal channel portion 11. Each memory opening 49 can vertically extend through the source-select-level electrically conductive layers 146S, the word-line-level electrically conductive layers (146W, 246), and the upper source-level semiconductor layer 116 with a straight sidewall.

Figure 20D:
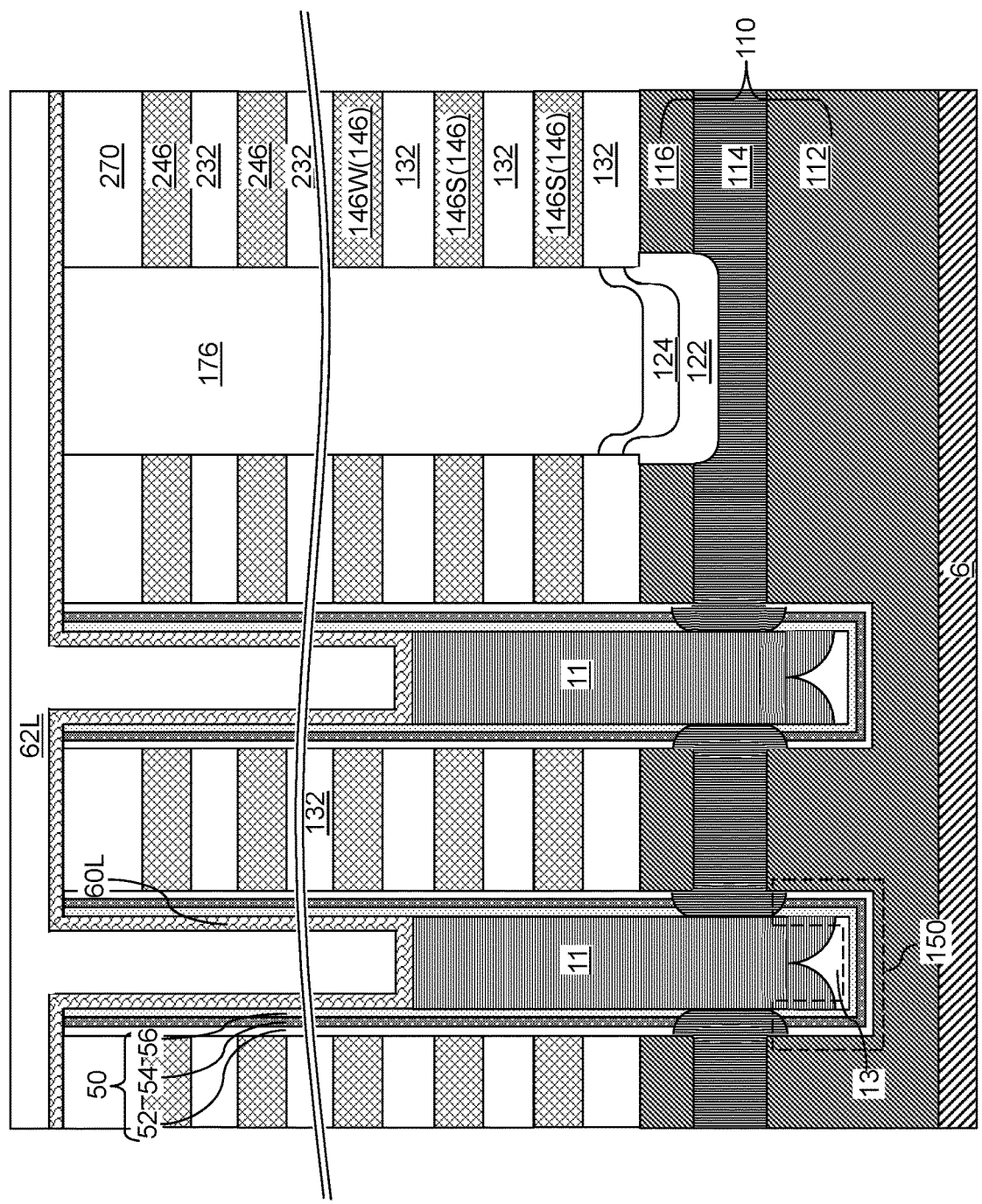

Referring to FIG. 20D, a non-selective semiconductor deposition process can be performed to deposit a second semiconductor material to form a semiconductor channel material layer 60L. The second semiconductor material can includes a p-doped semiconductor material or an undoped semiconductor material, i.e., an intrinsic semiconductor material that is not intentionally doped. The undoped semiconductor material may be intrinsic, or may include p-type electrical dopants at an atomic concentration less than $1.0 \times 10^{16}$/cm$^3$, and/or less than $1.0 \times 10^{15}$/cm$^3$. The second semiconductor material of the semiconductor channel material layer 60L may include at least one elemental semiconductor material (e.g., polysilicon or amorphous silicon), at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used.

Generally, the semiconductor channel material layer 60L may be free of carbon atoms, or may include carbon atoms at an average atomic concentration less than $1.0 \times 10^{17}$ atoms/$cm^3$, and/or less than $1.0 \times 10^{16}$ atoms/$cm^3$, and/or less than $1.0 \times 10^{15}$ atoms/$cm^3$, and/or less than $1.0 \times 10^{14}$ atoms/$cm^3$, and/or less than $1.0 \times 10^{13}$ atoms/$cm^3$. The semiconductor channel material layer 60L can be formed by non-selectively depositing the second semiconductor material over the pedestal channel portions 11 and on the memory films 50. The semiconductor channel material layer 60L is deposited without in-situ doping of carbon atoms and without in-situ doping of any n-type dopant atoms. The semiconductor channel material layer 60L may be deposited with in-situ doping of p-type dopant atoms, or may be deposited without in-situ doping of any type of dopant atoms.

A dielectric core layer 62L may be deposited in the cavities that remain in the memory openings 49 that are not filled with the semiconductor channel material layer 60L. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Figure 20E:
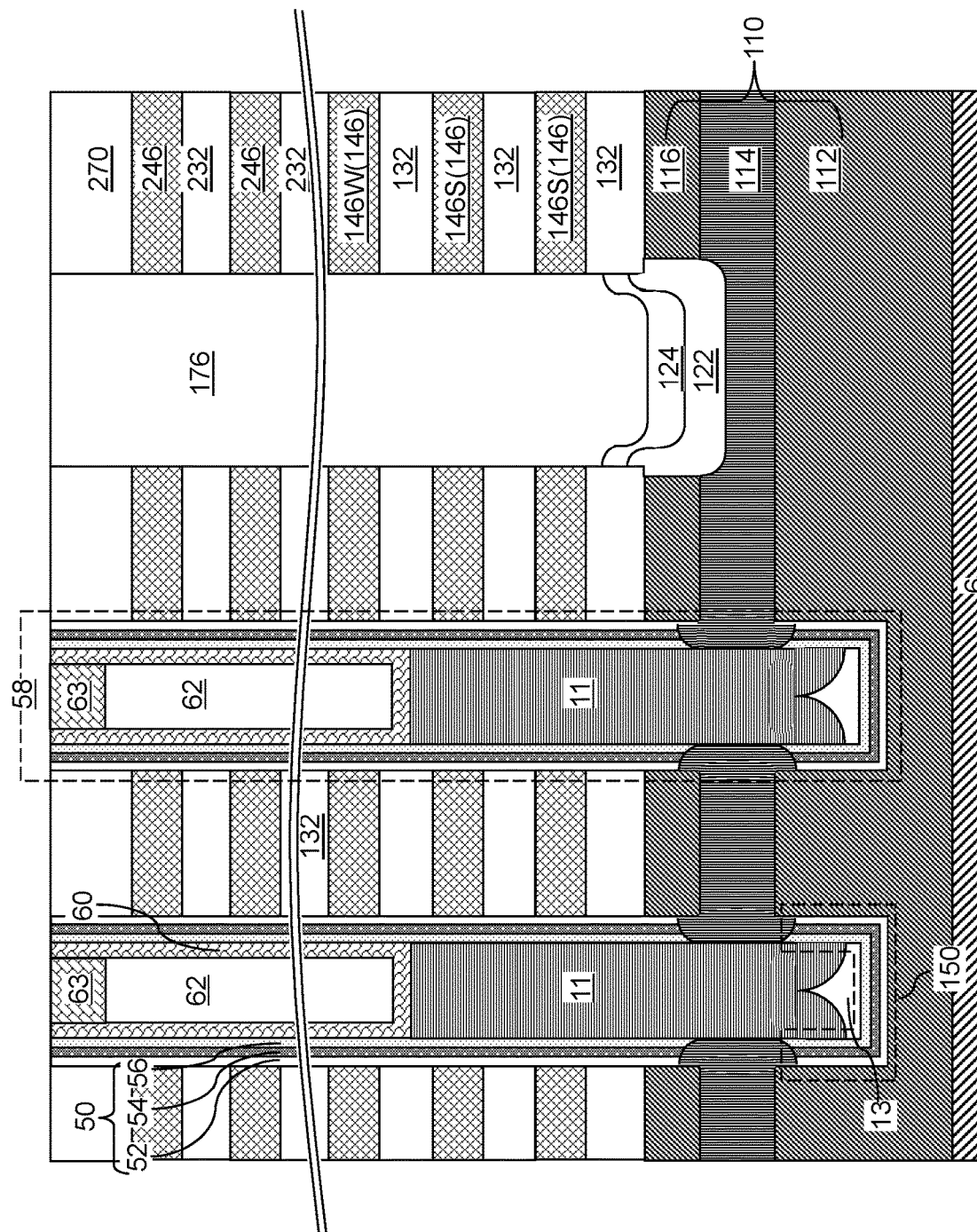
Figure 21:
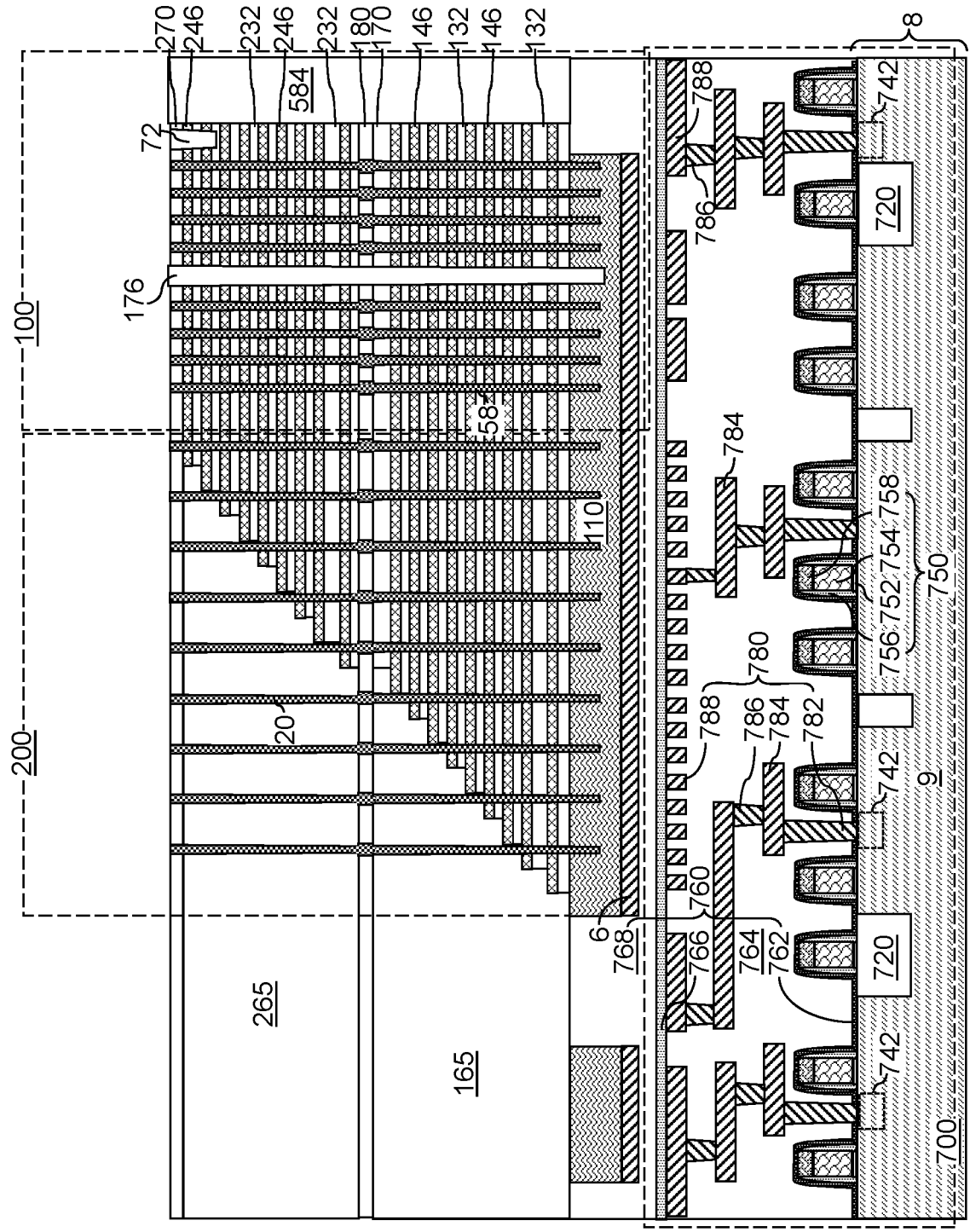
FIG. 21 is a vertical cross-sectional view of the first exemplary structure after formation of memory opening fill structures according to the first embodiment of the present disclosure.

Referring to FIGS. 20E and 21, the dielectric core layer 62L can be vertically recessed such that each patterned portion of the dielectric core layer 62L has a top surface at, or about, the horizontal plane including the bottom surface of the second insulating cap layer 270. Each remaining portion of the dielectric core layer 62L constitutes a dielectric core 62.

A doped semiconductor material having n-type doping may be deposited in the cavities overlying the dielectric cores 62. Portions of the deposited doped semiconductor material and the semiconductor channel material layer 60L that overlie the horizontal plane including the top surface of the second insulating cap layer 270 may be removed by a planarization process such as a chemical mechanical planarization (CMP) process. Each remaining portion of the n-doped semiconductor material constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The n-doped semiconductor material may be, for example, n-doped polysilicon or n-doped amorphous silicon. Each remaining portion of the semiconductor channel material layer 60L constitutes a vertical semiconductor channel 60.

Each contiguous combination of a pedestal channel portion 11 and a vertical semiconductor channel 60 constitutes a composite semiconductor channel (11, 60). A set of all material portions that fills a memory opening 49 constitutes a memory opening fill structure 58. Each memory opening fill structure 58 can include a memory film 50, a composite semiconductor channel (11, 60), a dielectric core 62, and a drain region 63. Each support pillar structure 20 may have a same set of structural components as a memory opening fill structure 58.

In case at least one of the first semiconductor material and the second semiconductor material is amorphous, an anneal process can be performed to crystallize the first semiconductor material and optionally the second semiconductor material (in case the second semiconductor material is amorphous). The pedestal channel portions 11 and the vertical semiconductor channel 60 can be annealed at an elevated temperature, which may be in a range from 800 degrees Celsius to 1,050 degrees Celsius. The duration of the anneal process may be in a range from 1 second to 1 hour depending on the anneal temperature. Any amorphous semiconductor material of the pedestal channel portions 11 and the vertical semiconductor channels 60 can be converted into a respective polycrystalline semiconductor material.

In case pedestal channel portion 11 is not in-situ doped with n-type dopant atoms and is doped with carbon atoms, an anneal process can be performed to induce diffusion of n-type electrical dopants from the source contact layer 114 into the pedestal channel portion 11. In this case, the carbon atoms cause the polycrystalline grains of the pedestal channel portions 11 to remain small. However, the vertical semiconductor channels 60 can have large grains (i.e., have a larger average grain size) to provide a higher electrical conductivity for charge carriers (such as electrons) during operation of the vertical NAND strings. According to an embodiment of the present disclosure, control of diffusion of n-type dopants in the pedestal channel portions 11 is facilitated by the smaller average grain size in the pedestal channel portions 11, and channel conductivity in the vertical semiconductor channels 60 is enhanced by larger grains of the vertical semiconductor channels 60. In this case, the n-type dopant atoms in the source contact layer 114 diffuse in the pedestal channel portions 11 at a lower diffusion rate than in the vertical semiconductor channels 60.

In one embodiment, the pedestal channel portions 11 can be polycrystalline and can have a first average grain size after crystallization annealing (if any), and the vertical semiconductor channels 60 can be polycrystalline and can have a second average grain size that is at least 50%, such as twice, such as three times, and/or at least six times, and/or at least ten times, such as three to fifteen times, the first average grain size. For example, the first average grain size may be in a range from 10 nm to 100 nm, and the second average grain size may be in a range from 100 nm to 1 micron, although lesser and greater dimensions may also be employed for each of the first average grain size and the second average grain size.

In one embodiment, the pedestal channel portions 11 are formed with in-situ arsenic and/or carbon doping in a polycrystalline form, and vertical semiconductor channels 60 may be formed in polycrystalline form. In this case, an anneal process is not necessary although an anneal process may be employed to increase the grain size of the second semiconductor material in the vertical semiconductor channels 60.

Generally, each pedestal channel portion 11 can have a cylindrical sidewall segment that contacts the source contact layer 114, and can include at least one of carbon and arsenic as dopant atoms at a first average dopant concentration. Each vertical semiconductor channel 60 can contact a top surface of the pedestal channel portion 11. Each vertical semiconductor channel 60 can include the carbon and/or arsenic dopant atoms at a second average dopant concentration that is less than 20%, and/or less than 5%, and/or less than 1%, and/or less than 0.3%, and/or less than 0.1%, and/or less than 0.03%, and/or less than 0.01%, and/or less than 0.003%, and/or less than 0.001%, of the first average carbon and arsenic dopant concentration, or can be free of the carbon and arsenic dopants atoms.

In one embodiment, each pedestal channel portion 11 comprises polysilicon containing carbon atoms at an average atomic concentration in a range from $5.0 \times 10^{17}$ atoms/cm$^3$ to $2.0 \times 10^{21}$ atoms/cm$^3$, and each vertical semiconductor channel 60 comprises polysilicon containing carbon atoms at an average atomic concentration less than $1.0 \times 10^{17}$ atoms/cm$^3$ or is free of carbon atoms. Additionally, each pedestal channel portion 11 can comprise n-type dopant atoms at an average atomic concentration in a range from $1.0 \times 10^{18}$ atoms/cm$^3$ to $1.0 \times 10^{20}$ atoms/cm$^3$, and each vertical semiconductor channel 60 can include n-type dopant atoms at an average atomic concentration of less than $1.0 \times 10^{17}$ atoms/cm$^3$, or can be free of n-type dopant atoms (e.g., the vertical semiconductor channel 60 is p-type or intrinsic).

In one embodiment, each pedestal channel portion 11 can comprise polysilicon containing arsenic atoms at an average atomic concentration in a range from $1.0 \times 10^{18}$ atoms/cm$^3$ to $1.0 \times 10^{20}$ atoms/cm$^3$, and each vertical semiconductor channel 60 can comprise polysilicon containing arsenic atoms at an average atomic concentration less than $1.0 \times 10^{17}$ atoms/cm$^3$, such as less than $1.0 \times 10^{15}$ atoms/cm$^3$, and/or less than $1.0 \times 10^{14}$ atoms/cm$^3$, or is free of arsenic atoms.

Figure 22A:
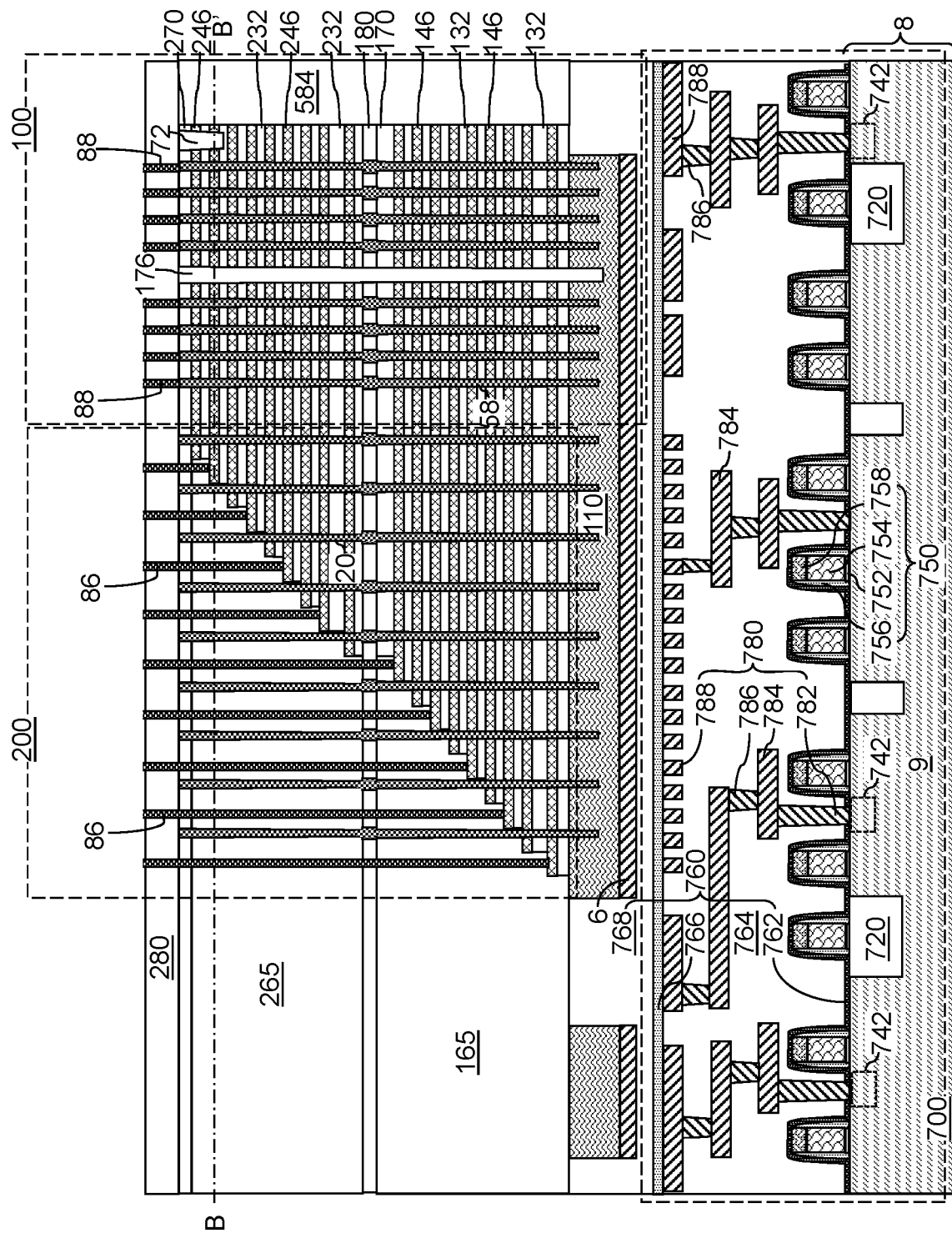
FIG. 22A is a vertical cross-sectional view of the first exemplary structure after formation of a contact-level dielectric layer and various contact via structures according to the first embodiment of the present disclosure.
Figure 22B:
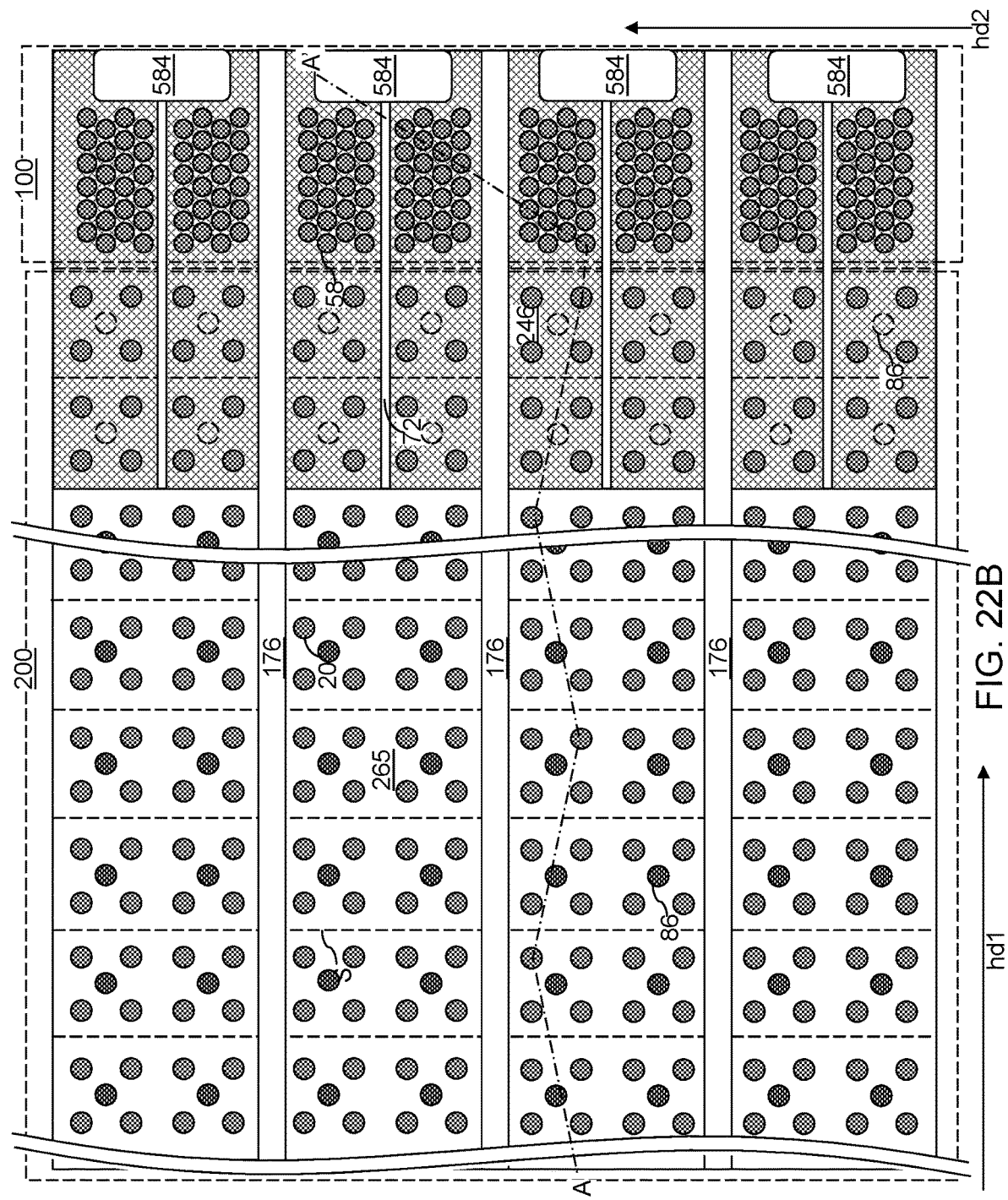
FIG. 22B is a horizontal cross-sectional view of the first exemplary structure along the vertical plane B-B' of FIG. 22A. The hinged vertical plane A-A' corresponds to the plane of the vertical cross-sectional view of FIG. 22A.

Referring to FIGS. 22A and 22B, a contact-level dielectric layer 280 can be formed over the second-tier structure (232, 242, 265, 72). The contact-level dielectric layer 280 includes a dielectric material such as silicon oxide, and may have a thickness in a range from 100 nm to 600 nm, although lesser and greater thicknesses may also be used.

A photoresist layer (not shown) may be applied over the contact-level dielectric layer 280, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the contact-level dielectric layer 280 and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory opening fill structures 58.

Figure 23:
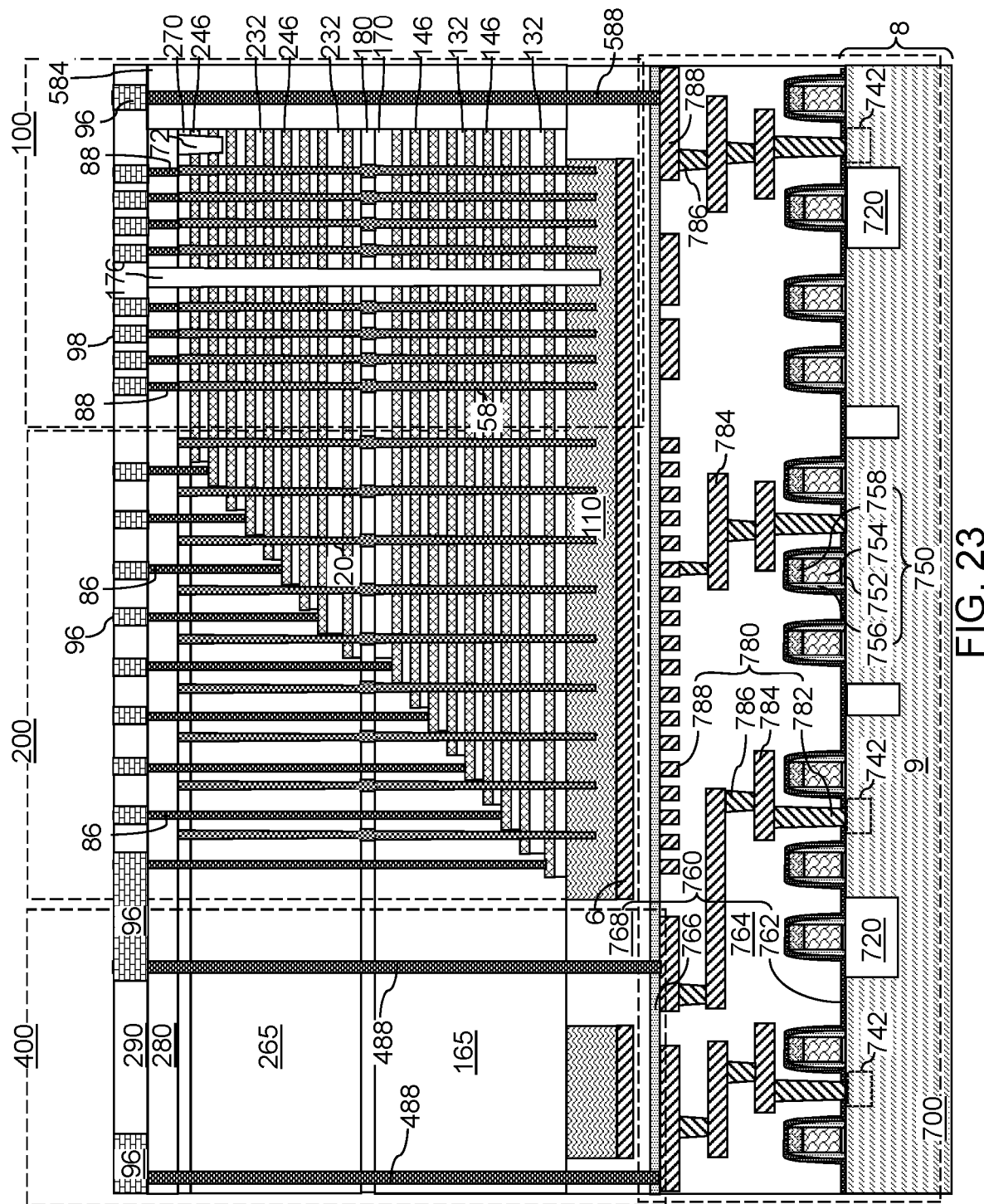
FIG. 23 is a vertical cross-sectional view of the first exemplary structure after formation of through-memory-level via structures and upper metal line structures according to the first embodiment of the present disclosure.

Referring to FIG. 23, peripheral-region via cavities may be formed through the contact-level dielectric layer 280, the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the contact-level dielectric layer 280. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layer 280, and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layer 280. The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of composite semiconductor channels (11, 60). Each composite semiconductor channel (11, 60) extends substantially perpendicular to a top surface of the substrate 8. The array of monolithic three-dimensional NAND strings comprises a plurality of charge storage elements (comprising portions of the memory films 50), each charge storage element located adjacent to a respective one of the vertical semiconductor channels 60.

Referring to FIGS. 1A-23 and according to various aspects of the first embodiment of the present disclosure, a three-dimensional memory device is provided, which comprises: an alternating stack of insulating layers (132, 232) and electrically conductive layers (146, 246) located over a substrate 8; a source contact layer 114 located between the substrate 8 and the alternating stack {(132, 146), (232, 246)}; a memory opening 49 vertically extending through the alternating stack {(132, 146), (232, 246)} and the source contact layer 114; and a memory opening fill structure 58 located within the memory opening 49 and comprising a composite semiconductor channel (11, 60) and a memory film 50 laterally surrounding the composite semiconductor channel (11, 60), wherein the composite semiconductor channel (11, 60) comprises: a pedestal channel portion 11 having a cylindrical sidewall segment that contacts the source contact layer 114 and including at least one of carbon or arsenic dopant atoms at a first average dopant concentration; and a vertical semiconductor channel 60 contacting a top surface of the pedestal channel portion 11, wherein the vertical semiconductor channel 60 includes the at least one of carbon or arsenic dopant atoms at a second average dopant concentration that is less than 20% of the first average dopant concentration or is free of the at least one of carbon or arsenic dopants atoms.

In one embodiment, the memory film 50 comprises a concave annular bottom surface segment that contacts the source contact layer 114; and an outer periphery of the concave annular bottom surface is located at a greater vertical distance from the substrate 8 than an inner periphery of the concave annular bottom surface is from the substrate 8.

In one embodiment, an upper source-level semiconductor layer 116 is located between the source contact layer 114 and the alternating stack {(132, 146), (232, 246)}; the electrically conductive layers (146, 246) comprise: source-select-level electrically conductive layers 146S located below a horizontal plane including an outer periphery of the top surface of the pedestal channel portion 11, and word-line-level electrically conductive layers (146W, 246) located above the horizontal plane including the outer periphery of the top surface of the pedestal channel portion 11; and the memory opening 49 vertically extends through the source-select-level electrically conductive layers 146S, the word-line-level electrically conductive layers (146W, 246), and the upper source-level semiconductor layer 116 with a straight sidewall.

In one embodiment, the pedestal channel portion 60 contacts the source contact layer 114 at a cylindrical interface located within a cylindrical vertical plane located at, or inside, an inner sidewall of the memory film 50. In one embodiment, the memory opening fill structure 58 comprises a bottom dielectric cap structure 150 having a same set of material compositions as component layers of the memory film 50, and underlying the pedestal channel portion 11. In one embodiment, the bottom dielectric cap structure 150 comprises a concave annular surface that contacts the source contact layer 114. In one embodiment, a bottom periphery of an outer sidewall of the memory film 50 and a top periphery of an outer sidewall of the bottom dielectric cap structure 150 have a same horizontal cross-sectional shape and overlap with each other in a plan view.

In one embodiment, the memory opening fill structure 58 comprises a void 13 that is free of any solid phase material between the bottom dielectric cap structure 150 and the pedestal channel portion 11. In one embodiment, the void 13 comprises a tapered concave upper boundary at an interface with a tapered convex bottom surface of the pedestal channel portion 11; and the void 13 has a greater height at a center portion than at a peripheral portion that laterally surrounds the center portion. In one embodiment, each of the memory film 50 and the bottom dielectric cap structure 150 comprises a layer stack including, from one side to another, a blocking dielectric layer 52, a charge storage layer 54, and a tunneling dielectric layer 56.

In one embodiment, the pedestal channel portion 11 comprises polysilicon containing carbon atoms at an average atomic concentration in a range from $5.0 \times 10^{17}$ atoms/cm$^3$ to $2.0 \times 10^{21}$ atoms/cm$^3$; and the vertical semiconductor channel 60 comprises polysilicon containing carbon atoms at an average atomic concentration less than $1.0 \times 10^{17}$ atoms/cm$^3$ or is free of carbon atoms. In one embodiment, the pedestal channel portion 11 comprises n-type dopant atoms at an average atomic concentration in a range from $1.0 \times 10^{18}$ atoms/cm$^3$ to $1.0 \times 10^{20}$ atoms/cm$^3$; and the vertical semiconductor channel 60 includes n-type dopant atoms at an average atomic concentration of than $1.0 \times 10^{17}$ atoms/cm$^3$, or is free of n-type dopant atoms.

In one embodiment, the pedestal channel portion 11 comprises polysilicon containing arsenic atoms at an average atomic concentration in a range from $1.0 \times 10^{18}$ atoms/cm$^3$ to $1.0 \times 10^{20}$ atoms/cm$^3$; and the vertical semiconductor channel 60 comprises polysilicon containing arsenic atoms at an average atomic concentration less than $1.0 \times 10^{17}$ atoms/cm$^3$ or is free of arsenic atoms.

In one embodiment, the pedestal channel portion 11 is polycrystalline and has a first average grain volume; and the vertical semiconductor channel 60 is polycrystalline and has a second average grain volume that is at least three times the first average grain volume.

FIGS. 24A-24I illustrate sequential vertical cross-sectional views of a memory opening 49 in a second exemplary structure during formation of a memory opening fill structure according to a second embodiment of the present disclosure. In the second embodiment, the source-level sacrificial layer 104' is employed in lieu of the source-level sacrificial layer 104 of the first embodiment. The source-level sacrificial layer 104' of the second embodiment includes a dielectric material such as silicon nitride, undoped silicate glass, or a doped silicate glass. The second exemplary structure at the processing steps of FIG. 24A can be the same as the first exemplary structure at the processing steps of FIG. 9A except that the material composition of the source-level sacrificial layer 104' being a dielectric material that suppresses growth of a semiconductor material therefrom in a subsequent selective semiconductor deposition process.

Referring to FIG. 24B, a selective semiconductor deposition process can be performed to grow a semiconductor material from physically exposed surfaces of the upper source-level semiconductor layer 116 and the lower source-level semiconductor layer 112. For example, a semiconductor-containing precursor gas (such as $SiH_4$, $SiH_2Cl_2$, $SiHCl_3$, $Si_2H_6$, $Ge_2H_6$, etc.) and a gas phase etchant gas (such as HCl) may be flowed simultaneously or alternately into a process chamber after placing the second exemplary structure into the process chamber.

A semiconductor constriction ring 216 grows from each physically exposed cylindrical surface of the upper source-level semiconductor layer 116, and a semiconductor constriction cap structure 212 grows from each physically exposed surface of the lower source-level semiconductor layer 112 during the selective semiconductor deposition process inside each memory opening. The semiconductor constriction rings 216 and the semiconductor constriction cap structures 212 include a same semiconductor material, such as polysilicon or amorphous silicon, which may be doped or undoped. The semiconductor constriction rings 216 and the semiconductor constriction cap structures 212 grow inward from the sidewall of a respective memory opening 49, and thus, laterally constrict remaining volumes of the memory openings 49. Each semiconductor constriction ring 216 is formed with a respective annular shape, i.e. a ring shape, and is topologically homeomorphic to a torus. Each semiconductor constriction cap structures 212 is formed as a unitary structure without an opening therein in a configuration of a plate with an attached overlying cylindrical portion, and thus, is topologically homeomorphic to a sphere. The duration of the selective semiconductor deposition process is selected such that the lateral thickness of each semiconductor constriction ring 216 is not greater than the radius of each memory opening 49 (or one half of a maximum lateral dimension of each memory opening 49 along a widthwise direction) less the total thickness of a memory film to be subsequently formed. For example, each semiconductor constriction ring 216 can have a lateral thickness in a range from 5% to 30% of the radius of each memory opening 49 (or one half of a maximum lateral dimension of each memory opening 49 along a widthwise direction).

In one embodiment, each semiconductor constriction ring 216 can comprise an outer cylindrical surface that contacts a sidewall of a bottommost one of the insulating layers (such as a bottommost first insulating layer 32) and a sidewall of the source-level sacrificial layer 104'. Each semiconductor constriction ring 216 can comprise an inner surface that includes an upper annular convex surface segment, a lower annular convex surface segment, and a cylindrical surface segment that connects the upper annular convex surface segment and the lower annular convex surface segment.

Each semiconductor constriction cap structure 212 can contact a planar surface (which may be a horizontal surface) and a cylindrical surface of the lower source-level semiconductor layer 112. Each semiconductor constriction cap structure 212 can have a same material composition as the semiconductor constriction rings 216. Each semiconductor constriction cap structure 212 can comprise a cylindrical portion and a plate portion adjoined to a bottom end of the cylindrical portion.

Referring to FIG. 24C, the processing steps of FIG. 9B can be performed to form a memory film 50. The memory film 50 can be conformally formed over the physically exposed surfaces of the memory openings 49 and the support openings 19 and over each semiconductor constriction cap structure 212 and over each semiconductor constriction ring 216. The memory film 50 can have a contoured vertical cross-sectional profile in each memory opening 49 (and in each support opening 19) due to the presence of the semiconductor constriction cap structures 212 and the semiconductor constriction rings 216. Generally, the memory film 50 can be formed at a peripheral portion of each memory opening 49 over the semiconductor constriction rings 216. A cavity 49' is present within each memory opening 49 and within each support opening 19.

Referring to FIG. 24D, a first semiconductor material can be conformally deposited by performing a non-selective semiconductor deposition process. The non-selective semiconductor deposition process can include, for example, a low pressure chemical vapor deposition (LPCVD) process. A first semiconductor channel material layer 11L can be formed on physically exposed surfaces of the memory film 50 by conformal deposition of the first semiconductor material. The first semiconductor material can include any material that can be employed as the first semiconductor material of the pedestal channel portions 11 at the processing steps of FIG. 20C in the first exemplary structure. As such, the first semiconductor material may comprise n-type polysilicon or amorphous silicon doped with carbon and/or arsenic.

In one embodiment, first semiconductor channel material layer 11L may be deposited as an amorphous material that is subsequently crystallized into a polycrystalline semiconductor material. According to an aspect of the present disclosure, the first semiconductor material of the first semiconductor channel material layer 11L may be deposited with in-situ doping of carbon atoms. In case in-situ doping of carbon atoms is employed to deposit the first semiconductor channel material layer 11L, the non-selective semiconductor deposition process can flow a carbon dopant gas such as methane, ethane, ethylene, acetylene, etc. concurrently with flow of the silicon-containing precursor gas. The average atomic concentration of carbon atoms in the first semiconductor channel material layer 11L may be in a range from $5.0 \times 10^{17}$ atoms/cm$^3$ to $2.0 \times 10^{21}$ atoms/cm$^3$, such as from $2.0 \times 10^{18}$ atoms/cm$^3$ to $1.0 \times 10^{21}$ atoms/cm$^3$, and/or from $1.0 \times 10^{19}$ atoms/cm$^3$ to $1.0 \times 10^{20}$ atoms/cm$^3$, although lesser and greater atomic concentrations can also be employed. The carbon atoms hinder growth of large grains during crystallization of the amorphous material of the first semiconductor channel material layer 11L during a subsequent anneal process. Reduction of the average grain size in the first semiconductor channel material layer 11L induces formation of a large number of grain boundaries in a subsequent anneal process in remaining portions of the first semiconductor channel material layer 11L. The dense network of grain boundaries in remaining portions of the first semiconductor channel material layer 11L reduces the diffusion rate of dopant atoms such as n-type dopant atoms provided in the source contact layer 114. Thus, control of diffusion of n-type dopants in the remaining portions of the first semiconductor channel material layer 11L can be enhanced due to the presence of carbon atoms in the remaining portions of the first semiconductor channel material layer 11L during the anneal process.

According to another aspect of the present disclosure, the first semiconductor material of the first semiconductor channel material layer 11L may be deposited with in-situ doping of arsenic atoms. In case in-situ doping of arsenic atoms is employed to deposit the first semiconductor channel material layer 11L, the non-selective semiconductor deposition process can flow an arsenic-containing dopant gas such as arsine (AsH$_3$) concurrently with flow of the silicon-containing precursor gas. The average atomic concentration of arsenic atoms in the first semiconductor channel material layer 11L may be in a range from $1.0 \times 10^{18}$ atoms/cm$^3$ to $1.0 \times 10^{20}$ atoms/cm$^3$, such as from $2.0 \times 10^{18}$ atoms/cm$^3$ to $2.0 \times 10^{19}$ atoms/cm$^3$, although lesser and greater atomic concentrations can also be employed. The arsenic atoms provide in-situ n-type doping of the first semiconductor channel material layer 11L. Each remaining portion of the first semiconductor channel material layer 11L can function as an extension of a source region for a vertical field effect transistor that is formed within each memory opening 49. Each remaining portion of the first semiconductor channel material layer 11L, as doped with n-type dopants, provides a path for gate-induced drain leakage (GIDL) current generation during an erase operation of the three-dimensional NAND memory array to be formed.

The duration of the non-selective semiconductor deposition process that forms the first semiconductor channel material layer 11L can be selected such that a portion of the first semiconductor material deposited within a region laterally surrounded by the semiconductor constriction ring 216 is plugged with the first semiconductor material within each memory opening 49. An optional void (i.e., air gap) 107 can be formed within each memory opening 49 at the level of the source-level sacrificial layer 104'.

Referring to FIG. 24E, an isotropic etch process can be performed to etch back portions of the first semiconductor channel material layer 11L located above the constriction zones of the first semiconductor channel material layer 11L laterally surrounded by the semiconductor constriction rings 216. The duration of the isotropic etch process may be selected to physically expose the memory film 50 at least from above the horizontal plane including the bottom surface of the bottommost one of the sacrificial material layers 142. Portions of the first semiconductor material can be removed from above the region laterally surrounded by the semiconductor constriction ring 216 in each memory opening 49 by performing an isotropic etch back process. Each remaining portion of the first semiconductor channel material layer 11L located at a bottom portion of a respective memory opening 49 constitutes a pedestal channel portion 11, which can have the same material composition as any configuration of the pedestal channel portion 11 as provided at the processing steps of FIG. 20C.

In one embodiment, each pedestal channel portion 11 of the second embodiment may be formed by conformally depositing the first semiconductor material on the memory film with in-situ carbon doping, and removing portions of the first semiconductor material from above the semiconductor constriction rings 216. In one embodiment, each pedestal channel portion 11 of the second embodiment may be formed by conformally depositing the first semiconductor material on the memory film with in-situ arsenic doping, and removing portions of the first semiconductor material from above the semiconductor constriction rings 216.

Referring to FIG. 24F, a selective semiconductor material deposition process can be performed to grow a pillar channel portion 311 including a doped semiconductor material (e.g., n-type doped polysilicon or amorphous silicon) from each physically exposed top surface of the pedestal channel portions 11. The selective semiconductor material deposition process employed to form the pillar channel portions 311 can be the same as any of the selective semiconductor deposition processes that may be employed to form the pedestal channel portions at the processing steps of FIG. 20C in the first exemplary structure. The doped semiconductor material in the pillar channel portions 311 may have the same material composition as, or may have a material composition that is different from, the pedestal channel portions 11.

In one embodiment, the pillar channel portions 311 may be deposited as an amorphous material (e.g., amorphous silicon) that is subsequently crystallized into a polycrystalline semiconductor material (e.g., polysilicon). According to an aspect of the present disclosure, the doped semiconductor material of the pillar channel portions 311 may be deposited with in-situ doping of carbon atoms. In case in-situ doping of carbon atoms is employed to deposit the pillar channel portions 311, the selective semiconductor deposition process can flow a carbon dopant gas such as methane, ethane, ethylene, acetylene, etc. concurrently with flow of the silicon-containing precursor gas. The average atomic concentration of carbon atoms in the pillar channel portions 311 may be in a range from $5.0\times10^{17}$ atoms/cm$^3$ to $2.0\times10^{21}$ atoms/cm$^3$, such as from $2.0\times10^{18}$ atoms/cm$^3$ to $1.0\times10^{21}$ atoms/cm$^3$, and/or from $1.0\times10^{19}$ atoms/cm$^3$ to $1.0\times10^{20}$ atoms/cm$^3$, although lesser and greater atomic concentrations can also be employed. The carbon atoms hinder growth of large grains during crystallization of the amorphous material of the pillar channel portions 311 during a subsequent anneal process. Reduction of the average grain size in the pillar channel portions 311 induces formation of a large number of grain boundaries, which occupies a large volume fraction of each pillar channel portion 311 after the anneal process. The dense network of grain boundaries in the pillar channel portions 311 reduces the diffusion rate of dopant atoms such as n-type dopant atoms provided in the source contact layer 114. Thus, control of diffusion of n-type dopants in the pillar channel portions 311 can be enhanced due to the presence of carbon atoms in the pillar channel portions 311.

According to another aspect of the present disclosure, the doped semiconductor material of the pillar channel portions 311 may be deposited with in-situ doping of arsenic atoms. In case in-situ doping of arsenic atoms is employed to deposit the pillar channel portions 311, the selective semiconductor deposition process can flow an arsenic-containing dopant gas such as arsine (AsH$_3$) concurrently with flow of the silicon-containing precursor gas. The average atomic concentration of arsenic atoms in the pillar channel portions 311 may be in a range from $1.0\times10^{18}$ atoms/cm$^3$ to $1.0\times10^{20}$ atoms/cm$^3$, such as from $3.0\times10^{18}$ atoms/cm$^3$ to $3.0\times10^{19}$ atoms/cm$^3$, although lesser and greater atomic concentrations can also be employed. The arsenic atoms provide in-situ n-type doping to the pillar channel portions 311, which functions as an extension of a source region for a vertical field effect transistor that is formed within each memory opening 49. The pillar channel portions 311, as doped with n-type dopants, provide the paths for gate-induced drain leakage (GIDL) current generation during an erase operation of the three-dimensional NAND memory array to be formed.

The duration of the selective semiconductor deposition process is selected such that the top surface of each pillar channel portion 311 is formed above the sacrificial material layer 142 that will be replaced with a topmost source-select-level electrically conductive layer 146S and below the sacrificial material layer 142 that will be replaced with the bottommost word-line-level electrically conductive layer 146W that will be subsequently formed in the second exemplary structure.

Referring to FIG. 24G, a non-selective semiconductor deposition process can be performed to deposit a second semiconductor material to form a semiconductor channel material layer 60L. The second semiconductor material can includes a p-doped semiconductor material or an undoped semiconductor material, i.e., a semiconductor material that is not intentionally doped. The undoped semiconductor material may be intrinsic, or may include electrical dopants at an atomic concentration less than $1.0\times10^{16}$/cm$^3$, and/or less than $1.0\times10^{15}$/cm$^3$. The second semiconductor material of the semiconductor channel material layer 60L may include at least one elemental semiconductor material (e.g., amorphous silicon or polysilicon), at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used.

Generally, the second semiconductor material may be free of carbon atoms, or may include carbon atoms at an average atomic concentration less than $1.0 \times 10^{17}$ atoms/$cm^3$, and/or less than $1.0 \times 10^{16}$ atoms/$cm^3$, and/or less than $1.0 \times 10^{15}$ atoms/$cm^3$, and/or less than $1.0 \times 10^{14}$ atoms/$cm^3$, and/or less than $1.0 \times 10^{13}$ atoms/$cm^3$. The semiconductor channel material layer 60L can be formed by non-selectively depositing the second semiconductor material over the pillar channel portions 311 and on the memory films 50. The second semiconductor material is deposited without in-situ doping of carbon atoms and without in-situ doping of any n-type dopant atoms. The second semiconductor material may be deposited with in-situ doping of p-type dopant atoms, or may be deposited without in-situ doping of any type of dopant atoms.

Referring to FIG. 24H, a dielectric core layer 62L may be deposited in the cavities that remain in the memory openings 49 that are not filled with the semiconductor channel material layer 60L. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Figure 24I:
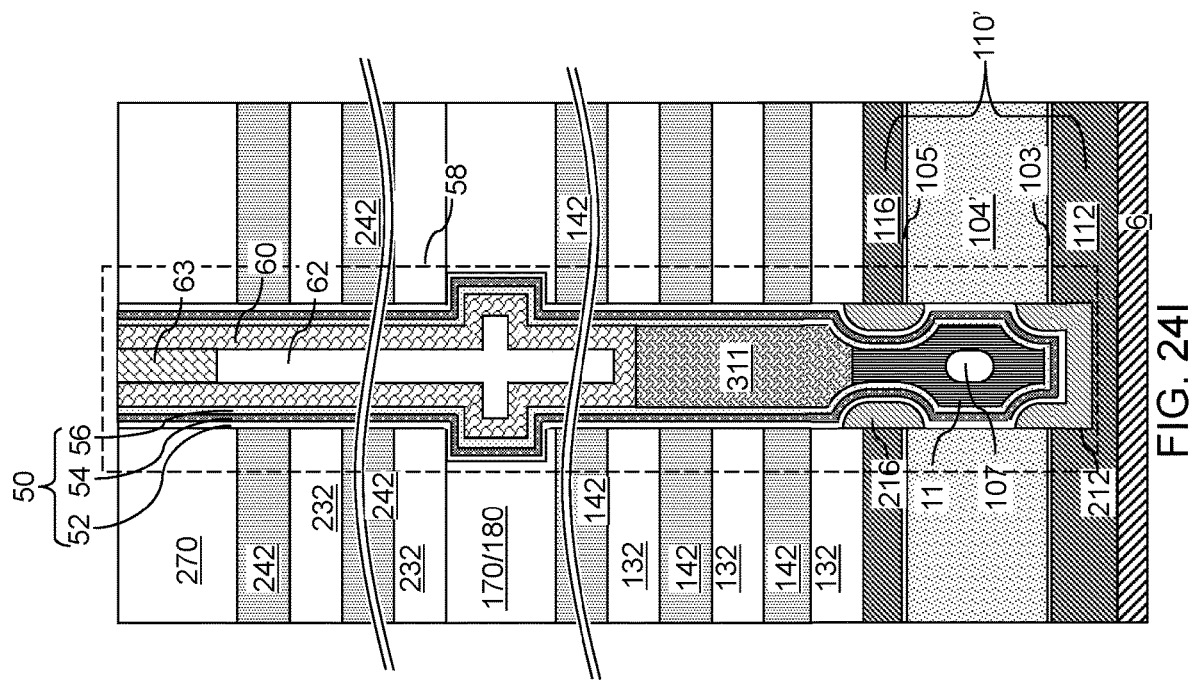

Referring to FIG. 24I, the dielectric core layer 62L can be vertically recessed such that each patterned portion of the dielectric core layer 62L has a top surface at, or about, the horizontal plane including the bottom surface of the second insulating cap layer 270. Each remaining portion of the dielectric core layer 62L constitutes a dielectric core 62.

A doped semiconductor material having n-type doping may be deposited in the cavities overlying the dielectric cores 62. Portions of the deposited doped semiconductor material and the semiconductor channel material layer 60L that overlie the horizontal plane including the top surface of the second insulating cap layer 270 may be removed by a planarization process such as a chemical mechanical planarization (CMP) process. Each remaining portion of the n-doped semiconductor material constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The n-doped semiconductor material may be, for example, n-doped polysilicon or n-doped amorphous silicon. Each remaining portion of the semiconductor channel material layer 60L constitutes a vertical semiconductor channel 60.

Each contiguous combination of a pedestal channel portion 11, a pillar channel portion 311, and a vertical semiconductor channel 60 constitutes a composite semiconductor channel (11, 311, 60). A set of all material portions that fills a memory opening 49 constitutes a memory opening fill structure 58. Each memory opening fill structure 58 can include, a semiconductor constriction ring 216, a semiconductor constriction cap structure 212, a memory film 50, a composite semiconductor channel (11, 311, 60), a dielectric core 62, and a drain region 63. Each support pillar structure 20 may have a same set of structural components as a memory opening fill structure 58.

Figure 25:
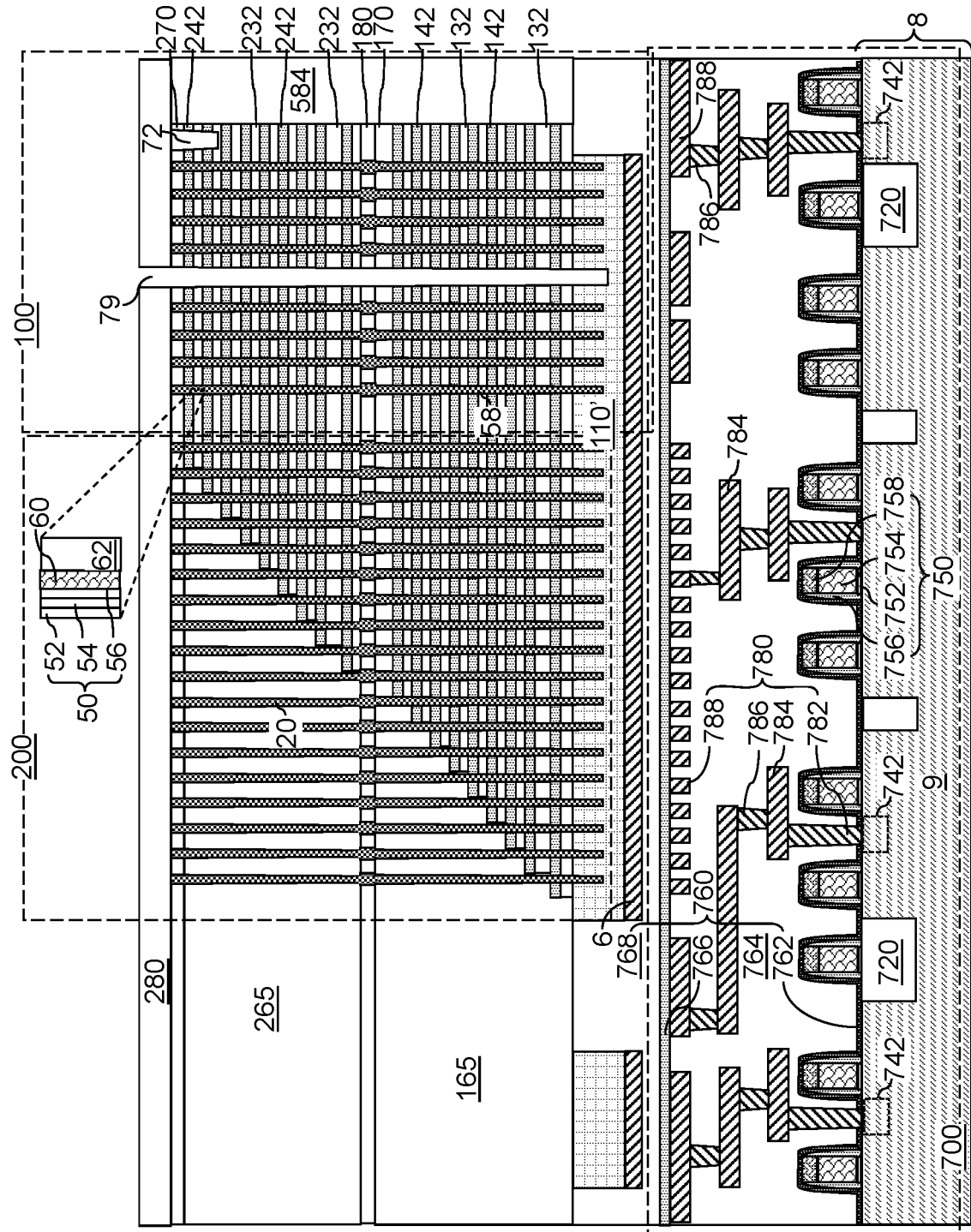
FIG. 25 is a vertical cross-sectional view of the second exemplary structure after formation of a first contact-level dielectric layer and backside trenches according to the second embodiment of the present disclosure.

Referring to FIG. 25, a contact-level dielectric layer 280 can be formed over the second-tier structure (232, 242, 265, 72). The contact-level dielectric layer 280 includes a dielectric material such as silicon oxide, and may have a thickness in a range from 100 nm to 600 nm, although lesser and greater thicknesses may also be used.

A photoresist layer may be applied over the contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the second-tier structure (232, 242, 270, 265, 72, 280) and the first-tier structure (132, 142, 170, 165), and into the in-process source-level material layers 110'. Portions of the second-tier structure (232, 242, 270, 265, 72, 280), the first-tier structure (132, 142, 170, 165), and the in-process source-level material layers 110' that underlie the openings in the photoresist layer may be removed to form the backside trenches 79. The clusters of memory opening fill structures 58 may be laterally spaced apart along the second horizontal direction hd2 by the backside trenches 79.

FIGS. 26A-26E illustrate sequential vertical cross-sectional views of a pair of memory openings and a backside trench during formation of a source contact layer according to the second embodiment of the present disclosure.

Figure 26A:
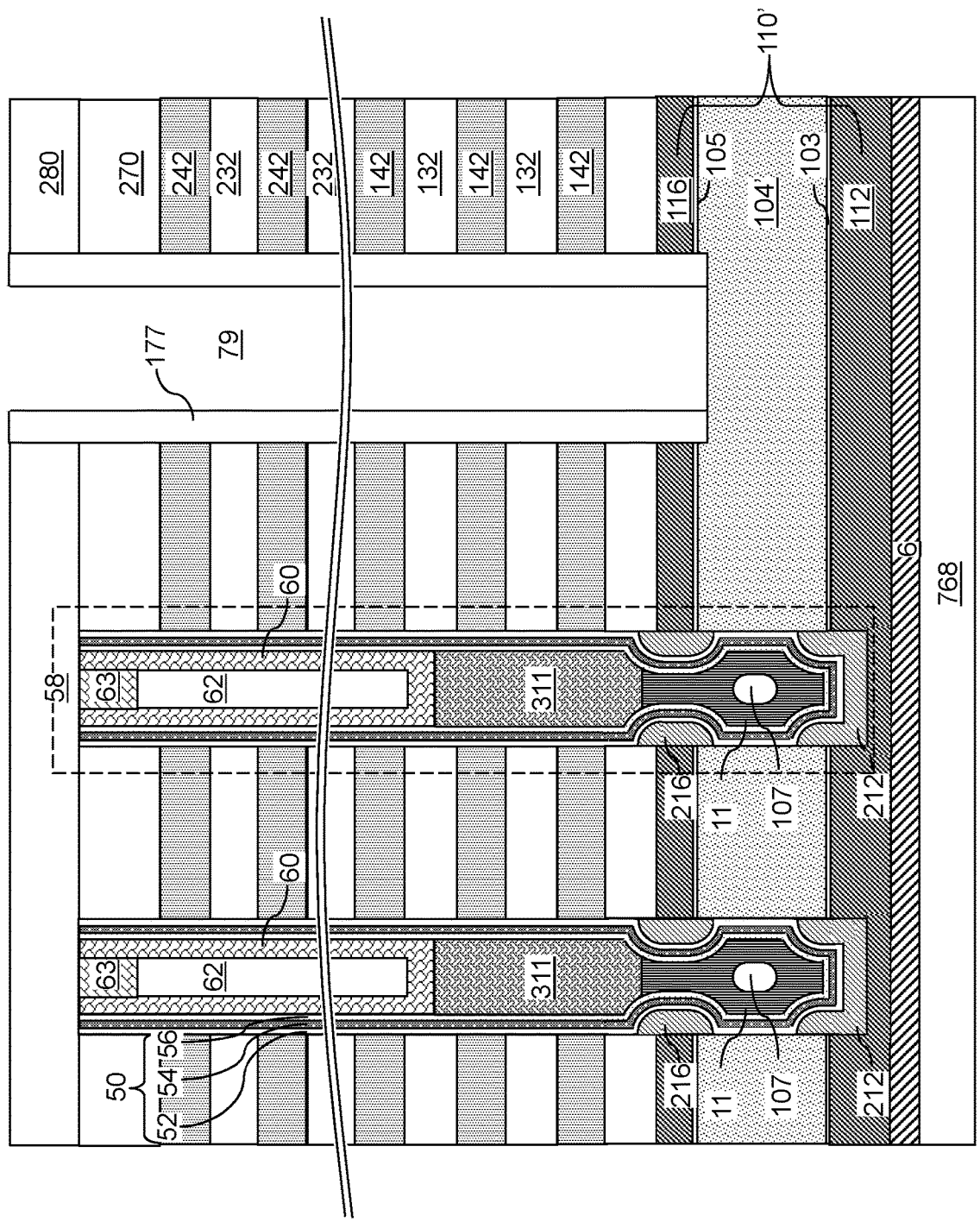
FIGS. 26A-26E illustrate sequential vertical cross-sectional views of a pair of memory openings and a backside trench during formation of a source contact layer according to the second embodiment of the present disclosure.

Referring to FIG. 26A, a backside trench spacer 177 may be formed on sidewalls of each backside trench 79. For example, a conformal spacer material layer may be deposited in the backside trenches 79 and over the second-tier structure (232, 242, 270, 265, 72, 280), and may be anisotropically etched to form the backside trench spacers 177. The backside trench spacers 177 include a material that is different from the material of the source-level sacrificial layer 104'. For example, if the source-level sacrificial layer 104' includes silicon nitride, the backside trench spacers 77 may include silicon oxide or a semiconductor material (such as polysilicon). If the source-level sacrificial layer 104' includes borosilicate glass, the backside trench spacers 77 may include silicon nitride or a semiconductor material (such as polysilicon).

Figure 26B:
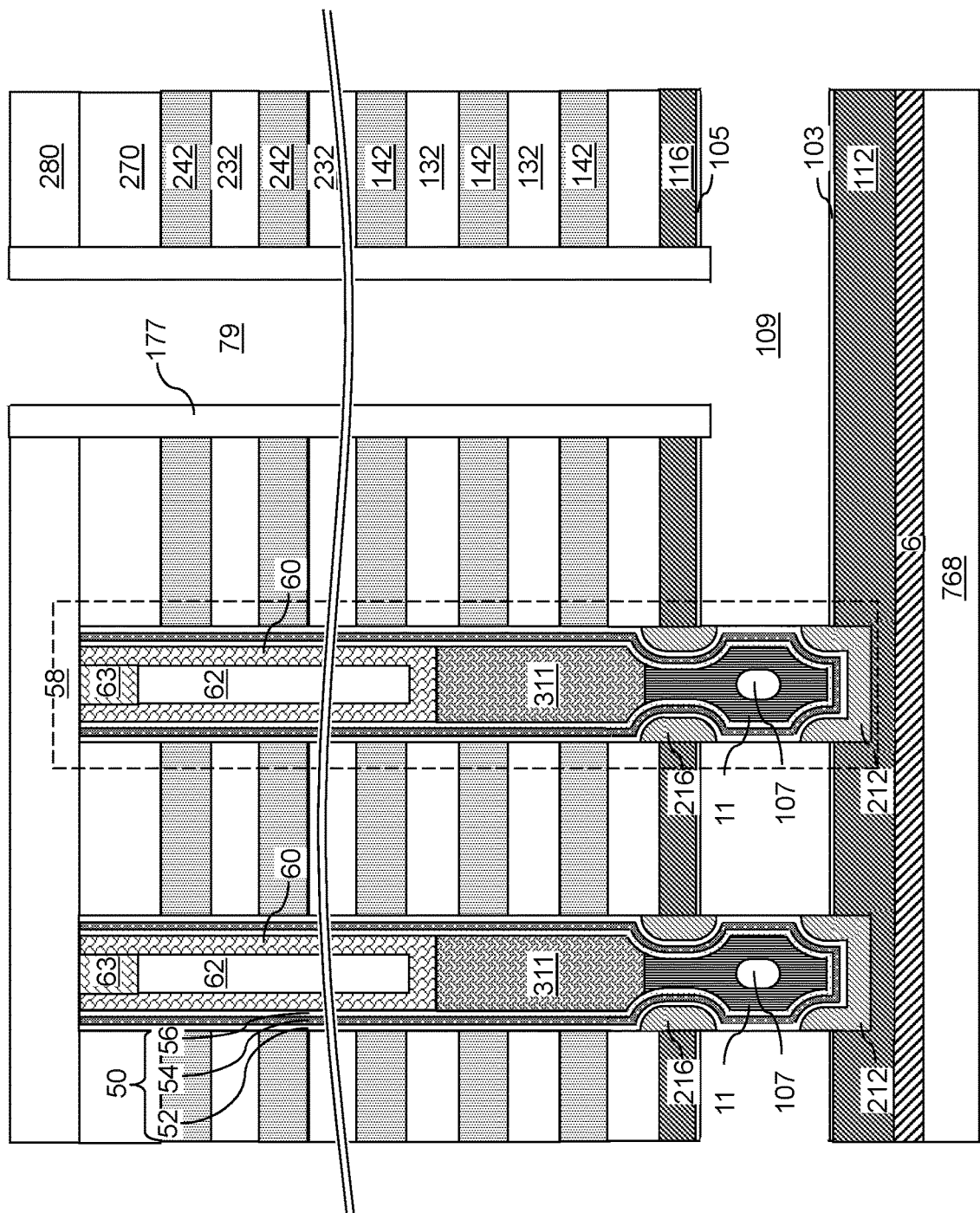

Referring to FIG. 26B, an etchant that etches the material of the source-level sacrificial layer 104' selective to the materials of the contact-level dielectric layer 280, the backside trench spacers 177, the semiconductor constriction rings 216, and the semiconductor constriction cap structures 212, and optionally selective to the upper sacrificial liner 105 and the lower sacrificial liner 103 may be introduced into the backside trenches in an isotropic etch process. For example, if the source-level sacrificial layer 104' includes silicon nitride, the backside trench spacers 177 include silicon oxide or a semiconductor material, and the upper and lower sacrificial liners (105, 103) include silicon oxide, a wet etch process employing hot phosphoric acid may be used to remove the source-level sacrificial layer 104' selective to the backside trench spacers 177 and the upper and lower sacrificial liners (105, 103). In case the source-level sacrificial layer 104' includes borosilicate glass, a wet etch process employing hydrofluoric acid may be employed. A source cavity 109 is formed in the volume from which the source-level sacrificial layer 104 is removed.

Figure 26C:
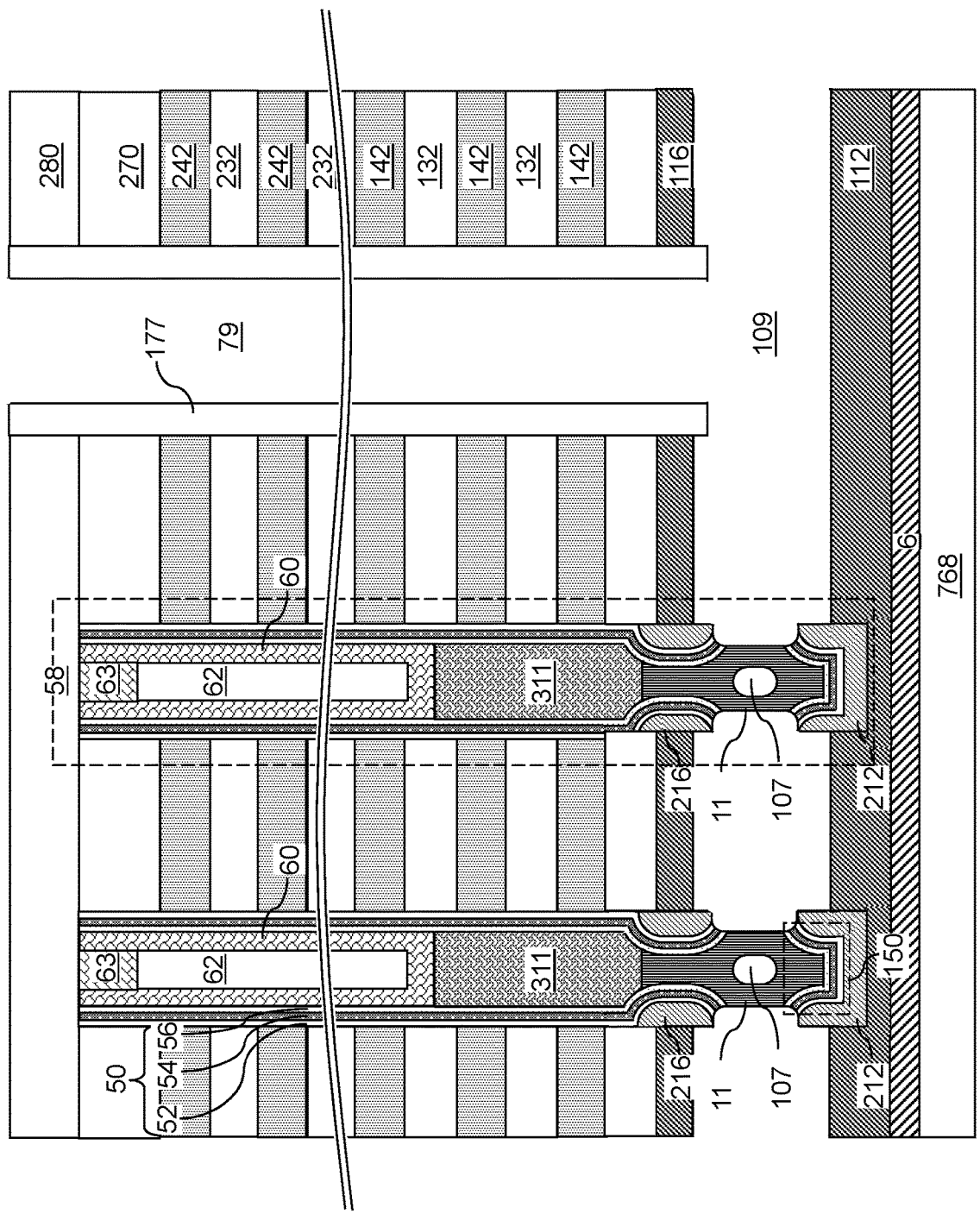

Referring to FIG. 26C, a sequence of isotropic etchants, such as wet etchants, may be applied to the physically exposed portions of the memory films 50 to sequentially etch the various component layers of the memory films 50 from outside to inside, and to physically expose cylindrical surfaces of the pedestal channel portions 11 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104' and a bottom portion of each of the memory films 50 selective to at least one source-level semiconductor layer (such as the lower source-level semiconductor layer 112 and the upper source-level semiconductor layer 116) and the pedestal channel portions 11.

Generally, the source cavity 109 can be formed by removing the source-level sacrificial layer 104 and a cylindrical portion of each memory film 50 located at the level of the source-level sacrificial layer 104'. A bottom portion of each memory film 50 is detached from a predominant remaining portion of the memory film 50 upon removal of the cylindrical portion of the memory film 50. The detached bottom portion of each memory film 50 is herein referred to as a bottom dielectric cap structure 150. Each bottom dielectric cap structure 150 can have the same set of material compositions as component layers of the overlying memory film 50. In one embodiment, each of the memory film 50 and each bottom dielectric cap structure 150 can comprise a respective layer stack including, from one side to another, a blocking dielectric layer 52, a charge storage layer 54, and a tunneling dielectric layer 56. In one embodiment, each bottom dielectric cap structure 150 comprises a concave annular surface that is formed due to the isotropic nature of the etch process employed to form the source cavity 109. Each bottom dielectric cap structure 150 can contact a bottom surface of a pedestal channel portion 11. Each semiconductor constriction cap structure 212 can comprise a cylindrical portion and a plate portion adjoined to a bottom end of the cylindrical portion. In one embodiment, a top surface of the plate portion of the semiconductor constriction cap structure 212 contacts a bottom surface of a bottom dielectric cap structure 150. An inner cylindrical surface of the cylindrical portion of the semiconductor constriction cap structure 212 contacts a cylindrical surface of the bottom dielectric cap structure 150. The bottom dielectric cap structure 150 can comprise a concave annular surface that contacts the source contact layer 114 that is deposited in the subsequent step.

Figure 26D:
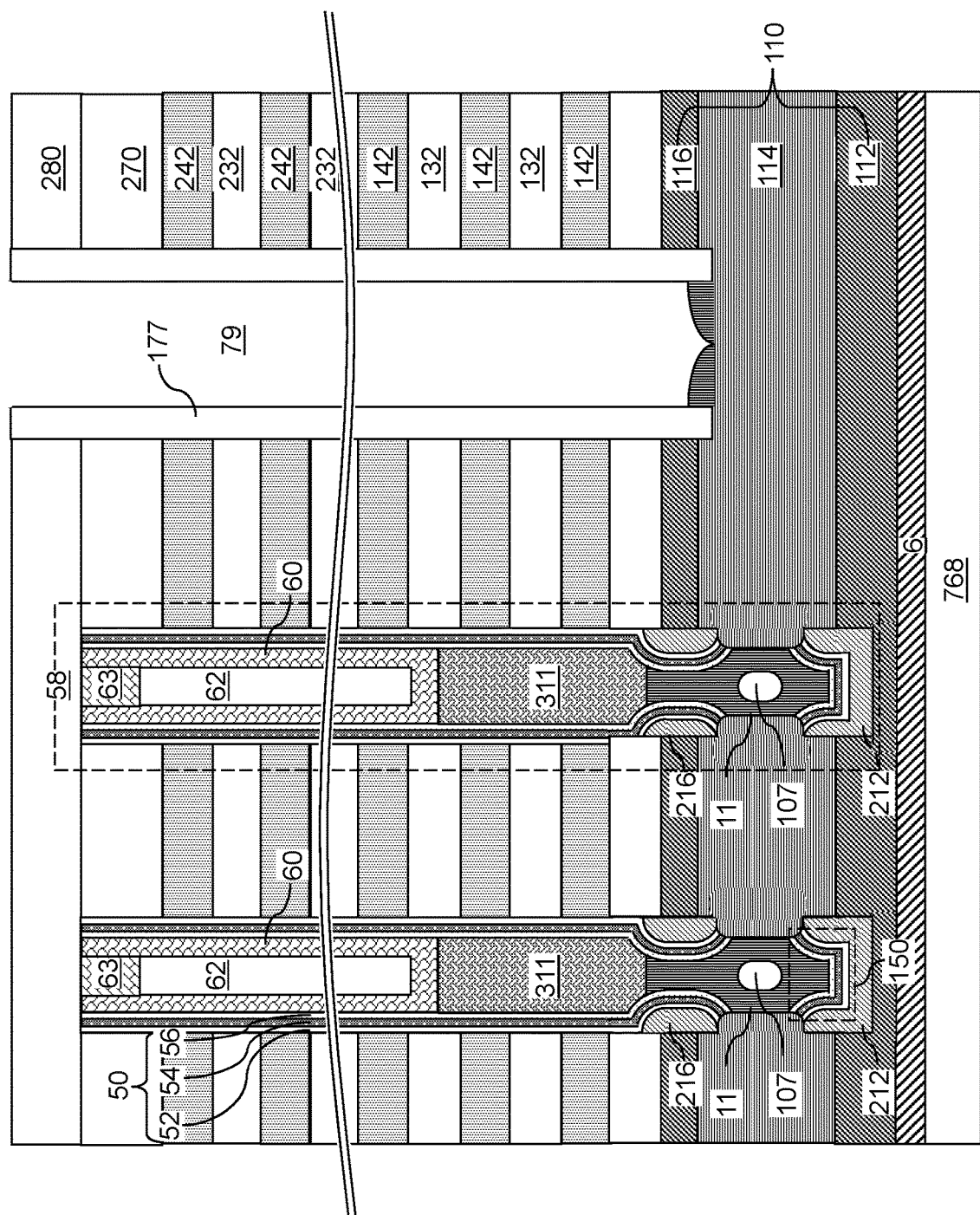

Referring to FIG. 26D, a semiconductor material having a doping of the second conductivity type may be deposited on the physically exposed surfaces around the source cavity 109. In one embodiment, the second conductivity type can be n-type. The physically exposed surfaces include bottom portions of outer sidewalls of the pedestal channel portions 11 and a horizontal surface of the at least one source-level semiconductor layer (such as a bottom surface of the upper source-level semiconductor layer 116 and/or a top surface of the lower source-level semiconductor layer 112). For example, the physically exposed surfaces may include the bottom portions of outer sidewalls of the pedestal channel portions 11, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In one embodiment, the selective semiconductor deposition process grows an n-doped semiconductor material from physically exposed semiconductor surfaces around the source cavity 109 including the physically exposed surfaces of the pedestal channel portions 11. Alternatively, the n-doped semiconductor material may be deposited on all physically exposed surfaces of the source cavity 109 by a non-selective semiconductor deposition process. In this case, portions of the deposited semiconductor material may be etched back from above the second insulating cap layer 270 and from inside the backside trenches 79.

The deposited doped semiconductor material forms a source contact layer 114, which contacts sidewalls of the pedestal channel portions 11. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. In one embodiment the deposited doped semiconductor material is amorphous silicon or polysilicon, the second conductivity type can be n-type, and the electrical dopants within the source contact layer 114 may include phosphorous atoms, arsenic atoms, and/or antimony atoms. The source contact layer 114 as initially formed may consist essentially of semiconductor atoms and dopant atoms of the second conductivity type. Alternatively, the source contact layer 114 may also be carbon doped as described above with respect to the first embodiment.

The duration of the selective semiconductor deposition process may be selected such that the source cavity 109 is filled with the source contact layer 114, and the source contact layer 114 contacts bottom end portions of inner sidewalls of the backside trench spacers 177. Thus, the source-level sacrificial layer 104 may be replaced with the source contact layer 114. The layer stack including the lower source-level semiconductor layer 112, the source contact layer 114, and the upper source-level semiconductor layer 116 constitutes source-level material layers 110, which replaces the in-process source-level material layers 110'. The source-level material layers 110 are collectively referred to as a buried source layer.

Generally, the source contact layer 114 can be deposited in the source cavity 109 on each cylindrical sidewall of the pedestal channel portions 11. In one embodiment, the source contact layer 114 can be deposited with in-situ doping of n-type dopant atoms, which is subsequently employed as a dopant source for n-type dopants to diffuse into pedestal channel portions to be subsequently formed in the memory openings 49. In one embodiment, each memory film 50 can comprise a concave annular bottom surface segment that contacts the source contact layer 114, and the outer periphery of the concave annular bottom surface may be located at a greater vertical distance from the substrate 8 than an inner periphery of the concave annular bottom surface is from the substrate 8 due to the etch profile provided by the isotropic etch process employed to remove cylindrical portions of the memory films 50 during formation of the source cavity 109.

Figure 26E:
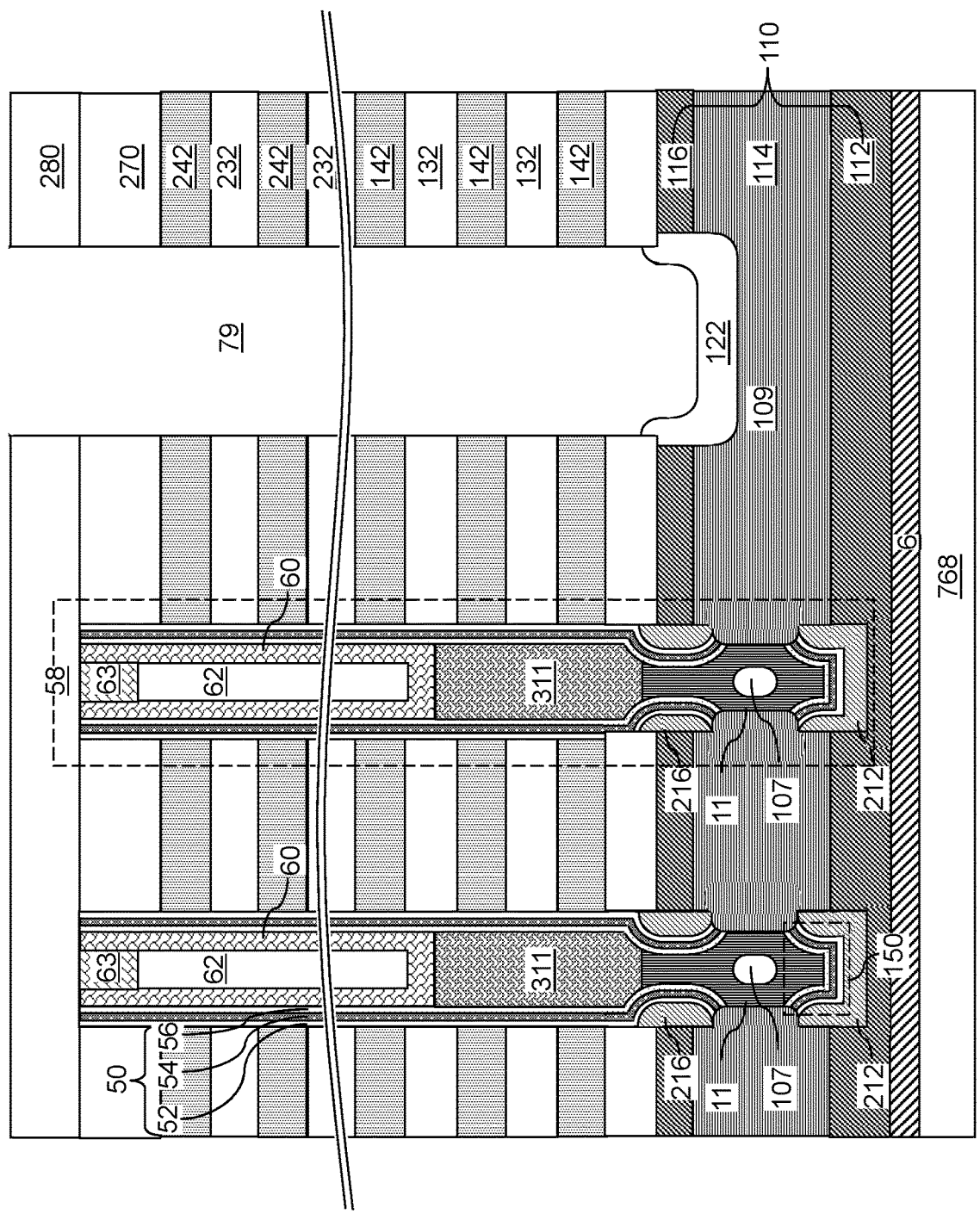
Figure 27:
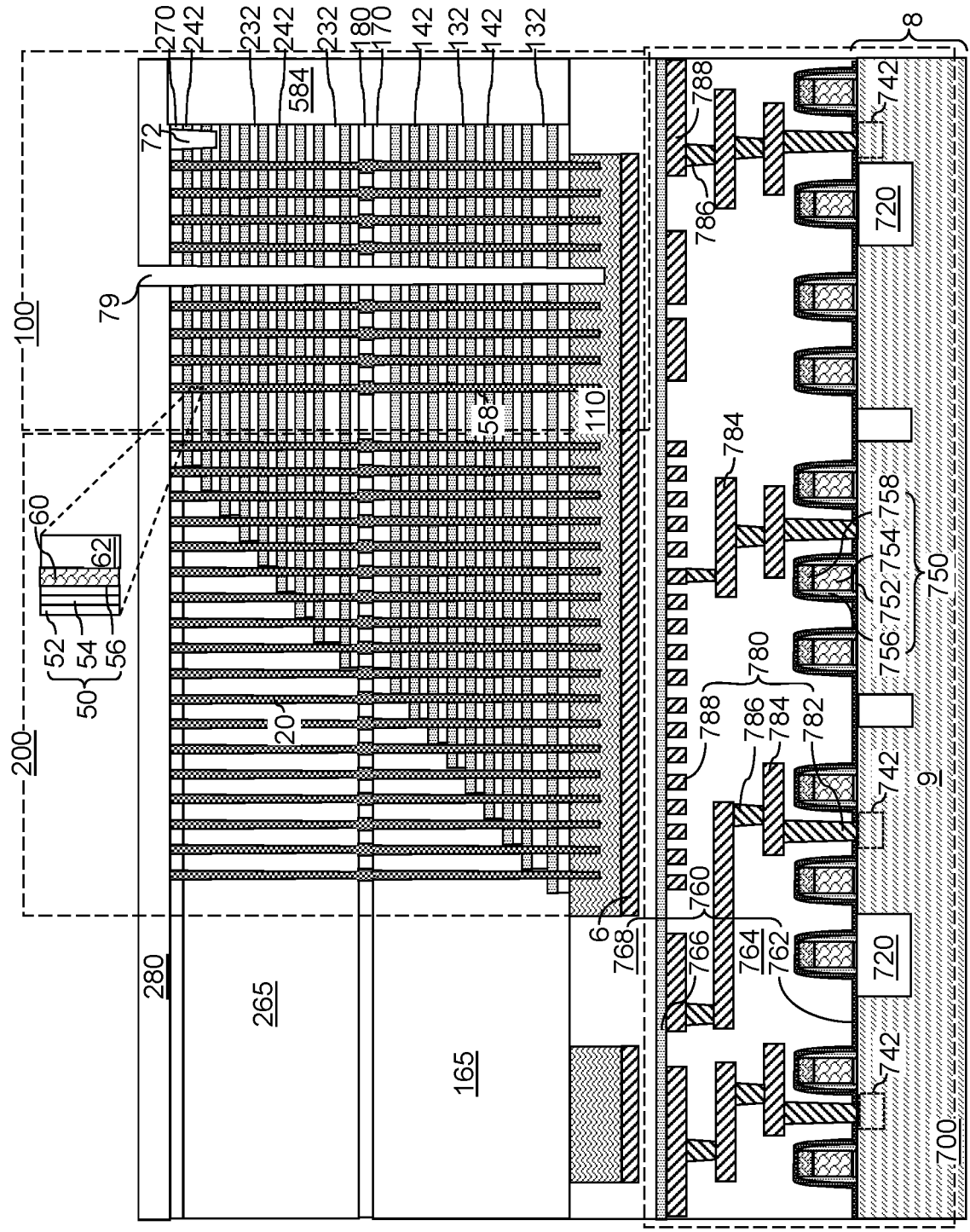
FIG. 27 is a vertical cross-sectional view of the second exemplary structure after formation of a contact-level dielectric layer and backside trenches according to the second embodiment of the present disclosure.

Referring to FIGS. 26E and 27, the backside trench spacers 177 may be removed selective to the insulating layers (132, 232), the first and second insulating cap layers (170, 270), the contact-level dielectric layer 280, and the source contact layer 114 using an isotropic etch process. For example, if the backside trench spacers 77 include silicon oxide, a wet etch process using dilute hydrofluoric acid may be performed to remove the backside trench spacers 177.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122.

Generally, in case at least one of the doped semiconductor material and the second semiconductor material is amorphous, an anneal process can be performed to crystallize the doped semiconductor material and optionally the second semiconductor material (in case the second semiconductor material is amorphous). The oxidation process that forms the dielectric semiconductor oxide plates 122 can include such an anneal process. The pedestal channel portions 11, the pillar channel portions 311, and the vertical semiconductor channel 60 can be annealed at an elevated temperature, which may be in a range from 800 degrees Celsius to 1,050 degrees Celsius. The duration of the anneal process may be in a range from 1 second to 1 hour depending on the anneal temperature. Any amorphous semiconductor material of the pedestal channel portions 11, the pillar channel portions 311, and the vertical semiconductor channels 60 can be converted into a respective polycrystalline semiconductor material.

Generally, diffusion of a fraction of the n-type dopant atoms can be induced from the source contact layer 114 into the pedestal channel portion 11 by performing an anneal process, which may, or may not, be the same as the anneal process that accompanies the oxidation process that forms the dielectric semiconductor oxide plates 122.

In case at least one of the pedestal channel portion 11 and the pillar channel portion 311 in each memory opening 49 is not in-situ doped with n-type dopant atoms and is doped with carbon atoms, an anneal process can be performed to induce diffusion of n-type electrical dopants from the source contact layer 114 into the pedestal channel portion 11 and/or into the pillar channel portion 311. In this case, the carbon atoms cause the polycrystalline grains of the pedestal channel portion 11 and the pillar channel portion 311 to remain small. However, the vertical semiconductor channel 60 in each memory opening 49 can have large grains to provide high electrical conductivity for charge carriers (such as electrons) during operation of the vertical NAND strings. According to an embodiment of the present disclosure, control of diffusion of n-type dopants in the pedestal channel portions 11 and in the pillar channel portions 311 is facilitated by the small average grain size in each of the pedestal channel portions 11 and the pillar channel portions 311, and channel conductivity in the vertical semiconductor channels 60 is enhanced by large grains of the vertical semiconductor channels 60 that are enabled by absence of carbon atoms or presence of carbon atoms only at trace levels. In this case, the n-type dopant atoms in the source contact layer 114 diffuse in the pedestal channel portions 11 and the pillar channel portions 311 at a lower diffusion rate than in the vertical semiconductor channels 60.

In one embodiment, the pedestal channel portions 11 and the pillar channel portions 311 comprise as deposited polysilicon formed with in-situ arsenic doping, and vertical semiconductor channels 60 comprise as-deposited polysilicon. In this case, an anneal process is not necessary although an anneal process may be employed to increase the grain size of the second semiconductor material in the vertical semiconductor channels 60.

Generally, each pedestal channel portion 11 can have a cylindrical sidewall segment that contacts the source contact layer 114, and can include at least one of carbon and arsenic as dopant atoms at a first average dopant concentration. Each vertical semiconductor channel 60 can include the carbon or arsenic dopant atoms at a second average dopant concentration that is less than 20%, and/or less than 5%, and/or less than 1%, and/or less than 0.3%, and/or less than 0.1%, and/or less than 0.03%, and/or less than 0.01%, and/or less than 0.003%, and/or less than 0.001%, of the first average dopant concentration, or can be free of the carbon or arsenic dopants atoms.

In one embodiment, each pedestal channel portion 11 and each pillar channel portion 311 can comprise carbon atoms at an average atomic concentration in a range from $5.0 \times 10^{17}$ atoms/cm$^3$ to $2.0 \times 10^{21}$ atoms/cm$^3$, and each vertical semiconductor channel 60 can comprise carbon atoms at an average atomic concentration less than $1.0 \times 10^{17}$ atoms/cm$^3$ or is free of carbon atoms. Additionally, each pedestal channel portion 11 and each pillar channel portion 311 can comprise n-type dopant atoms at an average atomic concentration in a range from $1.0 \times 10^{18}$ atoms/cm$^3$ to $1.0 \times 10^{20}$ atoms/cm$^3$, and each vertical semiconductor channel 60 can include n-type dopant atoms at an average atomic concentration of than $1.0 \times 10^{17}$ atoms/cm$^3$, or can be free of n-type dopant atoms.

In one embodiment, each pedestal channel portion 11 and each pillar channel portion 311 can comprise arsenic atoms at an average atomic concentration in a range from $1.0 \times 10^{18}$ atoms/cm$^3$ to $1.0 \times 10^{20}$ atoms/cm$^3$, and each vertical semiconductor channel 60 can comprise arsenic atoms at an average atomic concentration less than $1.0 \times 10^{17}$ atoms/cm$^3$, such as less than $1.0 \times 10^{15}$ atoms/cm$^3$, and/or less than $1.0 \times 10^{14}$ atoms/cm$^3$, or is free of arsenic atoms.

Figure 28:
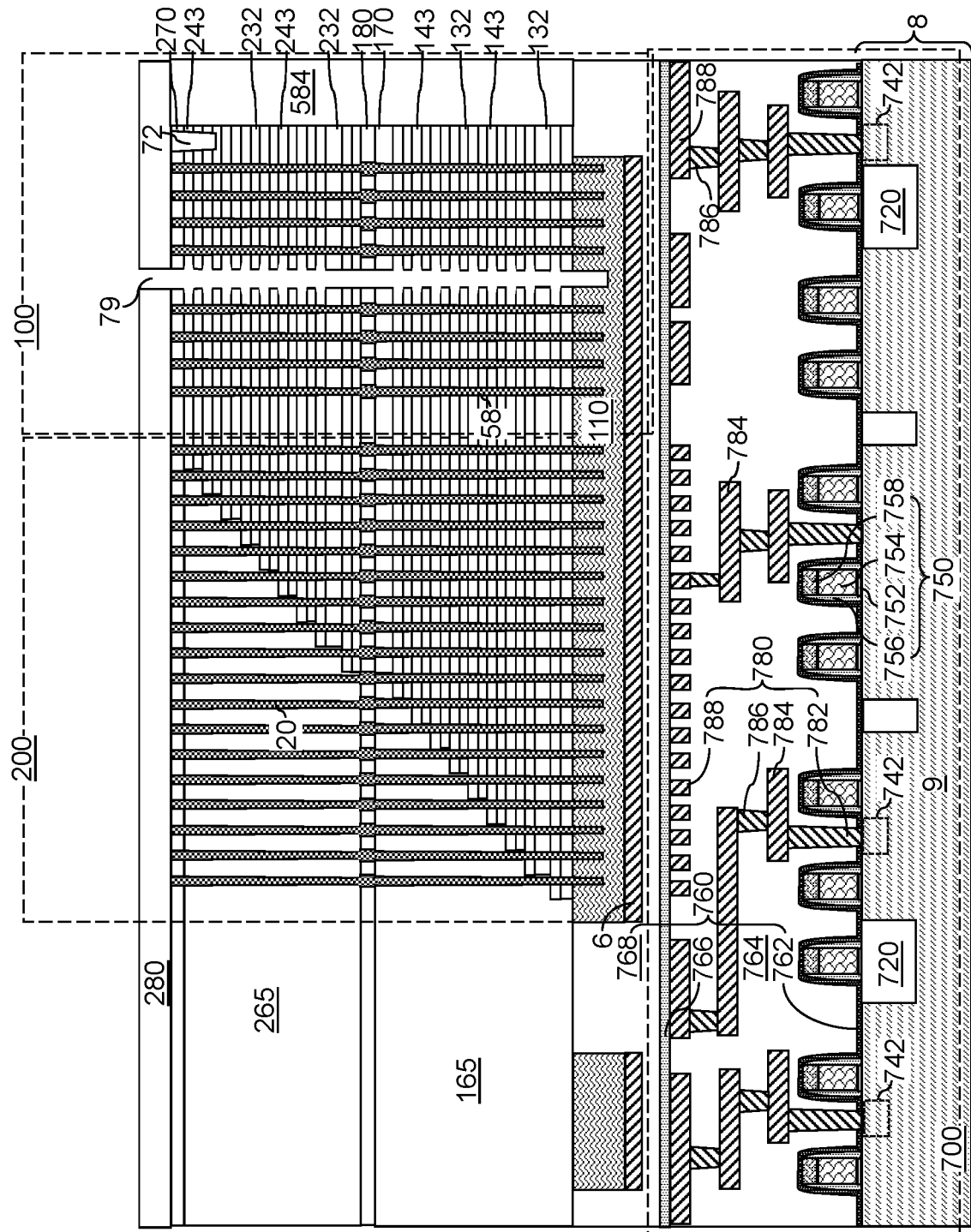
FIG. 28 is a vertical cross-sectional view of the second exemplary structure after formation of backside recesses according to the second embodiment of the present disclosure.

Referring to FIG. 28, the processing steps of FIG. 17 can be performed to form backside recesses (143, 243).

Figure 29A:
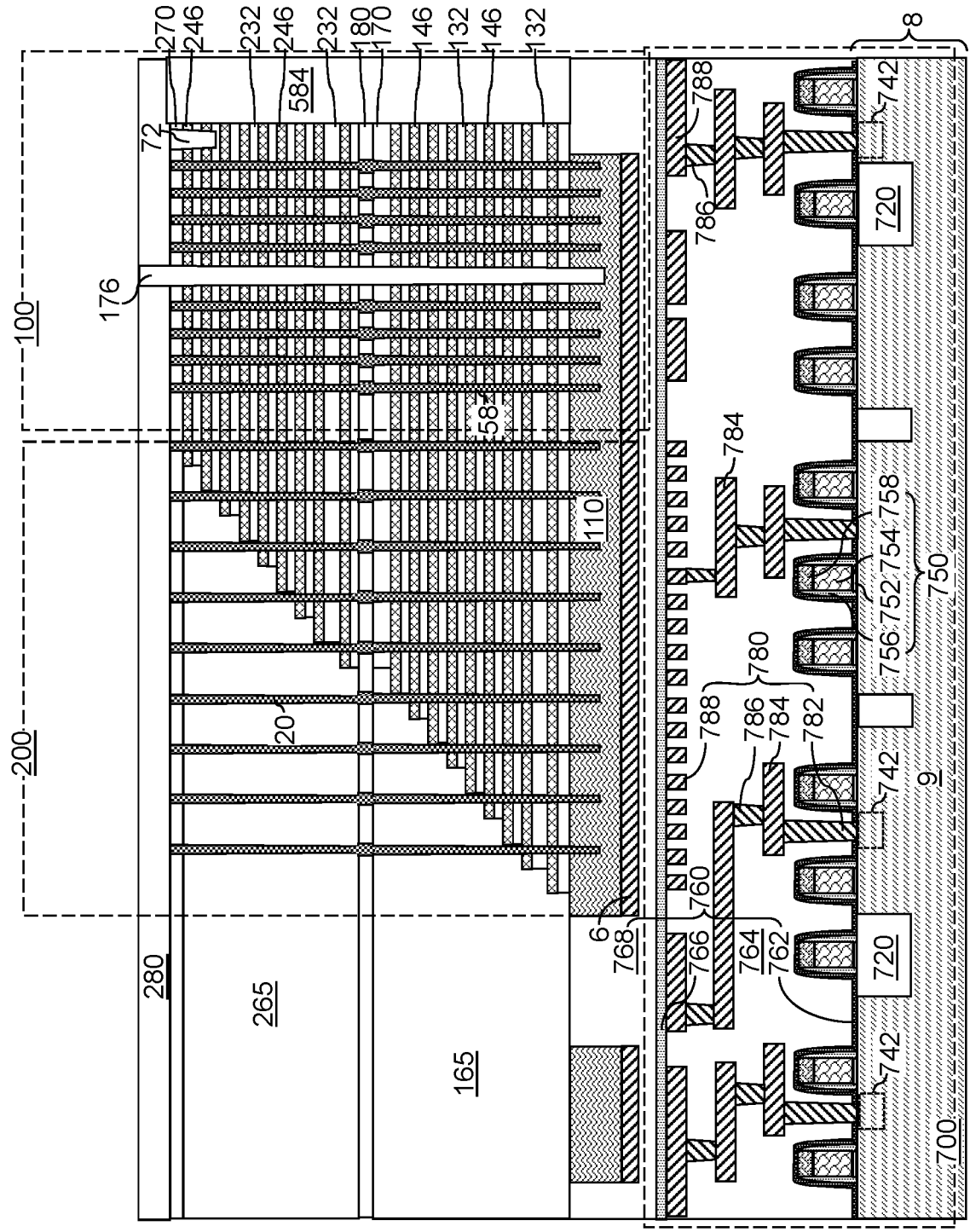
FIG. 29A is a vertical cross-sectional view of the second exemplary structure after formation of electrically conductive layers according to the second embodiment of the present disclosure.
Figure 29B:
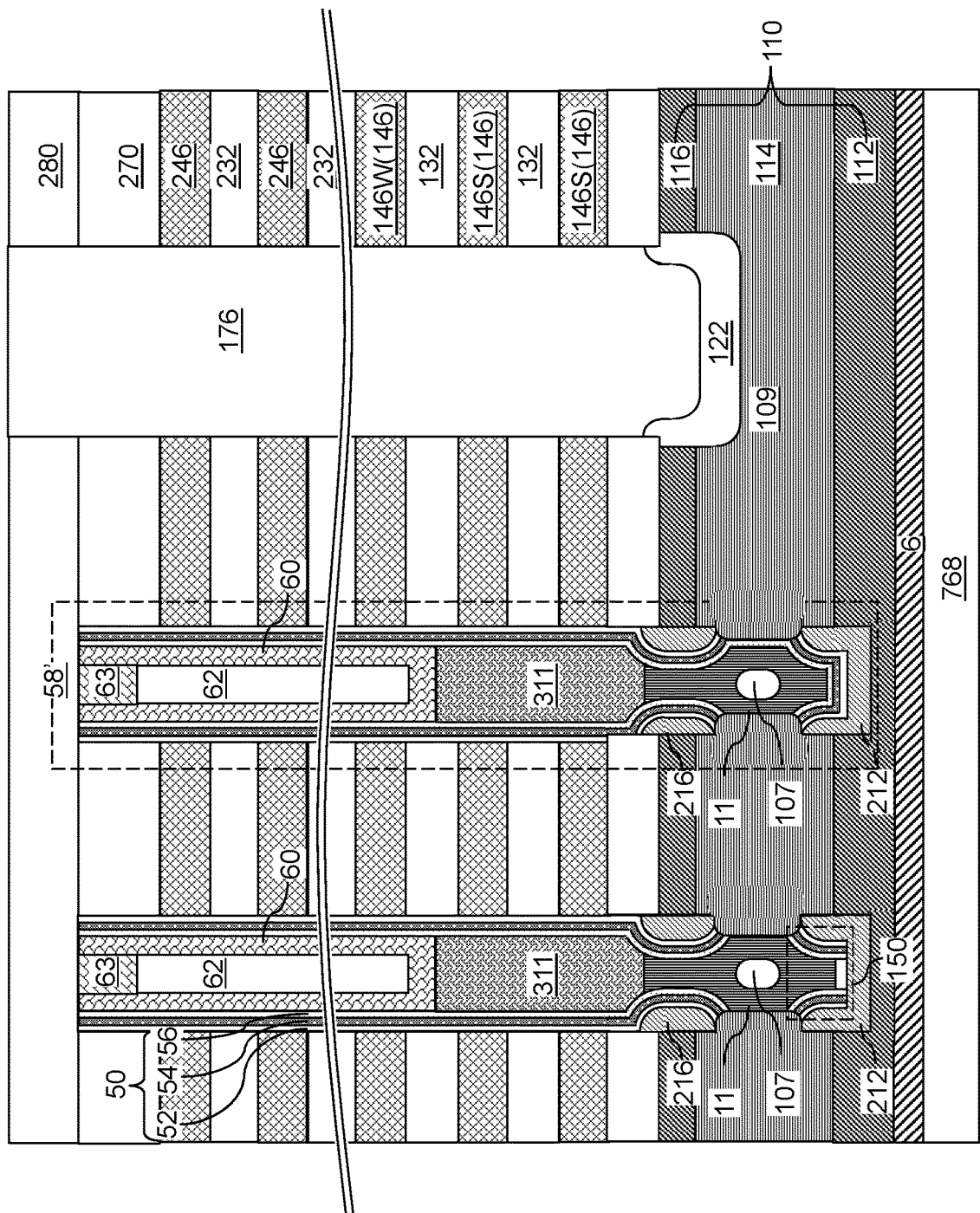
FIG. 29B is a magnified view of a region of the second exemplary structure that includes a pair of memory opening fill structures and a backside trench.

Referring to FIGS. 29A and 29B, the processing steps of FIGS. 18A, 18B, and 19A-19C can be performed to form a backside blocking dielectric layer (not expressly shown), electrically conductive layers (146, 246), and dielectric backside trench fill structures 176.

In one embodiment, the electrically conductive layers (146, 246) can comprise source-select-level electrically conductive layers (i.e., source side select gate electrodes) 146S located below a horizontal plane including an outer periphery of the top surface of a pillar channel portion 311, and word-line-level electrically conductive layers (i.e., word lines) (146W, 246) located above the horizontal plane including the outer periphery of the top surface of the pillar channel portion 311. Each memory opening 49 can vertically extend through the source-select-level electrically conductive layers 146S, the word-line-level electrically conductive layers (146W, 246), and the upper source-level semiconductor layer 116 with a straight sidewall.

Figure 30:
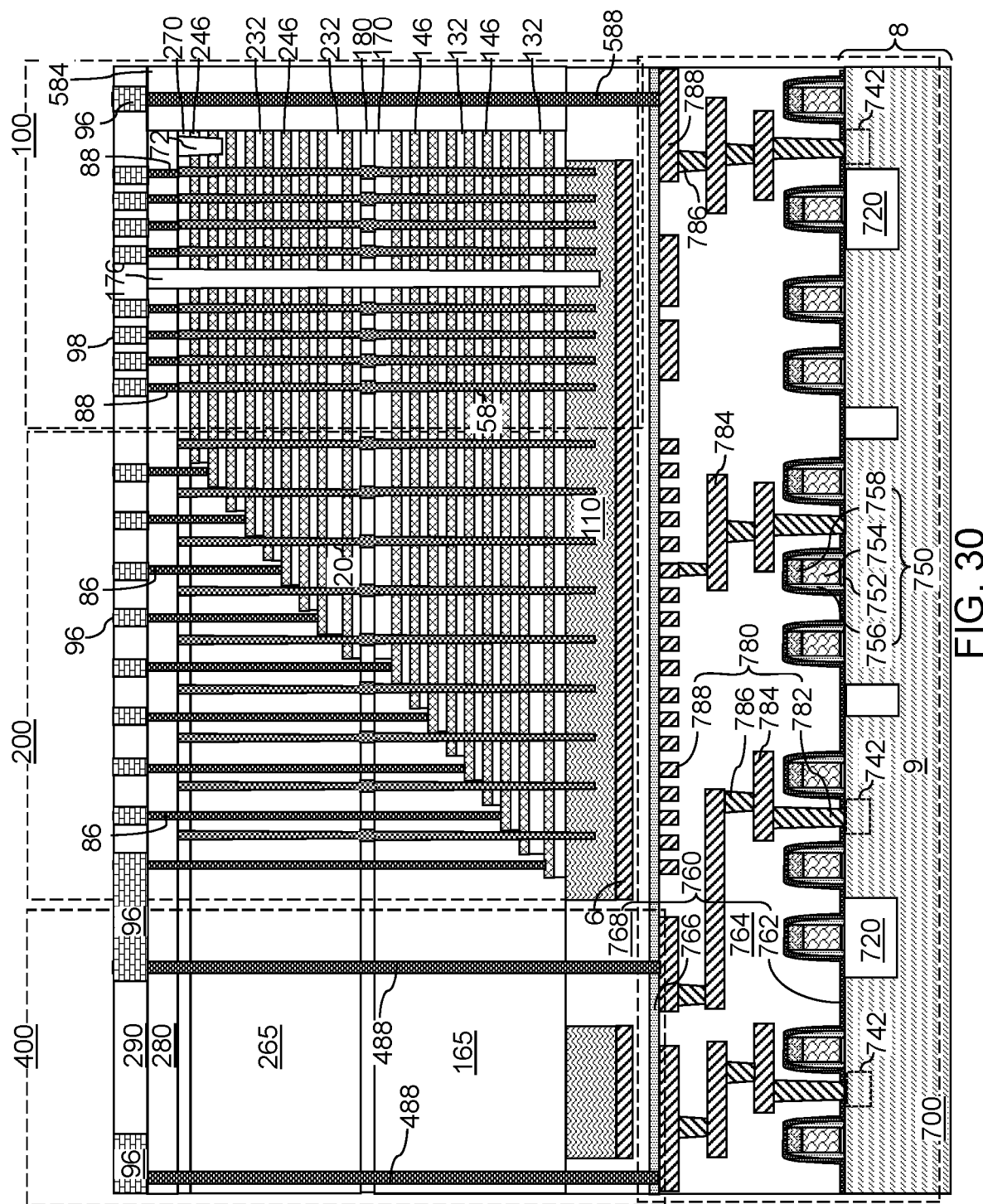
FIG. 30 is a vertical cross-sectional view of the second exemplary structure after formation of various contact via structures, through-memory-level via structures, and upper metal line structures according to the second embodiment of the present disclosure.

Referring to FIG. 30, the processing steps of FIGS. 22A, 22B, and 23 can be performed to form various contact via structures (88, 86, 488, 588) and metal interconnect structures. For example, drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory opening fill structures 58.

Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the contact-level dielectric layer 280. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layer 280, and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layer 280. The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

Referring to FIGS. 24A-30 and all related drawings and according to various aspects of the second embodiment of the present disclosure, a three-dimensional memory device is provided, which comprises: an alternating stack of insulating layers (132, 232) and electrically conductive layers (146, 246) located over a substrate 8; source-level material layers 110 located between the substrate 8 and the alternating stack {(132, 146), (232, 246)}, wherein the source-level material layers 110 comprise, from bottom to top, a lower source-level semiconductor layer 112, a source contact layer 114, and an upper source-level semiconductor layer 116; a memory opening 49 vertically extending through the alternating stack {(132, 146), (232, 246)}, the upper source-level semiconductor layer 116, the source contact layer 114, and an upper portion of the lower source-level semiconductor layer 112; and a memory opening fill structure 58 located within the memory opening 49 and comprising a semiconductor constriction ring 216, a composite semiconductor channel (11, 311, 60), and a memory film 50 laterally surrounding the composite semiconductor channel (11, 311, 60), wherein: the semiconductor constriction ring 216 is located on, and within, a cylindrical surface of the upper source-level semiconductor layer 116; the memory film 50 contacts an inner sidewall of the semiconductor constriction ring 216 and has a lesser lateral dimension inside the semiconductor constriction ring 216 than above the semiconductor constriction ring 216; and the composite semiconductor channel (11, 311, 60) comprises a pedestal channel portion 11 in contact with the source contact layer 114, and a vertical semiconductor channel 60 that overlies the pedestal channel portion 11.

In one embodiment, the composite semiconductor channel (11, 311, 60) further comprises a pillar channel portion 311 contacting a top surface of the pedestal channel portion 11 and a bottom surface of the vertical semiconductor channel 60. The pillar channel portion 311 has a different material composition than the vertical semiconductor channel 60, and may have the same material composition as or may have a material composition that is different from, the pedestal channel portion 11. Each interface between the pillar channel portion 311 and each of the pedestal channel portion 11 and the vertical semiconductor channel 60 can include a respective continuous microstructural interface including a continuous set of grain boundary surfaces.

In one embodiment, each of the pillar channel portion 311 and the pedestal channel portion 11 includes n-type dopant atoms at a respective average atomic concentration in a range from $1.0 \times 10^{18}/cm^3$ to $2.0 \times 10^{21}/cm^3$; and the vertical semiconductor channel 60 is intrinsic or includes electrical dopants at an atomic concentration not greater than $1.0 \times 10^{17}/cm^3$.

In one embodiment, the electrically conductive layers (146, 246) comprise: source-select-level electrically conductive layers 146S located below a horizontal plane including a bottom surface of the vertical semiconductor channel 60, and word-line-level electrically conductive layers (146W, 246) located above the horizontal plane including the bottom surface of the vertical semiconductor channel 60; and the pedestal channel portion 11 is located below a horizontal plane including a bottom surface of a bottommost one of the electrically conductive layers (146, 236).

In one embodiment, the pillar channel portion 311 comprises at least one of carbon and arsenic as dopant atoms at a first average dopant concentration; and the vertical semiconductor channel 60 includes the at least one of carbon or arsenic dopant atoms at a second average dopant concentration that is less than 20% of the first average dopant concentration or is free of the at least one of carbon or arsenic dopants atoms. In one embodiment, the pillar channel portion 311 comprises polysilicon containing carbon atoms at an average atomic concentration in a range from $5.0 \times 10^{17}$ atoms/$cm^3$ to $4.0 \times 10^{21}$ atoms/$cm^3$; and the vertical semiconductor channel 60 comprises polysilicon containing carbon atoms at an average atomic concentration less than $1.0 \times 10^{17}$ atoms/$cm^3$ or is free of carbon atoms. In one embodiment, the pillar channel portion 311 comprises polysilicon containing arsenic atoms at an average atomic concentration in a range from $1.0 \times 10^{18}$ atoms/$cm^3$ to $1.0 \times 10^{20}$ atoms/$cm^3$; and the vertical semiconductor channel 60 comprises polysilicon containing arsenic atoms at an average atomic concentration less than $1.0 \times 10^{17}$ atoms/cm$^3$ or is free of arsenic atoms.

In one embodiment, the pillar channel portion 311 is polycrystalline and has a first average grain size; and the vertical semiconductor channel 60 is polycrystalline and has a second average grain size that is at least 50% larger than the first average grain size.

In one embodiment, the pedestal channel portion 11 comprises a cylindrical sidewall segment that contacts the source contact layer 114; and a periphery of a horizontal cross-sectional shape of the cylindrical sidewall segment of the pedestal channel portion 11 is located entirely within, and is laterally offset inward, from a horizontal cross-sectional shape of the cylindrical surface of the upper source-level semiconductor layer 116 in a plan view along a vertical direction. In one embodiment, an upper segment of the pedestal channel portion 11 contacts the memory film 50; a middle segment of the pedestal channel portion 11 contacts the source contact layer 114; and a lower segment of the pedestal channel portion 11 is located below a horizontal plane including a bottom periphery of an interface between the pedestal channel portion 11 and the source contact layer 114. The upper segment of the pedestal channel portion 11 can be located above the horizontal plane including a top periphery of the interface between the pedestal channel portion 11 and the source contact layer 114. In one embodiment, the upper segment of the pedestal channel portion 11 comprises a region having a lesser lateral dimension than the middle segment of the pedestal channel portion 11; and a void 107 that is free of any solid phase material may be located within the middle segment of the pedestal channel portion 11.

In one embodiment, the memory film 50 comprises a concave annular bottom surface segment that contacts the source contact layer 114; and an outer periphery of the concave annular bottom surface is located at a greater vertical distance from the substrate 8 than an inner periphery of the concave annular bottom surface is from the substrate 8.

In one embodiment, the semiconductor constriction ring 216 comprises: an outer cylindrical surface that contacts a sidewall of a bottommost one of the insulating layers (132, 232) and a sidewall of the source contact layer 114; and an inner surface that contacts the memory film 50 and comprising an upper annular convex surface segment, a lower annular convex surface segment, and a cylindrical surface segment that connects the upper annular convex surface segment and the lower annular convex surface segment.

In one embodiment, the memory opening fill structure 58 further comprises: a semiconductor constriction cap structure 212 contacting a planar surface and a cylindrical surface of the lower source-level semiconductor layer 112, underlying the pedestal channel portion 11, and having a same material composition as the semiconductor constriction ring 216; and a bottom dielectric cap structure 150 having a same set of material compositions as component layers of the memory film 50, and contacting a bottom surface of the pedestal channel portion 11. In one embodiment, the semiconductor constriction cap structure 212 comprises a cylindrical portion and a plate portion adjoined to a bottom end of the cylindrical portion; a top surface of the plate portion of the semiconductor constriction cap structure 212 and an inner cylindrical surface of the cylindrical portion of the semiconductor constriction cap structure 212 contact surfaces of the bottom dielectric cap structure 150; and the bottom dielectric cap structure 150 comprises a concave annular surface that contacts the source contact layer 114.

In one embodiment, the electrically conductive layers (146, 246) can comprise source-select-level electrically conductive layers 146S located below a horizontal plane including an outer periphery of the top surface of a pillar channel portion 311, and word-line-level electrically conductive layers (146W, 246) located above the horizontal plane including the outer periphery of the top surface of the pillar channel portion 311. Each memory opening 49 can vertically extend through the source-select-level electrically conductive layers 146S, the word-line-level electrically conductive layers (146W, 246), and the upper source-level semiconductor layer 311 with a straight sidewall.

FIGS. 31A-31I illustrate sequential vertical cross-sectional views of a first-tier memory opening 149 in a third exemplary structure during formation of a sacrificial first-tier memory opening fill portion 148 according to a third embodiment of the present disclosure. In the third embodiment, the in-process source-level material layers 110' may be formed in the same manner as in the first embodiment. The layers of the first-tier alternating stack (132, 142) are formed in two stages.

Referring to FIG. 31A, a first subset of layers of the first-tier alternating stack (132, 142) can be deposited over the in-process source-level material layers 110'. In one embodiment, the first subset of layers of the first-tier alternating stack (132, 142) can include M first insulating layers 132 and M first sacrificial material layers 142 that alternate vertically. The integer M can be the sum of the total number M1 of source select levels to be employed in the three-dimensional array of NAND memory elements, and the total number M2 of word line levels in which memory openings are to be formed with a laterally expanded dimension (such as an increased diameter). For example, the total number M1 of source select levels may be in a range from 1 to 6, such as from 2 to 4. The total number M2 of word line levels in which memory openings are to be formed with a laterally expanded dimension may be in a range from 1 to 6 such as from 2 to 4. The ratio of the integer M relative to the total number of sacrificial material layers 142 to be provided for the first-tier alternating stack (132, 142) may be in a range from 0.015 to 0.30, although lesser and greater ratios may also be employed. In the illustrated example shown in FIG. 31A, M1 is 2, M2 is 2, and M is 4. The topmost sacrificial material layer 142 may be deposited with a greater thickness to compensate for a loss of thickness that occurs during subsequent processing steps.

The M1 first insulating layers 132 and the M1 first sacrificial material layers 142 that are deposited over the in-process source-level material layers 110 constitute a first subset of layers of the first-tier alternating stack (132, 142). The M2 first insulating layers 132 and the M2 first sacrificial material layers 142 that are subsequently deposited constitute a second subset of layers of the first-tier alternating stack (132, 142). A first layer stack including the first subset of the layers of the alternating stack (132, 142) and the second subset of the layers of the alternating stack (132, 142) can be formed over the in-process source-level material layers 110, which overlies the substrate 8. Thus, the first layer stack can include a vertically alternating sequence of M first insulating layers 132 and M first sacrificial material layers 142. The thickness and the material composition of each first insulating layer 132 and each first sacrificial material layer 142 can be the same as in the first embodiment.

Referring to FIG. 31B, a photoresist layer (not shown) can be applied over the first layer stack of M first insulating layers 132 and M first sacrificial material layers 142, and can be lithographically patterned with the pattern of the first-tier memory openings and the first-tier support openings. The general pattern of the openings in the photoresist layer can be the same as the pattern of the first-tier memory openings 149 and the first-tier support openings 129 illustrated in FIG. 4B. However, in the third embodiment, the size of each opening in the photoresist layer can be reduced relative to the size of the respective opening in the photoresist layer in the first embodiment. The pattern of the openings in the photoresist layer can be transferred through the first layer stack of M first insulating layers 132 and M first sacrificial material layers 142, and through each layer within the in-process source-level material layers 110 other than the lower source-level semiconductor layer 112, and into an upper portion of the lower source-level semiconductor layer 112 by an anisotropic etch process. The photoresist layer can be subsequently removed, for example, by ashing.

First openings 149A having the same pattern as the pattern of the first-tier memory openings 149 and the first-tier support openings 129 of FIG. 4B with a modification (reduction) in lateral dimensions can be formed. In one embodiment, each first opening 149A formed in the memory array region 100 can have a first width w1, which is the maximum lateral dimension of a respective first opening 149A in case the first opening 149A has an axial symmetry, or a maximum lateral dimension along a widthwise direction in case the first opening 149A is elongated. For example, the first width w1 can be the diameter of a first opening 149A in case the first opening 149A has a circular cylindrical shape, or may be a minor axis in case the first opening 149A has an elliptical cylindrical shape. In an illustrative example, the first width w1 may be in a range from 25 nm to 150 nm, such as from 30 nm to 100 nm, although lesser and greater dimensions can also be employed.

Referring to FIG. 31C, an optional sacrificial liner 145 and an etch stop fill material portion 147 can be formed within each first opening 149A. For example, a sacrificial liner material layer including a sacrificial liner material such as silicon oxide, silicon nitride, or a dielectric metal oxide can be conformally deposited, and a sacrificial fill material such as amorphous silicon, amorphous carbon, a silicon-germanium alloy, or borosilicate glass can be conformally deposited in remaining volumes of the first openings 149A. Excess portions of the sacrificial fill material and the sacrificial liner material layer can be removed from above the horizontal plane including the top surface of the topmost layer of the first layer stack by a planarization process. For example, a recess etch and/or a chemical mechanical planarization process can be employed for the planarization process. Each remaining portion of the sacrificial liner material layer constitutes a sacrificial liner 145, and each remaining portion of the sacrificial fill material constitutes an etch stop fill material portion 147.

Referring to FIG. 31D, each etch stop fill material portion 147 and optionally each sacrificial liner 145 can be vertically recessed below the horizontal plane including the top surface of the topmost layer within the first layer stack. The recess depth can be selected based on the target width of an upper portion of the first opening 149A that is subsequently widened. For example, the recess depth can be the difference between the total thickness of the second subset of layers of the first-tier alternating stack (132, 142) (which include the M2 first insulating layers 132 and the M2 first sacrificial material layers 142) less the target etch distance of an isotropic etch process to be subsequently performed. A cavity 139 is present over each etch stop fill material portion 147. The recess depth is the same as the height of the cavity 139.

Referring to FIG. 31E, an isotropic etch process can be performed while the etch stop fill material portions 147 fill the lower region of each first opening 149A. The cavity 139 located in the upper region of each first opening 149A is expanded to a second width w2, which may be greater than the first width w1, such as in a range from 150% to 300% of the first width w1. In one embodiment, the second width w2 may be in a range from 40 nm to 400 nm, such as from 60 nm to 200 nm, although lesser and greater dimensions can also be employed. In one embodiment, the isotropic etch process can include a wet etch process including a mixture of wet etch chemicals that provides a same or similar wet etch rate for the first material of the first insulating layers 132 and the first sacrificial material layers 142. The cavity 139 as expanded by the isotropic etch process may have a cylindrical sidewall and an annular bottom surface. In one embodiment, the annular bottom surface of the cavity 139 may have a concave profile (not expressly illustrated).

Referring to FIG. 31F, a sacrificial fill material that can be removed selective to the materials of the first insulating layers 132 and the first sacrificial material layers 142 can be deposited in the cavities 139. Excess portions of the sacrificial fill material can be removed from above the horizontal plane including the top surface of the topmost layer of the first layer stack (132, 142) by a planarization process, which may employ a recess etch and/or a chemical mechanical planarization process. Each remaining portion of the sacrificial fill material constitutes a first sacrificial opening fill component 148A, The first sacrificial opening fill components 148A include a sacrificial material such as amorphous silicon, a silicon-germanium alloy, germanium, a silicon-germanium alloy, amorphous carbon, borosilicate glass, or a silicon-based polymer material. The sacrificial fill material of the first sacrificial opening fill components 148A may be the same as, or may be different from, the material of the etch stop fill material portions 147.

Figure 31G:
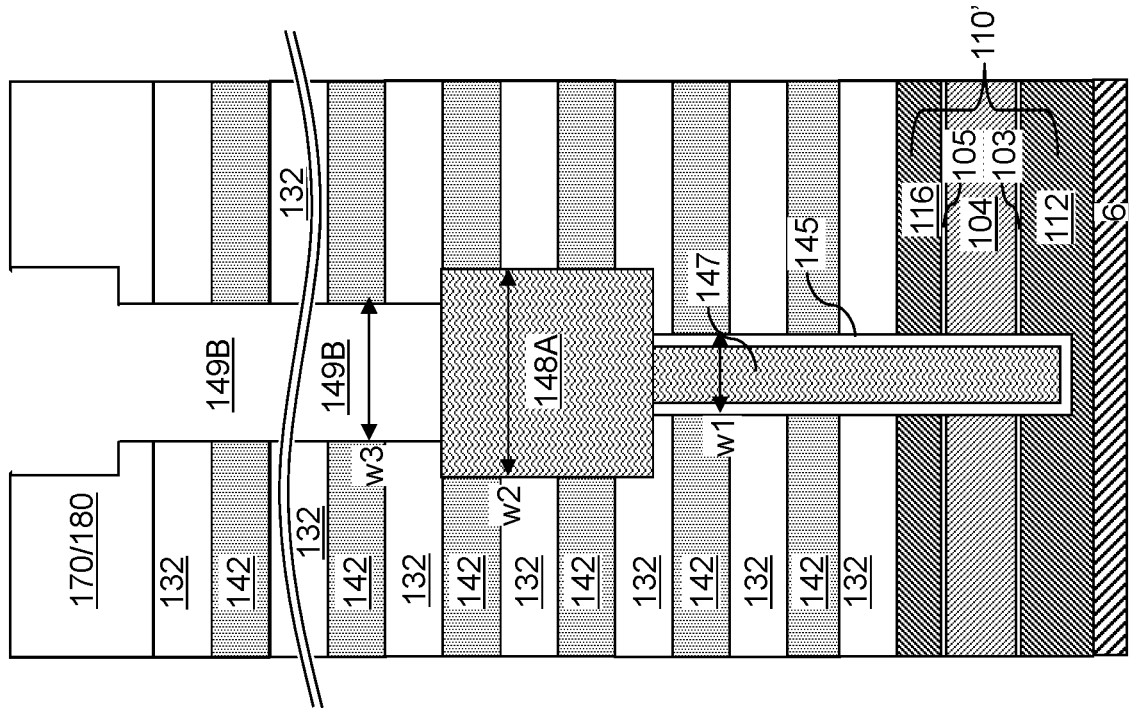

Referring to FIG. 31G, a second layer stack including additional material layers of the first-tier alternating stack (132, 142) of the first exemplary structure can be deposited over the first layer stack and the first sacrificial opening fill components 148A. The second layer stack can include a third subset of the layers of the first-tier alternating stack (132, 142). The collection of the first subset of the layers of the first-tier alternating stack (132, 142) (which include M1 first insulating layers 132 and M1 first sacrificial material layers 142), the second subset of the layers of the first-tier alternating stack (132, 142) (which include M2 first insulating layers 132 and M2 first sacrificial material layers 142), and the third subset of the layers of the first-tier alternating stack (132, 142) constitute the first-tier alternating stack (132, 142). Subsequently, a first insulating cap layer 170 and an inter-tier insulating layer 180 can be deposited in the same manner as in the first embodiment.

Figure 31H:
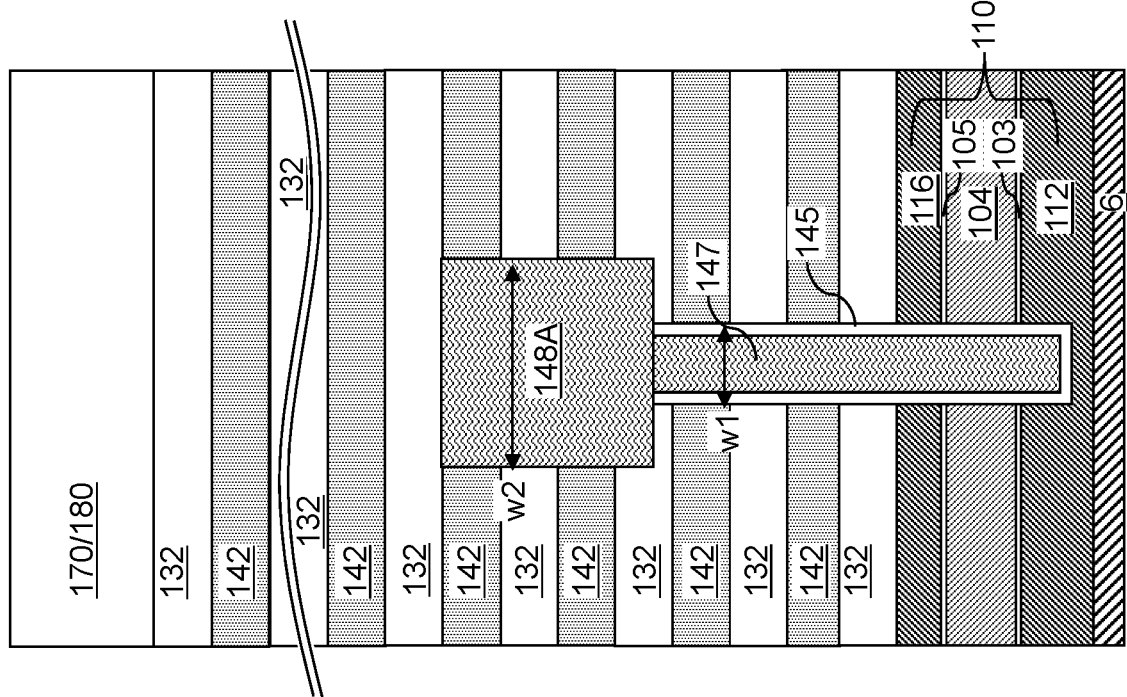

Referring to FIG. 31H, the processing steps of FIGS. 4A and 4B can be performed with a modification in the anisotropic etch process to form second openings 149B through the inter-tier insulating layer 180, the first insulating cap layer 170, and the second layer stack including the third subset of the layers of the first-tier alternating stack (132, 142). Specifically, the pattern of the second openings 149B can be the same as the pattern of the first-tier memory openings 149 and the first-tier support openings 129 at the processing steps of FIGS. 4A and 4B. The duration of the anisotropic etch process can be selected such that the anisotropic etch process stops after etching through each layer within the third subset of the layers of the first-tier alternating stack (132, 142). The second openings 149B in the memory array region 100 can have a third width w3 as the lateral dimension. The third width w3 can be less than the second width w2, and the entirety of each second opening 149B can land on a top surface of a respective one of the first sacrificial opening fill components 148A. Optionally, an upper portion of each second opening 149B may be widened to facilitate alignment with second-tier memory openings to be subsequently formed. The third width w3 is greater than the first width w1 so that a volume of each first opening 149A having the first width w1 is constricted without constricting second openings 149B in a subsequent processing step.

Figure 31I:
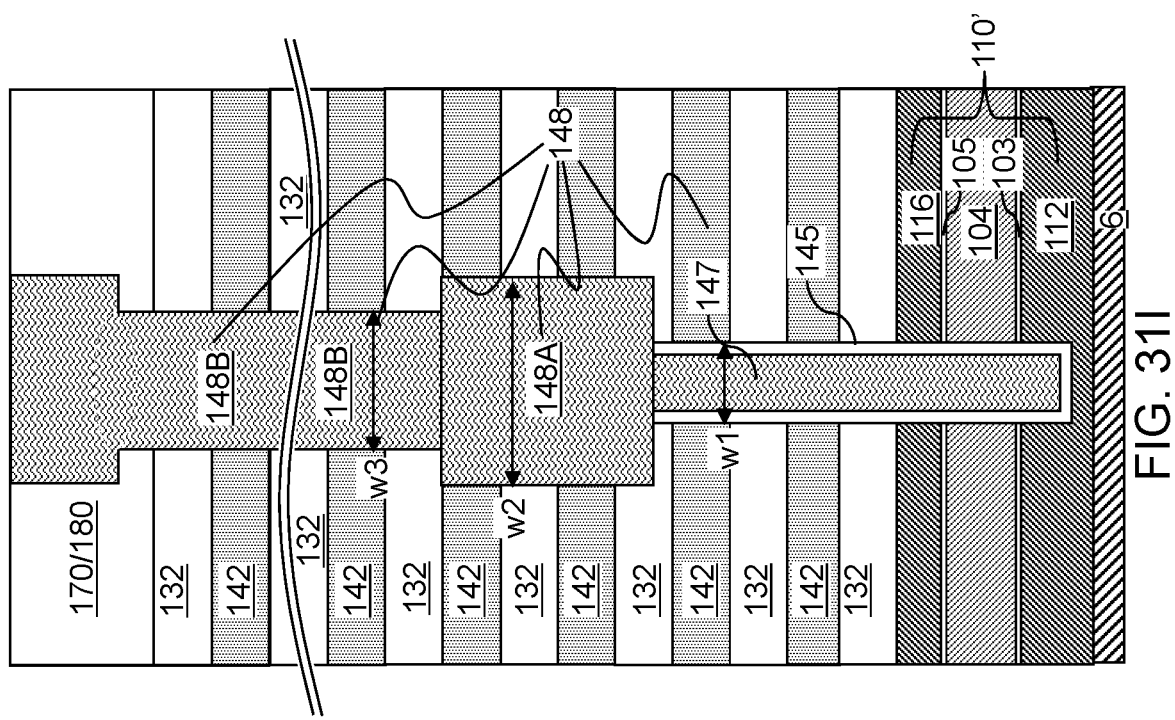
Figure 32:
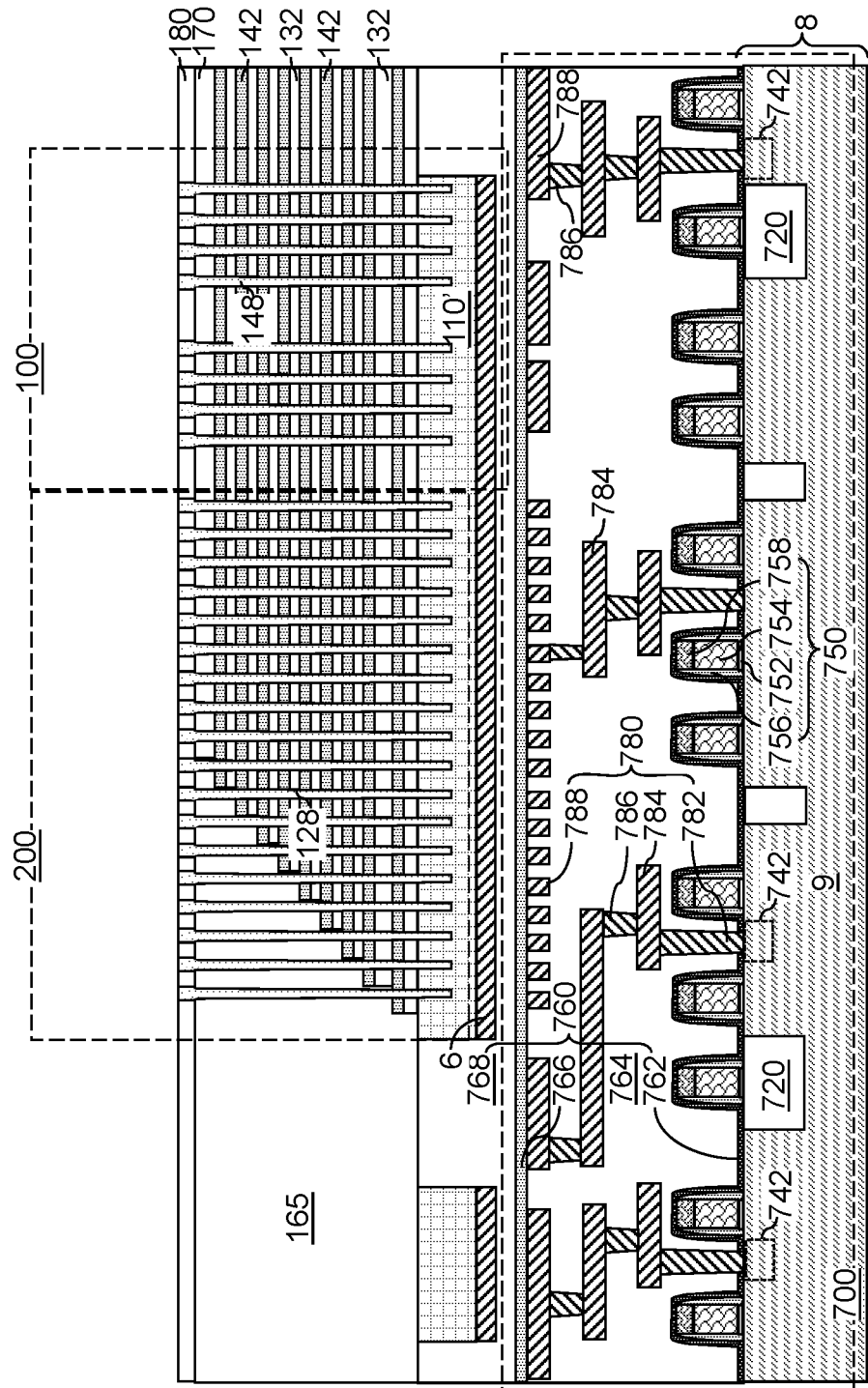
FIG. 32 is a vertical cross-sectional view of the third exemplary structure after formation of sacrificial first-tier memory opening fill portions according to the third embodiment of the present disclosure.

Referring to FIGS. 31I, and 32 a sacrificial fill material that can be removed selective to the materials of the first insulating layers 132 and the first sacrificial material layers 142 can be deposited in the second openings 149B. Excess portions of the sacrificial fill material can be removed from above the horizontal plane including the top surface of the inter-tier insulating layer 180 by a planarization process, which may employ a recess etch and/or a chemical mechanical planarization process. Each remaining portion of the sacrificial fill material constitutes a second sacrificial opening fill component 148B. The second sacrificial opening fill components 148B include a sacrificial material such as amorphous silicon, a silicon-germanium alloy, germanium, a silicon-germanium alloy, amorphous carbon, borosilicate glass, or a silicon-based polymer material. The second sacrificial opening fill components 148B may include the same material as, or may include a material that is different from the material of, the first sacrificial opening fill components 148A and/or the etch stop fill material portions 147. Each continuous combination of an etch stop fill material portion 147, a first sacrificial opening fill component 148A, and a second sacrificial opening fill component 148B constitutes a sacrificial first-tier memory opening fill portion 148.

Figure 33:
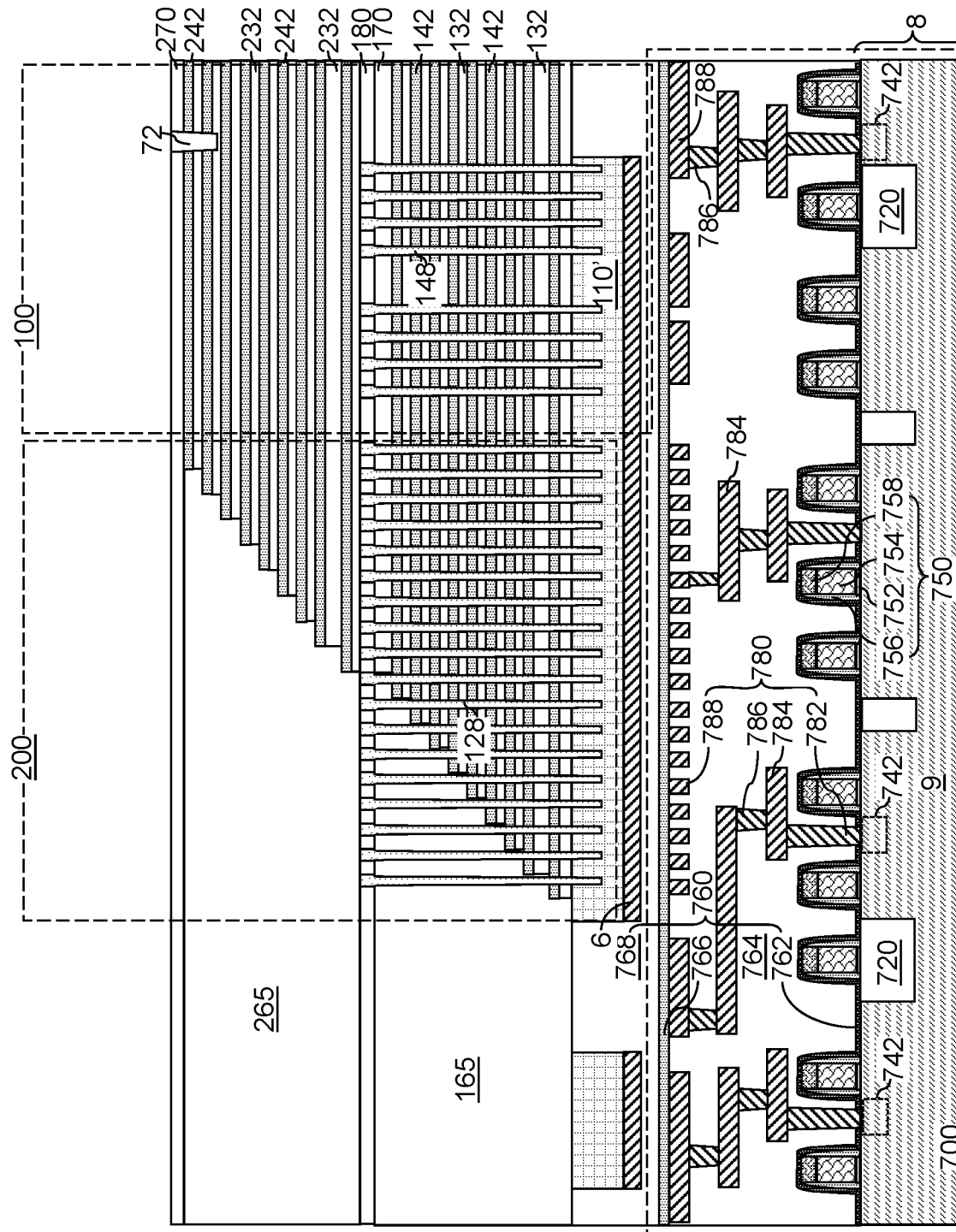
FIG. 33 is a vertical cross-sectional view of the third exemplary structure after formation of a second-tier alternating stack of second insulating layers and second spacer material layers, second stepped surfaces, and a second retro-stepped dielectric material portion according to the third embodiment of the present disclosure.

Referring to FIG. 33, the processing steps of FIG. 6 can be performed a second-tier structure (232, 242, 265, 72).

Figure 34A:
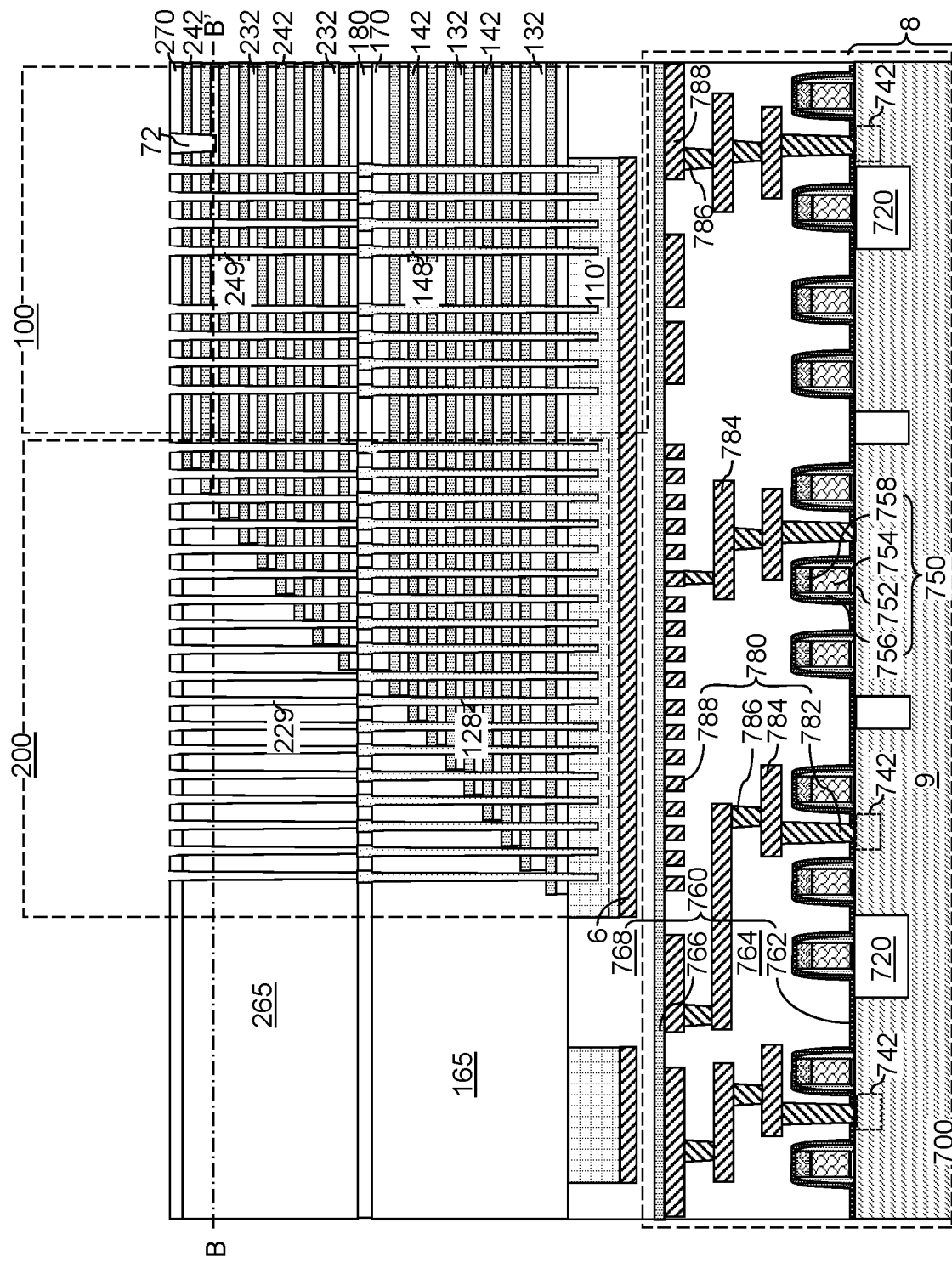
FIG. 34A is a vertical cross-sectional view of the first exemplary structure after formation of second-tier memory openings and second-tier support openings according to the first embodiment of the present disclosure.

Referring to FIGS. 34A, 34B, and 35A, the processing steps of FIGS. 7A and 7B can be performed to form second-tier memory openings 249 and second-tier support openings. FIG. 35A illustrates a region of a second-tier memory opening 249 and underlying material portions.

Referring to FIG. 35B, a memory opening 49 (which is also referred to as an inter-tier memory opening) can be formed by removing a sacrificial first-tier memory opening fill portion 148 from underneath a second-tier memory opening 249. Thus, a combination of a second sacrificial opening fill component 148B, a first sacrificial opening fill component 148A, an etch stop fill material portion 147, and an optional sacrificial liner 145. Each memory opening 49 includes a continuous void that includes the volumes of a second-tier memory opening 249, an entire volume of the second opening 149B, and an entire volume of the first opening 149A as expanded at the processing steps of FIG. 31E and including the combined volumes of a first sacrificial opening fill component 148A, an etch stop fill material portion 147, and an optional sacrificial liner 145.

Generally, each memory opening 49 of the third embodiment can have a width-modulated vertical cross-sectional profile that has a first width w1 at a lower region, a second width w2 at a middle region, and a third width w3 at an upper region. The second width w2 is greater than the first width w1, and the third width w3 is less than the second width and is greater than the first width w1. The lower region of each memory opening 49 extends through the in-process source-level material layers 110' and a first subset of layers of the first-tier alternating stack (132, 142). The middle region of each memory opening 49 is located at levels of a second subset of the layers of the first-tier alternating stack (132, 232) that overlie the first subset of the layers of the first-tier alternating stack (132, 142). The upper region of each memory opening 49 is located at levels of a third subset of the layers of the first-tier alternating stack (132, 142) that overlies the second subset of the layers of the first-tier alternating stack (132, 142).

The lower region of each memory opening 49 can have a first cylindrical sidewall, the middle region of each memory opening 49 can have a second cylindrical sidewall, and the upper region of each memory opening 49 can have a third cylindrical sidewall. In one embodiment, each memory opening 49 can comprise an annular bottom surface that connects a top periphery of the first cylindrical sidewall of the memory opening 49 and a bottom periphery of the second cylindrical sidewall of the memory opening 49. In one embodiment, each memory opening 49 can comprise an annular top surface that connects a top periphery of the second cylindrical sidewall of the memory opening 49 to a bottom periphery of the third cylindrical sidewall of the memory opening 49.

Figure 35D:
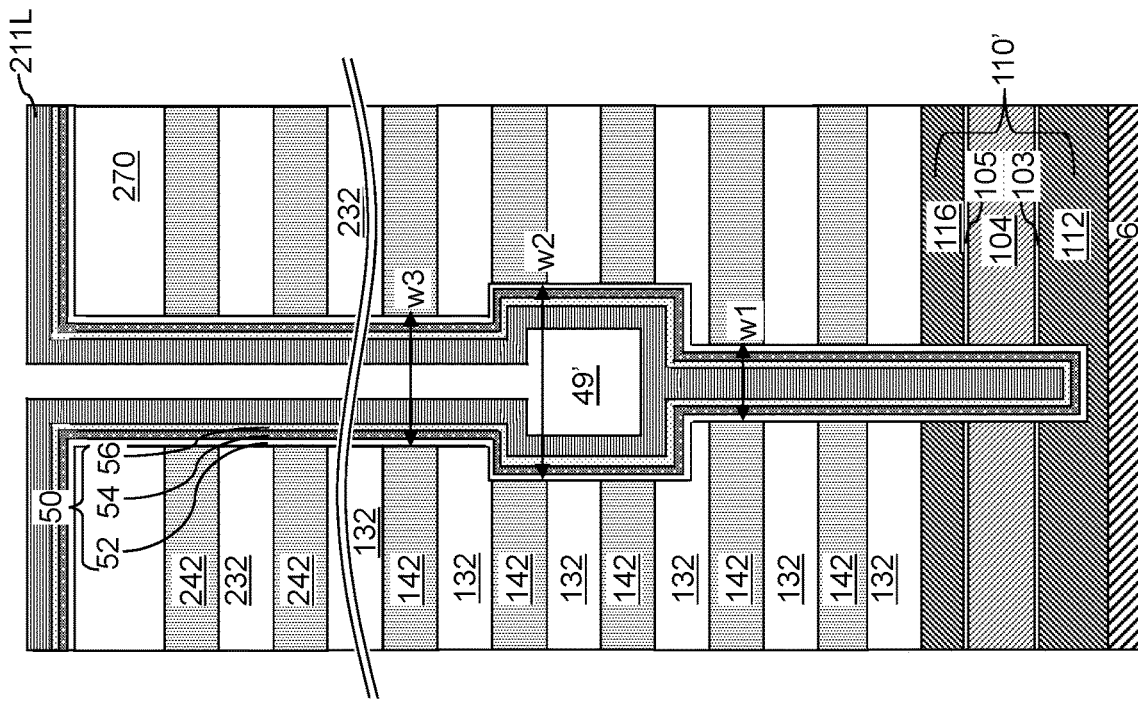
Figure 35C:
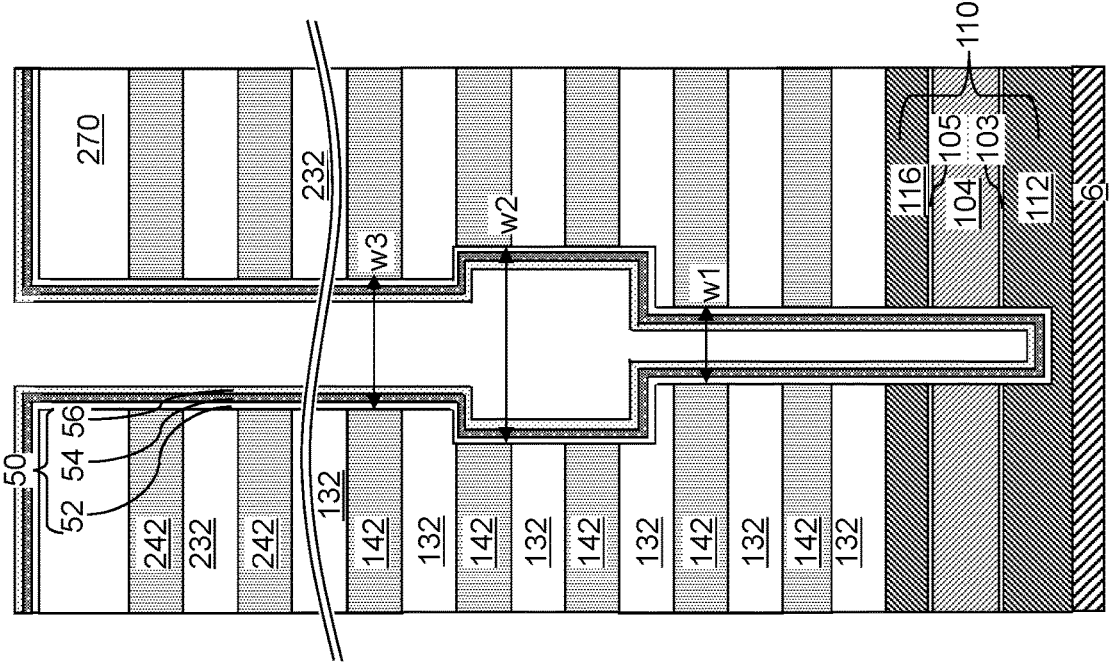

Referring to FIG. 35C, the processing steps of FIG. 9B can be performed to form a memory film 50. The memory film 50 can be formed by conformal deposition processes on the physically exposed sidewalls of each memory opening 49 and each support opening (not expressly shown).

Referring to FIG. 35D, the processing steps of FIG. 24D can be performed to conformally deposit a first semiconductor material employing a non-selective semiconductor deposition process. The non-selective semiconductor deposition process can include, for example, a low pressure chemical vapor deposition (LPCVD) process. A first semiconductor channel material layer 211L can be formed on physically exposed surfaces of the memory film 50 by conformal deposition of the first semiconductor material. The first semiconductor material can include any material that can be employed as the first semiconductor material of the pedestal channel portions 11 at the processing steps of FIG. 20C in the first exemplary structure. As such, the first semiconductor material may comprises amorphous silicon or polysilicon doped with carbon or arsenic.

In one embodiment, first semiconductor channel material layer 211L may be deposited as an amorphous material (e.g., amorphous silicon) that is subsequently crystallized into a polycrystalline semiconductor material (e.g., polysilicon). According to an aspect of the present disclosure, the first semiconductor material of the first semiconductor channel material layer 211L may be deposited with in-situ doping of carbon atoms. In case in-situ doping of carbon atoms is employed to deposit the first semiconductor channel material layer 211L, the non-selective semiconductor deposition process can flow a carbon dopant gas such as methane, ethane, ethylene, acetylene, etc. concurrently with flow of the silicon-containing precursor gas. The average atomic concentration of carbon atoms in the first semiconductor channel material layer 211L may be in a range from $5.0 \times 10^{17}$ atoms/cm$^3$ to $2.0 \times 10^{21}$ atoms/cm$^3$, such as from $2.0 \times 10^{18}$ atoms/cm$^3$ to $1.0 \times 10^{21}$ atoms/cm$^3$, and/or from $1.0 \times 10^{19}$ atoms/cm$^3$ to $1.0 \times 10^{20}$ atoms/cm$^3$, although lesser and greater atomic concentrations can also be employed. The carbon atoms hinder growth of large grains during crystallization of the amorphous material of the first semiconductor channel material layer 211L during a subsequent anneal process. Reduction of the average grain size in the first semiconductor channel material layer 211L induces formation of a large number of grain boundaries in a subsequent anneal process in remaining portions of the first semiconductor channel material layer 211L. The dense network of grain boundaries in remaining portions of the first semiconductor channel material layer 211L decreases diffusion rate of dopant atoms such as n-type dopant atoms provided in a source contact layer that is formed in a subsequent processing step. Thus, control of diffusion of n-type dopants in the remaining portions of the first semiconductor channel material layer 211L can be enhanced due to the presence of carbon atoms in the remaining portions of the first semiconductor channel material layer 211L during the anneal process.

According to another aspect of the present disclosure, the first semiconductor material of the first semiconductor channel material layer 211L may be deposited with in-situ doping of arsenic atoms. In case in-situ doping of arsenic atoms is employed to deposit the first semiconductor channel material layer 211L, the non-selective semiconductor deposition process can flow an arsenic-containing dopant gas such as arsine ($AsH_3$) concurrently with flow of the silicon-containing precursor gas. The average atomic concentration of arsenic atoms in the first semiconductor channel material layer 211L may be in a range from $1.0 \times 10^{18}$ atoms/cm$^3$ to $1.0 \times 10^{20}$ atoms/cm$^3$, such as from $2.0 \times 10^{18}$ atoms/cm$^3$ to $2.0 \times 10^{19}$ atoms/cm$^3$, although lesser and greater atomic concentrations can also be employed. The arsenic atoms provide in-situ n-type doping of the first semiconductor channel material layer 211L. Each remaining portion of the first semiconductor channel material layer 211L can function as an extension of a source region for a vertical field effect transistor that is formed within each memory opening 49. Each remaining portion of the first semiconductor channel material layer 211L, as doped with n-type dopants, provides a path for gate-induced drain leakage (GIDL) current generation during an erase operation of the three-dimensional NAND memory array to be formed.

The duration of the non-selective semiconductor deposition process that forms the first semiconductor channel material layer 211L fills the entirety of the lower region of each memory opening 49 without sealing center portions of the middle region of each memory opening 49 and the upper region of each memory opening 49. A cavity 49' extending through the middle region and the upper region and a second-tier portion of the memory opening 49 can be present within each memory opening 49.

Referring to FIG. 35E, an isotropic recess etch process can be performed to remove portions of the first semiconductor channel material layer 211L from inside the middle region and the upper region of each memory opening 49 and from above the second-tier structure (232, 242, 265, 72). Each remaining portion of the first semiconductor channel material layer 211L fills a lower region of a memory opening 49, and is herein referred to as a pedestal channel portion 211.

Referring to FIG. 35F, a non-selective semiconductor deposition process can be performed to deposit a second semiconductor material to form a semiconductor channel material layer 60L. The second semiconductor material can include a p-doped semiconductor material or an undoped semiconductor material, i.e., a semiconductor material that is not intentionally doped. The undoped semiconductor material may be intrinsic, or may include electrical dopants at an atomic concentration less than $1.0 \times 10^{16}$/cm$^3$, and/or less than $1.0 \times 10^{15}$/cm$^3$. The second semiconductor material of the semiconductor channel material layer 60L may include at least one elemental semiconductor material (e.g., amorphous silicon or polysilicon), at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}$/cm$^3$ to $1.0 \times 10^{18}$/cm$^3$, such as from $1.0 \times 10^{14}$/cm$^3$ to $1.0 \times 10^{17}$/cm$^3$. In one embodiment, the semiconductor channel material layer 60L includes, and/or consists essentially of, boron-doped amorphous silicon or boron-doped polysilicon. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used.

Generally, the second semiconductor material may be free of carbon atoms, or may include carbon atoms at an average atomic concentration less than $1.0 \times 10^{17}$ atoms/cm$^3$, and/or less than $1.0 \times 10^{16}$ atoms/cm$^3$, and/or less than $1.0 \times 10^{15}$ atoms/cm$^3$, and/or less than $1.0 \times 10^{14}$ atoms/cm$^3$, and/or less than $1.0 \times 10^{13}$ atoms/cm$^3$. The semiconductor channel material layer 60L can be formed by non-selectively depositing the second semiconductor material over the pedestal channel portions 211 and on the memory films 50. The second semiconductor material is deposited without in-situ doping of carbon atoms and without in-situ doping of any n-type dopant atoms. The second semiconductor material may be deposited with in-situ doping of p-type dopant atoms, or may be deposited without in-situ doping of any type of dopant atoms.

Referring to FIG. 35G, a dielectric core layer 62L may be deposited in the cavities that remain in the memory openings 49 that are not filled with the semiconductor channel material layer 60L. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating. In one embodiment, a void (i.e., air gap) 169 that is free of any solid phase material is formed within a portion of the memory opening having the second width w2.

Referring to FIG. 35H, the dielectric core layer 62L can be vertically recessed such that each patterned portion of the dielectric core layer 62L has a top surface at, or about, the horizontal plane including the bottom surface of the second insulating cap layer 270. Each remaining portion of the dielectric core layer 62L constitutes a dielectric core 62.

A doped semiconductor material having n-type doping may be deposited in the cavities overlying the dielectric cores 62. Portions of the deposited doped semiconductor material and the semiconductor channel material layer 60L that overlie the horizontal plane including the top surface of the second insulating cap layer 270 may be removed by a planarization process such as a chemical mechanical planarization (CMP) process. Each remaining portion of the n-doped semiconductor material constitutes a drain region 63. The dopant concentration in the drain regions 63 may be in a range from $5.0 \times 10^{18}$/cm$^3$ to $2.0 \times 10^{21}$/cm$^3$, although lesser and greater dopant concentrations may also be used. The n-doped semiconductor material may be, for example, n-doped polysilicon or n-doped amorphous silicon. Each remaining portion of the semiconductor channel material layer 60L constitutes a vertical semiconductor channel 60. A void 169 can be laterally surrounded by a dielectric core 62 that is located inside a vertical semiconductor channel 60.

Each contiguous combination of a pedestal channel portion 211 and a vertical semiconductor channel 60 constitutes a composite semiconductor channel (211, 60). A set of all material portions that fills a memory opening 49 constitutes a memory opening fill structure 58. Each memory opening fill structure 58 can include a memory film 50, a composite semiconductor channel (211, 60), a dielectric core 62, and a drain region 63. Each support pillar structure 20 may have a same set of structural components as a memory opening fill structure 58.

Subsequently, the processing steps of FIG. 25 can be performed to form a contact-level dielectric layer 280. A photoresist layer may be applied over the contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the second-tier structure (232, 242, 270, 265, 72, 280) and the first-tier structure (132, 142, 170, 165), and into the in-process source-level material layers 110'. Portions of the second-tier structure (232, 242, 270, 265, 72, 280), the first-tier structure (132, 142, 170, 165), and the in-process source-level material layers 110' that underlie the openings in the photoresist layer may be removed to form the backside trenches 79. The clusters of memory opening fill structures 58 may be laterally spaced apart along the second horizontal direction hd2 by the backside trenches 79.

Figure 36A:
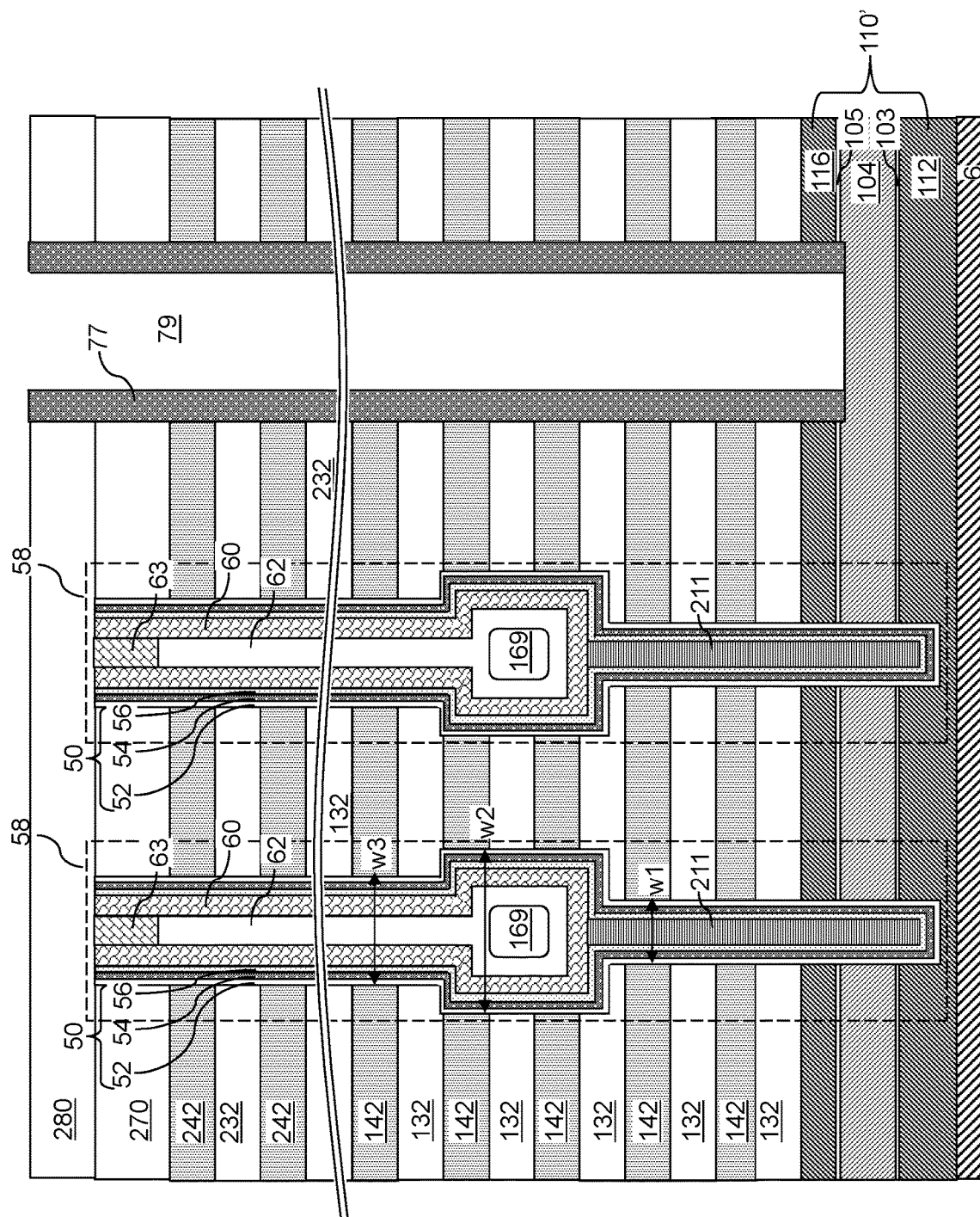
FIGS. 36A-36H illustrate sequential vertical cross-sectional views of a pair of memory openings and a backside trench during formation of a source contact layer and replacement of sacrificial material layers with electrically conductive layers according to the third embodiment of the present disclosure.

Referring to FIG. 36A, the processing steps of FIGS. 14 and 15A can be performed to form a backside trench spacer 77 on sidewalls of each backside trench 79. For example, a conformal spacer material layer may be deposited in the backside trenches 79 and over the second-tier structure (232, 242, 270, 265, 72), and may be anisotropically etched to form the backside trench spacers 77. The backside trench spacers 77 include a material that is different from the material of the source-level sacrificial layer 104. For example, the backside trench spacers 77 may include silicon nitride.

Figure 36B:
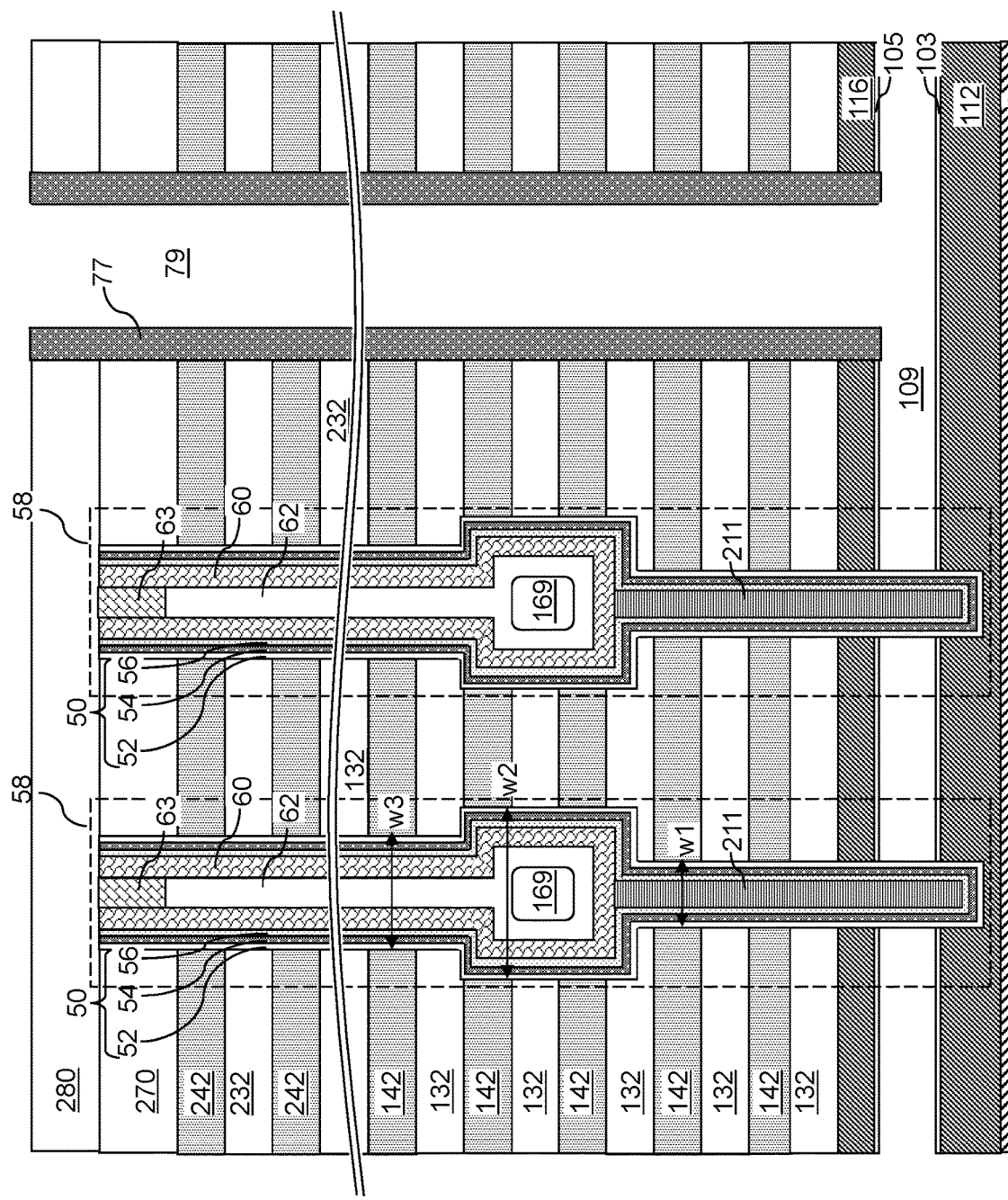

Referring to FIG. 36B, an etchant that etches the material of the source-level sacrificial layer 104 selective to the materials of the backside trench spacers 77, the second insulating cap layer 270, the upper sacrificial liner 105, and the lower sacrificial liner 103 may be introduced into the backside trenches in an isotropic etch process. For example, the processing steps of FIG. 15B may be performed. A source cavity 109 is formed in the volume from which the source-level sacrificial layer 104 is removed.

Figure 36C:
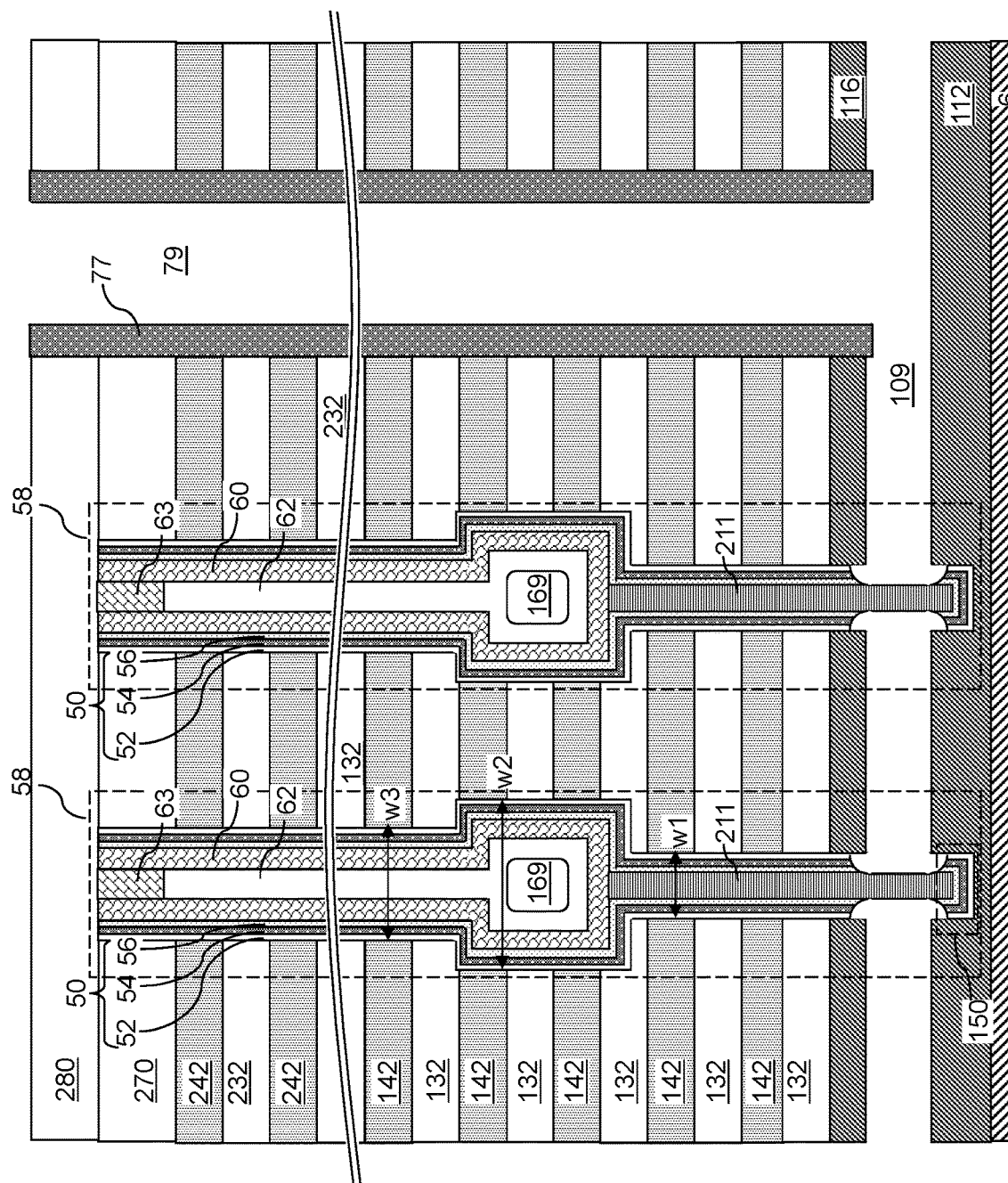

Referring to FIG. 36C, a sequence of isotropic etchants, such as wet etchants, may be applied to the physically exposed portions of the memory films 50 to sequentially etch the various component layers of the memory films 50 from outside to inside, and to physically expose cylindrical surfaces of the pedestal channel portions 211 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the pedestal channel portions 211.

Generally, the source cavity 109 can be formed by removing the source-level sacrificial layer 104 and a cylindrical portion of each memory film 50 located at the level of the source-level sacrificial layer 104. A bottom portion of each memory film 50 is detached from a predominant remaining portion of the memory film 50 upon removal of the cylindrical portion of the memory film 50. The detached bottom portion of each memory film 50 is herein referred to as a bottom dielectric cap structure 150. Each bottom dielectric cap structure 150 can have the same set of material compositions as component layers of the overlying memory film 50. In one embodiment, each of the memory film 50 and each bottom dielectric cap structure 150 can comprise a respective layer stack including, from one side to another, a blocking dielectric layer 52, a charge storage layer 54, and a tunneling dielectric layer 56. In one embodiment, each bottom dielectric cap structure 150 comprises a concave annular surface that is formed due to the isotropic nature of the etch process employed to form the source cavity 109. In one embodiment, each memory opening fill structure 58 may be formed with straight sidewalls at the levels of the in-process source-level material layers 110'. In this case, a bottom periphery of an outer sidewall of the memory film 50 and a top periphery of an outer sidewall of the bottom dielectric cap structure 150 may have the same horizontal cross-sectional shape, and may overlap with each other in a plan view. As used herein, a plan view is a view along a vertical direction, which is the direction that is perpendicular to the top surface of the substrate 8.

Figure 36D:
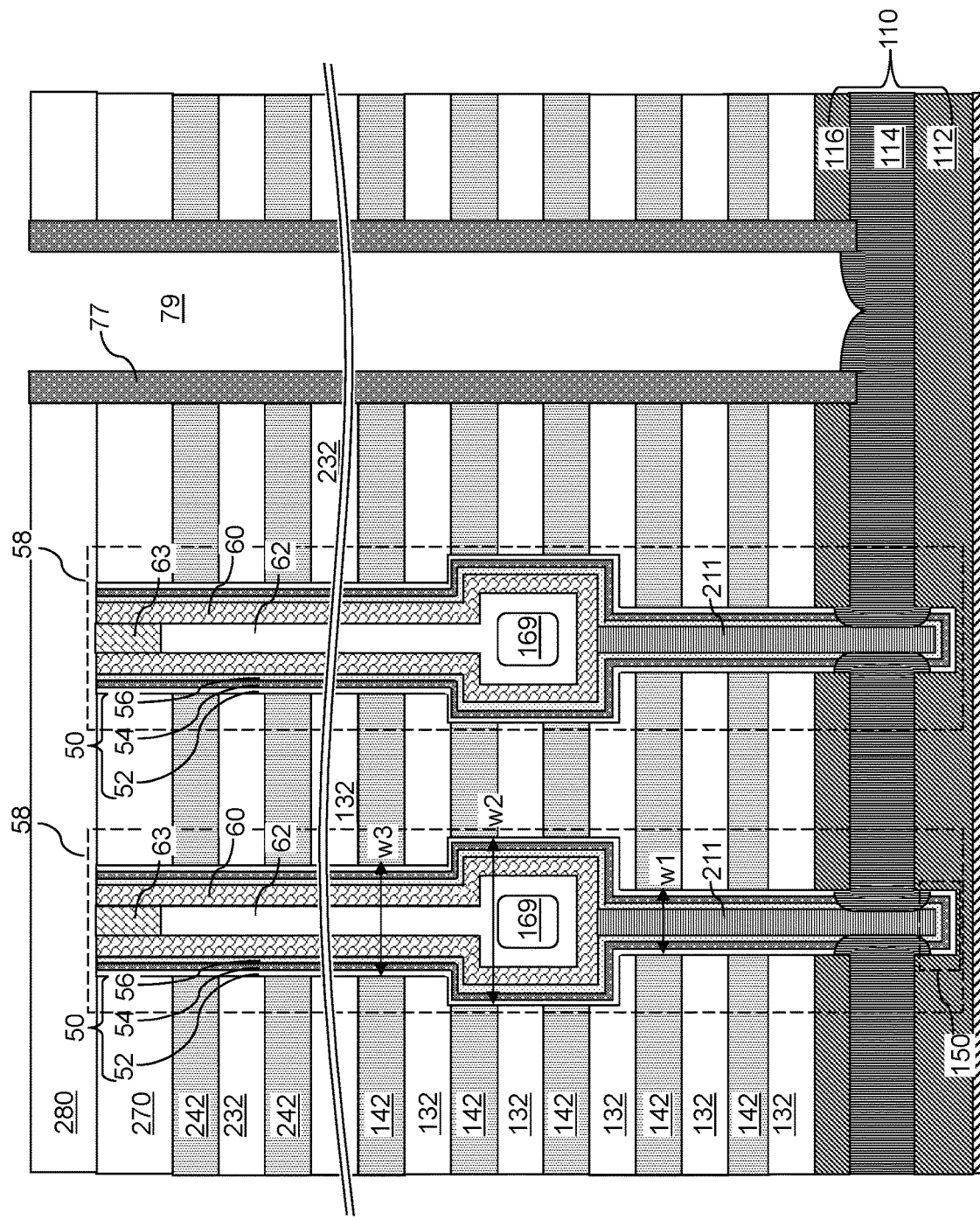

Referring to FIG. 36D, a semiconductor material, such as polysilicon, having a doping of the second conductivity type may be deposited on the physically exposed surfaces around the source cavity 109. In one embodiment, the second conductivity type can be n-type. The processing steps of FIG. 15D may be performed to deposit the n-doped semiconductor material. The physically exposed surfaces include physically exposed cylindrical surface segments of the pedestal channel portions 211 and a horizontal surface of the at least one source-level semiconductor layer (such as a bottom surface of the upper source-level semiconductor layer 116 and/or a top surface of the lower source-level semiconductor layer 112).

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In one embodiment, the selective semiconductor deposition process grows an n-doped semiconductor material from physically exposed semiconductor surfaces around the source cavity 109, which include the physically exposed cylindrical surface segments of the pedestal channel portions 211. Alternatively, the n-doped semiconductor material may be deposited on all physically exposed surfaces of the source cavity 109 by a non-selective semiconductor deposition process. In this case, portions of the deposited semiconductor material may be etched back from above the second insulating cap layer 270 and from inside the backside trenches 79.

The deposited doped semiconductor material forms a source contact layer 114, which contacts sidewalls of the pedestal channel portions 211. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. In one embodiment, the second conductivity type can be n-type, and the electrical dopants within the source contact layer 114 may include phosphorous atoms, arsenic atoms, and/or antimony atoms. The source contact layer 114 as initially formed may consist essentially of semiconductor atoms and dopant atoms of the second conductivity type. Alternatively, the source contact layer 114 may also include carbon dopant atoms in addition to the semiconductor (e.g., silicon) atoms and the n-type dopant atoms (e.g., P and/or As).

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the doped semiconductor material may include doped polysilicon. Thus, the source-level sacrificial layer 104 may be replaced with the source contact layer 114. The layer stack including the lower source-level semiconductor layer 112, the source contact layer 114, and the upper source-level semiconductor layer 116 constitutes source-level material layers 110, which replaces the in-process source-level material layers 110'. The source-level material layers 110 are collectively referred to as a buried source layer.

Generally, the source contact layer 114 can be deposited in the source cavity 109 on each cylindrical sidewall of the pedestal channel portions 211. In one embodiment, the source contact layer 114 can be deposited with in-situ doping of n-type dopant atoms, which is subsequently employed as a dopant source for n-type dopants to diffuse into pedestal channel portions to be subsequently formed in the memory openings 49. In one embodiment, each memory film 50 can comprise a concave annular bottom surface segment that contacts the source contact layer 114, and the outer periphery of the concave annular bottom surface may be located at a greater vertical distance from the substrate 8 than an inner periphery of the concave annular bottom surface is from the substrate 8 due to the etch profile provided by the isotropic etch process employed to remove cylindrical portions of the memory films 50 during formation of the source cavity 109.

Figure 36E:
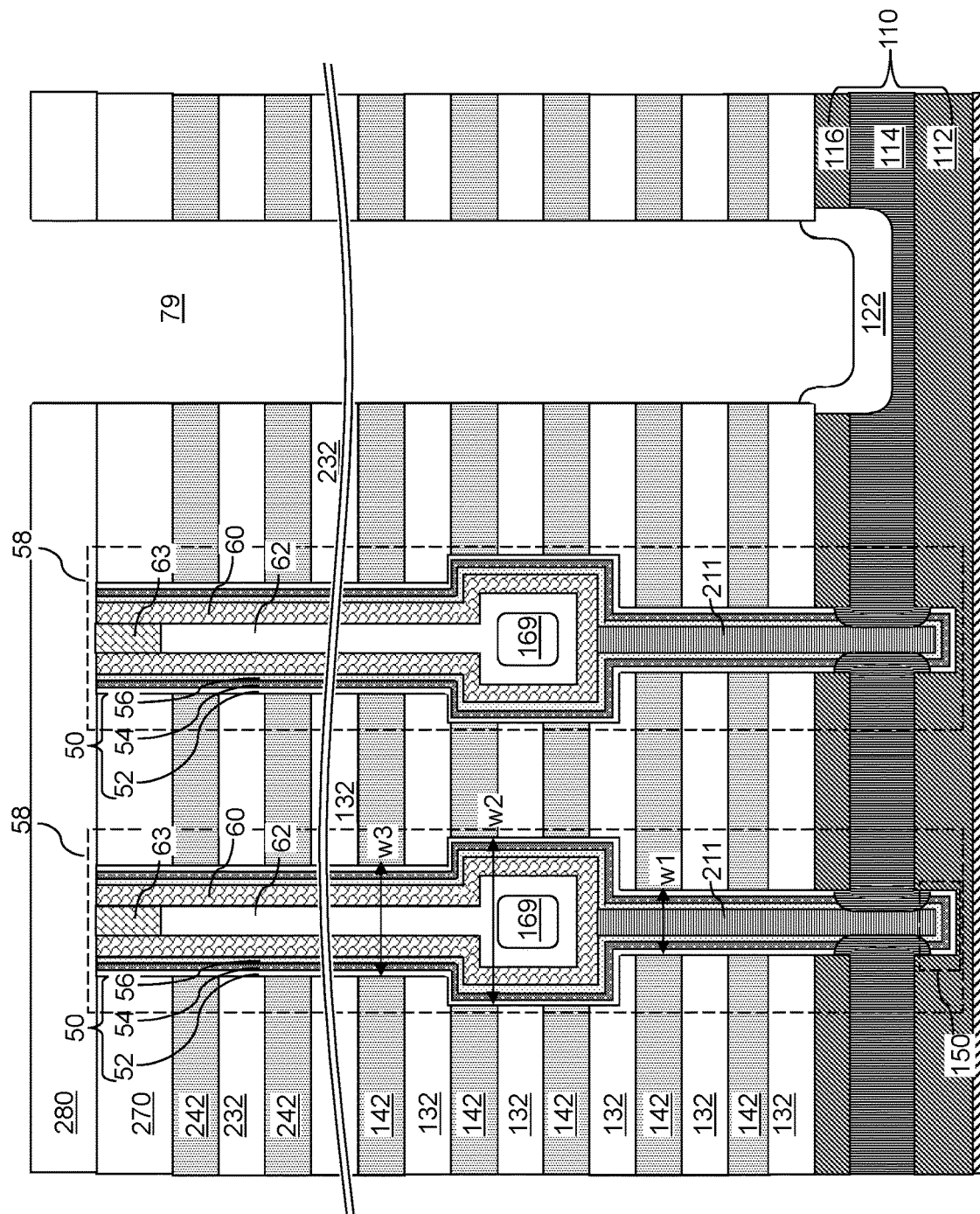

Referring to FIG. 36E, the backside trench spacers 77 may be removed selective to the insulating layers (132, 232), the first and second insulating cap layers (170, 270), and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122.

Figure 36F:
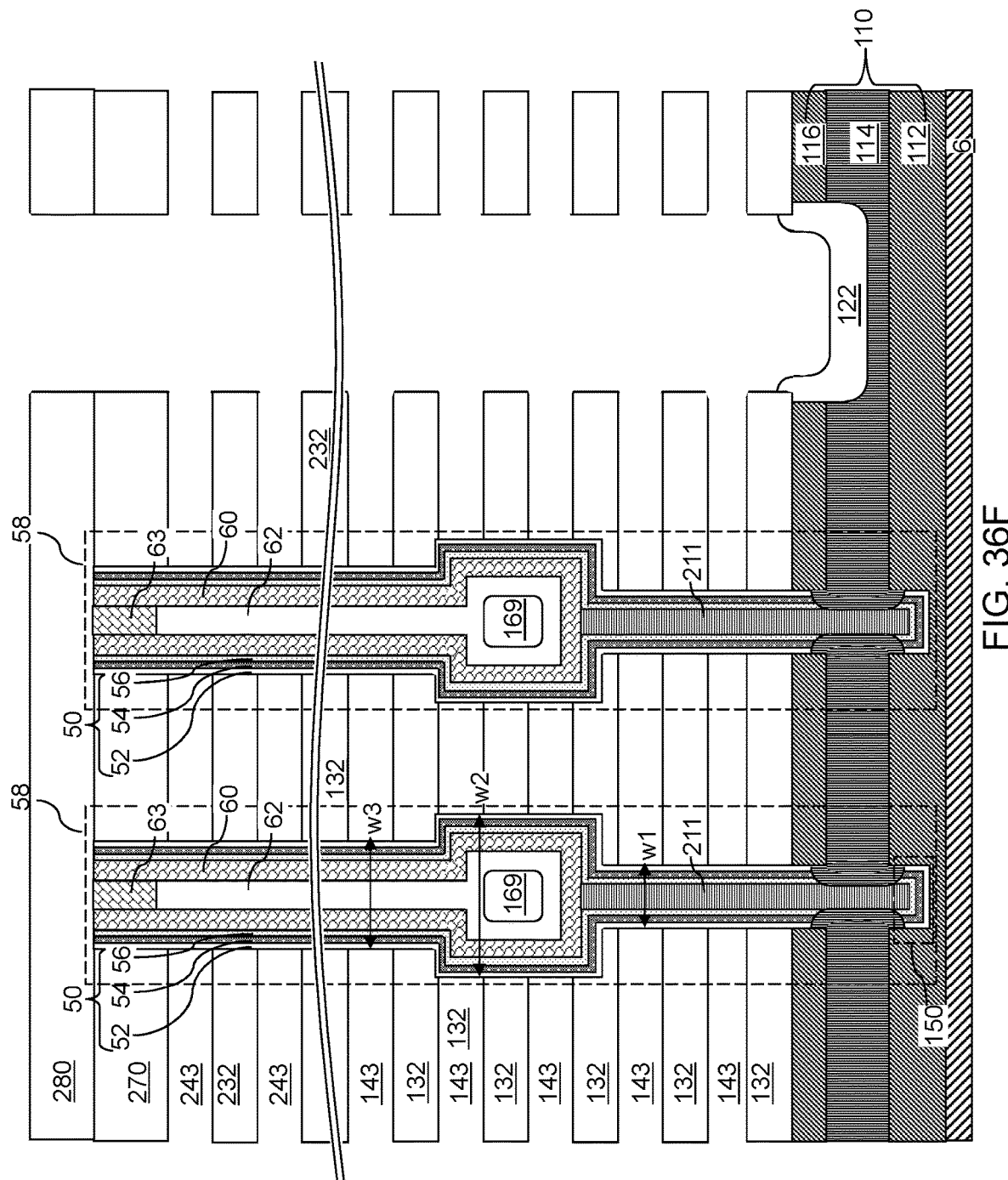

Referring to FIG. 36F, the sacrificial material layers (142, 242) are may be removed selective to the insulating layers (132, 232), the first and second insulating cap layers (170, 270), and the source contact layer 114, and the dielectric semiconductor oxide plates 122. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 36G:
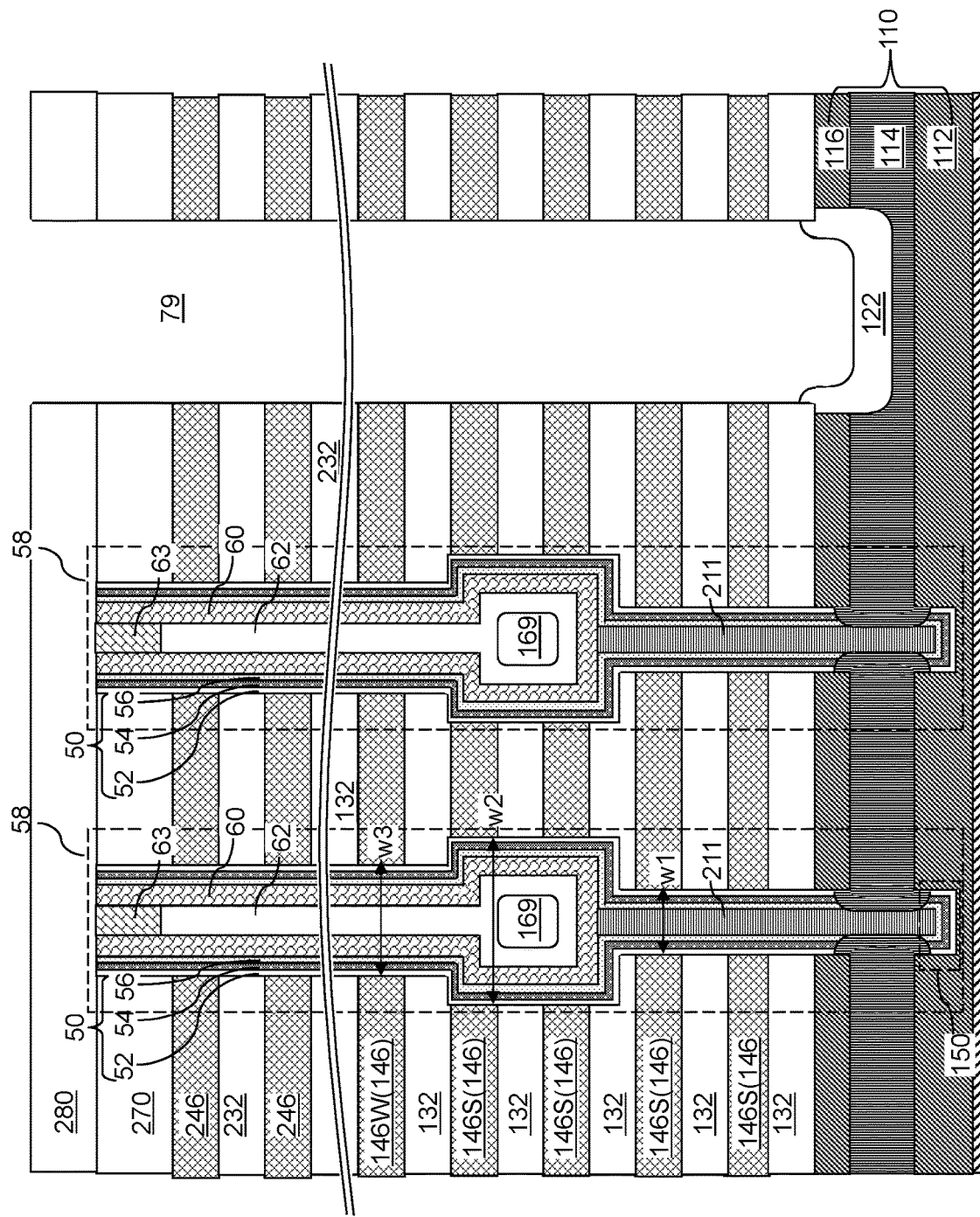

Referring to FIG. 36G, a backside blocking dielectric layer (not shown) may be optionally deposited in the backside recesses (143, 243) and the backside trenches 79 and over the second-tier structure (232, 242, 270, 265, 72). The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the second-tier structure (232, 242, 270, 265, 72). The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the second-tier structure (232, 242, 270, 265, 72). Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the second-tier structure (232, 242, 270, 265, 72), for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In one embodiment, the electrically conductive layers (146, 246) can comprise source-select-level electrically conductive layers (i.e., source side select gate electrode layers) 146S located below a horizontal plane including an outer periphery of the top surface of a pedestal channel portion 11, and word-line-level electrically conductive layers (i.e., word lines) (146W, 246) located above the horizontal plane including the outer periphery of the top surface of the pedestal channel portion 11. Each memory opening 49 can vertically extend through the source-select-level electrically conductive layers 146S, the word-line-level electrically conductive layers (146W, 246), and the upper source-level semiconductor layer 116 with a straight sidewall. Each source-select-level electrically conductive layers 146S can be formed by replacing a first sacrificial material layer 146 within the first subset of layers of the first-tier alternating stack (132, 142), which include M1 first insulating layers 132 and M1 first sacrificial material layers. Each first sacrificial material layer 142 within the second subset of layers of the first-tier alternating stack (132, 142) can be replaced with a respective word-line-level electrically conductive layer 146W that is a subset of the first electrically conductive layers 146.

Figure 36H:
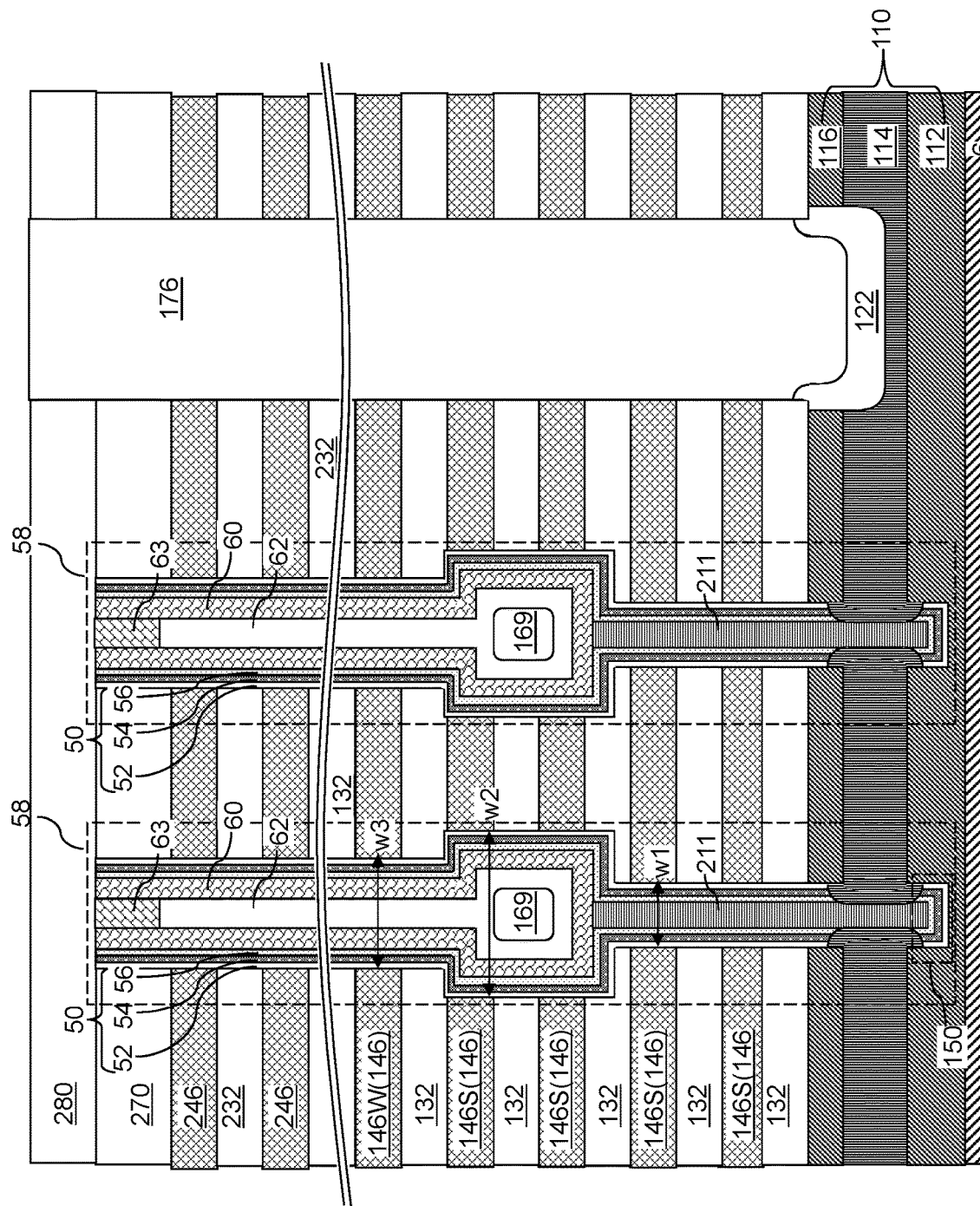

Referring to FIG. 36H, a dielectric fill material can be deposited in the backside trenches 79 to form dielectric backside trench fill structures 176.

In case at least one of the first semiconductor material and the second semiconductor material is amorphous, an anneal process can be performed to crystallize the first semiconductor material and optionally the second semiconductor material (in case the second semiconductor material is amorphous). The pedestal channel portions 211 and the vertical semiconductor channel 60 can be annealed at an elevated temperature, which may be in a range from 800 degrees Celsius to 1,050 degrees Celsius. The duration of the anneal process may be in a range from 1 second to 1 hour depending on the anneal temperature. Any amorphous semiconductor material of the pedestal channel portions 211 and the vertical semiconductor channels 60 can be converted into a respective polycrystalline semiconductor material.

In case pedestal channel portion 211 is not in-situ doped with n-type dopant atoms and is doped with carbon atoms, an anneal process can be performed to induce diffusion of n-type electrical dopants from the source contact layer 114 into the pedestal channel portion 211. In this case, the carbon atoms cause the polycrystalline grains of the pedestal channel portions 211 to remain small. However, the vertical semiconductor channels 60 can have large grains to provide high electrical conductivity for charge carriers (such as electrons) during operation of the vertical NAND strings. According to an embodiment of the present disclosure, control of diffusion of n-type dopants in the pedestal channel portions 211 is facilitated by the small average grain size in the pedestal channel portions 211, and channel conductivity in the vertical semiconductor channels 60 is enhanced by large grains of the vertical semiconductor channels 60 that are enabled by absence of carbon atoms or presence of carbon atoms only at trace levels. In this case, the n-type dopant atoms in the source contact layer 114 diffuse in the pedestal channel portions 211 at a lower diffusion rate than in the vertical semiconductor channels 60.

In one embodiment, the pedestal channel portions 211 can be polycrystalline and can have a first average grain size, and the vertical semiconductor channels 60 can be polycrystalline and can have a second average grain size that is at least 50% larger than the first average grain size.

In one embodiment, the pedestal channel portions 211 are formed as polysilicon with in-situ arsenic doping, and vertical semiconductor channels 60 may be formed as polysilicon. In this case, an anneal process is not necessary although an anneal process may be employed to increase the grain size of the second semiconductor material in the vertical semiconductor channels 60.

Generally, each pedestal channel portion 211 can have a cylindrical sidewall segment that contacts the source contact layer 114, and can include at least one of carbon and arsenic as dopant atoms at a first average dopant concentration. Each vertical semiconductor channel 60 can contact a top surface of the pedestal channel portion 211. Each vertical semiconductor channel 60 can include the least one of carbon and arsenic dopant atoms at a second average dopant concentration that is less than 20%, and/or less than 5%, and/or less than 1%, and/or less than 0.3%, and/or less than 0.1%, and/or less than 0.03%, and/or less than 0.01%, and/or less than 0.003%, and/or less than 0.001%, of the first average least one of carbon and arsenic dopant concentration, or can be free of the least one of carbon and arsenic dopants atoms.

In one embodiment, each pedestal channel portion 211 comprises carbon atoms at an average atomic concentration in a range from $5.0 \times 10^{17}$ atoms/cm$^3$ to $2.0 \times 10^{21}$ atoms/cm$^3$, and each vertical semiconductor channel 60 comprises carbon atoms at an average atomic concentration less than $1.0 \times 10^{17}$ atoms/cm$^3$ or is free of carbon atoms. Additionally, each pedestal channel portion 211 can comprise n-type dopant atoms at an average atomic concentration in a range from $1.0 \times 10^{18}$ atoms/cm$^3$ to $1.0 \times 10^{20}$ atoms/cm$^3$, and each vertical semiconductor channel 60 can include n-type dopant atoms at an average atomic concentration of than $1.0 \times 10^{17}$ atoms/cm$^3$, or can be free of n-type dopant atoms.

In one embodiment, each pedestal channel portion 211 can comprise arsenic atoms at an average atomic concentration in a range from $1.0 \times 10^{18}$ atoms/cm$^3$ to $1.0 \times 10^{20}$ atoms/cm$^3$, and each vertical semiconductor channel 60 can comprise arsenic atoms at an average atomic concentration less than $1.0 \times 10^{17}$ atoms/cm$^3$, such as less than $1.0 \times 10^{15}$ atoms/cm$^3$, and/or less than $1.0 \times 10^{14}$ atoms/cm$^3$, or is free of arsenic atoms.

Figure 37:
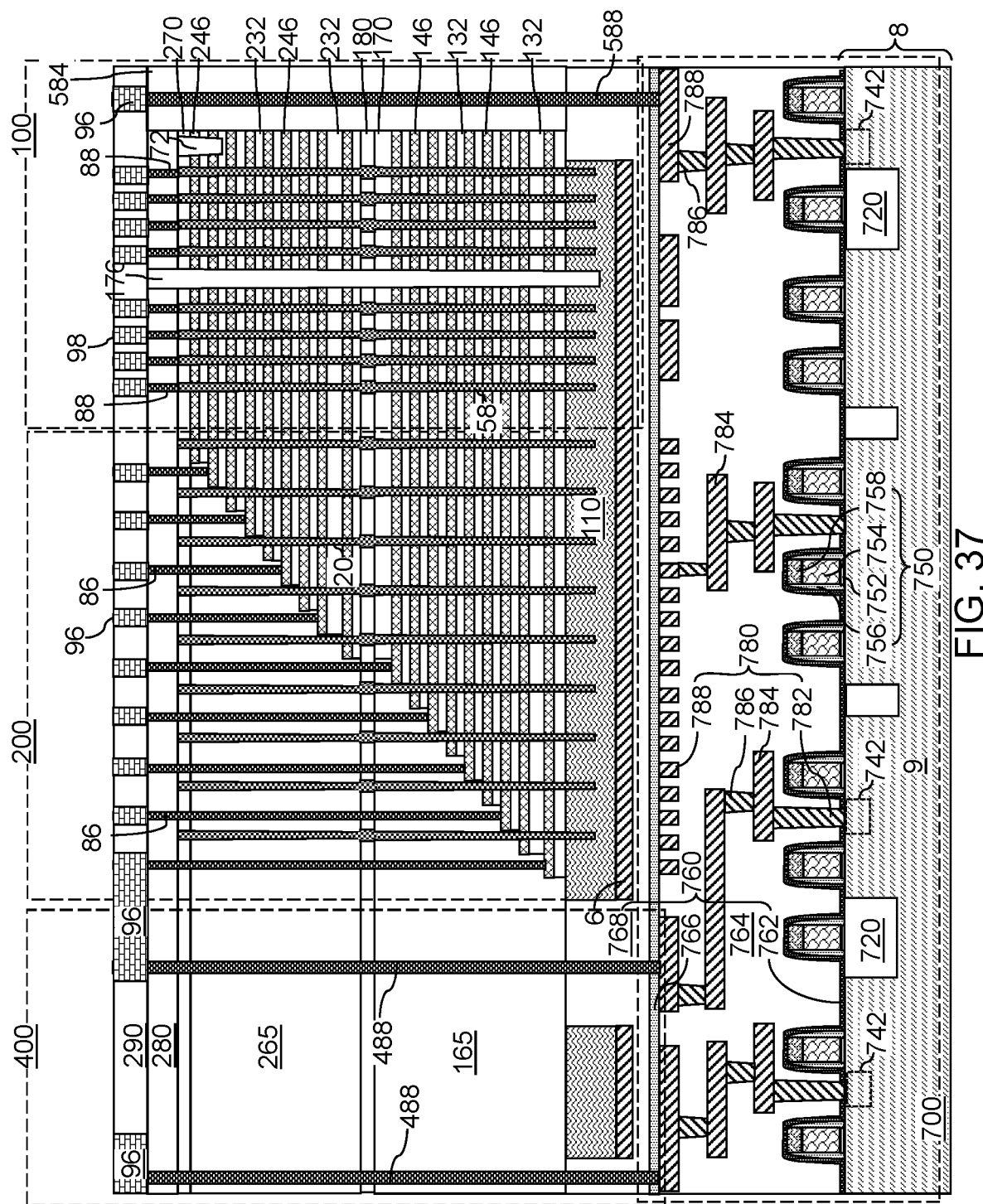
FIG. 37 is a vertical cross-sectional view of the third exemplary structure after formation of various contact via structures, through-memory-level via structures, and upper metal line structures according to the third embodiment of the present disclosure.

Referring to FIG. 37, a photoresist layer (not shown) may be applied over the contact-level dielectric layer 280, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the contact-level dielectric layer 280 and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory opening fill structures 58.

Referring to FIGS. 31A-37 and related drawings and according to various aspects of the third embodiment of the present disclosure, a three-dimensional memory device is provided, which comprises: an alternating stack of insulating layers (132, 232) and electrically conductive layers (146, 246) located over a substrate 8, wherein the electrically conductive layers (146, 246) comprise source-select-level electrically conductive layers 146S and word-line-level electrically conductive layers (146W, 246) overlying the source-select-level electrically conductive layers 146S; a source contact layer 114 located between the substrate 8 and the alternating stack {(132, 146), (232, 246)}; a memory opening 49 vertically extending through the alternating stack {(132, 146), (232, 246)} and the source contact layer 114 with a width-modulated vertical cross-sectional profile that has a first width w1 at and below levels of the source-select-level electrically conductive layers 146S, and has a second width w2 that is greater than the first width w1 at levels of a first subset of the word-line-level electrically conductive layers 146W; and a memory opening fill structure 58 located within the memory opening 49 and comprising a composite semiconductor channel (211, 60) and a memory film 50 laterally surrounding the composite semiconductor channel (211, 60), wherein the composite semiconductor channel (211, 60) comprises: a pedestal channel portion 211 located within a portion of the memory opening 49 having the first width w1 and having a cylindrical sidewall segment that contacts the source contact layer 114; and a vertical semiconductor channel 60 contacting a top surface of the pedestal channel portion 211 and extending through the word-line-level electrically conductive layers (146W, 246).

In one embodiment, the memory opening 49 comprises an annular bottom surface that connects a top periphery of a first cylindrical sidewall of the memory opening 49 extending through the source-select-level electrically conductive layers 146S and a bottom periphery of a second cylindrical sidewall of the memory opening 49 extending through the first subset of the word-line-level electrically conductive layers (146W), which are the bottommost M1 first electrically conductive layers 146.

In one embodiment, the memory opening 49 has a third width w3 that is less than the second width w2 at levels of a second subset of the word-line-level electrically conductive layers (such as a subset of the first electrically conductive layers 146 that excludes the set of M bottommost first electrically conductive layers 146) that overlie the first subset of the word-line-level electrically conductive layers (which include the M2 bottommost word-line-level electrically conductive layers located between the M1 source-select-level electrically conductive layers 146S and (N-M) first electrically conductive layers 146, N being the total number of the first electrically conductive layers 146). The vertical semiconductor channel 60 vertically extends through each layer within the second subset of the word-line-level electrically conductive layers (146W, 246).

In one embodiment, the top surface of the pedestal channel portion 211 is located between a horizontal plane including a bottom surface of a bottommost one of the word-line-level electrically conductive layers (146W, 246) and a horizontal plane including a top surface of a topmost one of the source-select-level electrically conductive layers 146S; and a void 169 that is free of any solid phase material is located within a portion of the memory opening 49 having the second width w2, and is laterally surrounded by a dielectric core 62 located inside the vertical semiconductor channel 60.

In one embodiment, the memory film 50 comprises a concave annular bottom surface segment that contacts the source contact layer 114; and an outer periphery of the concave annular bottom surface is located at a greater vertical distance from the substrate 8 than an inner periphery of the concave annular bottom surface is from the substrate 8.

In one embodiment, the pedestal channel portion 211 contacts the source contact layer 114 at a cylindrical interface located within a cylindrical vertical plane located at or inside an inner sidewall of a portion of the memory film 50 that extends through the source-select-level electrically conductive layers 146S.

In one embodiment, the memory opening fill structure 58 comprises a bottom dielectric cap structure 150 having a same set of material compositions as component layers of the memory film 50, and contacting a bottom surface of the pedestal channel portion 211; and the bottom dielectric cap structure 150 comprises a concave annular surface that contacts the source contact layer 114. In one embodiment, a bottom periphery of an outer sidewall of a portion of the memory film 50 extending through the source-select-level electrically conductive layers 146S and a top periphery of an outer sidewall of the bottom dielectric cap structure 150 have a same horizontal cross-sectional shape and overlap with each other in a plan view; and each of the memory film 50 and the bottom dielectric cap structure 150 comprises a layer stack including, from one side to another, a blocking dielectric layer 52, a charge storage layer 54, and a tunneling dielectric layer 56.

In one embodiment, the pedestal channel portion 211 includes at least one of carbon and arsenic as dopant atoms at a first average dopant concentration; and the vertical semiconductor channel 60 includes the at least one of carbon or arsenic dopant atoms at a second average dopant concentration that is less than 20% of the first average dopant concentration or is free of the at least one of carbon or arsenic dopants atoms. In one embodiment, the pedestal channel portion 211 comprises polysilicon containing carbon atoms at an average atomic concentration in a range from $5.0 \times 10^{17}$ atoms/cm$^3$ to $2.0 \times 10^{21}$ atoms/cm$^3$; and the vertical semiconductor channel 60 comprises polysilicon containing carbon atoms at an average atomic concentration less than $1.0 \times 10^{17}$ atoms/cm$^3$ or is free of carbon atoms.

In one embodiment, the pedestal channel portion 211 comprises n-type dopant atoms at an average atomic concentration in a range from $1.0 \times 10^{18}$ atoms/cm$^3$ to $1.0 \times 10^{20}$ atoms/cm$^3$; and the vertical semiconductor channel 60 includes n-type dopant atoms at an average atomic concentration of than $1.0 \times 10^{17}$ atoms/cm$^3$, or is free of n-type dopant atoms.

In one embodiment, the pedestal channel portion 211 comprises polysilicon containing arsenic atoms at an average atomic concentration in a range from $1.0 \times 10^{18}$ atoms/cm$^3$ to $1.0 \times 10^{20}$ atoms/cm$^3$; and the vertical semiconductor channel 60 comprises arsenic atoms at an average atomic concentration less than $1.0 \times 10^{17}$ atoms/cm$^3$ or is free of arsenic atoms.

In one embodiment, the pedestal channel portion 211 is polycrystalline and has a first average grain size; and the vertical semiconductor channel 60 is polycrystalline and has a second average grain size that is at least 50% larger than the first average grain size.

The various embodiments of the present disclosure can be employed to provide a controlled n-type doping profile at a bottom portion of a composite semiconductor channel {(11, 60), (11, 311, 60), (211, 60)}. The controlled n-type doping profile can be provided by employing carbon doping in a pedestal channel portion (11 or 211) and/or in a pillar channel portion 311 (if employed), and employing a vertical semiconductor channel 60 that is carbon-free or includes a trace amount of carbon atoms therein. The carbon atoms cause grains of the pedestal channel portion (11 or 211) and/or the pillar channel portion 311 (if employed) to be relatively small, thereby facilitating control of diffusion of n-type dopants from a source contact layer 114. The absence of carbon atoms in the vertical semiconductor channels 60 allows formation of large grains in the vertical semiconductor channel 60, thereby providing high electrical conductivity for charge carriers through reduction of charge carrier scattering at grain boundaries. Alternately or additionally, the pedestal channel portion (11 or 211) and/or the pillar channel portion 311 (if employed) can be in-situ doped with slower diffusing n-type dopant atoms, such as arsenic atoms. The embodiments provide a sharp p-n junction at the boundary between the vertical semiconductor channel 60 and the pedestal channel portion (11 or 211) or the pillar channel portion 311 (if employed). The controlled n-type doping profile can be advantageously employed to provide a suitable level of gate-induced drain leakage (GIDL) current while minimizing unnecessary leakage current through a semiconductor channel of NAND strings.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate;
source-level material layers located between the substrate and the alternating stack, wherein the source-level material layers comprise, from bottom to top, a lower source-level semiconductor layer, a source contact layer, and an upper source-level semiconductor layer;
a memory opening vertically extending through the alternating stack, the upper source-level semiconductor layer, the source contact layer, and an upper portion of the lower source-level semiconductor layer; and
a memory opening fill structure located within the memory opening and comprising a semiconductor constriction ring, a composite semiconductor channel, and a memory film laterally surrounding the composite semiconductor channel,
wherein:
the semiconductor constriction ring is located on, and within, a cylindrical surface of the upper source-level semiconductor layer;
the memory film contacts an inner sidewall of the semiconductor constriction ring and has a lesser lateral dimension inside the semiconductor constriction ring than above the semiconductor constriction ring; and
the composite semiconductor channel comprises a pedestal channel portion in contact with the source contact layer, and a vertical semiconductor channel that overlies the pedestal channel portion.

2. The three-dimensional memory device of claim 1, wherein the composite semiconductor channel further comprises a pillar channel portion contacting a top surface of the pedestal channel portion and a bottom surface of the vertical semiconductor channel.

3. The three-dimensional memory device of claim 2, wherein:
each of the pillar channel portion and the pedestal channel portion includes n-type dopant atoms at a respective average atomic concentration in a range from $1.0 \times 10^{18}/\text{cm}^3$ to $2.0 \times 10^{21}/\text{cm}^3$; and
the vertical semiconductor channel is intrinsic or includes electrical dopants at an atomic concentration not greater than $1.0 \times 10^{17}/\text{cm}^3$.

4. The three-dimensional memory device of claim 2, wherein:
the electrically conductive layers comprise:
source-select-level electrically conductive layers located below a horizontal plane including a bottom surface of the vertical semiconductor channel, and
word-line-level electrically conductive layers located above the horizontal plane including the bottom surface of the vertical semiconductor channel; and
the pedestal channel portion is located below a horizontal plane including a bottom surface of a bottommost one of the electrically conductive layers.

5. The three-dimensional memory device of claim 2, wherein:

the pillar channel portion comprises at least one of carbon and arsenic as dopant atoms at a first average dopant concentration; and
the vertical semiconductor channel includes the at least one of carbon or arsenic dopant atoms at a second average dopant concentration that is less than 20% of the first average dopant concentration or is free of the at least one of carbon or arsenic dopants atoms.

6. The three-dimensional memory device of claim 5, wherein:
the pillar channel portion comprises polysilicon containing carbon atoms at an average atomic concentration in a range from $5.0 \times 10^{17}$ atoms/cm$^3$ to $4.0 \times 10^{21}$ atoms/cm$^3$; and
the vertical semiconductor channel comprises polysilicon containing carbon atoms at an average atomic concentration less than $1.0 \times 10^{17}$ atoms/cm$^3$ or is free of carbon atoms.

7. The three-dimensional memory device of claim 5, wherein:
the pillar channel portion comprises polysilicon containing arsenic atoms at an average atomic concentration in a range from $1.0 \times 10^{18}$ atoms/cm$^3$ to $1.0 \times 10^{20}$ atoms/cm$^3$; and
the vertical semiconductor channel comprises polysilicon containing arsenic atoms at an average atomic concentration less than $1.0 \times 10^{17}$ atoms/cm$^3$ or is free of arsenic atoms.

8. The three-dimensional memory device of claim 1, wherein:
the pillar channel portion is polycrystalline and has a first average grain size; and
the vertical semiconductor channel is polycrystalline and has a second average grain size that is at least 50% larger than the first average grain size.

9. The three-dimensional memory device of claim 1, wherein:
the pedestal channel portion comprises a cylindrical sidewall segment that contacts the source contact layer; and
a periphery of a horizontal cross-sectional shape of the cylindrical sidewall segment of the pedestal channel portion is located entirely within and is laterally offset inward from a horizontal cross-sectional shape of the cylindrical surface of the upper source-level semiconductor layer in a plan view along a vertical direction.

10. The three-dimensional memory device of claim 9, wherein:
an upper segment of the pedestal channel portion contacts the memory film;
a middle segment of the pedestal channel portion contacts the source contact layer; and
a lower segment of the pedestal channel portion is located below a horizontal plane including a bottom periphery of an interface between the pedestal channel portion and the source contact layer.

11. The three-dimensional memory device of claim 10, wherein:
the upper segment of the pedestal channel portion comprises a region having a lesser lateral dimension than the middle segment of the pedestal channel portion; and
a void that is free of any solid phase material is located within the middle segment of the pedestal channel portion.

12. The three-dimensional memory device of claim 1, wherein the semiconductor constriction ring comprises:

an outer cylindrical surface that contacts a sidewall of a bottommost one of the insulating layers and a sidewall of the source contact layer; and an inner surface that contacts the memory film and comprising an upper annular convex surface segment, a lower annular convex surface segment, and a cylindrical surface segment that connects the upper annular convex surface segment and the lower annular convex surface segment.

13. The three-dimensional memory device of claim 1, wherein the memory opening fill structure further comprises:

a semiconductor constriction cap structure contacting a planar surface and a cylindrical surface of the lower source-level semiconductor layer, underlying the pedestal channel portion, and having a same material composition as the semiconductor constriction ring; and a bottom dielectric cap structure having a same set of material compositions as component layers of the memory film, and contacting a bottom surface of the pedestal channel portion.

14. The three-dimensional memory device of claim 13, wherein:

the semiconductor constriction cap structure comprises a cylindrical portion and a plate portion adjoined to a bottom end of the cylindrical portion;

a top surface of the plate portion of the semiconductor constriction cap structure and an inner cylindrical surface of the cylindrical portion of the semiconductor constriction cap structure contact surfaces of the bottom dielectric cap structure; and the bottom dielectric cap structure comprises a concave annular surface that contacts the source contact layer.

15. A method of forming a three-dimensional semiconductor device, comprising:

forming in-process source-level material layers over a substrate, the in-process source-level material layers comprise, from bottom to top, a lower source-level semiconductor layer, a source-level sacrificial layer, and an upper source-level semiconductor layer;

forming an alternating stack of insulating layers and sacrificial material layers over the sacrificial source layer;

forming a memory opening through the alternating stack and into the in-process source-level material layers;

growing a semiconductor constriction ring from a surface of the upper source-level sacrificial layer by performing a selective semiconductor deposition process inside the memory opening;

forming a memory film at a peripheral portion of the memory opening over the semiconductor constriction ring;

forming a composite semiconductor channel including a pedestal channel portion and a vertical semiconductor channel over the memory film;

forming a source cavity by removing the source-level sacrificial layer and a cylindrical portion of the memory film located at a level of the source-level sacrificial layer;

depositing a source contact layer in the source cavity on a cylindrical sidewall of the pedestal channel portion; and replacing the sacrificial material layers with electrically conductive layers.

16. The method of claim 15, wherein the pedestal channel portion is formed by:

conformally depositing a first semiconductor material on the memory film, wherein a portion of the first semiconductor material deposited within a region laterally surrounded by the semiconductor constriction ring is plugged with the first semiconductor material; and removing portions of the first semiconductor material from above the region laterally surrounded by the semiconductor constriction ring by performing an isotropic etch back process, wherein a remaining portion of the first semiconductor material constitutes the pedestal channel portion.

17. The method of claim 16, wherein:

the vertical semiconductor channel is formed by non-selectively depositing a second semiconductor material that is different in material composition from the first semiconductor material employing a conformal deposition process; and the method further comprises forming a dielectric core inside the vertical semiconductor channel and forming a drain region at an upper end of the vertical semiconductor channel.

18. The method of claim 17, wherein:

the first semiconductor material is deposited with in-situ carbon doping;

the second semiconductor material is deposited without in-situ carbon doping;

the source contact layer is deposited with in-situ doping of n-type dopant atoms; and the method further comprises inducing diffusion of a fraction of the n-type dopant atoms from the source contact layer into the pedestal channel portion by performing an anneal process.

19. The method of claim 17, wherein:

the pedestal channel portion is polycrystalline and has a first average grain size; and the vertical semiconductor channel is polycrystalline and has a second average grain size that is at least 50% larger than the first average grain size.

20. The method of claim 17, wherein the pedestal channel portion is formed by:

conformally depositing a first semiconductor material on the memory film with in-situ arsenic doping, wherein a portion of the first semiconductor material deposited within a region laterally surrounded by the semiconductor constriction ring is plugged with the first semiconductor material; and removing portions of the first semiconductor material from above the region laterally surrounded by the semiconductor constriction ring by performing an isotropic etch back process, wherein a remaining portion of the first semiconductor material constitutes the pedestal channel portion.

* * * * *